United States Patent
Kawashita et al.

(10) Patent No.: US 11,097,568 B2
(45) Date of Patent: *Aug. 24, 2021

(54) OPTICAL DEVICE, DISPLAY BODY, DEVICE PROVIDED WITH A DISPLAY BODY, OPTICAL FILTER, AND METHOD FOR MANUFACTURING AN OPTICAL DEVICE

(71) Applicant: TOPPAN PRINTING CO., LTD., Tokyo (JP)

(72) Inventors: Masashi Kawashita, Tokyo (JP); Hidemitsu Hakii, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 170 days.

This patent is subject to a terminal disclaimer.

(21) Appl. No.: 16/228,739

(22) Filed: Dec. 20, 2018

(65) Prior Publication Data

US 2019/0143736 A1 May 16, 2019

Related U.S. Application Data

(63) Continuation of application No. PCT/JP2017/023301, filed on Jun. 23, 2017.

(30) Foreign Application Priority Data

Jun. 24, 2016 (JP) .............................. JP2016-125704
Jun. 24, 2016 (JP) .............................. JP2016-125705
(Continued)

(51) Int. Cl.
*B42D 25/328* (2014.01)
*B42D 25/373* (2014.01)
(Continued)

(52) U.S. Cl.
CPC .............. *B42D 25/328* (2014.10); *B32B 3/30* (2013.01); *B32B 15/08* (2013.01); *B42D 25/324* (2014.10);
(Continued)

(58) Field of Classification Search
CPC .. B42D 25/328; B42D 25/373; B42D 25/324; B42D 25/351; B42D 25/36; B42D 25/45;
(Continued)

(56) References Cited

U.S. PATENT DOCUMENTS 7,907,339 B2   3/2011  Tompkin et al.
2010/0328587 A1  12/2010  Yamada et al.
(Continued)

FOREIGN PATENT DOCUMENTS

EP    2 787 340 A1   10/2014
JP    2008-096556 A   4/2008
(Continued)

OTHER PUBLICATIONS

International Search Report with English language translation and Written Opinion issued in International Application No. PCT/JP2017/023301 dated Sep. 5, 2017.
(Continued)

*Primary Examiner* — Kimberly N. Kakalec
(74) *Attorney, Agent, or Firm* — Foley & Lardner LLP

(57) ABSTRACT

An optical device comprises a support having a reference plane, and a dielectric periodic structure including a plurality of periodic elements which are arranged, on the reference plane, in a two-dimensional lattice having a sub-wavelength spacing and are either projections projecting from the reference plane or recesses depressed from the reference plane. The optical device further includes a metal layer, which is positioned on a surface of the periodic structure including a region of the reference plane surrounding the individual (Continued)

periodic elements and the surfaces of the periodic elements and which has a shape that follows the surface profile of the periodic structure.

13 Claims, 43 Drawing Sheets

(30) Foreign Application Priority Data

| Jun. 24, 2016 | (JP) | JP2016-126071 |
|---|---|---|
| Jun. 24, 2016 | (JP) | JP2016-126072 |
| Sep. 15, 2016 | (JP) | JP2016-181036 |
| Sep. 15, 2016 | (JP) | JP2016-181037 |
| May 9, 2017 | (JP) | JP2017-092883 |
| Jun. 22, 2017 | (JP) | JP2017-122322 |
| Jun. 22, 2017 | (JP) | JP2017-122323 |

(51) Int. Cl.

| G09F 19/14 | (2006.01) |
|---|---|
| B32B 15/08 | (2006.01) |
| G02B 5/28 | (2006.01) |
| G02B 5/18 | (2006.01) |
| G02B 5/20 | (2006.01) |
| B32B 3/30 | (2006.01) |
| B42D 25/324 | (2014.01) |
| B42D 25/351 | (2014.01) |
| B42D 25/36 | (2014.01) |
| B42D 25/45 | (2014.01) |
| G09F 19/12 | (2006.01) |
| H01L 31/0216 | (2014.01) |

(52) U.S. Cl.
CPC ........... *B42D 25/351* (2014.10); *B42D 25/36* (2014.10); *B42D 25/373* (2014.10); *B42D 25/45* (2014.10); *G02B 5/18* (2013.01); *G02B 5/1823* (2013.01); *G02B 5/1857* (2013.01); *G02B 5/20* (2013.01); *G02B 5/28* (2013.01); *G02B 5/285* (2013.01); *G09F 19/12* (2013.01); *G09F 19/14* (2013.01); *H01L 31/02165* (2013.01)

(58) Field of Classification Search
CPC .. B32B 15/08; B32B 3/30; G02B 5/28; G02B 5/18; G02B 5/20; G02B 5/1823; G02B 5/1857; G02B 5/285; G09F 19/12; G09F 19/14; H01L 31/02165
See application file for complete search history.

(56) References Cited

U.S. PATENT DOCUMENTS

| 2011/0052802 A1 | 3/2011 | Kaida et al. |
|---|---|---|
| 2011/0080640 A1 | 4/2011 | Kaida et al. |
| 2014/0085725 A1 | 3/2014 | Lochbihler et al. |
| 2014/0253920 A1 | 9/2014 | Sugimoto |
| 2014/0329336 A1 | 11/2014 | Moriya et al. |
| 2015/0070693 A1 | 3/2015 | Sugimoto et al. |
| 2015/0219807 A1 | 8/2015 | Lochbihler |
| 2017/0011665 A1 | 1/2017 | Koda et al. |
| 2017/0326898 A1 | 11/2017 | Koda |

FOREIGN PATENT DOCUMENTS

| JP | 2008-162260 A | 7/2008 | |
|---|---|---|---|
| JP | 2008-275740 A | 11/2008 | |
| JP | 2009-145764 A | 7/2009 | |
| JP | 2009-186813 A | 8/2009 | |
| JP | 2009-266900 A | 11/2009 | |
| JP | 2011-002491 A | 1/2011 | |
| JP | 2011-013330 A | 1/2011 | |
| JP | 2012-153111 A | 8/2012 | |
| JP | 5124272 A | 1/2013 | |
| JP | 2013-174683 A | 9/2013 | |
| JP | 2014-059529 A | 4/2014 | |
| JP | 2014-098780 A | 5/2014 | |
| JP | 2014-238465 A | 12/2014 | |
| JP | 2015-055482 A | 3/2015 | |
| JP | 2015-184532 A | 10/2015 | |
| WO | WO-2009/123290 A1 | 10/2009 | |
| WO | WO-2009/125751 A1 | 10/2009 | |
| WO | WO-2012/105555 A1 | 8/2012 | |
| WO | WO-2012/156049 A1 | 11/2012 | |
| WO | WO-2013/080473 A1 | 6/2013 | |
| WO | WO-2014023415 A1 * | 2/2014 | .......... G02B 5/1814 |
| WO | WO-2015/028037 A1 | 3/2015 | |
| WO | WO-2015/147283 A1 | 10/2015 | |
| WO | WO-2016/125843 A1 | 8/2016 | |

OTHER PUBLICATIONS

Extended European Search Report dated Feb. 10, 2020 for corresponding Application No. 17815529.7.
Office Action dated Jul. 7, 2020 for corresponding Japanese Patent Application No. 2016-181036.
Office Action dated Jun. 16, 2020 for corresponding Japanese Patent Application No. 2016-125704.
Office Action dated Jun. 16, 2020 for corresponding Japanese Patent Application No. 2016-125705.
Office Action dated Oct. 6, 2020 for corresponding Japanese Patent Application No. 2016-125705.
International Searching Authority, "International Search Report," issued in connection with International Patent Application No. PCT/JP2018/044291, dated Feb. 26, 2019.
International Searching Authority, "Written Opinion," issued in connection with International Patent Application No. PCT/JP2018/044291, dated Feb. 26, 2019.
Japanese Office Action issued in Japanese Application No. 2016-181037 dated Nov. 4, 2020, with English Translation.

* cited by examiner

FIG.42
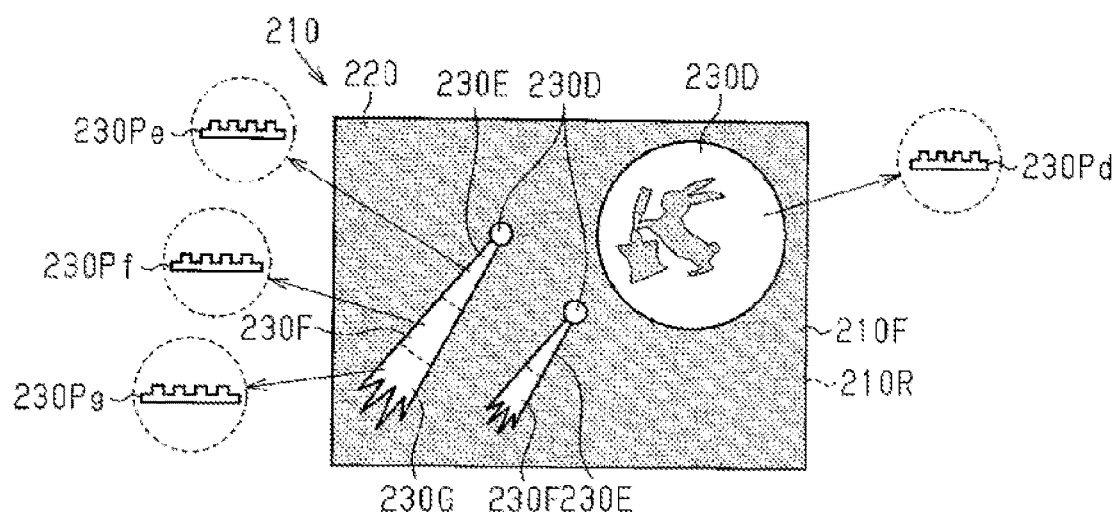
FIG.43
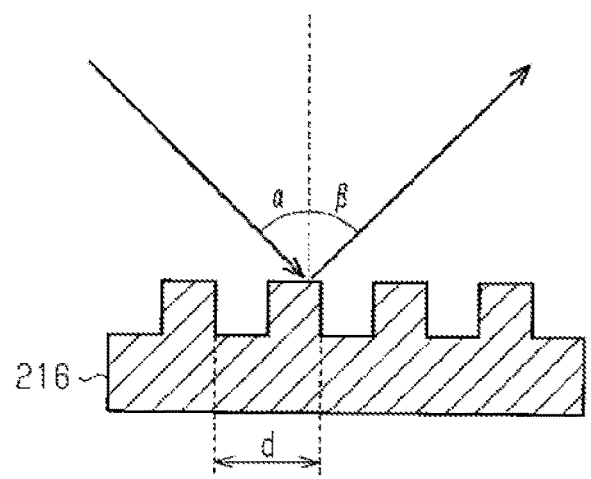
FIG. 44A
FIG. 44B
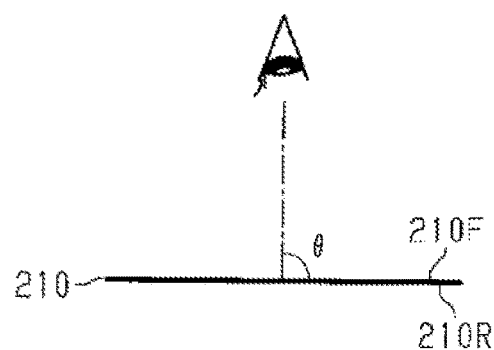
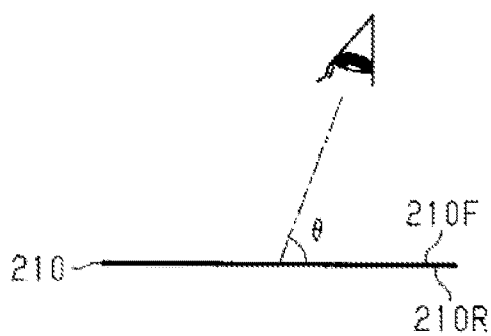

OPTICAL DEVICE, DISPLAY BODY, DEVICE PROVIDED WITH A DISPLAY BODY, OPTICAL FILTER, AND METHOD FOR MANUFACTURING AN OPTICAL DEVICE

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2017/023301, filed on Jun. 23, 2017, which is based upon and claims the benefit of priority to 9 Japanese Patent Applications: (1) Japanese Patent Application No. 2016-125704, filed on Jun. 24, 2016; (2) Japanese Patent Application No. 2016-125705, filed on Jun. 24, 2016; (3) Japanese Patent Application No. 2016-126071, filed on Jun. 24, 2016; (4) Japanese Patent Application No. 2016-126072, filed on Jun. 24, 2016; (5) Japanese Patent Application No. 2016-181036, filed on Sep. 15, 2016; (6) Japanese Patent Application No. 2016-181037, filed on May 9, 2017; (7) Japanese Patent Application No. 2017-092883, filed on Jun. 24, 2016; (8) Japanese Patent Application No. 2017-122322, filed on Jun. 22, 2017; and (9) Japanese Patent Application No. 2017-122323, filed on Jun. 22, 2017. The disclosures of which are all hereby incorporated herein by reference in their entireties.

TECHNICAL FIELD

The present invention relates to an optical device, a device body, a device provided with a display body, an optical filter, and a method for manufacturing an optical device.

BACKGROUND ART

Optical devices are ones that make use of optical phenomena such as optical reflection, absorption, interference and diffraction. A display body, which is an example of optical devices, utilizes an optical interference of a diffraction grating or a multilayer film so as to add a visual effect differing from a printed matter to the image displayed by the display body (see, for example, Patent Literature 1). If the display body is attached to a product, product counterfeiting difficulty and product design properties can be increased. Other instances of the optical device include an optical filter for display devices and image pickup devices (see, for example, Patent Literature 2). The optical filter is able to emit light of a wavelength region which is a part of incident light.

CITATION LIST

[Patent Literature] Patent Literature 1: JP 5124272 B2; Patent Literature 2: JP 2014-098780 A

SUMMARY OF THE INVENTION

Technical Problem

An optical device capable of selectively transmitting or reflecting light of a specific wavelength region can be used as a display body of forming a colored image different from white or black, or as an optical filter. In order to increase the versatility of such an optical device, it is favorable that the degree of freedom of adjusting a transmitted or reflected wavelength region in the optical device is increased.

The present invention has for an object the provision of an optical device, a display body, a display body-attached device, and an optical filter, all of which are able to increase the degree of freedom of adjusting the transmitted or reflected wavelength region, and also to a method for manufacturing an optical device.

Solution to Problem

An optical device for solving the above problem includes a support having a reference plane, a dielectric periodic structure including a plurality of periodic elements arranged in a two-dimensional lattice having a sub-wavelength period on the reference plane wherein the periodic elements are either of the projections projected from the reference plane and the recesses depressed from the reference plane, and a metal layer positioned on a surface of the periodic structure which is a plane including a region of the reference plane surrounding the periodic elements and the surfaces of the periodic elements.

The display body for addressing the above problem is one having such a configuration of the optical device as described above.

A display body-attached device for addressing the above problem includes the display body described above.

The optical filter for addressing the problem is one having such a configuration of the optical device as described above.

According to the configuration stated above, since the optical device includes a layer having a sub-wavelength periodic lattice structure made of a metal and a dielectric, plasmon resonance occurs in the layer having the lattice structure upon irradiation of light to the optical device. The light of the wavelength region consumed by plasmon resonance is not reflected with the optical device, but light of the specific wavelength region suffering the action of plasmon resonance is passed through the optical device and emitted from the optical device. As a consequence, the light of the specific wavelength region is emitted as reflected or transmitted light. The wavelength region of the transmitted or reflected light is determined depending a plurality of factors including the position and size of the respective periodic elements, and the metal layer whose position is determined depending on the respective periodic elements. Hence, the degree of freedom of adjusting the transmitted or reflected wavelength region can be increased.

A method for manufacturing an optical device with which the above problem is addressed comprises a first step of transferring projections and recesses of an intaglio plate to a resin coated onto a surface of a substrate to form a periodic structure wherein periodic elements of the projections or recesses are arranged in a two-dimensional lattice having a sub-wavelength period as viewed in a direction perpendicular to the surface of the substrate, and a second step of forming, on the periodic structure, a metal layer having a shape that follows a surface profile of the periodic structure.

According to the above method, the resulting optical device is ensured to have a high degree of freedom of adjusting a transmitted or reflected wavelength region therein. The periodic structure having fine projections and recesses can be easily, favorably formed.

Advantageous Effect of the Invention

According to the present invention, the degree of freedom of adjusting a transmitted or reflected wavelength region can be increased in the optical device.

BRIEF DESCRIPTION OF THE DRAWINGS

FIG. 42 is a plan view showing a planar structure in an example of the fifth embodiment of the display body.

FIG. 43 is a view showing the relations among the period of projections, an angle of incidence and an angle of diffraction.

FIGS. 44A and 44B are, respectively, views showing a change of observer's observation angle for a display body.

DESCRIPTION OF REPRESENTATIVE EMBODIMENTS

Representative embodiments according to the present invention will hereafter be described below in detail and with reference to the drawings. The representative embodiments described below are merely examples of the present invention, and the design thereof could be appropriately changed by one skilled in the art.

First Embodiment

With reference to FIGS. 1 to 12, a first embodiment of a display body which is an example of an optical device and a method for manufacturing a display body is illustrated. It will be noted that the display body may be used for the purposes of increasing product counterfeiting difficulty or enhancing product design properties, or may be used for both purposes. For the purpose of increasing the product counterfeiting difficulty, a display body may be attached, for example, to authentication documents such as a passport, licenses and the like, a variety of securities such as merchandise coupons, checks and the like, cards such as credit cards, cash cards and the like, and paper money. For the purpose of enhancing product design properties, the display body may be attached, for example, to wearable ornaments, products carried around by users, stationary goods such as house furnishings, home electrics and the like, and structures such as walls, doors and the like.

Figure 1:
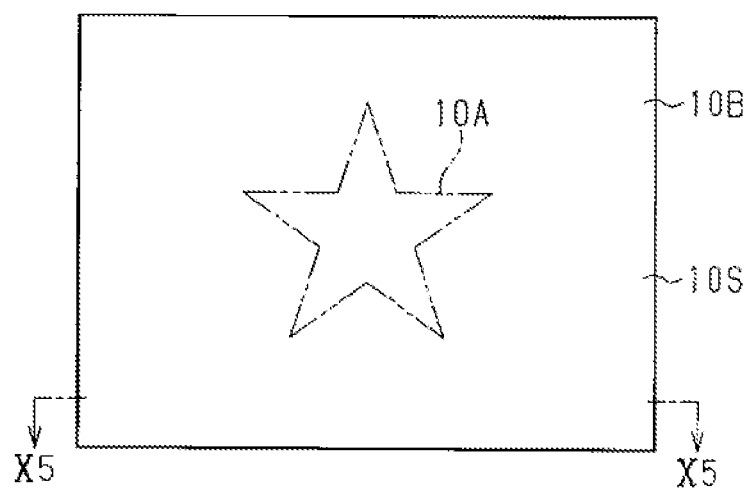
FIG. 1 is a plan view showing a planar structure of a display body in a first embodiment.

As shown in FIG. 1, a front surface 10S of a display body is divided into a first display region 10A and a second display region 10B. The sectional structure of the first display region 10A and the sectional structure of the second display region 10B differ from each other. The first display region 10A is one wherein a character, a figure, a symbol, a pattern or a picture is drawn on the front surface 10S. In FIG. 1, a star-shaped figure is drawn in the region, for example.

[Structure of Display Body]

The configuration of the first display region 10A is now described.

Figure 2:
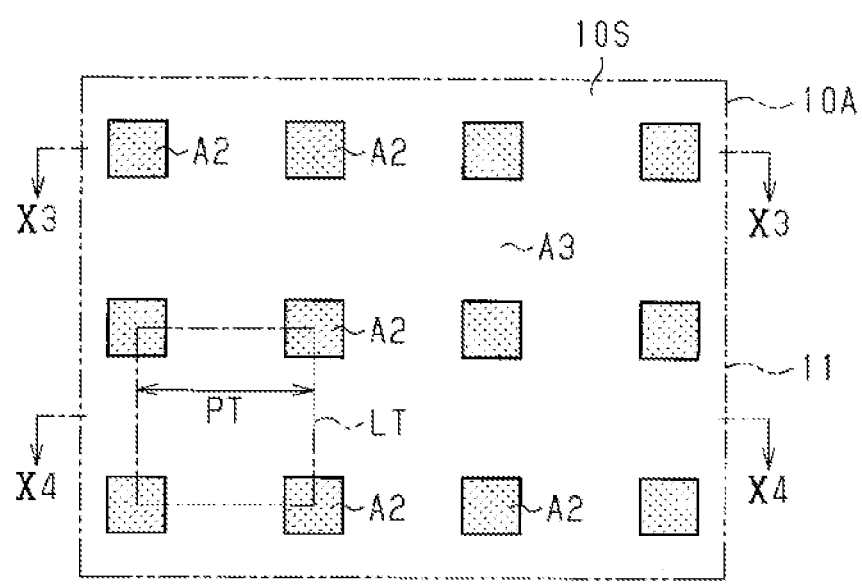
FIG. 2 is an enlarged view showing an enlarged planar structure of a first display region in the display body of the first embodiment.

As shown in FIG. 2, the first display region 10A includes a plurality of isolated regions A2 and a single peripheral region A3 surrounding the individual isolated regions A2 therewith as viewed in a direction perpendicular to the front surface 10S of the display body. In FIG. 2, the respective isolated regions A2 are depicted as dots for the convenience of illustration.

The respective isolate regions A2 are arranged in a square array along the front surface 10S. The square array is one wherein the isolated regions A2 are positioned at the respective apexes of a square LT with a side of a structural period PT. It will be noted that the respective isolated regions A2 may be arranged in a hexagonal arrangement. More particularly, the isolated regions A2 are arrayed in an island arrangement that is either one of a square arrangement or a hexagonal arrangement. It will also be noted that the hexagonal arrangement is one wherein the isolated regions A2 are positioned at the respective apexes of an equilateral triangle.

Figure 3:
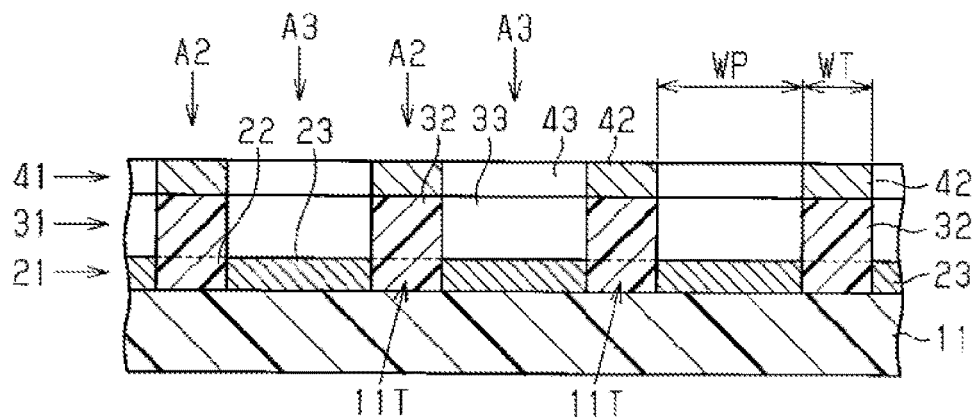
FIG. 3 is a view showing a sectional structure of the first display region of the first embodiment and is a sectional view taken along the line X3-X3 of FIG. 2.

As shown in FIG. 3, the display body is provided with a transparent support 11 enabling light in the visible region to be transmitted. The wavelength of light in the visible region is from 400 nm to 800 nm. The support 11 is common to both the first display region 10A and the second display region 10B. The sectional structure of the support 11 may be a single layer structure or a multilayer structure.

The constituent material for the support 11 is a dielectric and includes, for example, a resin such as a photocurable resin or an inorganic material such as quartz. From the standpoint that flexibility required for attaching the display body to a product is readily obtained and optical characteristics can be imparted to the support in high degree of freedom, it is preferred that the constituent material of the support 11 is a resin. The refractive index of the support 11 is higher than that of an air layer and is, for example, from 1.2 to 1.7.

The first display region 10A includes a first grating layer 21, an intermediate grating layer 31 and a second grating layer 41 in the order from the support 11. The intermediate grating layer 31 is sandwiched between the first grating layer 21 and the second grating layer 41. It will be noted that the surface on which the first grating layer 21 is positioned in the support 11 is the front surface of the support 11 and the front surface side of the structure is a side at which the first grating layer 21 is positioned relative to the support 11. On the contrary, the rear surface side of the structure is a side at which the support 11 is positioned relative to the first grating layer 21.

[First Grating Layer 21]

The first grating layer 21 is formed on the front surface of the support 11. The first grating layer 21 includes a plurality of first dielectric layers 22 and a single first metal layer 23. The first dielectric layer 22 is positioned in the isolated region A2 as viewed in a direction perpendicular to the front surface 10S of the display body. The single first metal layer 23 is positioned in the peripheral region A3 as viewed in a direction perpendicular to the front surface 10S. The plurality of the first dielectric layers 22 are arranged across the front surface 10S in an island arrangement, which is either of a square arrangement and a hexagonal arrangement.

The respective first dielectric layers 22 are structures projected from the surface of the support 11. The respective dielectric layers 22 are integral with the support 11, for example. Alternatively, the respective first dielectric layers 22 may have a boundary with the surface of the support 11 and are thus ones different from the support 11.

The first metal layer 23 has a mesh pattern for surrounding the individual first dielectric layers 22 one by one as viewed in a direction perpendicular to the front surface 10S. In the first grating layer 21, the single first metal layer 23 is an optical sea component which is full of free electrons from side to side. The respective dielectric layers 22 are island components distributed in the sea component.

As viewed in a direction perpendicular to the front surface 10S, the positioning period of the first dielectric layers 22 is the total of a shortest width WP of mutually adjacent first dielectric layers 22 and the width WT of the first dielectric layer 22 and is thus the structural period PT. The structural period PT is a sub-wavelength period which is less than a wavelength in the visible region.

The ratio of the width WT of the first dielectric layer 22 to the structural period PT is from 0.25 to 0.75. In view that the processing accuracy of the first grating layer 21 is obtained and a plasmon resonance is likely to occur in the first grating layer 21, the ratio of the width WT of the first dielectric layer 22 to the structural period PT is preferably from 0.40 to 0.60.

The thickness of the first grating layer 21 is preferably from 100 nm to 200 nm. From the standpoint that high processing accuracy of the first grating layer 21 is obtained, a plasmon resonance is likely to be obtained in the first grating layer 21 and image colors through different observations become bright, the thickness of the first grating layer 21 is preferably from 10 nm to 100 nm.

[Intermediate Grating Layer 31]

The intermediate grating layer 31 is positioned on the first grating layer 21. The thickness of the intermediate grating layer 31 is greater than the thickness of the first grating layer 21. From the viewpoint that high processing accuracy of the intermediate grating layer 31 is obtained, the thickness of the intermediate grating layer 31 is preferably 150 nm or below.

The intermediate grating layer 31 includes a plurality of first intermediate dielectric layers 32 and a single second intermediate dielectric layer 33. The respective first intermediate dielectric layers 32 are positioned in the isolated region A2 as viewed in a direction perpendicular to the front surface 10S. The single second intermediate dielectric layer 33 is positioned in the peripheral region A3 as viewed in a direction perpendicular to the front surface 10S. The plurality of the first intermediate dielectric layers 32 are arranged across the front surface 10S in an island arrangement which is either of a square arrangement and a hexagonal arrangement.

The respective first intermediate dielectric layers 32 are a structure projected from the first dielectric layer 22. The respective intermediate dielectric layers 32 are integral with the first dielectric layer 22, for example. Alternatively, the respective first intermediate dielectric layers 32 have a boundary, for example, with the first dielectric layer 22 and are thus ones different from the first dielectric layer 22. As viewed in a direction perpendicular to the front surface 10S, the positioning period of the first intermediate layer 32 is the total of the shortest width WP and the width WT like the first dielectric layer 22, thus resulting in the structural period PT. The ratio of the width WT of the first intermediate dielectric layer 32 to the structural period PT is from 0.25 to 0.75. Preferably, the ratio of the width WT of the first intermediate dielectric layer 32 to the structural period PT is from 0.40 to 0.60.

The second intermediate dielectric layer 33 has a mesh pattern for surrounding the individual first intermediate dielectric layers 32 one by one as viewed in a direction perpendicular to the front surface 10S. In the intermediate grating layer 31, the single second intermediate dielectric layer 33 serves as a structural and optical sea component. The respective first intermediate dielectric layers 33 serve as structural and optical island components. The second intermediate dielectric layer 33 is an air layer or a resin layer and has a dielectric constant lower than the first intermediate dielectric layer 32.

[Second Grating Layer 41]

The second grating layer 41 is positioned on the intermediate grating layer 31. The thickness of the second grating layer 41 is preferably from 10 nm to 200 nm. The thickness of the second grating layer 41 is smaller than the thickness of the intermediate grating layer 31. From the standpoint that high processing accuracy of the second grating layer 41 is obtained, a plasmon resonance is likely to occur in the second grating layer 41 and the color of an image through different observations becomes bright, the thickness of the second grating layer 41 is preferably from 10 nm to 100 nm.

The second grating layer 41 includes a plurality of second metal layers 42 and a single second dielectric layer 43. The positions of the respective metal layers 42 include the isolated regions A2 as viewed in a direction perpendicular to the front surface 10S. The position of the single second dielectric layer 43 is included in the peripheral region A3 as viewed in a direction perpendicular to the front surface 10S. The plurality of the second metal layers 42 are arranged in an island arrangement so as to be parallel to the front surface 10S. The island arrangement is either of a square arrangement or a hexagonal arrangement.

The respective second metal layers 42 have such a structure overlaid on the top face of the first intermediate dielectric layers 32. The respective second metal layers 42 have a boundary between themselves and the first intermediate dielectric layers 32 and are thus different from the first dielectric layers 32. As viewed in a direction perpendicular to the front surface 10S, the positioning period of the second metal layers 42 is the total of the shortest width WP and the width WT like the first dielectric layers 22, resulting the structural period PT. The ratio of the width of the second metal layer 42 to the structural period PT is from 0.25 to 0.75. Preferably, the ratio of the width of the second metal layer 42 to the structural period PT is from 0.40 to 0.60.

The second dielectric layer 43 has a mesh pattern for surrounding the individual second metal layers 42 one by one as viewed in a direction perpendicular to the front surface 10S. In the second grating layer 41, the single second dielectric layer 43 serves as an optical sea component wherein free electrons are less in amount than in the second metal layers 42. The respective second metal layers 42 serve as island components distributed in the sea component. The second dielectric layer 43 is an air layer or a resin layer with its dielectric constant being smaller than that of the first intermediate dielectric layer 32.

The volume ratio of the first metal layer 23 serving as a sea component in the first grating layer 21 is larger than the volume ratio of the second metal layers 42 serving as island components in the second grating layer 41. The volume ratio of the second metal layers 42 serving as island components in the second grating layer 41 is larger than the volume ratio of a metal material in the intermediate grating layer 31.

It should be noted that the structure constituted of the first dielectric layers 22 and the first intermediate dielectric layers 32 is an example of the periodic element, which is a projection 11T projecting from a reference plane when the surface of the support 11 is taken as the reference plane. The structure made up of the support 11, the first dielectric layers 22 and the first intermediate dielectrics 32 is an example of a periodic structure. The layer constituted of the first metal layer 23 and the second metal layers 42 is taken as a metal layer whose shape, taken as an entire layer, follows a surface profile of the periodic structure. The surface of the periodic structure is a plane including a region surrounding the respective periodic elements and the surfaces of the respective periodic elements in the reference plane.

Figure 4:
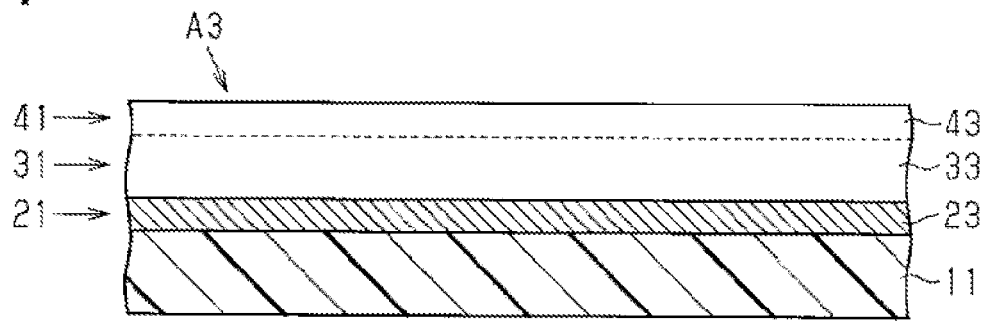
FIG. 4 is a view showing the sectional structure of the first display region of the first embodiment and is a sectional view taken along the line X4-X4 of FIG. 2.

As shown in FIG. 4, in the peripheral region A3, the first metal layer 23 of the first grating layer 21, the second intermediate dielectric layer 33 of the intermediate grating layer 31 and the second dielectric layer 43 of the second grating layer 41 are positioned in the order from the support 11. The second intermediate dielectric layer 33 is sandwiched between the first metal layer 23 and the second dielectric layer 43.

Figure 5:
FIG. 5 is a view showing a sectional structure of a second display region of the first embodiment and is a sectional view taken along the line X5-X5 of FIG. 1.

As shown in FIG. 5, the second display region 10B does not include, on the support 11, such first grating layer 21, intermediate grating layer 31 and second grating layer 41 as described above. More particularly, the second display region 10B is able to transmit light in the visible region in accordance with the optical transparency of the support 11.

It will be noted that the second display region 10B may include, on the support 11, a layer different from the first display region 10A. The second display region 10B may include, for example, the first dielectric layer 22 alone. The second display region 10B may include, for example, a single metal layer alone constituted of the same material as the constituent material for the first metal layer 23. The layer configuration of the second display region 10B can be appropriately selected depending on the requirement for an image displayed in the second display region 10B.

Figure 6:
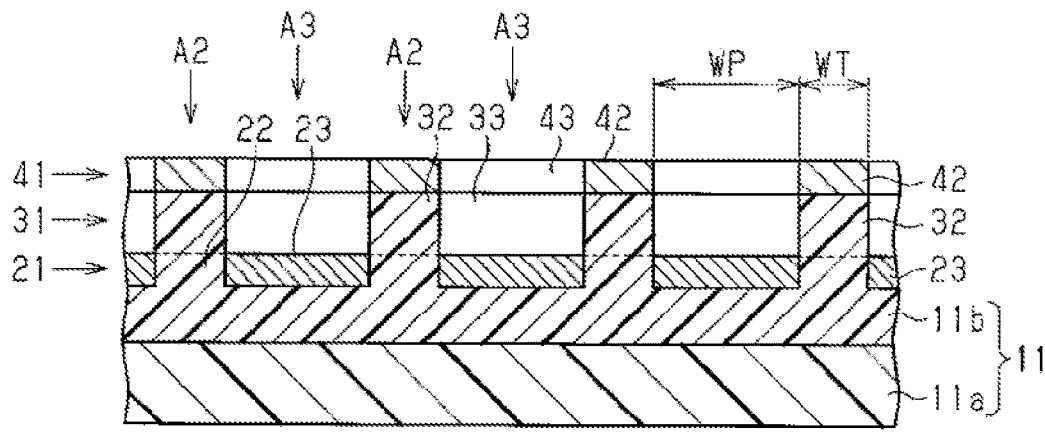
FIG. 6 is a sectional view showing another example of a sectional structure of a first display region of the first embodiment.

As stated above, the sectional structure of the support 11 may be either a multilayer structure, or the respective first dielectric layers 22 may have no boundary between themselves and the support 11. FIG. 6 shows a structure wherein the support 11 is constituted of two layers, of which the front surface side layer of the support 11 is integrated with the respective first dielectric layers 22. More particularly, the support 11 includes a substrate 11a and an intermediate layer 11b, wherein the intermediate layer 11b is positioned on the front surface side relative to the substrate 11a. The respective first dielectric layers 22 project from the intermediate layer 11b, and the respective first dielectric layers 22 and the intermediate layer 11b are integrated together.

[Optical Configuration of Display Body]

Next, the optical configuration of the display body is illustrated.

There is now illustrated an example of a configuration wherein the front surface 10S of the display body and the rear surface 10T of the display body are, respectively, in contact with an air layer, and the second intermediately dielectric layer 33 and the second dielectric layer 43 are, respectively, an air layer or a resin layer having a refractive index close to that of the air layer.

Figure 7:
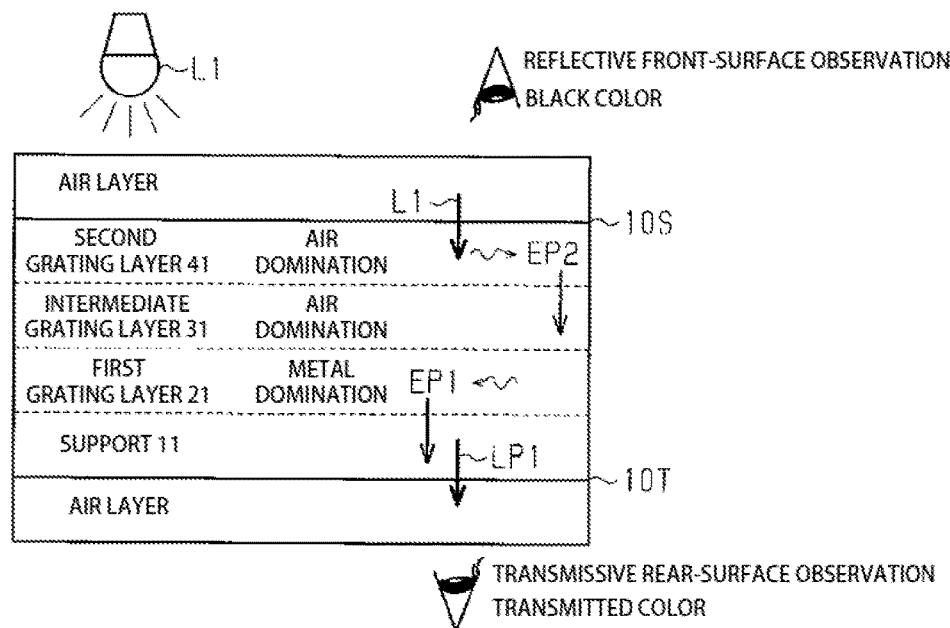
FIG. 7 is an operational view showing the operation of the display body of the first embodiment through reflective observation from a front surface side and also through transmissive observation from a rear surface side.

As shown in FIG. 7, the refractive index of the support 11 is at a level dominated by a dielectric and is greater than the refractive index of the air layer.

The refractive index of the first dielectric layer is higher than the refractive index of the air layer, and the refractive index of the first metal layer 23 is lower than the refractive index of the air layer. The refractive index of the first grating layer 21 approximates an averaged magnitude of the refractive index of the first metal layer 23 and the refractive index of the first dielectric layer 22. Since the ratio of the width WT of the first dielectric layer 22 to the structural period PT is from 0.25 to 0.75, the refractive index of the first grating layer 21 eventually results in the value being dominated by the first metal layer 23 of the sea component and is much lower than the refractive index of the air layer.

The refractive index of the first intermediate dielectric layer 32 is higher than the refractive index of the air layer, and the refractive index of the second intermediate dielectric layer 33 is equal to or higher than the refractive index of the air layer. The refractive index of the intermediate grating layer 31 approximates the averaged magnitude of the refractive index of the second intermediate dielectric layer 33 and the refractive index of the first intermediate dielectric layer 32. Since the ratio of the width WT of the first intermediate dielectric layer 32 to the structural period PT is from 0.25 to 0.75, the refractive index of the intermediate grating layer 31 eventually results in the magnitude being dominated by the second intermediate dielectric layer 33 of the sea component and is higher than the refractive index of the air layer and is close to the refractive index of the air layer.

The refractive index of the second metal layer 42 is lower than the refractive index of the air layer, and the refractive index of the second dielectric layer 43 is equal to or higher than the refractive index of the air layer. The refractive index of the second grating layer 41 approximates the averaged magnitude of the refractive index of the second dielectric layer 43 and the refractive index of the second metal layer 42. Since the ratio of the width WT of the second metal layer 42 to the structural period PT is from 0.25 to 0.75, the refractive index of the second grating layer 41 results in the magnitude being dominated by the second intermediate dielectric layer 43 of the sea component and is lower than the refractive index of the air layer and is close to the refractive index of the air layer.

[Reflective Front-Surface Observation and Transmissive Rear-Surface Observation]

White light L1 incident from the outside of the display body to the second grating layer 41 enters from the air layer into the second grating layer 41, followed by entering from the second lattice 41 into the intermediate grating layer 31. The light L1 incident to the second grating layer 41 enters from the air layer into the second grating layer 41 having a refractive index close to the air layer, so that Fresnel reflection hardly occurs at the interface between the air layer and the second grating layer 41. Light incident to the intermediate grating layer 31 enters from the second lattice 41 having a refractive index close to the air layer into the intermediate grating layer 31 having a refractive index close to the air layer. In this case, Fresnel reflection also hardly occurs at the interface between the second grating layer 41 and the intermediate grating layer 31.

On the other hand, since the structural period PT of the second metal layer 42 is a sub-wavelength period not larger than a wavelength in the visible region, a plasmon resonance occurs in the second grating layer 41. Plasmon resonance is a phenomenon wherein part of the light incident into the second grating layer 41 and collective vibrations of electrons are combined together. Part of the light L1 incident into the second grating layer 41 is converted to a surface plasmon through plasmon resonance in the second grating layer 41, and the surface plasmon passes through the second grating layer 41. The surface plasmon passing through the second grating layer 41 is re-converted into light and emitted. The wavelength region of light EP2 emitted from the second grating layer 41 due to plasmon resonance is a specific wavelength region that depends on the grating structure including the structural period PT of the second metal layers 42 and also on the type of material. Consequently, the second grating layer 41 permits part of the light in the wavelength region of light incident into the second grating layer 41 to be transmitted to the intermediate grating layer 31.

The structural period PT of the first dielectric layer 22 is a sub-wavelength period not larger than a wavelength in the visible region, so that a plasmon resonance occurs in the first grating layer 21. That is, part of the light incident into the first grating layer 21 is also converted to a surface plasmon through plasmon resonance in the first grating layer 21, and the surface plasmon passes through the first grating layer 21 and is re-converted into light and emitted. The wavelength region of the light EP1 emitted from the first grating layer 21 due to plasmon resonance is a specific wavelength region depending on the grating structure including the structural period PT of the first grating layers 22 and the type of material. As a consequence, the first grating layer 21 permits part of the light in the wavelength region of light incident into the first grating layer 21 to be transmitted to the support 11.

As stated above, according to the reflective front-surface observation wherein light L1 is made incident from the outside of the display body to the second grating layer 41 so that the front surface 10S is observed from the front surface side of the display body, a black color or a color close to black color is visually recognized in the first display region 10A due to the combination of difficulty in generating Fresnel reflection at the respective interfaces and the occurrence of plasmon resonance in the respective grating layers.

On the other hand, according to the transmissive rear-surface observation wherein light L1 is made incident from the outside of the display body to the second grating layer 41 and the rear surface 10T is observed from the rear surface side of the display body, colored light LP1, i.e. light other than white and black light, which is transmitted after undergoing plasmon resonance in the respective grating layers, is visually recognized in the first display region 10A. It will be noted that the results of the reflective front-surface observation and the transmissive rear-surface observation show a similar tendency in the case where the quantity of external light directed toward the front surface 10S is larger than the quantity of external light directed toward the rear surface 10T.

[Reflective Rear-Surface Observation, Transmissive Front-Surface Observation]

Figure 8:
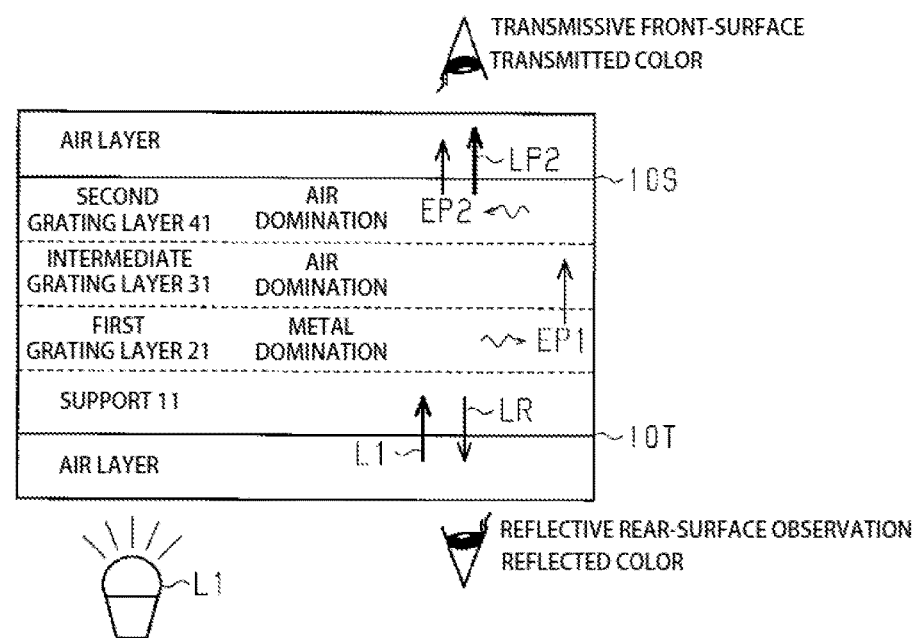
FIG. 8 is an operational view showing the operation of the display body of the first embodiment through reflective observation from a rear surface side and also through transmissive observation from a surface side.

As shown in FIG. 8, white color light L1 incident from the outside of the display body to the support 11 enters from the air layer into the support 11 and then from the support 11 to the first grating layer 21. Since the light L1 incident into the support 11 enters from the support 11 having a refractive index higher than the air layer into the first grating layer 21 having a refractive index lower than the air layer, Fresnel reflection is likely to occur at the interface between the support 11 and the first grating layer 21. It will be noted that the difference in refractive index between the support 11 and the first grating layer 21 is larger than the difference in refractive index between the first grating layer 21 and the intermediate grating layer 31 and is also larger than the difference in refractive index between the intermediate grating layer 31 and the second grating layer 41.

On the other hand, part of the light passing through the interface between the support 11 and the first grating layer 21 is provided for generating plasmon resonance in the first grating layer 21. The wavelength region of light EP1 emitted from the first grating layer 21 due to plasmon resonance here is a specific wavelength region depending on the grating structure including the structural period PT of the first metal layer 23 and the type of material. The light in this wavelength region is consumed by plasmon resonance without being reflected at the interface between the support 11 and the first grating layer 21. Eventually, part of the light in the wavelength region of the light incident into the support 11 is reflected at the interface between the support 11 and the first grating layer 21, and the first grating layer 21 allows part of the light in the wavelength region of light incident into the first grating layer 21 to be transmitted to the intermediate grating layer 31.

Part of the light incident to the second grating layer 41 after transmission through the intermediate grating layer 31 is provided for generating plasmon resonance in the second grating layer 41. Here, the wavelength region of light EP2 emitted from the second grating layer 41 due to plasmon resonance is a specific wavelength region depending on the grating structure including the structural period PT of the second dielectric layer 43 and the type of material. As a consequence, the second grating layer 41 allows part of the light in the wavelength region of light incident into the second grating layer 41 to be transmitted to the air layer.

As stated above, according to the reflective rear-surface observation wherein light L1 is made incident from the outside of the display body to the support 11 and the rear surface 10T is visually observed from the rear surface side of the display body, colored light LR caused by Fresnel reflection at the above interface, i.e. light LR other than white and black light, is visually recognized in the first display region 10A. It will be noted that such Fresnel reflection occurring at the interface between the support 11 and the first grating layer 21 acts to visually produce a color closer to black in the first display region 10A upon the reflective front-surface observation as described above.

On the other hand, with the transmissive front-surface observation wherein light L1 is made incident from the outside of the display body to the support 11 and the front surface 10S is observed from the front surface side of the display body, colored light L2 after undergoing Fresnel reflection and plasmon resonance in the respective grating layers is visually recognized in the first display region 10A. It will be noted that the results of the transmissive front-surface observation and the reflective rear-surface observation show a similar tendency in the case that the quantity of external light directed toward the rear surface 10T is higher than the quantity of external light directed toward the front surface 10S.

[Method for Manufacturing a Display Body]

Next, an example of a method of manufacturing the display body is described.

Initially, first dielectric layers 22 and first intermediate dielectric layers 32 are formed on the surface of a support 11. The first dielectric layers 22 and the first intermediate dielectric layers 32 are integrally formed as projections from the surface of the support 11. For the method of forming the projections, there can be adopted, for example, a photolithographic method using light or a charged particle beam, a nanoimprinting method, or a plasma etching method. Especially, as a method of forming projections on the surface of the support 11 made of a resin, there can be used, for example, a nanoimprinting method. In the case that projections are formed by processing a substrate made of a hard material, there can be used a combined method of a photolithographic method using light or a charged particle beam and a plasma etching method.

For example, where a display body having a support 11 constituted of a substrate 11a and an intermediate layer 11b as shown in FIG. 6 is made, a polyethylene terephthalate sheet is used as the substrate 11a, and a UV curing resin is coated onto the surface of the substrate 11a. Next, the surface of a synthetic quartz mold that is an intaglio plate is pressed against the surface of the coated film made of the UV curing resin, followed by irradiation of UV light. Subsequently, the UV-cured resin is demolded from the synthetic quartz mold. Accordingly, the projections and recesses of the intaglio plate are transferred onto the surface of the substrate 11a thereby forming the projections each made of the first dielectric layer 22 and the first intermediate dielectric layer 32 and the intermediate layer 11b. It will be noted that the irradiation of UV light may be changed to heating. Additionally, the UV curing resin may be changed to a thermoplastic resin. The irradiation of UV light may be changed to heating and cooling.

Next, a first metal layer 23 and a second metal layer 42 are formed on the surface of the support 11 provided with the projections. The first metal layer 23 and the second metal layer 42 are formed, for example, by a vacuum deposition method or a sputtering method. In this way, a first grating layer 21 segmented with the top faces of the first metal layers 23 is formed and the second grating layer 41 segmented with the top faces of the second metal layers 42 is formed. Moreover, the intermediate grating layer 31 sandwiched between the first grating layer 21 and the second grating layer 41 is formed.

Configuration Example of First Display Region

Figure 9:
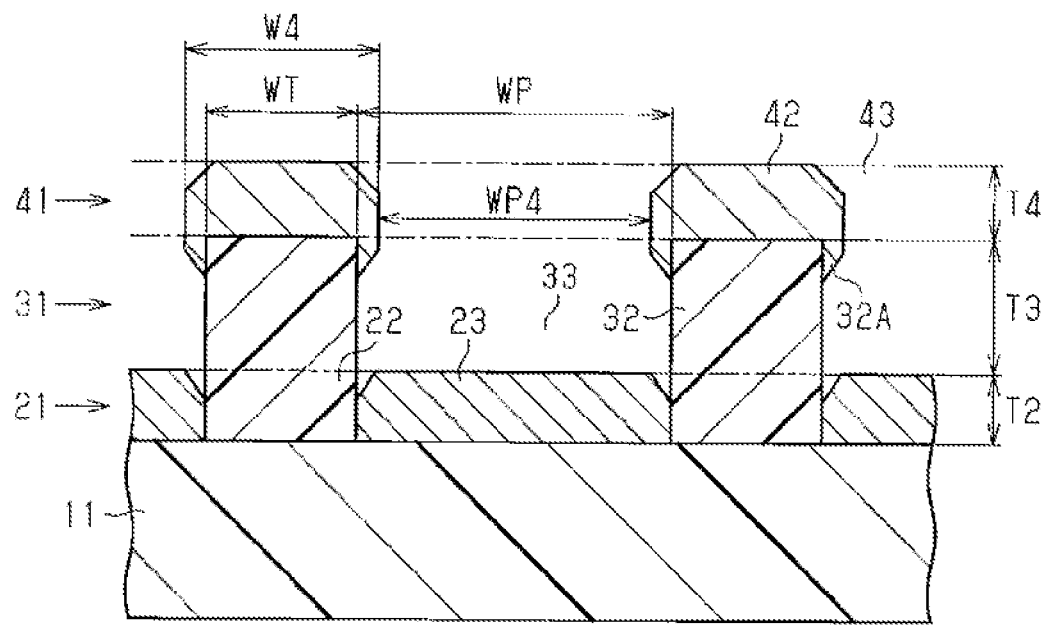
FIG. 9 is a sectional view showing an enlarged example of a part of a sectional structure in the first display body of the first embodiment.

As shown in FIG. 9, a greater thickness T2 of the first metal layer 23 results in a greater intensity of light generated by Fresnel reflection at the interface between the first grating layer 21 and the support 11 and also results in a higher image brightness in the reflective rear-surface observation. A smaller ratio of the width WT of the first dielectric layer 22 to the structural period PT also results in a higher image brightness in the reflective rear-surface observation.

A greater thickness T2 of the first metal layer 23 results in a smaller intensity of light transmitted from the rear surface 10T to the front surface 10S and also results in a color closer to black in the reflective front-surface observation. A smaller ratio of the width WT of the first dielectric layer 22 to the structural period PT also results in a color closer to black in the reflective front-surface observation.

When the thickness T2 of the first metal layer 23 is not less than 10 nm and the ratio of the width WT of the first dielectric layer 22 to the structural period PT is not larger than 0.75, there can be obtained a satisfactory accuracy in the above observations for judging the front and back of the display body.

On the other hand, a smaller thickness T2 of the first metal layer 23 or a smaller thickness T4 of the second metal layer 42 results in a greater intensity of light passing therethrough in the cases of the transmissive front-surface observation and the transmissive rear-surface observation. A greater ratio of the width WT of the first dielectric layer 22 to the structural period PT also results in a greater intensity of light passing through the display body.

When the thickness T2 of the first metal layer 23 or the thickness T4 of the second metal layer 42 is not larger than 200 nm and the ratio of the width WT of the first dielectric layer 22 to the structural period PT is not less than 0.25, the image visually recognized upon the transmissive front-surface observation and the image visually recognized upon the transmissive rear-surface observation are made clear, sufficient to allow visual recognition thereof.

The total of the thickness T2 of the first dielectric layer 22 and the thickness T3 of the first intermediate dielectric layer 32 should preferably be less than the structural period PT that is the total of the width WT of the first dielectric layer 22 and the shortest width WP. More preferably, the total of the thickness T2 of the first dielectric layer 22 and the thickness T3 of the first intermediate dielectric layer 32 should be less than half the structural period PT.

When configured as such, it is possible to enhance the shape accuracy of the structure in the resin structure wherein the first dielectric layer 22 and the first intermediate dielectric layer 32 are integrated. Moreover, the projection 11T made of the first dielectric layer 22 and the first intermediate dielectric layer 32 is suppressed from collapsing on the surface of the support 11.

In the first grating layer 21 and the second grating layer 41 making use of a metal material wherein its real part of complex permittivity in the visible region wavelength is a negative value, plasmon resonance is likely to occur. Hence, the constituent material for the first metal layer 23 is preferably one wherein the real part of the complex permittivity is a negative value. Likewise, the constituent material for the second metal layer 42 is also one wherein the real part of the complex permittivity is a negative value.

The constituent materials for the first metal layer 23 and the second metal layer 42 include, for example, aluminum, silver, gold, indium, tantalum and the like.

It will be noted that as stated in the manufacturing method, the first metal layer 23 and the second metal layer 42 can be formed by a single step wherein a metal layer is formed on the support 11 on which the first dielectric layer 22 and the first intermediate layer 32 have been formed.

In this case, the metal particles sputtered from a film-forming source are deposited on the surface of the support 11 in a given distribution of angle. As a result, the width W4 of the second metal layer 42 becomes slightly larger than the width WT of the first intermediate dielectric layer 32, and a shortest width WP4 of mutually adjacent second meal layers 42 becomes slightly smaller than the shortest width WP. In this case, the ratio of the width W4 of the second metal layer 42 to the structural period PT is from 0.25 to 0.75. Incidentally, the circumference of the first intermediate dielectric layer 32 in the first metal layer 23 suffers the influence of the shadow effect by the second metal layer 42 and is thinner at a portion closer to the first intermediate dielectric layer 32.

In the structure formed according to the above film-forming method, an intermediate metal layer 32A, which is a metal layer contiguous to the second metal layer 42, is formed on the side surfaces of the first intermediate dielectric layer 32.

The intermediate metal layer 32A is sandwiched between the first intermediate dielectric layer 32 and the second intermediate dielectric layer 33. The intermediate metal layer 32A forms a structure integrated with the second metal layer 42, its thickness on the side surface of the first intermediate dielectric layer 32 becomes thinner at a portion closer to the first metal layer 23.

Such an intermediate metal layers 32A have the structural period PT that is a sub-wavelength period, so that the refractive index along the thickness direction of the second grating layer 41 and the intermediate grating layer 31 changes continuously. The intermediate metal layer 32A is unlikely to reflect light incident from the outside of the display body into the second grating layer 41 and this light is likely to be transmitted to the intermediate grating layer 31 and the first grating layer 21. Therefore, according to the reflective front-surface observation, a color closer to black is visually recognized in the first display region 10A.

In the structure formed by the above film-forming method, a constituent material for the first metal layer 23 and a constituent material for the second metal layer 42 are the same as each other.

It is to be noted here that with a smaller difference in refractive index between the second dielectric layer 43 and the second metal layer 42, the refractive index averaged in the second grating layer 41 is more likely to suppress Fresnel reflection at the interface between the second grating layer 41 and other layer. On the other hand, with a greater difference in refractive index between the first dielectric layer 22 and the first metal layer 23, the averaged refractive index of the first grating layer 21 is more likely to promote Fresnel reflection at the interface between the first grating layer 21 and the support 11.

In such a configuration that the first metal layer 23 and the second metal layer 42 have the mutually same refractive index and a difference in refractive index between the first dielectric layer 22 and the first metal layer 23 is greater than a difference in refractive index between the second dielectric layer 42 and the second metal layer 43, Fresnel reflection at the interface between the second grating layer 41 and other layer can be suppressed and Fresnel reflection at the interface between the first grating layer 21 and other layer can be promoted.

It will be noted that in order to suppress Fresnel reflection at the interface between the second grating layer 41 and other layer and to promote Fresnel reflection at the interface between the first grating layer 21 and other layer, it is preferred to satisfy the following requirements. More particularly, it is preferred that a difference in refractive index between the surface layer opposite to the intermediate grating layer 31 relative to the second dielectric layer 43 and in contact with the second dielectric layer 43 and the second dielectric layer 43 is less than a difference in refractive index between the first metal layer 23 and the support 11. The surface layer is, for example, an air layer. More preferably, the refractive index of the second dielectric layer 43 is equal to the refractive index of the surface layer.

As stated above, in the first embodiment, light in the specific wavelength region is emitted as reflected light or transmitted light due to plasmon resonance. The wavelength region of the transmitted light or reflected light is determined by a plurality of factors including the position and size of the periodic elements in the form of the respective projections 11T and the metal layers whose positions are determined by the respective periodic elements. Hence, the degree of freedom of adjusting the wavelength region transmitted through or reflected from the display body can be increased.

In the meantime, in order to increase the difficulty of counterfeiting, and design properties, it is preferred that one display body is able to form images of mutually different appearances depending on the observation conditions. For instance, there is demanded a display body wherein images of mutually different colors are visually recognized upon the front surface observation and the rear surface observation of the display body, respectively, or a display body wherein images of mutually different colors are visually recognized upon the observation of light reflected on one surface of the display body and the observation of transmitted light. The provision of a display body enabling images of mutually different appearances to be visually recognized depending on the conditions of observation is an object of the first embodiment as well. According to the first embodiment, there can be obtained the effects set out below and including such an effect on the problem as described above.

(1-1) Because images having different colors in the reflective front-surface observation and the reflective rear-reflective front-surface observation can be visually recognized in the first display region 10A, it becomes possible to increase the accuracy of judging the front and back of the display body. Moreover, it becomes possible to easily determine the authenticity of products attached with the display body and also to increase the design properties of the product attached with the display body.

(1-2) Because images having different colors in the reflective front-surface observation and the transmissive rear-surface observation can be visually recognized in the first display region 10A, it becomes possible to increase accuracy on the results of determining the front and back. Because images having different colors in the reflective rear-surface observation and the transmissive front-surface observation can be visually recognize in the first display region 10A, it becomes possible to increase accuracy on the results of determining the front and back.

(1-3) The size of the structural period PT is a sub-wavelength period that is less than the wavelength in the visible region and is one that is able to suppress the formation of primary diffracted light out of light in the visible region. Therefore, the colors of images recognized through the reflective rear-surface observation, the transmissive front-surface observation and the transmissive rear-surface observation can be made brighter while suppressing an iridescent color from being contained.

(1-4) The total of the thickness T2 of the first grating layer 21 and the thickness T3 of the intermediate grating layer 31 has a magnitude enough to apply an intaglio plate such as for nanoimprinting thereto, it is enabled to integrally form the first dielectric layer 22 and the first intermediate dielectric layer 32.

(1-5) Since the first dielectric layer 22 and the first intermediate dielectric layer 32 are formed as an integral structure and the second intermediate dielectric layer 33 and the second dielectric layer 43 are integral with each other, it is possible to simplify the structure of the display body. Moreover, if the second intermediate dielectric layer 33 and the second dielectric layer 43 are configured to form an integral air layer, it becomes possible to further simplify the structure of the display body.

(1-6) The intermediate metal layer 32A has a reflection preventing function, so that the color of the image visually recognized by the reflective front-surface observation can be made closer to black.

(1-7) In each of the reflective front-surface observation, the reflective rear-surface observation and transmissive rear or front-surface observation, the color in the first display region 10A can be made inherent. Therefore, it becomes possible to increase an accuracy of determining the authenticity of the products attached with the display body.

(1-8) In each of the reflective front-surface observation, the reflective rear-surface observation and transmissive rear or front-surface observation, the color in the first display region 10A can be made inherent. Therefore, it becomes possible that the display form of the display body can be made more complicated and the design properties of the display body can be increased.

Modification Examples of the First Embodiment

The above first embodiment can be performed by changes in the following ways.

[Intermediate Grating Layer 31]

The first intermediate dielectric layer 32 and the second intermediate layer 33 can be formed as different structures, respectively. In this case, the second intermediate dielectric layer 33 should preferably be a resin layer, which has a refractive index closer to a refractive index of the air layer than the refractive index of the first dielectric layer 32.

The second intermediate dielectric layer 33 and the second dielectric layer 43 can be configured as different structures, respectively. In this case, the second dielectric layer 33 should preferably be a resin layer, which has a refractive index closer to a refractive index of the air layer than to a refractive index of the second dielectric layer 43.

[First Grating Layer 21]

Figure 10:
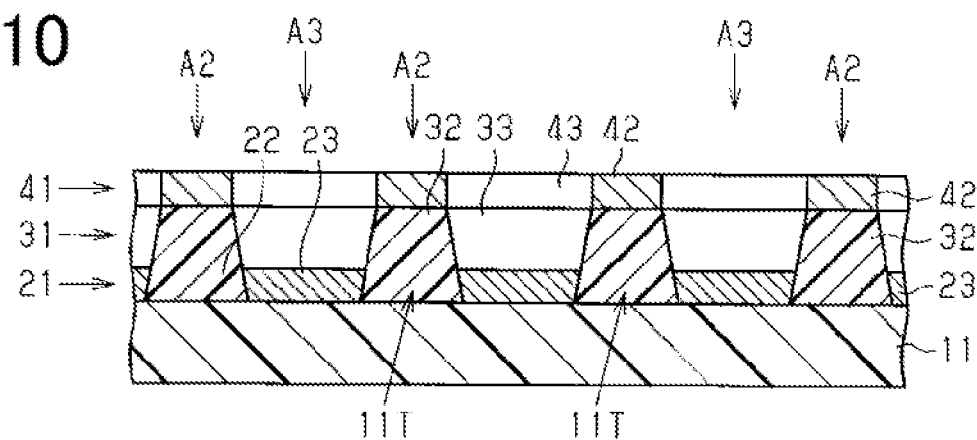
FIG. 10 is a sectional view showing an enlarged part of a sectional structure in the first display body of a modification of the first embodiment.

As shown in FIG. 10, the first dielectric layer 22 and the first intermediate dielectric layer 32 is configured as an integral structure. The projection 11T of the integral structure body can be shaped as a cone projecting from the surface of the support 11. With such a structure, when the first dielectric layers 22 and the first intermediate dielectric layers 32 are formed, an intaglio plate used therefor can be smoothly removed.

[Second Display Region 10B]

Figure 11:
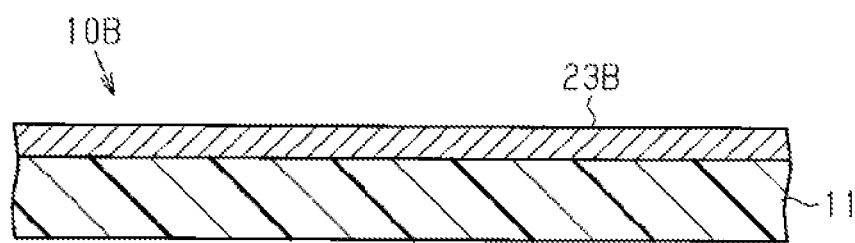
FIG. 11 is a sectional view showing an enlarged part of a sectional structure in a second display region of a modification example of the first embodiment.

As shown in FIG. 11, the second display region 10B can be configured as including a metal layer 23B alone on the surface of the support 11. In this case, an image having black color or a color to black can be visually recognized in the first display region 10A by the reflective front-surface observation, and an image having a metallic luster can be visually recognized in the second display region 10B. On the other hand, with the reflective rear-surface observation, a colored image, which is formed from light by Fresnel reflection at the interface between the first grating layer 21 and he support 11, i.e. light suffering the influence of the wavelength region consumed by plasmon resonance in the first grating layer 21, can be visually recognized in the first display region 10A. Moreover, an image having a metallic luster and reflected only by Fresnel reflection at the interface between the metal layer 23B and the support 11 can be visually recognized in the second display region 10B.

[Protective Layer]

The display body may further include a protective layer on the second metal layer 42. In this case, the intensity of Fresnel reflection at the interface between the protective layer and the second metal layer 42 and the selectivity of a wavelength of the display body associated therewith are changed depending on the refractive index of the protective layer. In this sense, the constituent material for the protective layer should be appropriately selected based on the wavelength region selected for the display body.

Figure 12:
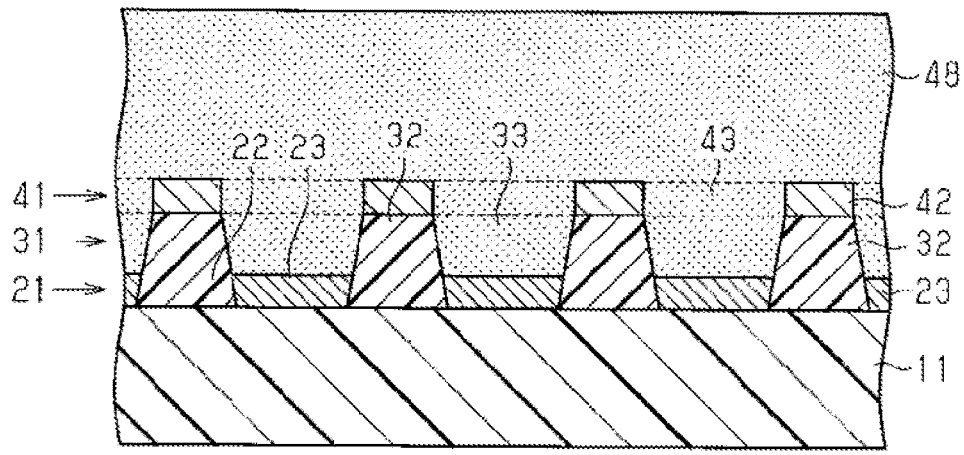
FIG. 12 is a sectional view showing an enlarged part of a sectional structure in a first display region of the modification example of the first embodiment.

It will be noted that as shown in FIG. 12, a protective layer 48 can be embodied as a structure integrated with the second dielectric layer 43 and the second intermediate dielectric layer 33. In this case, the protective layer 48 is preferably a resin layer having a low refractive index. The low refractive index resin layer has a refractive index that is closer to a refractive index of an air layer than a refractive index of the first dielectric layer 22 or the first intermediate dielectric layer 32.

Other Examples

The positions of the isolated region A2 as viewed in a direction perpendicular to the front surface 10S of the display body are not limited to a square arrangement or a hexagonal arrangement, but may be in a two-dimensional lattice array. More particularly, it may be sufficient that a plurality of the first dielectric layers 22 are arranged in a two-dimensional lattice, a plurality of the first intermediate dielectric layers 32 are arranged in a two-dimensional lattice, and a plurality of the second metal layers 42 are arranged in a two-dimensional lattice. In other words, the periodic elements of the periodic structure may be arranged in a two-dimensional lattice having a sub-wavelength period. The two-dimensional lattice array is one wherein elements are arranged along each of two intersecting directions within a two-dimensional plane. In this case, the ratio of the width WT to the structural period PT means a ratio of the width WT to the structural period PT in one direction, and the ratio being within a given range means that the ratio of the width WT to the structural period PT is within a given range in each of the two arrangement directions of the periodic elements.

The shape of the isolated region A2 as viewed in a direction perpendicular to the front surface 10S of the display body, i.e. the planar shape of the period element, is not limited to a square but may be a rectangle or other polygon, or may be a circle.

When the display body has such a structure as to generate a plasmon resonance in the first grating layer 21 and the second grating layer 41, the transmitted light passing through the display body becomes light in the specific wavelength region, which depends on the structural period PT. Even where Fresnel reflection occurs at the interface between the second grating layer 41 and other layer and a colored image different from black color is visually recognized in the first display region 10A by the reflective front-surface observation, the wavelength region consumed by the reflective front-surface observation is not included in reflected light, so that images of mutually different colors are visually recognized by the reflective front-surface observation and the transmissive rear-surface observation. Moreover, even with the reflective rear-surface observation and the transmissive front-surface observation, images of mutually different colors are visually recognized. Accordingly, the observations from the front and rear surfaces of the display body enable images of mutually different appearances to be visually recognized depending on the observation conditions. Therefore, the counterfeiting difficulty and design properties of the products attached with the display body can be increased.

For example, the ratio of the width WT of the first dielectric layer 22 to the structural period PT and the ratio of the width WT of the second metal layer 42 to the structural period PT may be a value different from a value of 0.25 to 0.75, respectively. Also, for example, the relationships among the thicknesses of the first grating layer 21, the intermediate grating layer 31 and the second grating layer 41 may differ from those in the above embodiment.

Second Embodiment

With reference to FIGS. 13 to 16, a second embodiment related to a display body which is an example of an optical device, a device attached with the display body, and a method for manufacturing the display body is described. In the following description, the illustration is focused on differences between the second embodiment and the first embodiment, and parts similar to those of the first embodiment are denoted by similar reference numerals and their illustration is omitted.

[Structure of Display Body]

Figure 13:
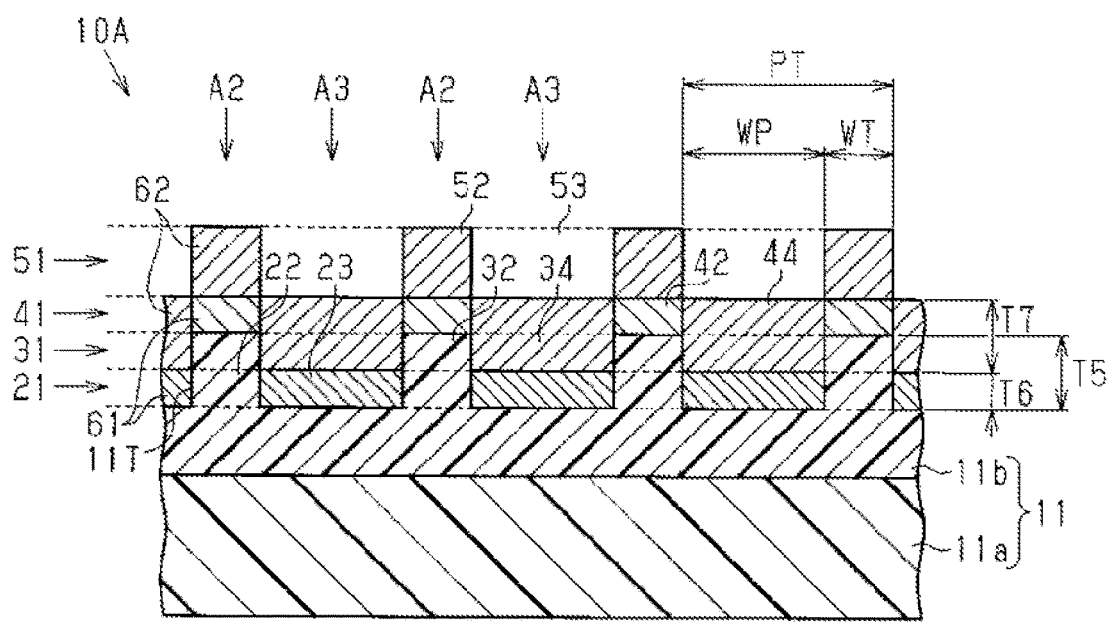
FIG. 13 is a sectional view showing a sectional structure of a first display region in a second embodiment of a display body.

As shown in FIG. 13, a first display region 10A of a display body includes, aside from a support 11, a first grating layer 21, an intermediate grating layer 31 and a second grating layer 41, an upper grating layer 51. The first grating layer 21, the intermediate grating layer 31, the second grating layer 41 and the upper grating layer 51 are disposed in this order from the surface of the support 11. More particularly, the second grating layer 41 is sandwiched between the intermediate grating layer 31 and the upper grating layer 51.

The support 11 has the same configuration as in the first embodiment. FIG. 13 shows an example of a configuration where the support 11 is constituted of a substrate 11a and an intermediate layer 11b. It will be noted that where the support 11 is configured of the substrate 11a and the intermediate layer 11b, it is preferred that the refractive index of a constituent material for the substrate 11a is closer to the refractive index of a constituent material of the intermediate layer 11b. The respective refractive indexes of the substrate 11a and the intermediate layer 11b are higher than an air layer and are, for example, from 1.2 to 1.7.

[First Grating Layer 21]

The first grating layer 21 includes a plurality of first dielectric layers 22 and a single first metal layer 23. The respective first dielectric layers 22 are positioned in an isolated region A2 as viewed in a direction perpendicular to a front surface 10S of the display body. The single first metal layer 23 is positioned in a peripheral region A3 as viewed in a direction perpendicular to the front surface 10S. The plurality of the first dielectric layers 22 are placed across the front surface 10S in an island arrangement, which is either of a square arrangement and a hexagonal arrangement.

The respective first dielectric layers 22 are a structure projecting from the surface of the support 11. The respective dielectric layers 22 may be integrated with the support 11 or may be formed as a different body from the support 11. As viewed in a direction perpendicular to the front surface 10S, the structural period PT that is a positioning period of the first dielectric layers 22 is a sub-wavelength period, which is less than a wavelength in the visible region. As viewed in a direction perpendicular to the front surface 10S, the first metal layer 23 is a structure having a mesh pattern for surrounding the first dielectric layers 22 one by one. The first metal layer 23 is formed as a different body from the support 11. In the first grating layer 21, the first metal layer 23 is a structural and optical sea component. The respective first dielectric layers 22 are structural and optical island components.

[Intermediate Grating Layer 31]

The intermediate grating layer 31 includes a plurality of first intermediate dielectric layers 32 and a single second intermediate dielectric layer 34. The respective intermediate dielectric layers 32 are positioned in the isolated region A2 as viewed in a direction perpendicular to the surface 10S. The single second intermediate dielectric layer 34 is positioned in a peripheral region A3 as viewed in a direction perpendicular to the front surface 10S. The plurality of the first intermediate dielectric layers 32 are placed across the front surface 10S in an island arrangement, which is either of a square arrangement or a hexagonal arrangement.

The respective first intermediate dielectric layers 32 are a structure projected from the first dielectric layer 22. The respective intermediate dielectric layers 32 may be integrated with the first dielectric layer 22, or may be formed as a different body from the first dielectric layer 22. As viewed in a direction perpendicular to the front surface 10S, the positioning period of the first intermediate dielectric layers 32 is the structural period PT. The second intermediate dielectric layer 34 is a mesh pattern for surrounding the individual first intermediate dielectric layers 32 one by one as viewed in a direction perpendicular to the front surface 10S. The second intermediate dielectric layer 34 is formed as a different body from the first metal layer 23. In the intermediate grating layer 31, the second intermediate dielectric layer 34 is a structural and optical sea component, and the respective first intermediate dielectric layers 32 are structural and optical island components.

[Second Grating Layer 41]

The second grating layer 41 includes a plurality of second metal layers 42 and a single second dielectric layer 44. The positions of the respective second metal layers 42 include the isolated regions A2 as viewed in a direction perpendicular to the front surface 10S. The position of the single second dielectric layer 44 is included in the peripheral region A3 as viewed in a direction perpendicular to the front surface 10S. The plurality of the second metal layers 42 are placed across the front surface 10S in an inland arrangement, which is either of a square arrangement and a hexagonal arrangement.

The respective second metal layers are a structure overlaid on the top surface of the first intermediate dielectric layer 32. The respective metal layers 42 are formed as a different body from the first intermediate dielectric layer 32. As viewed in a direction perpendicular to the front surface 10S, the positioning period of the second metal layers 42 is the structural period PT. The second dielectric layer 44 is a mesh pattern for surrounding the individual second metal layers 42 one by one as viewed in a direction perpendicular to the front surface 10S. The second dielectric layer 44 may be integrated with the second intermediate dielectric layer 34 or may be formed as a different body. In the second grating layer 41, the second dielectric layer 44 is a structural and optical sea component, and the respective second metal layers 42 are structural and optical island components.

[Upper Grating Layer 51]

The upper grating layer 51 includes a plurality of first upper dielectric layers 52 and a single second upper dielectric layer 53. The positions of the respective first upper dielectric layers 52 include the isolated region A2 as viewed in a direction perpendicular to the front surface 10S. The position of the single second upper dielectric layer 53 is included in the peripheral region A3 as viewed in a direction perpendicular to the front surface 10S. The plurality of the first upper dielectric layers 52 are placed across the front surface 10S in an island arrangement which is either of a square arrangement and a hexagonal arrangement.

The respective first upper dielectric layers 52 are a structure overlaid on the top surface of the second metal layer 42. The respective first upper dielectric layers 52 are formed as a different body from the second metal layer 42. As viewed in a direction perpendicular to the front surface 10S, the positioning period of the first upper dielectric layers 52 is the structural period PT. As viewed in a direction perpendicular to the front surface 10S, the second upper dielectric layer 53 has a mesh pattern for surrounding the individual dielectric layers 52 one by one. The second upper dielectric layer 53 is formed as a different body from the second dielectric layer 44. In the upper grating layer 51, the second upper dielectric layer 53 is a structural and optical sea component, and the respective first upper dielectric layers 52 are structural and optical island components.

Figure 14:
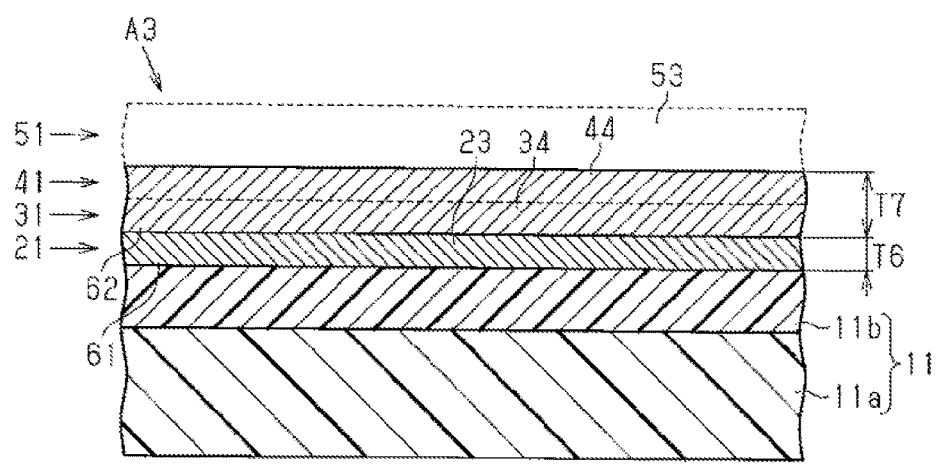
FIG. 14 is a sectional view showing a sectional structure of the first display region of the second embodiment.

As shown in FIG. 14, in the peripheral region A3, there are positioned, in the order nearer to the support 11, the first metal layer 23 of the first grating layer 21, the second intermediate dielectric layer 34 of the intermediate grating layer 31, the dielectric layer 44 of the second grating layer 41, and the second upper dielectric layer 53 of the upper grating layer 51.

[Materials for the Respective Grating Layers]

The first dielectric layer 22 and the first intermediate dielectric layer 32 are each made of a dielectric and is made up, for example, of a resin such as a photocurable resin or an inorganic material such as quartz. The respective refractive indexes of the first dielectric layer 22 and the first intermediate dielectric layer 32 are higher than that of an air layer and are, for example, from 1.2 to 1.7. For instance, the intermediate layer 11b of the substrate 11a, the first dielectric layer 22 and the first intermediate dielectric layer 32 are an integrated structure and are made of the same material.

The first metal layer 23 and the second metal layer 42 are each constituted of a metal material. The constituent materials for the first metal layer 23 and the second metal layer 42 are preferably ones whose real part of complex permittivity in the visible region wavelength is a negative value. Such materials preferably include, for example, aluminum, silver, gold, indium, tantalum and the like. The first metal layer 23 and the second metal layer 42 are formed, for example, of the same material.

The second intermediate dielectric layers 34, the second dielectric layer 44 and the first upper dielectric layer 34 are, respectively, a transparent dielectric capable of passing light in the visible region. The second intermediate dielectric layer 34, the second dielectric layer 44 and the first upper dielectric layer 52 are preferably made of an inorganic compound such as silicon dioxide (SiO2), aluminum oxide (Al2O3), tantalum oxide (Ta2O5), niobium oxide (Nb2O5), zirconium dioxide (ZrO2), titanium dioxide (TiO2), magnesium fluoride (MgF2), calcium fluoride (CaF2) and the like. In this regard, however, the second intermediate dielectric layer 34, the second dielectric layer 44 and the first upper dielectric layer 52 may be constituted of an organic compound, respectively. The refractive indexes of the second intermediate dielectric layer 34, the second dielectric layer 44 and the first upper dielectric layer 52 are, respectively, higher than an air layer and are, for example, from 1.3 to 3.0.

For example, the second intermediate dielectric layer 34 and the second dielectric layer 44 are an integrated structure, and the second intermediate dielectric layer 34, the second dielectric layer 44 and the first upper dielectric layer 52 are made of the same material.

The second upper dielectric layer 53 is a transparent dielectric capable of passing visible region light and is an air layer or a resin layer having a refractive index close to the air layer. The refractive index of the second upper dielectric layer 53 is lower than the respective refractive indexes of the first upper dielectric layer 52 and the second dielectric layer 44.

In the plane made of the isolated regions A2 and the peripheral region A3, the ratio of an area occupied by the isolated regions A2 per unit area is less than 0.5. That is, the volume ratio of the first metal layer 23 in the first grating layer 21 is greater than the volume ratio of the first dielectric layers 22 in the first grating layer 21. The volume ratio of the second intermediate dielectric layer 34 in the intermediate grating layer 31 is greater than the volume ratio of the first intermediate dielectric layers 32 in the intermediate grating layer 31.

The volume ratio of the second dielectric layer 44 in the second grating layer 41 is greater than the volume ratio of the second metal layers 42 in the second grating layer 41. The volume ratio of the second upper dielectric layer 53 in the upper grating layer 51 is greater than the volume ratio of the first upper dielectric layers 52 in the upper grating layer 51.

In the above configuration, the structure constituted of the first dielectric layer 22 and the first intermediate dielectric layer 32 is an example of a periodic element and is a projection 11T projecting from the reference plane in the case that the surface of the support 11 is taken as the reference plane. The structure constituted of the support 11, the first dielectric layers 22 and the first intermediate dielectric layers 32 is an example of a periodic structure. The layer formed of the first metal layer 23 and the second metal layers 42 is positioned on the surface of the periodic structure and is taken as a metal layer 61 having, as an entire layer, a shape that follows the surface profile of the periodic structure. The surface of the periodic structure means a surface including a region of the reference plane surrounding the individual periodic elements and the surfaces of the respective periodic elements.

The layer constituted of the second intermediate dielectric layer 34, the second dielectric layer 44 and the first upper layers 52 is positioned on a surface opposite to a surface in contact with the periodic structure in the metal layer 61 and is taken as a dielectric layer 62 having, as an entire layer, a shape that follows the surface profile of the metal layer 61.

[Method for Manufacturing the Display Body]

Next, an example of a method for manufacturing the display body of the second embodiment is described.

The support 11, the first dielectric layers 22, the first intermediate dielectric layers 32, the first metal layer 23 and the second metal layers 42 are formed in the same manner as in the first embodiment. More particularly, the first dielectric layers 22 and the first intermediate dielectric layers 32 are integrally formed as the projections 11T each projecting from the surface of the support 11. For the formation of the projection 11T, there can be adopted, for example, a photolithographic method using light or a charged particles beam, a nanoimprinting method or a plasma etching method. Especially, the nanoimprinting method can be used, for example, for the formation of the projections 11T on the surface of the support 11 made of a resin. Where the projections 11T are formed by processing a hard material substrate, there can be used a method using a combined method of a photolithographic method using light or a charged particle beam and a plasma etching method.

Next, the metal layer 61 is formed on the surface of the support 11, on which the projections 11T have been formed, according to a vacuum deposition method or a sputtering method. The metal layer 61 is formed in a shape that follows the surface profile of the periodic structure made of the support 11 and the projections 11T. In this way, the first metal layer 23 and the second metal layers 42 are formed.

Next, the dielectric layer 62 is formed on the surface of the structure formed with the metal layer 61 thereon. For the formation of the dielectric layer 62, there is used, for example, a vacuum deposition method or a sputtering method. The dielectric layer 62 is formed in a shape that follows the surface profile of the metal layer 61. In this way, the second intermediate dielectric layer 34, the second dielectric layer 44 and the first upper dielectric layers 52 are formed.

According to the manufacturing method as stated above, the first grating layer 21 segmented with the top surfaces of the first metal layer 23 is formed, and the first grating layer 31 segmented with the top surfaces of the first intermediate dielectric layers 32, i.e. with the top surfaces of the projections 11T, is formed. Moreover, the second grating layer 41 segmented with the top surfaces of the second metal layers 42 is formed, and the upper grating layer 51 segmented with the top surfaces of the first upper dielectric layers 52 is formed.

[Optical Operation of the Display Body]

Figure 15:
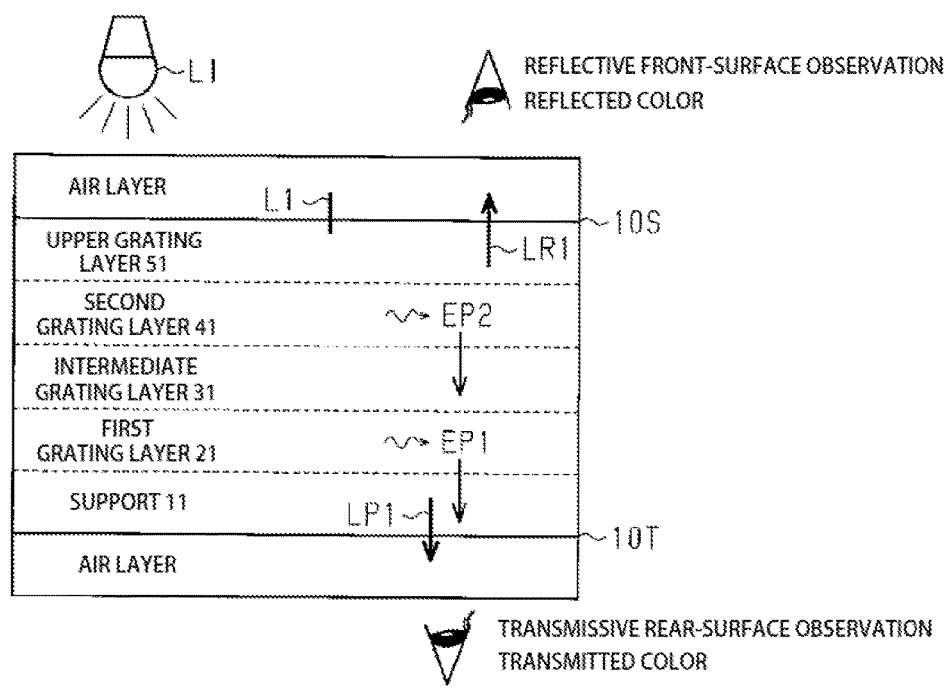
FIG. 15 is an operational view showing the operation of the display body of the second embodiment through reflective observation from a front surface side and also through transmissive observation from a rear surface side.

With reference to FIG. 15, the optical configuration and operations of the display body of the second embodiment are described.

As shown in FIG. 15, white light L1 incident from the outside of the display body to the upper grating layer 51 enters from the air layer into the upper grating layer 51. The refractive index of the upper grating layer 51 approximates the magnitude averaged between the refractive indexes of the first upper dielectric layer 52 and the second upper dielectric layer 53. More particularly, the refractive index of the upper grating layer 51 has the magnitude dominated by the second upper dielectric layer 53 that is a sea component and is a value close to that of the air layer. In this instance, the light L1 enters from the air layer into the upper grating layer 51 having a refractive index close to the air layer, so that Fresnel reflection is less likely to occur at the interface between the air layer and the upper grating layer 51. Accordingly, the reflection at the interface between the air layer and the upper dielectric layer 51 is suppressed, under which light incident into the upper grating layer 51 is transmitted through the upper grating layer 51 and arrives at the second grating layer 41.

The refractive index of the second grating layer 41 approximates an average magnitude of the refractive index of the second metal layer 42 and the refractive index of the second dielectric layer 44. More particularly, the refractive index of the second grating layer 41 has the magnitude dominated by the second dielectric layer 44 that is a sea component and is a value higher than the refractive index of the air layer. Since the second grating layer 41 has a grating structure made of a metal and a dielectric and the structural period PT of the second metal layer 42 is a sub-wavelength period, plasmon resonance occurs in the second grating layer 41. Accordingly, part of the light having arrived at the second grating layer 41 is reflected at the interface between the upper grating layer 51 and the second grating layer 41, and part of the light having arrived at the second grating layer 41 is converted to a surface plasmon and transmits through the second grating layer 41. Light EP2 in the wavelength region consumed by plasmon resonance is not reflected at the interface between the upper grating layer 51 and the second grating layer 41.

The refractive index of the intermediate grating layer 31 approximates an average magnitude of the refractive index of the first intermediate dielectric layer 32 and the refractive index of the second intermediate dielectric layer 34. More particularly, the refractive index of the intermediate grating layer 31 has the magnitude dominated by the second intermediate dielectric layer 34 that is a sea component. Since the first intermediate dielectric layer 32 and the second intermediate dielectric layer 34 are, respectively, made of a transparent dielectric enabling the transmission of visible region light, the intermediate dielectric layer 31 is high in light transparency in the visible region. Part of the light having arrived at the intermediate dielectric layer 31 is reflected at the interface between the second grating layer 41 and the intermediate grating layer 31 although depending on the difference in refractive index between the second grating layer 41 and the intermediate grating layer 31.

The refractive index of the first grating layer 21 approximates the magnitude averaged between the refractive index of the first dielectric layer 22 and the refractive index of the first metal layer 23. That is, the refractive index of the first dielectric layer 31 has the magnitude dominated by the first metal layer 23 that is a sea component. The first grating layer 21 has a grating structure made of a metal and a dielectric and the structural period PT of the first dielectric layers 22 is a sub-wavelength period, so that plasmon resonance occurs in the first grating layer 21. Accordingly, part of the light having arrived at the first grating layer 21 is reflected at the interface between the intermediate grating layer 31 and the first grating layer 21, and part of the light having arrived at the first grating layer 21 is converted to a surface plasmon and transmitted through the first grating layer 21. The light EP1 in the wavelength region consumed by plasmon resonance is not reflected at the interface between the intermediate grating layer 31 and the first grating layer 21.

Part of the light having transmitted through the first grating layer 21 may be reflected at the interface between the first grating layer 21 and the support 11, at the interface between the intermediate layer 11b and the substrate 11a and at the interface between the support 11 and the air layer. Part of the light having been transmitted through the first grating layer 21 is emitted through the support 11 to a rear surface side of the display body.

In this manner, when the white light L1 is made incident from the outside of the display body, the re-converted light of the surface plasmon having been transmitted through the first grating layer 21 and the second grating layer 41 and the light LP1 of a specific wavelength region including the light having been transmitted through all the layers are emitted to the rear surface side of the display body. Accordingly, according to the transmissive rear-surface observation wherein light L1 is made incident from the outside of the display body to the upper grating layer 51 to observe the rear surface 10T from the rear surface side of the display body, a colored hue different from black or white is visually recognized in the first display region 10A.

The lights reflected at the interfaces between the respective layers are emitted to the front surface side of the display body and cause an interference to occur due to the differences in optical path of these lights. As a result, when the white light L1 is made incident from the outside of the display body, the light LR1 in the specific wavelength resulting from plasmon resonance and the optical interference is emitted. As stated above, since plasmon resonance occurs for the light in the specific wavelength region in the first grating layer 21 and the second grating layer 41, respectively, a wavelength region of light passing through the grating layers 21, 41 after consumption by plasmon resonance and a wavelength region of light wherein reflection takes place at the interface between the grating layers 21, 41 and other layers without consumption by plasmon resonance differ from each other in every of the grating layers 21, 41. Accordingly, according to the reflective front-surface observation wherein the light L1 is made incident from the outside of the display body to the upper grating layer 51 and the front surface 10S is observed from the front surface side of the display body, a colored hue that differs from a color in the transmissive rear-surface observation and also differs from black and white is visually recognized in the first display region 10A.

When white light is made incident from the outside of the display body to the support 11, plasmon resonance occurs in the first grating layer 21 and the second grating layer 41, respectively. Then, the re-converted light of the surface plasmons having transmitted through the first grating layer 21 and the second grating layer 41 and light in the specific wavelength region including light passing through all the layers are emitted to the front surface side of the display body. On the other hand, when white light is made incident on the support 11 from the outside of the display body, light in the specific wavelength region resulting from plasmon resonance and the optical interference is emitted to the rear surface side of the display body as light reflected at the interfaces between the respective layers.

Accordingly, when light is made incident from the outside of the display body to the support 11, the transmissive front-surface observation wherein the front surface 10S is observed from the front surface side of the display body and the reflective rear-surface observation wherein the rear surface 10T is observed from the rear surface side of the display body become such that mutually different, colored hues different from white and black are visually recognized in the first display region 10A.

In the plane composed of the isolated regions A2 and the peripheral region A3, the area ratio occupied by the isolated regions A2 is less than 0.5. Based on this, plasmon resonance occurs in the first grating layer 21 and the second grating layer 41, of which the first grating layer 21 becomes a layer wherein the first metal layer 23 is predominantly positioned and the second grating layer 41 becomes a layer wherein the second dielectric layer 44 is predominantly positioned. Due to such a structural difference, the first grating layer 21 and the second grating layer 41 differ from each other with respect to the wavelength region consumed by plasmon resonance. The interface between the first grating layer 21 and other layer and the interface between the second grating layer 41 and other layer differ from each other in light reflectance. The difference in optical characteristic between the first grating layer 21 and the second grating layer 41 becomes more pronounced when the occupied area ratio of the isolated regions A2 is smaller.

Light incident from the front surface side of the display body to the display body arrives earlier to the second grating layer 41 than to the first grating layer 21 and receives a great optical influence of the second grating layer 41. On the other hand, light incident from the rear surface side of the display body to the display body arrives earlier to the first grating layer 21 than to the second grating layer 41 and receives a great optical influence of the first grating layer 21. Eventually, the hue of reflected light greatly differs between the case that light is incident from the front surface side to the display body and the case that light is incident from the rear surface side to the display body. More particularly, images of mutually different colors are visually recognized in the first display region 10A for the reflective front-surface observation and the reflective rear-surface observation, respectively. It will be noted that images of a similar color are visually recognized for the transmissive front-surface observation and the transmissive rear-surface observation.

Further, the wavelength region consumed by plasmon resonance in the respective grating layers 21, 41 is changed depending on the grating structures of the respective grating layers 21, 41, i.e. the structural period PT, the thicknesses of the respective grating layers 21, 41 and the widths WT of the first dielectric layer 22 and the second metal layer 42 and is also changed depending on the refractive indexes of a material for the metal layer 61 and a material for the projection 11T and also on the refractive index of a material for the dielectric layer 62. Accordingly, the color observed through the reflective observation or the transmissive observation can be adjusted, for example, by proper selection of a material for the first dielectric layer 22 in the first grating layer 21 and a material for the second dielectric layer 44 in the second grating layer 41.

For example, a comparison may be made using two display bodies wherein they have the same structural period PT, the two display bodies make respective use of the same materials for the projection 11T and the metal layer 61, and the two display bodies make use of different types of materials for the dielectric layer 62. More particularly, in the two display bodies, the configurations of the first grating layer 21 are the same, the materials for the first intermediate dielectric layer 32 in the intermediate grating layer 31 are the same, and the materials for the second metal layer 42 in the second grating layer 41 are the same. On the other hand, in the two display bodies, the materials for the second intermediate dielectric layer 34 in the intermediate grating layer 31 differ from each other, and the materials for the first upper dielectric layer 52 in the upper grating layer 51 differ from each other. When light is irradiated from the rear surface side to the two display bodies, the colors observed through the reflective rear-surface observation does not significantly change for the two display bodies due to the fact that the configurations of the first grating layer 21 are the same in the two display bodies. On the other hand, when light is irradiated from the front surface side to the two display bodies, the colors observed through the reflective front-surface observation differ from each other for the two display bodies depending on the refractive index of the second dielectric layer 44 of the respective display bodies. Moreover, since the two display bodies have mutually different configurations with respect to the intermediate grating layer 31, the second grating layer 41 and the upper grating layer 51, the wavelength regions of light passing through these layers differ from each other for the two display bodies. Hence, the colors observed through the transmissive front-surface observation differ from each other for the two display bodies, and the colors observed through the transmissive rear-surface observation also differ from each other for the two display bodies.

Configuration Example of the Respective Grating Layers

A preferred configuration example of the respective grating layers is described in detail.

As shown in FIGS. 13 and 14, a thickness T5 meaning the height of the projection 11T is the total thickness of the first grating layer 21 and the intermediate grating layer 31. The thickness T5 is preferably less than half the structural period PT because the durability of the structure body made of the support 11 and the projection 11T is enhanced due to the unlikelihood of the projection 11T collapsing and high processing accuracy of the projection 11T is easily obtained. Moreover, the thickness T5 is more preferably from 50 nm to 200 nm from the standpoint that the color visually observed by reflective observation and transmissive observation becomes bright by the action of plasmon resonance and the light interference.

The thickness T6 of the metal layer 61 corresponds to the respective thicknesses of the first metal layer 23 and the second metal layer 42. The thickness T6 is preferably not less than 10 nm, within which plasmon resonance is likely to occur and the color visually observed by reflective observation becomes bright. On the other hand, when the thickness T6 is not less than a thickness T5, the projection 11T is embedded in the metal layer 61, resulting in the disappearance of the intermediate grating layer 31. If, in the absence of the intermediate grating layer 31, the metal layer 61 has such a shape that follows the surface profile of the structure body made of the support 11 and the projection 11T thereby forming the first grating layer 21 and the second grating layer 41, there may arise a difference between the colors visually recognized by the reflective front-surface observation and the reflective rear-surface observation due to plasmon resonance and also a difference between the colors visually recognized by these reflective observations and the transmissive observation. However, when the metal layer 61 is thin to an extent of not embedding the projection 11T, the light transmittance in the display body is increased and a clear image in the transmissive observation is visually recognized. Accordingly, it is preferred that the thickness T6 of the metal layer 61 is less than the thickness T5, or the height of the projection T11.

It will be noted that although depending on the manner of preparing the metal layer 61, there may be some cases wherein the thickness of the metal layer 61 differs between the region on the projection 11T, i.e. the second metal layer 42, and the region between the adjacent projections 11T, i.e. the first metal layer 23. The thickness T6 of the metal layer 61 in the present embodiment is defined as a thickness of the metal layer 61 that is positioned at the central portion along the width of a region extending in a band in the peripheral region A3, i.e. a region where no projection 11T is present along one direction. It is to be noted that this definition is true of other embodiments.

A thickness T7 of the dielectric layer 62 means the total thickness of the second intermediate dielectric layer 34 and the second dielectric layer 44 and also a thickness of the first upper dielectric layer 52. The thickness T7 of the dielectric layer 62 is preferably larger than the thickness T5 corresponding to the height of the projection 11T. It will be noted that when the dielectric layer 62 projects over the metal layer 61 on the projection 11T in the region between the adjacent projections 11T, part of the second upper dielectric layer 53 in the upper grating layer 51 is constituted by the dielectric layer 62.

If the configuration is such that if the thickness T7 is larger than the thickness T5, plasmon resonance is likely to occur in the second grating layer 41 because the entirety of the metal layer 42 along its thickness in the second grating layer 41 is surrounded with the dielectric layer 62 and the change in type of material for the dielectric layer 62 is likely to affect the change in the wavelength region consumed by plasmon resonance in the second grating layer 41. The structure composed of the support 11, the projection 11T and the metal layer 61 is embedded in the dielectric layer 62, so that the dielectric layer 62 functions as a protective layer for the structure.

It will be noted that even when the thickness T7 is less than the thickness T5, plasmon resonance occurs in the layer having the grating structure of a metal and a dielectric, and there may arise a difference in the color visually recognized by reflective observation and transmissive observation due to the action of plasmon resonance.

Incidentally, when the thickness T7 of the dielectric layer 62 is small and the dielectric layer 62 positioned in the region between the adjacent projections 11T is more depressed than the metal layer 61 on the projection 11T, a part or the whole of the second dielectric layer 44 of the second grating layer 41 is constituted of the same material as the second upper dielectric layer 53 of the upper grating layer 51. More particularly, in this case, a part or the whole of the second dielectric layer 44 is an air layer or a resin layer. In this regard, however, the second dielectric layer 44 is preferably a structure contiguous from the second intermediate dielectric layer 34 as stated above. The thickness T7 of the dielectric layer 62 is preferably larger than the thickness T5, or the height of the projection 11T.

Although depending on the manner of preparing the dielectric layer 62, there may be some cases wherein the thickness of the dielectric layer 62 differs between the region on the projection 11T, or the first upper dielectric layer 52, and the region between the adjacent projections 11T, i.e. between the second intermediate dielectric layer 34 and the second dielectric layer 44. The thickness T7 of the dielectric layer 62 in this embodiment is defined as a thickness of the dielectric layer 62 that is positioned in a region extending in a band in the peripheral region A3, or is positioned at the central portion along the width of a region where no projection 11T is present along one direction. It is to be noted that this definition is true of other embodiments.

The occupied area ratio of the isolated regions A2 in the plane composed of the isolated regions A2 and the peripheral region A3, or the occupied area ratio of the projections 11T per unit area in the plane including the reference plane and the projections 11T, is preferably larger than 0.1. If the configuration is such that the area ratio is larger than 0.1, an aspect ratio that is a ratio of the height to the width of the projection 11T is suppressed from becoming excessive, so that the durability of the structure made of the support 11 and the projections 11T is increased and high processing accuracy of the projections 11T is likely to be obtained.

On the other hand, when the configuration is such that the above area ratio is less than 0.5, Fresnel reflection is favorably suppressed from occurring at the interface between the upper grating layer 51 and its upper layer. It will be noted that although depending on the manner of preparing the metal layer 61 and the dielectric layer 62, materials therefor may be attached to the side surfaces of the projection 11T upon the formation of these layers. If the configuration is such that the area ratio is less than 0.5, the space of the region between the adjacent projections 11T is satisfactorily secured, and the region between the projections 11T is suppressed from being filled with the material attached on the side faces of the projection 11T when the metal layer 61 and the dielectric layer 62 are formed. Accordingly, the metal layer 61 and the dielectric layer 62 are easily formed in a shape that follows the surface profile of the underlying layer. As a result, the upper grating layer 51 wherein the first upper dielectric layers 52 are interspersed can be favorably formed, with the result that the effect of suppressing Fresnel reflection at the interface of the upper grating layer 51 can be favorably obtained.

It will be noted that even when the area ratio is not less than 0.5, Fresnel reflection suppressing effect can be obtained, in comparison with the case that the surface of the dielectric layer 62 is flat, in so far as the surface of the dielectric layer 62 has a concavo-convex shape that follows the surface profile of the metal layer 61. Even when Fresnel reflection occurs at the interface between the upper grating layer 51 and its upper layer, there can arise a difference in the color visually recognized by the reflective front-surface observation and the reflective rear-surface observation due to plasmon resonance in the first grating layer 21 and the second grating layer 41 and also a difference in the color visually recognized by these reflective and transmissive observations. In this regard, however, since Fresnel reflection at the interface between the upper grating layer 51 and its upper layer, or Fresnel reflection in the vicinity of the outermost surface of the display body, is suppressed from occurring, a color corresponding to a wavelength region of reflected light at the interfaces between the respective layers inside the display body is likely to be visually recognized brightly in the reflective front-surface observation.

In order to suppress Fresnel reflection particularly at the front surface side of the display body, it is preferred that a difference in refractive index between the surface layer that is a layer in contact with the second upper dielectric layer 53 at a side opposite to the second grating layer 41 relative to the second upper dielectric layer 53 and the second upper dielectric layer 53 is less than a difference in refractive index between the first metal layer 23 and the support 11. The surface layer is, for example, an air layer. More preferably, the refractive index of the second upper dielectric layer 53 is equal to the refractive index of the surface layer.

It will be noted that the second display region 10B may include the support 11 alone like the first embodiment or may include, aside from the support 11, at least one of the metal layer 61 and the dielectric layer 62. The second display region 10B enables an image, which has a color and a texture depending on the layer configuration of the second display region 10B and also has a color and a texture different from those in the first display region 10A, to be visually recognized by the reflective observation and the transmissive observation.

[Display Body-Attached Device]

Figure 16:
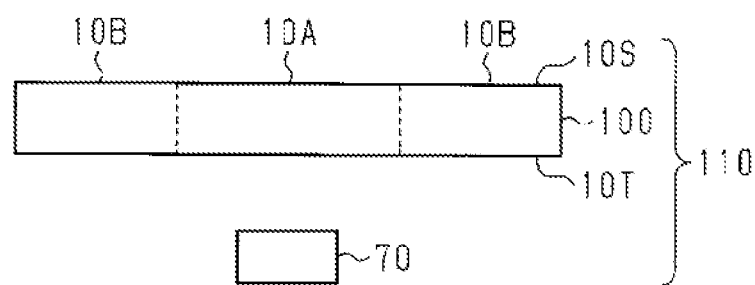
FIG. 16 is a view showing a configuration of a display body-attached device of the second embodiment.

With reference to FIG. 16, the configuration of a display body-attached device provided with the above display body is described.

As shown in FIG. 16, a display body-attached device 110 includes a display body 100 that is the display body of the second embodiment, and a light-emitting structure 70 configured to enable light emission. The light-emitting structure 70 is either a structure capable of emitting light irradiated onto the light-emitting structure 70 by reflection, or a structure capable of emitting light by self-light emission of the light-emitting structure 70. For instance, the light-emitting structure 70 is one that looks white under white light.

The light-emitting structure 70 is disposed at a position in face-to-face relation with a part of the rear surface 10T of the display body 100 and is kept distant from the rear surface 10T of the light-emitting structure 70. More particularly, as viewed in a direction perpendicular to the front surface 10S of the display body 100, the front surface 10S includes a region superposed with the light-emitting structure 70 and a region not superposed with the light-emitting structure 70. In more detail, the light-emitting structure 70 is arranged at a position facing a part of the first display region 10A.

According to such a configuration as described above, when white light is irradiated from the outside of the display body-attached device 110 toward the front surface 10S of the display body 100, a color of reflected light from the display body 100 is visually recognized, as in the reflective front-surface observation, at the portion of the first display region 10A where the light-emitting structure 70 is not disposed at the rear surface side of the display body 100 like the reflective front-surface observation.

On the other hand, as to the portion of the first display region 10A where the light-emitting structure 70 is positioned at the rear surface side of the display body 100, light is irradiated from the light-emitting structure 70 toward the rear surface 10T of the display body 100. Where the light-emitting structure 70 is of the type that emits light irradiated thereonto by reflection, the light irradiated onto the rear surface 10T may be either light that is obtained by reflecting the light, transmitted through the display body 100, with the light-emitting structure 70, or light that is obtained by reflecting, with the light-emitting structure 70, the light irradiated from a light source provided in the vicinity of the light-emitting structure 70 onto the light-emitting structure 70. Moreover, where the light-emitting structure 70 is of the type wherein light is emitted by self-light emission, light irradiated to the rear surface 10T is light generated by the light emission of the light-emitting structure 70. Accordingly, as viewed from a direction of the front surface side of the display body, a color of light including light reflected with the display body 100 after irradiation from the front surface side and light transmitted through the display body 100 after irradiation from the rear surface side is visually recognized in the portion of the first display region 10A superposed with the light-emitting structure 70.

As a result, when the front surface 10S is observed from the front surface side of the display body 100 in such a state that white light is irradiated from the outside of the display body-attached device 110 toward the front surface 10S of the display body 100, the portion of the first display region 10A superposed with light-emitting structure 70 and the portion not superposed with the light-emitting structure 70 look like mutually different hue colors, or colors with mutually different saturations and brightnesses. Accordingly, an image depending on the shape of the light-emitting structure 70 is visually recognized, so that a variety of images can be represented.

When an image depending on the shape of the light-emitting structure 70 is seen or not seen by switching on and off of irradiation of light to the light-emitting structure 70 or by switching on and off of light emission of the light-emitting structure 70, image visibility can be adjusted. In this way, a large variety of images can be represented.

It will be noted that the light-emitting structure 70 may be arranged at a position facing a part of the front surface 10S of the display body 100. In this case, when the rear surface 10T is observed from the rear surface side of the display body 100 in such a state that white light is irradiated from the outside of the display body-attached device 110 toward the rear surface 10T of the display body 100, the portion of the first display region 10A superposed with the light-emitting structure 70 and the portion not superposed with the light-emitting structure 70 appear to have mutually different colors.

As stated above, in the second embodiment, light in the specific wavelength region is emitted, as reflected or transmitted light, from the display body due to plasmon resonance. The wavelength region of transmitted or reflected light is determined depending on a plurality of factors including the position and size of the periodic elements of the respective projections 11T and the metal layers whose position is determined depending on the respective periodic elements, the degree of freedom of adjusting the wavelength region transmitted through or reflected with the display body can be increased.

Like the first embodiment, the provision of a display body that enables images of mutually different appearances depending on the conditions of observation to be visually recognized is also an object of the second embodiment. According to the second embodiment, the following effects are obtained including an effect on such problems as set out above in addition to the effects of (1-1) to (1-3), (1-7) and (1-8) of the first embodiment.

(2-1) The display body has the dielectric layer 62. Hence if the constituent material for the dielectric layer 62 is changed, the color observed through reflective observation or transmissive observation can be adjusted and the degree of freedom of adjusting the color can be enhanced. Especially, where the configuration is such that the dielectric layer 62 is made of an inorganic material, the refractive index of the dielectric layer 62 can be selected form a wide range thereof. Since the dielectric layer 62 has a shape that follows the surface profile of the metal layer 61, Fresnel reflection in the vicinity of the outermost surface of the display body can be suppressed when compared with the case that the dielectric layer 62 has a flat surface. As a consequence, the color observed by reflective front-surface observation becomes bright.

(2-2) When the configuration is such that the thickness T5 indicating the height of the projection 11T is less than half the periodic period PT, the structure made of the support 11 and the projections 11T is increased in durability, and high processing accuracy of the projections 11T is likely to be obtained.

(2-3) When the configuration is such that the thickness T6 of the metal layer 61 is not less than 10 nm, plasmon resonance is likely to occur in the first grating layer 21 and the second grating layer 41, and the color visually recognized by reflective observation becomes bright. When the configuration is such that the thickness T6 of the metal layer 61 is less than the thickness T5 corresponding to the height of the projection 11T, the light transmittance of the display body is increased, and the image observed by transmissive observation becomes clear.

(2-4) When the configuration is such that the thickness T7 of the dielectric layer 62 is less than the thickness T5 corresponding to the height of the projection 11T, plasmon resonance in the second grating layer 41 becomes likely to occur, and the change of a material for the dielectric layer 62 is likely to reflect on the change of the wavelength region consumed by plasmon resonance in the second grating layer 41. The structure made of the support 11, the projections 11T and the metal layer 61 is embedded in the dielectric layer 62, so that the structure is protected with the dielectric layer 62.

(2-5) In the plane including the reference plane that is the surface of the support 11 and the projections 11T serving as a periodic element, when the configuration is such that the occupied area ratio of the projections 11T per unit area is larger than 0.1, the durability of the structure made of the support 11 and the projections 11T is increased. Additionally, high processing accuracy of the projections 11T is easily obtained. With the configuration that the above area ratio is less than 0.5, such an effect is conveniently obtained that Fresnel reflection is suppressed from occurring at the interface between the upper grating layer 51 and its upper layer.

(2-6) With the display body-attached device 110, part of the light emitted from the light-emitting structure 70 is emitted through the first display region 10A of the display body 100 to a side opposite to the light-emitting structure 70. Accordingly, when light is irradiated toward either a front surface 10S or a rear surface 10T opposite to a surface facing the light-emitting device, under which when the irradiated surface is observed, the portion of the first display region 10A superposed with the light-emitting structure 70 and the portion not superposed with the light-emitting structure 70 look like mutually different colors. Therefore, an image is visually recognized depending on the shape of the light-emitting structure 70, and it is possible to represent a more variety of images and to more enhance counterfeiting difficulty and design properties in the display body-attached device 110.

(2-7) When using a manufacturing method of forming a periodic structure constituted of the support 11 and a plurality of projections 11T according to a manufacturing procedure wherein a nanoimprinting technique is used to form the projections, i.e. by transferring the projections and depressions of an intaglio plate to a resin coated onto the surface of the substrate 11a, a periodic structure having fine projections and depressions can be simply, conveniently formed.

Modification Examples of the Second Embodiment

The above second embodiment can be performed by alteration in the following ways.

In the second embodiment, the first metal layer 23 and the second metal layer 42 may have such a profile characteristic as shown in FIG. 9 like the first embodiment. The metal layer 61 may include an intermediate metal layer 32A that is a metal layer positioned at side surface of the first intermediate dielectric layer 32 and contiguous to the second metal layer 42. The intermediate metal layer 32A is sandwiched between the first intermediate dielectric layer 32 and the second intermediate dielectric layer 34, and the thickness of the first intermediate dielectric layer 32 on the side surface becomes thinner at a portion closer to the first metal layer 23. It will be noted that the presence of the intermediate metal layer 32A may cause plasmon resonance to occur in the intermediate grating layer 31.

In the second embodiment, the shape of the projection 11T may be in the form of a cone projected from the surface of the support 11 like the structure of the first embodiment shown in FIG. 10.

The display body may include, as a region included in the first display region 10A, a plurality of regions whose structural periods PT coincide with each other and only materials for the dielectric layer 62 among the constituent materials for the display body are mutually different from one another. According to this configuration, mutually different colors can be visually recognized by reflective observation in the plurality of the regions in the first display region 10A. In the plurality of the regions, the projections 11T and the metal layer 61 can be formed in the same procedure and thus, the display body can be easily prepared.

Figure 17:
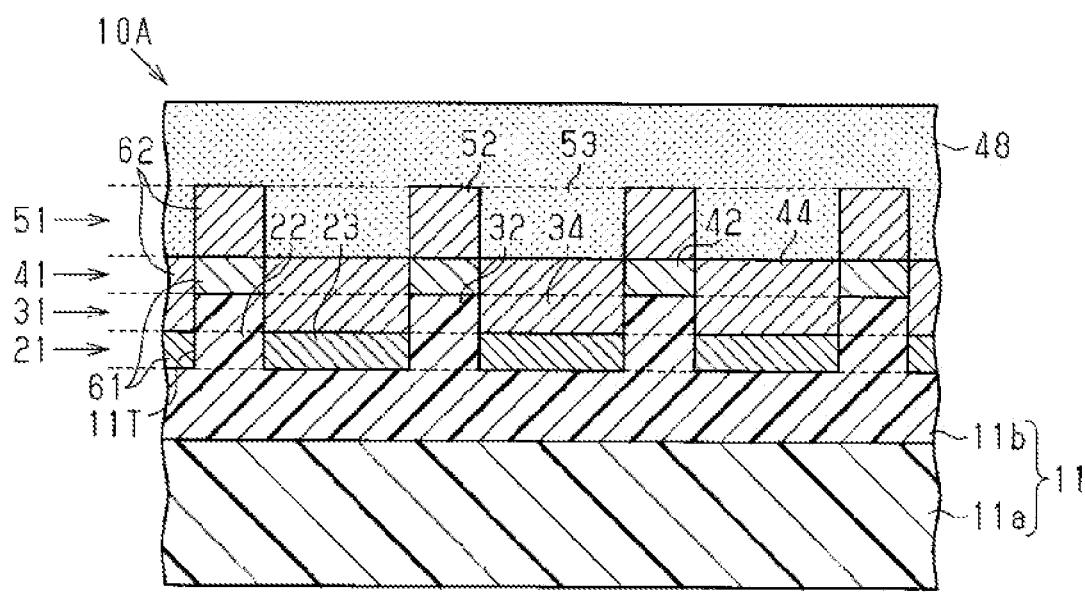
FIG. 17 is a sectional view showing an enlarged part of a sectional structure in a first display region of a modification example of the second embodiment.

As shown in FIG. 17, eh display body may further include a protective layer 48 on the dielectric layer 62. According to such a configuration, the structure made up of the support 11 and the projections 11T, the metal layer 61 and the dielectric layers 62 can be protected. The protective layer 48 can be embodied as a structure integrated with the second upper dielectric layer 53. In this case, the protective layer 48 should preferably be a resin layer having a low refractive index. The low refractive index resin layer has a refractive index closer to that of the air layer than the refractive index of the first dielectric layer 22 or the first intermediate dielectric layer 32.

Where the display body is employed for use wherein the display body is touched with one's bare hands, it is preferred that the protective layer 48 serving as an outermost layer of the display body is made of a resin containing fluorine. According to this configuration, contaminants such as sweat are suppressed from being attached to the surface of the display body.

It will be noted that, as shown in FIG. 17, the protective layer 48 may have a flat surface or a shape that follows the surface profile of the dielectric layer 62.

As viewed in a direction perpendicular to the front surface 10S of the display body, the arrangement of the isolated regions A2 is not limited to the square or hexagonal arrangement, but may be in the form of a two-dimensional lattice. More particularly, a plurality of the first dielectric layers 22 may be arranged in a two-dimensional lattice and a plurality of the first intermediate dielectric layers 32 may be arranged in a two-dimensional lattice. Moreover, a plurality of the second metal layers 42 may be arranged in a two-dimensional lattice and a plurality of the second metal layers 52 may be arranged in a two-dimensional lattice. In other words, the periodic elements of the periodic structure may be arranged in a two-dimensional lattice having a sub-wavelength period. The two-dimensional lattice arrangement is one wherein elements are arranged along the respective two intersecting directions in the two-dimensional plane. In this case, the thicknesses of the respective layers of the display body, which are within given ranges relative to the structural period PT, mean that the thicknesses of the respective layers are within given ranges relative to the structure period PT in each of the above two directions along which the periodic elements are arranged.

The shape of the isolated regions A2 as viewed in a direction perpendicular to the front surface 10S of the display body, or the planar shape of the periodic elements, is not limited to a square, but may be a rectangle or other polygon, or a circle.

Figure 18:
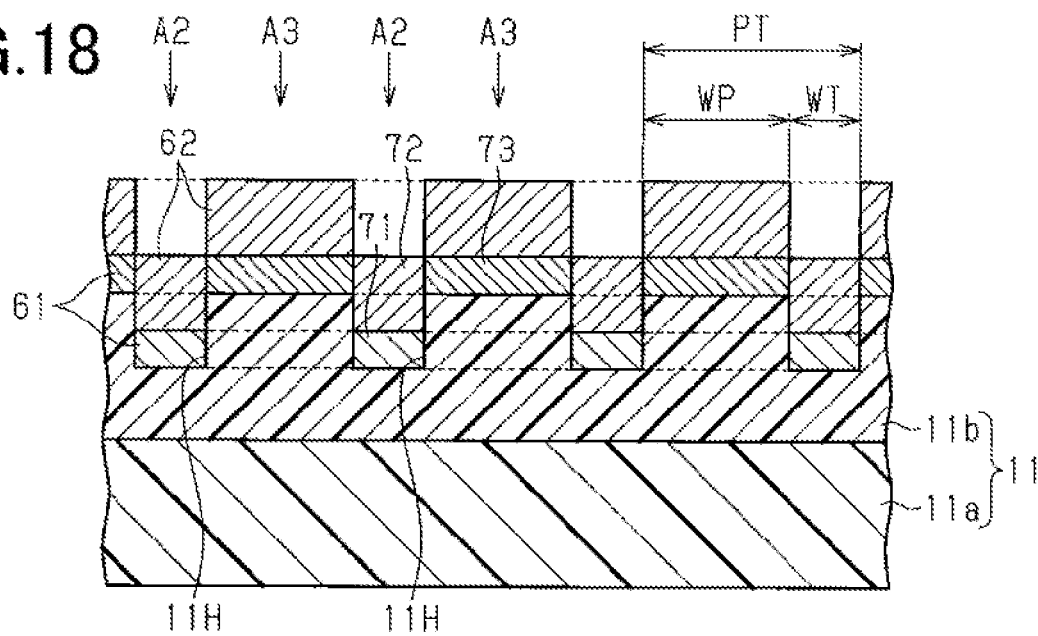
FIG. 18 is a sectional view showing an enlarged part of the sectional view in the first display region of the modification example of the second embodiment.

As shown in FIG. 18, recesses 11H depressed from the surface of the display body may be positioned in the isolated regions A2. As viewed in a direction perpendicular to the front surface 10S of the display body, a plurality of the recesses 11H are arranged in a two-dimensional lattice having a sub-wavelength period. In such a configuration, the support 11 is a periodic structure. More particularly, the periodic elements of the periodic structure PT may be the recesses 11H depressed from a reference plane when taking the surface of the support 11 as the reference plane. In this case, the metal layer 61 has a shape that follows the surface profile of the periodic structure, and the dielectric layer 62 has a shape that follows the surface profile of the metal layer 61. In this case, the grating structure made of a metal and a dielectric is formed of the metal layers 71 positioned at the bottom surface of the respective recesses 11H and a portion of the support 11 in a pattern for surrounding the individual metal layers 71. Moreover, the grating structure made of a metal and a dielectric is also formed of the dielectric layers 72 positioned on the metal layers 71 and the mesh-shaped metal layer 73 positioned on the reference plane and surrounding the individual metal layers 71. When light is irradiated onto the display body, different colors are respectively visually recognized by reflective front-surface observation and transmissive rear-surface observation, like the foregoing embodiments, due to the occurrence of plasmon resonance in the layers of these grating structures. Likewise, different colors are respectively visually recognized by reflective rear-surface observation and transmissive front-surface observation, and different colors are respectively visually recognized by reflective front-surface observation and reflective rear-surface observation.

It will be noted that with the case that the periodic element is the recess 11H, the occupied area ratio of the periodic elements per unit area in the plane including the reference plane and the periodic elements is preferably larger than 0.1 to less than 0.5. When the above area ratio is within the range defined above, the metal layers 61 and the dielectric layers 62 are likely to be formed in a shape that follows the concavo-convex surface profile of the periodic structure. Moreover, when the area ratio is within the range defined above, the durability of the periodic structure is increased and high processing accuracy of the recesses 11H is likely to be obtained. It will be noted that in the display body of the first embodiment, the periodic elements may be the recesses 11H depressed from the reference plane.

The display body of the display body-attached device may be a display device of the first embodiment.

<Additional Notes>

The measure for solving the foregoing problems embraces the following items as technical concepts derived from the first embodiment, the second embodiment and the modification examples thereof.

[Item 1]

A display body comprising a support having a reference plane, a dielectric periodic structure including a plurality of periodic elements which are arranged on the reference plane in a two-dimensional lattice having a sub-wavelength period and are, respectively, a projection projected from the reference plane or a recess depressed from the reference plane, and a metal layer which is positioned on the surface of the periodic structure including a region of the reference plane surrounding the periodic elements and the surfaces of the periodic elements and has a shape that follows a surface profile of the periodic structure.

According to such a configuration as recited above, the display body includes a layer made of a metal and a dielectric and having a grating structure with a sub-wavelength period, so that when light is irradiated from the outside of the display body onto one of the front surface and the rear surface of the display body, a plasmon resonance occurs in the layers having the grating structure. The light of a specific wavelength region consumed by plasmon resonance is not emitted from the above one surface, but light of a specific wavelength regions undergoing the action of plasmon resonance is emitted through the other surface of the front and rear surfaces of the display body through the display body. Accordingly, color images, which are visually recognized by reflective observation in relation to the one surface and by transmissive observation in relation to the other surface, are mutually different from each other. Moreover, color images, which are recognized by reflective observation and transmissive observation both in relation to the one surface, are mutually different from each other. That is, according to the above configuration, images of mutually different appearances can be visually recognized depending on the conditions of observation.

[Item 2]

The display body as recited in Item 1 comprising, on the reference plane, a first grating layer having a thickness of not less than 10 nm to not larger than 200 nm, a second grating layer having a thickness of not less than 10 nm to not larger than 200 nm, and an intermediate grating layer that is thicker than the first grating layer and the second grating layer and is sandwiched between the first grating layer and the second grating layer in a thickness direction wherein the first grating layer includes a plurality of first dielectric layers arranged in an island arrangement that is either of a square arrangement and a hexagonal arrangement and a second intermediate dielectric layer having a mesh pattern for surrounding the individual first intermediate dielectric layers and having a dielectric constant lower than the first intermediate dielectric layers; the second grating layer includes a plurality of second metal layers arranged in an island arrangement that is either of a square arrangement and a hexagonal arrangement and a second dielectric layer having a mesh pattern for surrounding the individual second metal layers; the periodic elements are made of the projections, respectively; the first dielectric layers and the first intermediate dielectric layers constitute the periodic elements; the first metal layer and the second metal layers are included in the metal layer; a volume ratio of the first metal layer in the first grating layer is larger than a volume ratio of the second metal layers in the second grating layer and a volume ratio of the second metal layers in the second grating layer is larger than a volume ratio of a metal material in the intermediate grating layer; and a ratio of a width of the first dielectric layer to the structural period of the first dielectric layers and a ratio of a width of the second metal layer to the structural period of the first dielectric layers are, respectively, from 0.2 to 0.75.

According to the above configuration, the averaged refractive index of the first grating layer is dominated by the refractive index of the first metal layer. Light incident from the outside of the display body into the support is liable to cause Fresnel reflection to occur at the interface between the first grating layer and the support. In contrary, the averaged refractive index of the second grating layer is dominated by the second dielectric layer. The averaged refractive index of the intermediate grating layer is also dominated by the second intermediate dielectric layer that is dielectric in nature. Light incident from the outside of the display body to the second grating layer is unlikely to cause Fresnel reflection to occur and enters into the second grating layer and then into the intermediate grating layer. As a result, with the reflective observation wherein the display body is observed from a direction perpendicularly facing the support, an image from Fresnel reflection is likely to be observed, whereas with reflective observation wherein the display body is observed from a direction facing the second grating layer, an image from Fresnel reflection is hardly observed.

Further, the first grating layer and the second grating layer allow plasmon resonance to occur. As to the first grating layer, part of the light incident on the first grating layer is consumed by plasmon resonance and passes therethrough. With respect to the second grating layer, part of the light incident on the second grating layer is consumed by plasmon resonance and passes therethrough. Hence, with the reflective observation wherein the display body is observed from a direction perpendicular to the support, an image from Fresnel reflection assumes a color other than black or white and is visually recognized clearly. It will be noted that when the display body is seen from a direction perpendicularly facing the second grating layer, transmitted light undergoing plasmon resonance in the first grating layer and also in the second grating layer forms an image assuming a color other than black or white.

On the other hand, light incident from the outside of the display body into the second grating layer is partly consumed by plasmon resonance in the second grating layer and also in the first grating layer and is more unlikely to be returned to the outside of the second grating layer. Accordingly, with the reflective observation wherein the display body is seen from a direction perpendicularly facing the second grating layer, an image assuming a color closer to black is visually recognized.

In view of the results described above, the position of the display body in the thickness direction of the respective layers, i.e. the front and rear surfaces of the display body, can be discriminated by reflective observation wherein the display body is observed in a direction perpendicularly facing the support and by reflective observation wherein the display body is observed from a direction perpendicularly facing the second grating layer, and further by a transmissive observation wherein the display body is observed in a direction perpendicularly facing the second grating layer.

[Item 3]

The display body as recited in Item 2, wherein the first metal layer and the second metal layer, respectively, have a complex permittivity of light in the visible region wherein a real part of the complex permittivity is a negative value.

According to the above configuration, plasmon resonance in the first and second grating layers are likely to occur, so that the colors of the images in the above observations can become clearer.

[Item 4]

The display body as recited in Item 2 or 3, wherein a ratio of the width of the first dielectric layer to the structural period of the first dielectric layers and a ratio of the width of the second metal layer to the structural period of the second metal layers are, respectively, from 0.40 to 0.60.

According to the configuration described above, the magnitude of the first dielectric layer relative to the magnitude of the first metal layer is suppressed from becoming excessively small, and the magnitude of the second metal layer relative to the magnitude of the second dielectric layer is suppressed from becoming excessively small. Hence, a processing load on the manufacture of the display body is alleviated.

[Item 5]

The display body as recited in any one of Items 2 to 4, wherein each first dielectric layer and each first intermediate dielectric layer form an integral structure, the thickness of the first grating layer is not larger than 100 nm, the thickness of the second grating layer is not larger than 100 nm, and the thickness of the intermediate grating layer is not larger than 150 nm.

According to the configuration described above, the total thickness of the first grating layer and the first intermediate grating layer is, for example, of the magnitude enough to enable the application of an intaglio plate such as for nanoimprinting lithography, so that the integral formation of the first dielectric layer and the first intermediate dielectric layer is possible.

[Item 6]

The display body as recited in any one of Items 2 to 5, wherein a constituent material for the first metal layer is the same as a constituent material of the second metal layer, the second dielectric layer is an air layer, and a difference in refractive index between the first dielectric layer and the first metal layer is larger than a difference in refractive index between the second dielectric layer and the second metal layer.

According to the above configuration, the first metal layer and the second metal layer have a mutually equal refractive index, and the configuration is such that a difference in refractive index between the first dielectric layer and the first metal layer is larger than a difference in refractive index between the second dielectric layer and the second metal layer. Hence, Fresnel reflection at the interface between the second grating layer and other layer can be further suppressed and Fresnel reflection at the interface between the first grating layer and other layer can be promoted.

[Item 7]

The display body as recited in any one of Items 2 to 6, wherein the first dielectric layer and the first intermediate dielectric layer forms an integral structure, and the second intermediate dielectric layer and the second dielectric layer form an integral structure.

According to the above configuration, since the first dielectric layer and the first intermediate dielectric layer form an integral structure and the second intermediate dielectric layer and the second dielectric layer form an integral structure, the structure of the display body can be simplified.

[Item 8]

The display body as recited in any one of Items 2 to 7, wherein the intermediate grating layer further includes an intermediate metal layer positioned on the side surface of the first intermediate dielectric layer and is sandwiched between the first intermediate dielectric layer and the second intermediate dielectric layer, and the intermediate metal layer forms a structure integrated with the second metal layer and is included in the metal layer wherein a thickness of the intermediate metal layer on the side surface becomes thinner at a portion closer to the first metal layer so as to suppress the reflection of light in the visible region.

According to the above configuration, the intermediate metal layer has an anti-reflection function, so that the color of an image visually recognized by reflective observation wherein the display body is observed from a direction perpendicularly facing the second grating layer can be made further closer to black.

[Item 9]

The display body as recited in Item 1, further comprising a dielectric layer that is positioned on a surface opposite to a contact surface with the periodic structure in the metal layer and has a shape following the surface profile of the metal layer.

According to the above configuration, when a constituent material for the dielectric layer is changed, a color observed by reflective observation and transmissive observation can be adjusted, thus increasing the degree of freedom of color adjustment. Since the dielectric layer has a shape that follows the surface profile of the metal layer, Fresnel reflection at the interface between the layer including the dielectric layer and its upper layer can be reduced over the case that the surface of the dielectric layer is flat. As a result, the color of the image visually recognized by reflective observation wherein the display body is observed from a direction perpendicularly facing the dielectric layer becomes clearer.

[Item 10]

The display body as recited in Item 9, wherein the dielectric layer is constituted of an inorganic compound.

According to the above configuration, the refractive index of the dielectric layer can be selected from a wider range based on the selection of material when compared with the case wherein the dielectric layer is formed of a resin.

[Item 11]

The display body as recited in Item 9 or 10, wherein the periodic element is the projection and the height of the projection is less than half the period of arrangement of the plurality of the periodic elements.

According to the above configuration, the durability of the periodic structure is increased and a high projection-processing accuracy is likely to be obtained.

[Item 12]

The display body as recited in any one of Items 9 to 11, wherein the periodic element is the projection, and the thickness of the metal layer is not less than 10 nm and is less than the height of the projection.

According to the above configuration, since the thickness of the metal layer is not less than 10 nm, plasmon resonance is likely to occur and the color visually recognized by reflective observation becomes bright. Moreover, since the thickness of the metal layer is less than the height of the projection, light transmittance in the display body is enhanced thereby making a transmissive observation image clear.

[Item 13]

The display body as recited in any one of Items 9 to 12, wherein the periodic element is the projection, and the thickness of the dielectric layer is larger than the height of the projection.

According to the above configuration, the grating structure made up of the metal layer and the dielectric layer is favorably formed with the likelihood of causing plasmon resonance to occur. The change in type of material for the dielectric layer is likely to be reflected on the change in a wavelength region of light consumed by plasmon resonance. Since the structure constituted of the periodic structure and the metal layer is embedded in the dielectric layer, the structure is protected with the dielectric layer.

[Item 14]

The display body as recited in any one of Items 9 to 13, wherein in the plane including the reference plane and the periodic elements, an occupied area ratio of the periodic elements per unit area is from larger than 0.1 to less than 0.5.

According to the above configuration, since the area ratio is larger than 0.1, the durability of the periodic structure is increased and a high projection-processing accuracy is likely to be obtained. Further, since the area ratio is less than 0.5, Fresnel reflection at the interface between the layer including the dielectric layer and its upper layer is favorably suppressed.

[Item 15]

The display body as recited in any one of Items 9 to 14, further comprising a protective layer covering a surface opposite to a contact surface with the metal layer in the dielectric layer.

According to the above configuration, the structure constituted of the periodic structure, the metal layer and the protective layer can be protected.

A display body-attached device comprising the display body recited in any one of Items 1 to 15, and a light-emitting structure arranged at a position facing part of one surface of the front surface and the rear surface of the display body and configured to enable light to be emitted toward the display body.

According to the above configuration, part of the light emitted from the light-emitting structure is emitted from a surface positioned opposite to the light-emitting structure. Accordingly, when the display body is observed from a direction perpendicularly facing a surface opposite to the light-emitting structure side in such a state that light is irradiated toward the surface, a portion where the light-emitting structure is positioned and a portion where no light-emitting structure is positioned look mutually different in color.

Therefore, a larger variety of images can be represented.

[Item 17]

A method for manufacturing a display body comprising a first step of transferring a projection and recess pattern of an intaglio plate to a resin coated onto the surface of a substrate to form a periodic structure wherein periodic elements made of projections or recesses are positioned in a two-dimensional lattice having a sub-wavelength period, and a second step of forming, on the periodic structure, a metal layer having a shape that follows a surface profile of the periodic structure.

According to the above manufacturing method, there can be obtained a display body capable of visually recognizing images of mutually different appearances depending on the observation conditions. Especially, a periodic structure having fine projections and recesses can be easily, conveniently formed.

[Item 18]

The method for manufacturing a display body as recited in Item 17, further comprising a third step of forming, on the metal layer, a dielectric layer having a shape that follows the surface profile of the metal layer.

According to the above manufacturing method, the color observed by reflective observation or transmissive observation for the display body can be adjusted by changing a constituent material for the dielectric layer. Thus, the degree of freedom of adjusting the color is increased.

Third Embodiment

Embodiments of a display body which is an example of an optical body, a display body-attached device, and a method of manufacturing the display body are described with reference to FIGS. 19 to 31. First to fourth application examples 1 to 4 are describe below. The fundamental structures of the display bodies in these application examples are common to one another, and the fundamental structure of a display body and its manufacturing method are initially described.

[Structure of Display Body]

Figure 19:
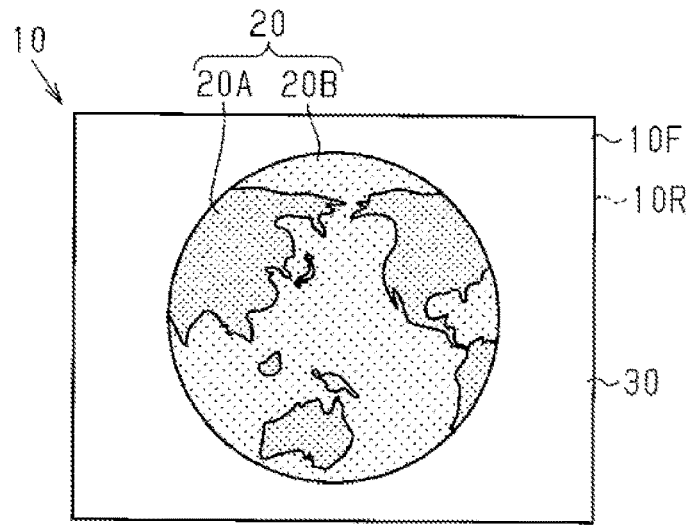
FIG. 19 is a plan view of a planar structure in a third embodiment of a display body.

As shown in FIG. 19, a display body 10 has a front surface 10F and a rear surface 10R opposite to the front surface 10F. As viewed in a direction perpendicular to the front surface 10F, the display body 10 includes a display region 20 and an auxiliary 30. The display region 20 includes two types of regions including a first region 20A and a second region 20B, and the front surface 10F is segmented into the first region 20A, the second region 20B and the auxiliary region 30. The display region 20 assumes on a structural color. In the state where white light is irradiated onto the surface 10F, the hue of the first region 20A and the hue of the second region 20B are mutually different from each other. The auxiliary region 30 assumes a metallic luster color.

For instance, letters, symbols, figures, patterns, designs and the like are represented using the first region 20A and the second region 20B, and the background is represented by the auxiliary region 30. With the configuration shown in FIG. 19 for one instance, a design of the Earth is represented using the first region 20A looking green and the second region 20B looking blue, and the background is represented by the auxiliary region 30 looking silvery.

Figure 20:
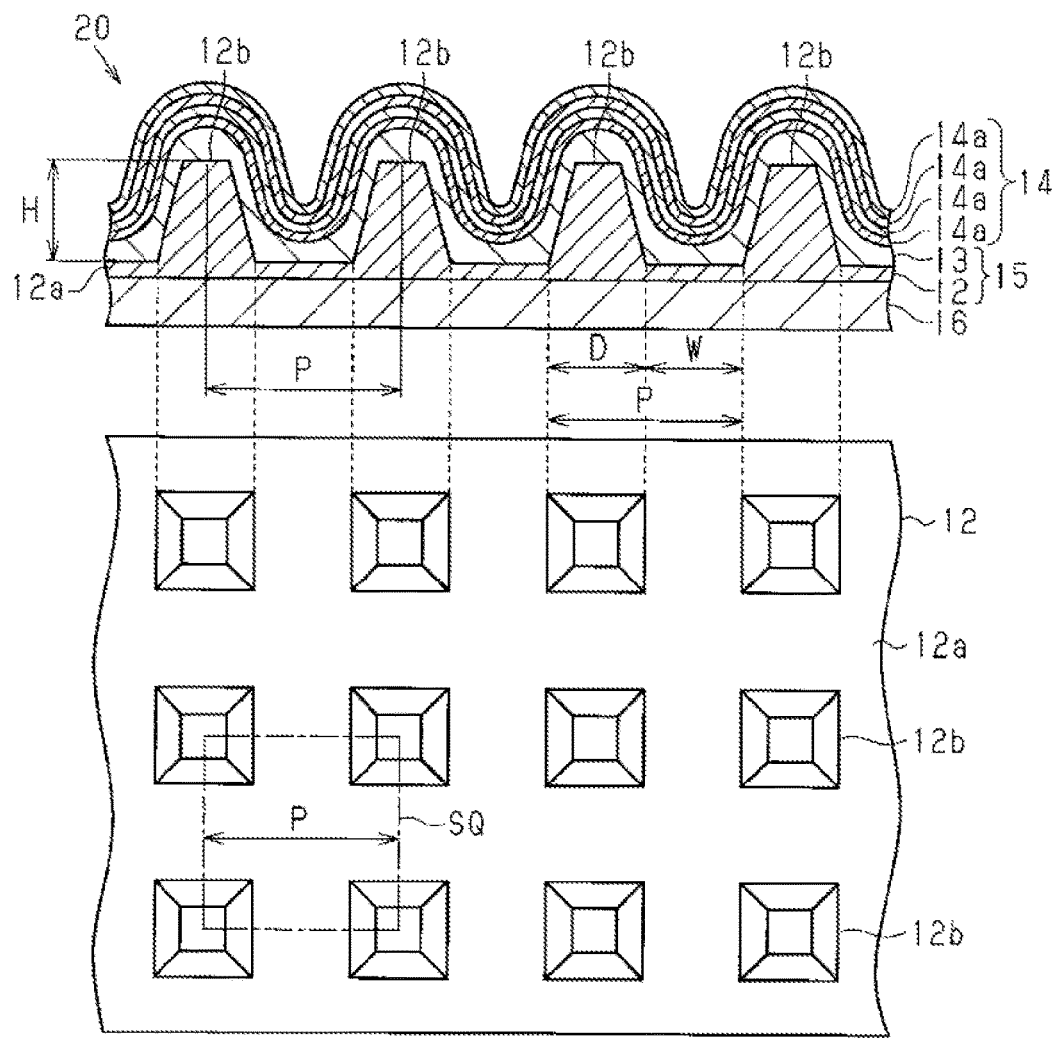
FIG. 20 is a view showing a sectional structure and a planar structure of a concavo-convex structure layer in a display region of the display body of the third embodiment.

Referring to FIG. 20, the structure of the display region 20 is illustrated.

As shown in FIG. 20, the display body 10 includes, in the display region 20, a substrate 16, a concavo-convex structure layer 12, a metal layer 13, and a multilayer film layer 14. The substrate 16, the concavo-convex structure layer 12, the metal layer 13 and the multilayer film layer 14 are arranged in this order. The side where the multilayer film layer 14 is positioned relative to the substrate 16 is a front surface side of the display body 10. The side where the substrate 16 is positioned relative to the multilayer film layer 14 is a rear surface side of the display body 10. FIG. 20 shows, along with the sectional structure of the display region 20, a planar structure of the concavo-convex structure layer 12 as viewed from a direction in face-to-face relation with the front surface 10F of the display body 10.

The substrate 16 has a plate form, and the surface of the substrate 16 which is positioned at the front surface side of the display body 10 is a front surface of the substrate 16. The substrate 16 is transparent to light in the visible region and allows light in the visible region to be passed therethrough. The wavelength of light in the visible region is from 400 nm to 800 nm. The substrate 16 is a dielectric and the material for the substrate 16 includes, for example, synthetic quartz, and a resin such as polyethylene terephthalate (PET), a polycarbonate (PC), polyethylene naphthalate (PEN) or the like. The refractive index of the substrate 16 is higher than an air layer and is, for example, from 1.2 to 1.7. The substrate 16 may be formed of a single layer or a plurality of layers.

The plasmon structure layer 15 that is a structure constituted of the concavo-convex structure layer 12 and the metal layer 13 allows incident light to be transmitted therethrough by plasmon resonance.

The concavo-convex structure layer 12 is configured of a flat portion 12a extending across the front surface of the substrate 16 and a plurality of projections 12b projecting from the flat portion 12a toward the front surface side of the display body 10. More particularly, the projection 12b is projected from a surface extending across the rear surface 10R of the display body 10 toward the front surface 10F. The concavo-convex structure layer 12 is a dielectric transparent to light in the visible region and is constituted, for example, of a UV curing resin, a thermosetting resin or a thermoplastic resin. The refractive index of the concavo-convex structure layer 12 is higher than an air layer.

The projection 12b is in the form of a quadrangular pyramid frustum and thus has a shape wherein the top of the pyramid becomes flat, and the width of the projection 12b in a direction across the surface of the substrate 16 becomes gradually smaller in the direction from the rear surface 10R of the display body 10 toward the front surface 10F.

The length of from a base end to a tip end of the projection 12b, i.e. a length of the projection 12b in the extending direction of the projection 12b, is a projection height H. The one side length of the square base of the projection 12b is a projection width D. From the standpoint of ease in obtaining high processing accuracy of the projection 12b, an aspect ratio Ar (Ar=H/D) which is a ratio of the projection height H to the projection width D is preferably not larger than 3, more preferably not larger than 2.

The plurality of the projections 12b are arranged in a square arrangement, which is an instance of a two-dimensional lattice, as viewed in a direction perpendicular to the front surface 10F of the display body 10. The square arrangement is one wherein the centers of the projections 12b are positioned at the respective apexes of a square SQ with a side of the structural period P. More particularly, the structural period P means a distance between the centers of two mutually adjacent projections 12b, and the structural period P also means the total of a projection-to-projection distance W, which is a distance between the two mutually adjacent projections 12b, and the projection width D. The structural period P has a length not larger than the visible region wavelength, i.e. the structural period P is a sub-wavelength period. From the standpoint of ease in obtaining high processing accuracy of the projections 12b, the structural period P is preferably from 100 nm to 400 nm, more preferably from 200 nm to 400 nm.

An area Sa of the entire region where the plurality of the projections 12b are positioned is an area of the concavo-convex structure layer 12 as viewed in a direction perpendicular to the front surface 10F of the display body 10, or is the total of the area of the flat portion 12a exposed among the projections 12b and the area of the quadrangles each forming the base of the individual projections 12b. From the standpoint of ease in obtaining high processing accuracy of the projections 12b, a volume ratio Vr, which is a ratio of the total of individual volumes of the plurality of projections 12b to the volume represented by area Sa □ projection height H, is preferably from 0.05 to 0.5, The volume ratio Vr is a ratio occupied by the projections 12b per unit volume of a space where the concavo-convex structure is formed on the flat portion 12a. The projection-to-projection distance W can be determined while taking into account desired volume ratio Vr, structural period P and shape of the projection 12b.

The metal layer 13 is positioned at the front surface side of the display body 10 relative to the concavo-convex structure layer 12 and entirely covers the concavo-convex structure layer 12 therewith. The metal layer 13 has a shape that follows the surface profile of the concavo-convex structure layer 12. More particularly, the surface of the metal layer 13 has a concavo-convex profile that follows the concavo-convex profile of the concavo-convex structure layer 12. The period and height of the concavo-convex structure of the metal layer 13 depends on the period and height of the concavo-convex structure of the concavo-convex structure layer 12. The period and height of the concavo-convex structure of the concavo-convex structure layer 12 are defined by a shape of the projections 12b including the structural period P, the projection-to-projection distance W, the projection height H and the projection width D.

The metal layer 13 is constituted of a metal material, and the refractive index of the metal layer 13 is lower than that of an air layer. From the standpoint of ease in causing plasmon resonance to occur, the metal layer 13 is made up of a metal material whose real part of complex permittivity in the visible region wavelength is a negative value. The thickness of the metal layer 13 is preferably from 10 nm to 200 nm. The material for the metal layer 13 includes, for example, aluminum, gold, silver, tantalum, indium or the like.

It will be noted that in the concavo-convex structure layer 12 as viewed in a direction perpendicular to the surface 10F of the display body 10, the area of the flat portion 12a exposed from among the projections 12b should preferably be larger than the total area of the quadrangles each forming the base of the individual projections 12b. In this case, in the region directly on the flat portion 12a, or in the region of the metal layer 13 including the portion stacked on the flat portion 12a and the bases of the respective projections 12b, the metal layer 13 is a structural and optical sea component, and the bases of the projections 12b are structural and optical island components distributed in the sea component.

The multilayer film layer 14 has a stacked structure of a plurality of thin films 14a, thereby causing a multilayer film interference to occur. More particularly, when the multilayer film layer 14 receives incident light from the front surface side of the display body 10, intense light of a specific wavelength is returned as a result of the interference of light reflected with the respective thin films 14a. This permits a structural color of a specific hue to be visually recognized in the display region 20 as viewed from the front surface side of the display body 10.

The multilayer film layer 14 has a shape of repeated undulations following the concavo-convex structure of the metal layer 13, or a shape wherein curved portions expanding toward the front surface side of the display body 10 lie contiguously along the arrangement direction of the projections 12b of the concavo-convex structure layer 12. For instance, a portion of the multilayer film layers 14 closest to the rear surface 10R of the display body 10, i.e. an end portion of the curved portion, enters into a region between the projections 12b of the concavo-convex structure layer 12. It will be noted that the degree of the curve of the respective thin films 14a differs depending on the position of the respective thin films 14a in the stacked direction of the multilayer film layers 14.

The thin films 14a are constituted of materials transparent to the visible region light. The refractive indexes of the plurality of the thin films 14a differ from one another. The materials for the thin films 14a include, for example, inorganic materials such as titanium oxide (TiO2), silicon oxide (SiO2), aluminum oxide (Al2O3), niobium oxide (Nb2O5), tantalum oxide (Ta2O5), hafnium oxide (HfO2), zinc sulfide (ZnS), zirconium oxide (ZrO2) and the like, and polymer compounds such as nylons, polyesters and the like.

The number of the thin films 14a of the multilayer film layer 14, and the materials for and the thickness of the respective thin films 14a are so set that in the case where reflected light is seen from the front surface side of the display body 10, light of a wavelength region corresponding to a hue that is required to be visually recognized as a color assumed in the display region 20 is intensified and reflected from the multilayer film layer 14.

The length of a light path of light passing through the thin films 14a is changed depending on the degree of the curve of the thin films 14a, for which the wavelength of light intensified by the interference with the multilayer film layer 14 is also changed. Accordingly, when the arrangement of the projection 12b including the structural period P and the projection-to-projection distance W of the concavo-convex structure layer 12 and the shape of the projection 12b including the projection height H and the projection width D are changed, the hue of the color visually recognized in the display region 20 can be changed in the case where reflected light is seen from the front surface side of the display body 10.

For example, where the shape of the projection 12b is stationary, a greater structural period P results in a greater projection-to-projection distance W and also in a greater area of the multilayer film layer 14 positioned in the region between the projections 12b. As a consequence, the length of the light path of light passing through the thin films 14A is elongated, so that light of a longer wavelength is intensified and reflected from the multilayer film layer 14.

More particularly, the configuration of the respective thin films 14a in the multilayer film layer 14 and the arrangement and shape of the projections 12b in the concavo-convex structure layer 12 are so adjusted that in response to a desired hue required to be visually recognized as a color assumed in the display region 20 in the case where reflected light is seen from the front surface side of the display body 10, light of a wavelength corresponding to the hue is intensified and reflected from the multilayer film layer 14. The first region 20A and the second region 20B mutually differ from each other with respect to the configuration of the respective thin films 14a in the multilayer film layer 14 and the arrangement and shape of the projections 12b in the concavo-convex structure layer 12 in these regions, under which these regions assume mutually different colors when reflected light is seen from the front surface side of the display body 10.

Especially, the formation of the projections 12b with mutually different structural periods P on the two regions 20A and 20B is easier than the formation, on the two regions 20A and 20B, of the multilayer film layers 14 having mutually different layer configurations including the number, material and film thickness of the thin films 14a. Thus, it is preferred to differentiate the hue of the first region 20A from the hue of the second region 20B by the difference of the structural period P. In other words, the multilayer film layer 14 of the first region 20A and the multilayer film layer 14 of the second region 20B should preferably be one mutually contiguous multilayer structure having the same layer configuration.

It will be noted that in the above configuration, the periodic structure is formed of the substrate 16 and the concavo-convex structure layer 12. The projection 12b is an instance of a periodic element. The support is configured of the substrate 16 and the flat portion 12a, and the surface of the flat portion 12a, i.e. a surface opposite to a contact surface with the substrate 16 in the flat portion 12a is a reference plane. The metal layer 13 is taken as a metal layer having a shape, as an entire layer, which follows the surface profile of the periodic structure. The surface of the periodic structure is a plane of the reference plane including a region surrounding the respective periodic elements and the surfaces of the respective periodic elements. The multilayer film layer 14 is positioned on a surface opposite to a contact surface with the periodic structure in the metal layer 13 and covers the periodic structure and the metal layer 13 therewith.

Figure 21:
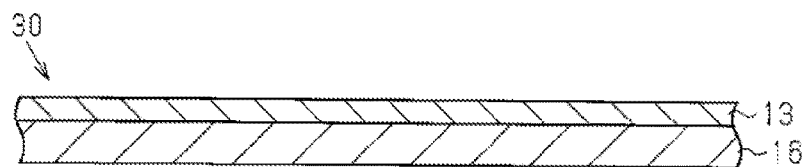
FIG. 21 is a sectional view showing a sectional structure in an auxiliary region of the display body of the third embodiment.

With reference to FIG. 21, the structure of the auxiliary region 30 is illustrated.

As shown in FIG. 21, the auxiliary region 30 is provided with a substrate 16 and a metal layer 13 wherein the flat metal layer 13 is positioned on the surface of the substrate 16. The substrate 16 is a structure wherein the display region 20 and the auxiliary region 30 are contiguous with each other, and the metal layer 13 is a layer wherein the display region 20 and the auxiliary region 30 are mutually contiguous with each other. In doing so, when incident light from the front surface side of the display body 10 is received, the auxiliary region 30 is observed to assume a color corresponding to the type of material for the metal layer 13 and appears to have a metallic luster.

[Manufacturing Method of Display Body]

A method for manufacturing the display body 10.

First, a procedure of making the display region 20 is described. Initially, the concavo-convex structure layer 12 is formed on the surface of the substrate 16. For the formation of the projections 12b in the concavo-convex structure layer 12, there can be adopted, for example, a photolithographic technique using light or a charged particle beam, a nanoimprinting method, or a plasma etching method. Especially, in order to form the projections 12b on the surface of a flat portion 12a made of a resin, the nanoimprinting method can be used, for example. In the case where the projections 12b are formed by processing a substrate made of a hard material, it is beneficial to use a combined method of a photographic technique using a charged particle beam and a plasma etching method. Of these, the nanoimprinting method is more suited to form the concavo-convex structure layer 12 having fine projections and recesses.

With the case using the nanoimprinting method, a polyethylene terephthalate sheet is used, for example, as the substrate 16 and a UV-curing resin is coated onto the surface of the substrate 16. Next, a synthetic quartz mold serving as an intaglio plate having recesses whose shape and arrangement correspond to the projections 12b is pressed against the surface of the coated film made of the UV-curing resin, followed by irradiation of UV light onto the coated film and the synthetic quartz mold. Subsequently, the cured UV-curing resin is removed from the synthetic quartz mold. In doing so, the projections 12b are formed to mold the concavo-convex structure layer 12. It will be noted that the UV-curing resin may be replaced by a thermosetting resin. In this case, UV irradiation should be changed to heating. Additionally, the UV-curing resin may be substituted with a thermoplastic resin. In this case, UV irradiation should be changed to heating and cooling.

Where the arrangement and shape of the projections 12b in the concavo-convex structure layer 12 differ between the first region 20A and the second region 20B, the concavo-convex structure layer 12 of the first region 20A and the concavo-convex structure layer 12 of the first region 20B can be simultaneously formed by changing the arrangement and shape of recesses in the synthetic quartz mold at a portion corresponding to the first region 20A and also at a portion corresponding to the second region 20B, respectively.

Next, the metal layer 13 is formed on the surface of the concavo-convex structure layer 12. As a method of forming the metal layer 13, mention is made, for example, of a vacuum deposition method, a sputtering method and the like. Moreover, the thin films 14a are successively formed on the surface of the metal layer 13 to form the multilayer film layer 14. As a method of forming the thin films 14a, mention may be made of, for example, a vacuum deposition method, a sputtering method and the like. In this way, the stacked structure of the display region 20 is formed.

The auxiliary region 30 can be prepared according to the preparation procedure of the display region 20 except that the step of forming the concavo-convex structure layer 12 and the step of forming the multilayer film layer 14 are not carried out. More particularly, the metal layer 13 is formed on the surface of the substrate 16 in the auxiliary region 30 simultaneously with the formation of the metal layer 13 in the display region 20.

Modification Examples of Display Body

The structure of the display region 20 in the display body 10 may be altered in the following ways.

The substrate 16 and the concavo-convex structure layer 12 may be integrated together. The concavo-convex structure layer 12 may not be provided with the flat portion 12a and the projections 12b may be projected from the surface of the substrate 16. In this case, the substrate 16 serves as a support and the surface of the substrate 16 becomes the reference plane.

The projection 12b is not limited to a square trapezoid in shape, but also may be in the form of a rectangular parallelepiped, or a truncated cone or a column. That is, the width of the projection 12b in a direction across the surface of the substrate 16 may be constant, or the shape of the projection 12b may be circular as viewed in a direction perpendicular to the surface 10F of the display body 10. Moreover, the projection 12b may be in the form of a shape having no flat face at the tip end thereof such as a pyramid or a circular cone.

The arrangement of the projections 12b as viewed in a direction perpendicular to the surface 10F of the display body 10 is not limited to a square arrangement, but may be in a two-dimensional lattice. The square arrangement is one wherein the projections 12b are arranged at a given period along each of two directions intersecting with each other within a two-dimensional plane. The two-dimensional lattice arrangement includes, aside from the square arrangement, an arrangement wherein the projections 12b are arranged along two directions intersecting at an angle different from 90 degrees within the two-dimensional plane.

The metal layer 12 may be positioned, for example, on the flat portion 12a exposed between the projections 12b and also on the top of each projection 12b without covering the entire surface of the concavo-convex structure layer 12. In other words, the metal layer 13 may have, as an entire layer, a shape that follows the surface profile of the concavo-convex structure layer 12. In other words, the metal layer 13 may have a shape wherein portions protruded toward the front surface side are distributed in a two-dimensional lattice along the arrangement of the projections 12b.

In short, the concavo-convex structure layer 12 and the metal layer 13 may be such that the plasmon structure layer 15 composed of these layers has a structure permitting the incident light to be transmitted by plasmon resonance. Although the reason why the transmission of incident light occurs is mainly due to the occurrence of plasmon resonance, the reason for the transmission includes, in addition to plasmon resonance, the transmission of incident light through the structure from a locally thin portion of the metal layer 13.

First Application Example

Figure 22:
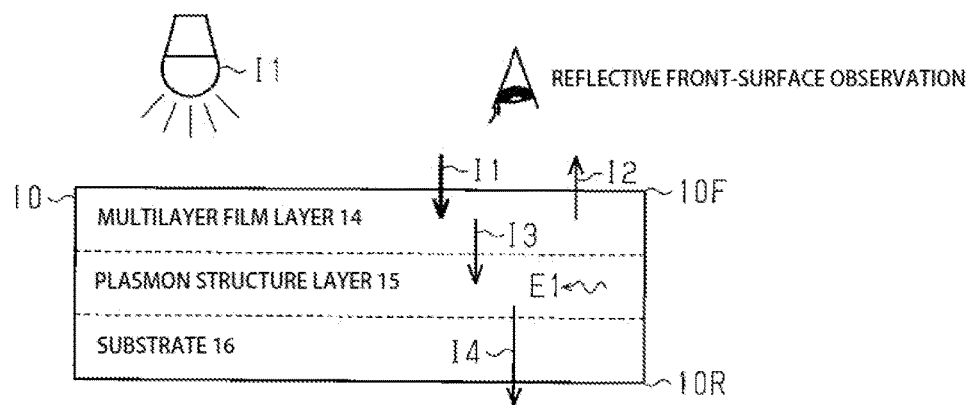
FIG. 22 is an operational view showing the operation of the display body of a first application example in the third embodiment through reflective observation from a front surface side.

With reference to FIG. 22, a first application example is illustrated. The first application example is an embodiment of a display body. A display body 10 of the first application example is used in such a way that light is incident mainly from the front surface side to the display body 10 and the display body 10 is observed only from the front surface side. For instance, the display body 10 is attached to an opaque face of a product, which is less likely to reflect light. The display body 10 may be used for the purpose of increasing the product counterfeiting difficulty, or may be used for the purpose of enhancing product design properties, or may be used for both.

In order to attain the purpose of increasing the product counterfeiting difficulty, the display body 10 is attached, for example, to authentication documents such as a passport, licenses and the like, valuable securities such as money coupons, bank checks and the like, cards such as credit cards, cash cards and the like, and paper money.

For the purpose of enhancing product design properties, the display body 10 is attached, for example, to wearable accessories, products carried around by users, stationary goods such as household furniture, home electric appliances and the like, and structures such as walls, doors and the like.

[Operation of Display Body]

With reference to FIG. 22, a description will be given of an image which is visually recognized in the case that the display region 20 is observed from a direction perpendicularly facing the surface 10F of the display body 10. It will be noted that in FIG. 22, the plasmon structure layer 15 constituted of the concavo-convex structure layer 12 and the metal layer 13 is schematically shown as one flat layer, and the multilayer film layer 14 is schematically shown as one flat layer for ease of understanding.

When white light 11 is irradiated from the outside of the display body 10 toward the front surface 10F of the display body 10, light 12 of a given wavelength region, which is reflected by the respective thin films 14a, is intensified by interference in the multilayer film layer 14 and this light 12 is emitted to the front surface side of the display body 10.

The multilayer film layer 14 allows light 13 of part of the wavelength region contained in the white light 11 to be transmitted therethrough, and this light 13 enters into the plasmon structure layer 15. The concavo-convex structure of the plasmon structure layer 15 is one wherein a metal thin layer is stacked on a dielectric, and the period of the concavo-convex structure is a sub-wavelength period not larger than the visible region wavelength. Therefore, the occurrence of first-order diffracted light is suppressed in the plasmon structure layer 15 having received the light 13, so that plasmon resonance occurs wherein light E1 of a specific wavelength region contained in the light 13 and collective oscillations of electrons are coupled together. The plasmon structure layer 15 allows the light E1 of part of the wavelength region contained in the light 13 to be transmitted as surface plasmon and converted to light l5, which is emitted from the plasmon structure layer 15. The wavelength region of the light 14 is determined depending on the period of the concavo-convex structure, or the structural period P. It will be noted that the light emitted from the plasmon structure layer 15 contains light having passed through the plasmon structure layer 15 such as by being transmitted through the structure from the locally thinned portion of the metal layer 13. In this regard, however, as to the light emitted from the rear surface side of the display body 10, the light 14 is predominant.

As stated above, the light 12 reflected in the multilayer film layer 14 is emitted to the front surface side of the display body 10. Accordingly, according to the reflective front-surface observation wherein the surface 10F is observed from the front surface side of the display body 10 in such a state that the white light 11 is irradiated from the outside of the display body 10 toward the surface 10F, a hue corresponding to the wavelength region of the light 12, i.e. a hue color corresponding to the wavelength region intensified with the multilayer film layer 14, is visually recognized in the display region 20. The color corresponding to the wavelength region of this light 12 is one different from white or black.

In the above configuration, the display body 10 includes plasmon resonance structure layer 15, by which the light consumed by plasmon resonance in the plasmon structure layer 15 is not reflected at the interface between thee plasmon structure layer 15 and other layer. Accordingly, the light transmitted through the multilayer film layer 14 is reflected, for example, in the inside of the display body 10 or at the interface between the substrate 16 and its upper layer and is thus suppressed from being emitted to the front surface side of the display body 10. Accordingly, because light of a wavelength region different from the light 12 of the wavelength region intensified by the multilayer film layer 14 is suppressed from being emitted to the front surface side of the display body 10, the brightness of the hue visually recognized in the display region 20 is enhanced.

As stated above, the wavelength region intensified by the multilayer film layer 14 of the first region 20A and the wavelength region intensified by the multilayer film layer 14 of the second region 20B differ from each other. As a consequence, in the reflective front-surface observation, the first region 20A and the second region 20B appear to have colors of mutually different hues, respectively. Since the brightnesses of the hues visually recognized in the first region 20A and the second region 20B are enhanced, respectively, a difference in hue between the first region 20A and the second region 20B becomes clear. Thus, the visibility of an image, such as a design, represented by these regions can be enhanced.

It will be noted that with the case that the auxiliary region 30 is observed from a direction perpendicular to the front surface 10F of the display body 10, when white light 11 is irradiated from the outside of the display body 10 toward the front surface 10F, the light of a wavelength corresponding to the type of material for the metal layer 13 is repulsed by the collective movement of free electrons in the metal layer 13. Therefore, the auxiliary region 30 appears to have a metallic luster in a hue corresponding to the wavelength region of the repulsed light.

Accordingly, because the display region 20 and the auxiliary region 30 look different from each other in texture, it becomes possible in the display body 10 to represent a diversity of images by means of the display region 20 and the auxiliary region 30. It is to be noted that light irradiated onto the front surface 10F of the display body 10 upon observation of the display region 20 and the auxiliary region 30 may not be white light.

By the way, in order to increase the product counterfeiting difficulty and design properties, attempts have been made to incorporate a plurality of display bodies assuming mutually different hues into one article, or to incorporate a plurality of regions assuming mutually different hues into one display body.

In order to further enhance the counterfeiting difficulty and design properties, it is desirable that the difference between mutually different hues be clear, i.e. the hue assumed by each display body or the hue assumed by each region be bright. As just described, the provision of a display body capable of enhancing the brightness of a visually recognized hue is also an object of the third embodiment. According to the first application, the effects enumerated below can be obtained including the effect on such a problem as set out above.

(3-1) Since the display body 10 is provided with the plasmon structure layer 15, light transmitted through the multilayer film layer 14 is suppressed from being emitted from the front surface side of the display body 10 due to the reflection in the inside of the display body 10 and the like. Accordingly, since light of a wavelength region different from the light 12 of the wavelength region intensified by the multilayer film layer 14 is suppressed from being emitted to the front surface side of the display body 10, the brightness of the hue visually recognized in the display region 20 is increased.

(3-2) The display region 20 includes the first region 20A and the second region 20B wherein mutually different hue colors are visually recognized by reflective front-surface observation. Since the brightness of the visually recognized hue is increased in the first region 20A and the second region 20B, respectively, the difference in hue between the first region 20A and the second region 20B becomes clear, with the result that the visibility of an image represented by these regions is enhanced. Accordingly, as to the products attached with the display body 10, counterfeiting difficulty and design properties are more enhanced.

(3-3) With a configuration wherein the structural period P of the projections 12b in the first region 20A and the structural period P of the projections 12B in the second region 20B differ from each other, the degree of freedom of adjusting the hues in the two regions 20A and 20B is higher when compared with a configuration wherein the hue of the first region 20A and the hue of the second region 20B are made different from each other only by the layer configurations including the number of the layers in the multilayer film layer 14, the types of materials for the layers and the film thicknesses. In the above configuration, the difference in the layer configuration of the multilayer film layer 14 between the two regions 20A and 20B can be made smaller when compared with the configuration wherein the hue of the first region 20A and the hue of the second region 20B are made different from each other only by the layer configuration of the multilayer film layer 14. The formation of the projections 12b having mutually different structural periods P on the two regions 20A and 20B is easier than in the case wherein the multilayer film layers 14 having mutually different layer configurations are stacked on the two regions 20A and 20B, respectively. Hence, according to the above configuration, the manufacturing procedure of the display body 10 can be simplified.

Especially, with a configuration wherein the multilayer film layer 14 of the region 20A and the multilayer film layer 14 of the second region 20B are formed as one contiguous multilayer structure having the same layer configuration, and the hue of the first region 20A and the hue of the second region 20B are made different from each other by the difference between the structural periods P thereof, the manufacture of the display body 10 is specifically easy.

(3-4) With a configuration wherein the display body 10 includes the display region 20 and the auxiliary region 30, the display region 20 and the auxiliary region 30 look different in texture when observed by reflective front-surface observation. Accordingly, a diversity of representations are possible by use of the display region 20 and the auxiliary region 30. Thus, counterfeiting difficulty and design properties are more enhanced with respect to the products attached with the display body 10.

(3-5) Since the metal layer 13 of the display region 20 and the metal layer 13 of the auxiliary region 30 are formed as one contiguous layer, the manufacture of the display body 10 is easier when compared with the configuration wherein these layers are formed as separate layers.

(3-6) According to the manufacturing method of forming the concavo-convex structure layer 12 wherein a plurality of projections 12b are formed by pressing an intaglio plate against a resin coated onto the surface of the substrate 16, the concavo-convex structure layer 12 having fine projections and recesses can be conveniently formed.

(3-7) In the manufacture of the display body 10 wherein the structural period P of the projections 12b in the first region 20A and the structural period P of the projections 12b in the second region 20B differ from each other, when using a manufacturing method of forming the projections 12b in the first region 20A and the projections 12b in the second region 20B simultaneously by use of the intaglio plate, the display body 10 can be manufactured more efficiently when compared with a manufacturing method of forming the projections 12b of the first region 20A and the projections 12b of the second region 20B by different steps.

Second Application Example

Figure 23:
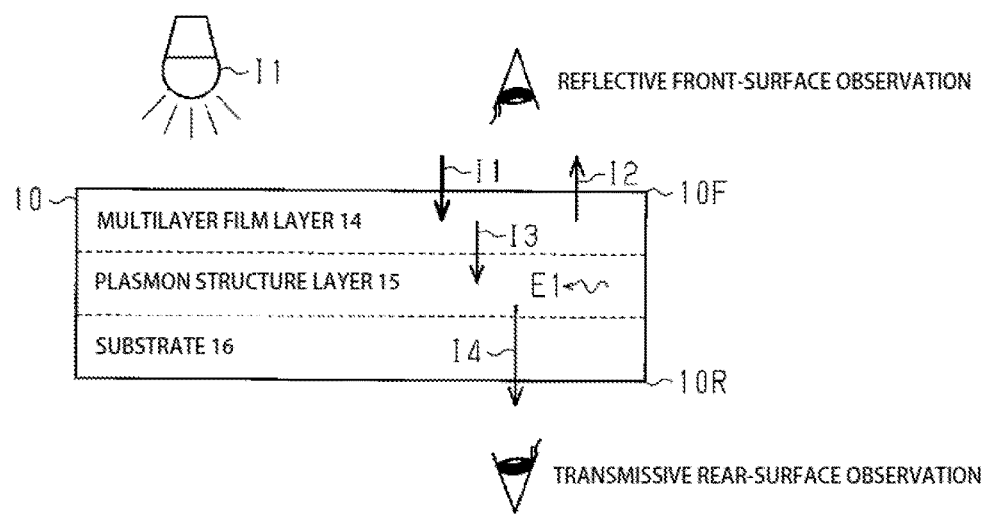
FIG. 23 is an operational view showing the operation of the display body of a second application example in the third embodiment through transmissive observation from a front surface side and also through reflective observation from a rear surface side.
Figure 24:
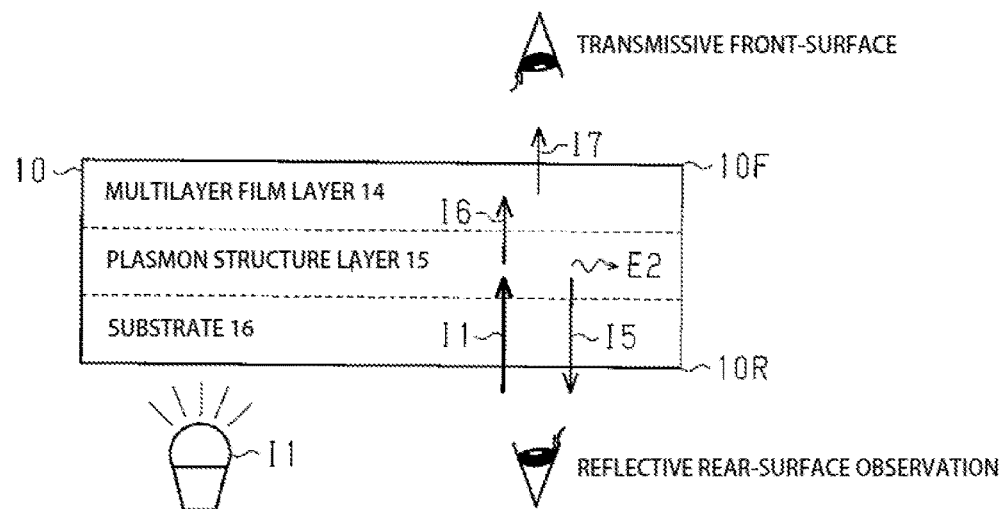
FIG. 24 is an operational view showing the operation of the display body of a second application example in the third embodiment through transmissive observation from a front surface side and also through reflective observation from a rear surface side.
Figure 25:
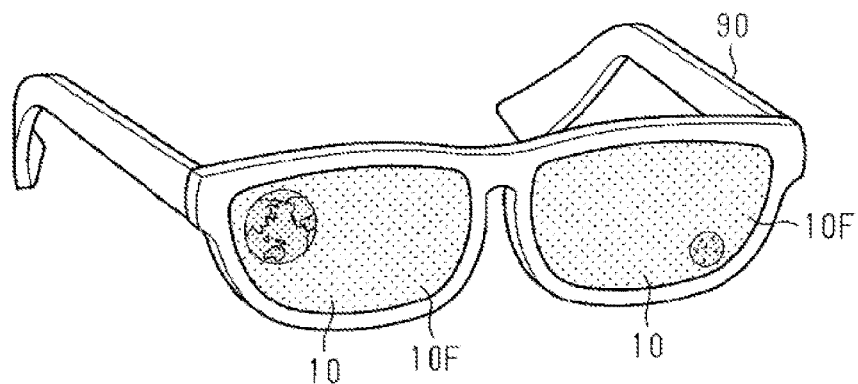
FIG. 25 is a view showing an example of a commodity provided with the display body of the second application example in the third embodiment.

With reference to FIGS. 23 to 25, the second application example is described. The second application example is an embodiment of a display body. A display body 10 of the second application example is used in such a way that the display body 10 is observed from both of a front surface side and a rear surface side thereof. For instance, the display body 10 is attached to a product in such a way that both the front surface and the rear surface of the display device 10 come in contact with an air layer or a transparent member. The display body 10 may be used for the purpose of increasing product counterfeiting difficulty or for the purpose of enhancing product design properties.

[Function of Display Body: Reflective Front-Surface Observation and Transmissive Rear-Surface Observation]

With reference to FIG. 23, a description will be given of an image visually recognized in the case where the display region 20 of the display body 10 is observed from the front surface side and the rear surface side when light is incident from the front surface side to the display body 10. It will be noted that in FIG. 23, the plasmon structure layer 15 constituted of the concavo-convex structure layer 12 and the metal layer 13 is schematically shown as one flat layer and the multilayer film layer 14 is schematically shown as one flat layer for ease of understanding.

When white light l1 is irradiated from the outside of the display body 11 toward the surface 10F, light l2 of a wavelength region intensified with the multilayer film layer 14 is emitted to the front surface side of the display body 10 like the first application example. Accordingly, when the display region 20 is observed from the front surface side, a color of a hue corresponding to the wavelength region of the light l2 is visually recognized in the display region 20.

As illustrated in the first application example, since the display body 10 is provided with the plasmon structure layer 15, light transmitted through the multilayer film layer 14 is suppressed from being emitted to the front surface side of the display body 10 due to the reflection in the inside of the display body 10. Thus, the brightness of the hue of the display region 20 as viewed from the front surface side is increased.

On the other hand, based on the fact that the light E1 of part of the wavelength region contained in the light l3 transmitted through the multilayer film layer 14 is consumed by plasmon resonance in the plasmon structure layer 15, the light l4 of part of the wavelength region contained in the light l3 is emitted from the plasmon structure layer 15, and is then transmitted through the substrate 16 and emitted to the rear surface side of the display body 10.

Accordingly, where the display region 20 is observed from the rear surface side of the display body 10, a color of a hue corresponding to the wavelength region of the light l4 is visually recognized. The color corresponding to the wavelength region of the light l4 is a color different from white, black and a color corresponding to the wavelength region of the light l2. As stated above, the wavelength region of the light l4 emitted from the plasmon structure layer 15 is determined according to the structural period P of the concavo-convex structure layer 12, so that when the structural period is changed, the wavelength region of the light l4 emitted to the rear surface side of the display body 10 can be changed.

It will be noted that where the auxiliary region 30 is observed from the front surface side of the display body 10, the auxiliary region 30 appears to have a hue depending on the type of material for the metal layer 13 and a metallic luster like the first application example. Where the auxiliary region 30 is observed from the rear surface side of the display body 10, the auxiliary region 30 is visually recognized as a dark color close to black for the reason that when the light l1 is irradiated from the outside of the display body 10 toward the surface 10F, the intensity of light transmitted through the auxiliary region is very small.

As stated above, according to the reflective front-surface observation wherein the front surface 10F is observed from the front surface side of the display body 10 in such a state that the white light l1 is irradiated from the outside of the display body 10 toward the front surface 10F, an image as in the first application example is observed.

On the other hand, according to the transmissive rear-surface observation wherein the rear surface 10R is observed from the rear surface side of the display body in such a state that the white light l1 is irradiated from the outside of the display body 10 toward the front surface 10F, a color of a hue different from the case of the reflective front-surface observation is observed in the display region 20. When a difference is made between the first region 20A and the second region 20B with respect to the structural period P in the concavo-convex structure layer 12, color hues visually recognized in the first region 20A and the second region 20B by transmissive rear-surface observation can be made different from each other. According to this configuration, there can be observed an image, such as a design configured from the first region 20A and the second region 20B or also from the first region 20A, the second region 20B and the auxiliary region 30, by the transmissive rear-surface observation as well.

It will be noted that the results of the reflective front-surface observation and the transmissive rear-surface observation show a similar tendency in the case where the amount of light directed toward the surface 10F is higher than the amount of external light directed toward the rear surface 10R. In addition, the light irradiated onto the front surface 10F of the display body 10 may not be white light.

[Function of Display Body: Transmissive Front-Surface Observation and Reflective Rear-Surface Observation]

With reference to FIG. 24, a description will be given of a visually observed image in the case where light is incident from the rear surface side to the display body 10, under which the display region 20 of the display body 10 is observed from the front surface side and the rear surface side, respectively. It will be noted that in FIG. 24, the plasmon structure layer 15 constituted of the concavo-convex structure layer 12 and the metal layer 13 is schematically shown as one flat layer and the multilayer film layer 14 is schematically shown as one flat layer for ease of understanding.

As shown in FIG. 24, when white light 11 is irradiated from the outside of the display body 10 to the rear surface 10R, the light 11 enters from an air layer into the substrate 16 and then from the substrate 16 into the plasmon structure layer 15.

The region directly on the flat portion 12a in the plasmon structure layer 15 is constituted of the base portion of the projection 12b and a portion of the metal layer 13 stacked on the flat portion 12a between the projections 12b. The refractive index of this region approximates the averaged magnitude of the refractive index of the base portion of these projections 12b and the refractive index of the metal layer 13 provided between the projections 12b. If the configuration is such that the volume of the total space between the projections 12b is greater than the volume of a plurality of projections 12b, the refractive index of the region directly on the flat portion 12a has the magnitude dominated by the metal layer 13 serving as a sea component and is much lower than the refractive index of the air layer. Accordingly, light 11 incident to the substrate 16 enters from the substrate 16 whose refractive index higher than the air layer and also from the flat portion 12a of the concavo-convex structure layer 12 to the portion directly on the flat portion 12a having a refractive index lower than the air layer. As a consequence, Fresnel reflection is likely to occur at the boundary therebetween.

On the other hand, when the light 11 is incident to the plasmon structure layer 15, plasmon resonance occurs in the plasmon structure layer 15. As a result, light 15 of part of the wavelength region contained in the light 11 is emitted to the rear surface side of the display body 10 as reflected light, and light 16 of part of the wavelength region contained in the light 11 is emitted from the plasmon structure layer 16 based on the fact that light E2 of part of the wavelength contained in the light 11 is consumed by plasmon resonance. Moreover, light 17 of the wavelength region contained in the light 16 is transmitted through the multilayer film layer 14 and emitted to the front surface side of the display body 10.

The wavelength regions of the lights 15, 16 are adjustable depending on the structural period P in the concavo-convex structure layer 12. The change of the structural period P is enabled to change the wavelength region of the light 17 emitted to the front surface side of the display body 10. The wavelength region of the light 17 is adjustable depending on the configuration of the thin films 14a of the multilayer film layer 14.

As described above, according to the transmissive front-surface observation wherein the surface 10F is observed from the front surface side of the display body 10 in such a state that the white light 11 is irradiated from the outside of the display body 10 toward the rear surface 10R, a color of a hue corresponding to the wavelength region of the light 17 is visually recognized in the display region 20. The color corresponding to the wavelength region of the light 17 is different from white and black.

Further, according to the reflective rear-surface observation wherein the rear surface 10R is observed from the rear surface side of the display body 10 in such a state that white light 11 is irradiated from the outside of the display body 10 toward the rear surface 10R, a color of a hue corresponding to the wavelength region of the light 15 is visually recognized in the display region 20. The color corresponding to the wavelength region of this light 15 is a color different from white, black and a color corresponding to the wavelength of the light 17.

More particularly, the display region 20 looks different in hue color or in color brightness and lightness between the transmissive front-surface observation and the reflective rear-surface observation, respectively.

Furthermore, when the structural period P in the concavo-convex structure 12 is made different between the first region 20A and the second region 20B, it is possible to make different color hues visually recognized in the first region 20A and the second region 20B, respectively. According to such a configuration, in any of the transmissive front-surface observation and the reflective rear-surface observation, an image, such as a design, constituted of the first region 20A and the second region 20B is observed.

With respect to the transmissive front-surface observation of the auxiliary region 30, the auxiliary region 30 is visually recognized as a dark color close to black like the transmissive rear-surface observation. Likewise, with respect to the reflective rear-surface observation of the auxiliary region 30, the auxiliary region 30 looks to have a hue corresponding to the type of material for the metal layer 13 and a metallic luster like the reflective front-surface observation. Accordingly, in any of the transmissive front-surface observation and the reflective rear-surface observation, an image, such as a design, constituted of the display region 20 and the auxiliary region 30 is observed.

It will be noted that the results of the transmissive front-surface observation and the reflective rear-surface observation show a similar tendency even in the case that the amount of external light directed toward the rear surface 10R is higher than the amount of external light directed toward the front surface 10F. Light irradiated to the rear surface 10R of the display body 10 may not be white light.

The reflection of the light 15 and the consumption of the light E2 occur in the plasmon structure layer 15, so that the light 11 irradiated toward the rear surface 10R is reduced in amount after transmission through the whole display body 10. Accordingly, where the light is irradiated to the front surface 10F and the rear surface 10R of the display body 10, the light 11 irradiated to the front surface 10F is suppressed from being returned to the front surface side except for the light reflected in the multilayer film layer 14 due to the presence of the plasmon structure layer 15. Additionally, the light contained in the light 11 irradiated to the rear surface 10R is also suppressed from being emitted to the front surface side after transmission through the display body 10. In this sense, the brightness of the hue visually recognized in the display region 20 by the reflective front-surface observation can be increased.

FIG. 25 shows a display body 10 attached to a lens of eyeglasses as a specific example of the display body of the second application example. For instance, in the state where the front surface 10F of the display body 10 is turned outwardly and external light falls on eyeglasses, an image of reflective front-surface observation is visually recognized as viewed from the outside of the eyeglasses 90 and an image of transmissive rear-surface observation is visually recognized as viewed from the inside of the eyeglasses. It will be noted that the display region 20 of the display body 10 may cover the lens entirely. If external light is intense, a person wearing the glasses 90 can visually recognize the view on the outside of the glasses 90, which assumes a hue corresponding to the wavelength of light emitted from the rear surface 10R of the display body 10.

In another example, the display body 10 may be attached to a window. The front surface 10F of the display body 10 faces outward, and in the state where external light in the daytime hits the window, for example, an image by reflective front-surface observation is visually recognized. From the inside of the window, an image by transmissive rear-surface observation is visually recognized. On the other hand, in the state where the room is lit at night, for example, an image by transmissive front-surface observation is visually recognized form the outside of the window. An image by reflective rear-surface observation is visually recognized from the inside of the window.

As described above, according to the second application example, the following effects are obtained in addition to those effects of the first application example (3-1) to (3-7), (3-8) When light is irradiated from the outside of the display body 10 toward the front surface 10F, colors of different hues between the transmissive front-surface observation and the reflective rear-surface observation are visually recognized in the display region 20. When light is irradiated from the outside of the display body 10 toward the rear surface 10R, colors of different hues between the transmissive front-surface observation and the reflective rear-surface observation are visually recognized. In this way, the hues of the visually recognized image differ between the case of the display body 10 being observed from the front surface side and the case of the display body 10 being observed from the rear surface side, so that the counterfeiting difficulty and design properties of products attached with the display body 10 can be more enhanced. It is easy to discriminate between the front and back of the display body 10.

Further, the representation of a diversity of images is possible using the combination of the hue difference between the first region 20A and the second region 20B and the color difference between the display region 20 and the auxiliary region 30, both in the respective observations. As to the product attached with the display body 10, the counterfeiting difficulty and design properties can be more enhanced.

Third Application Example

Figure 26:
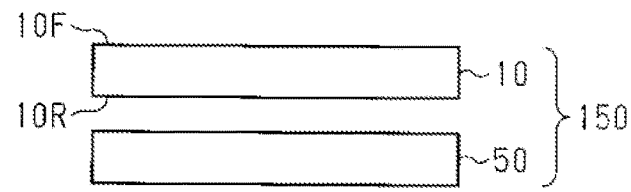
FIG. 26 is a schematic view showing a configuration of a device attached with the display body of a third application example in the third embodiment.
Figure 27:
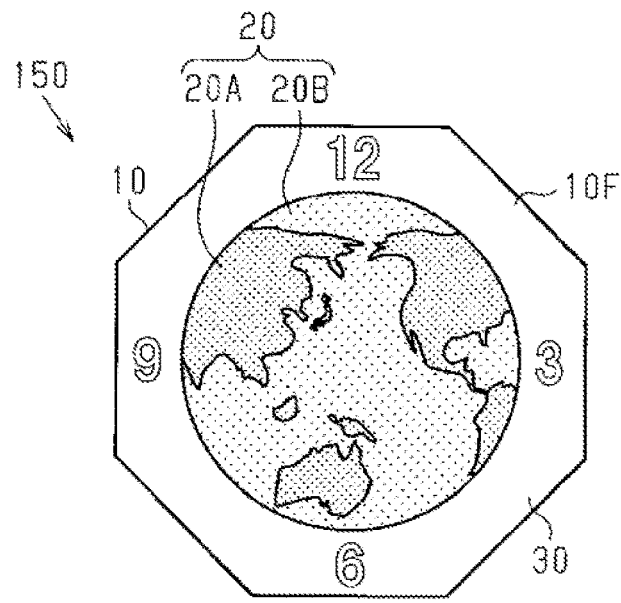
FIG. 27 is a plan view showing an example of a planar structure of a device attached with the display body of the third application example in the third embodiment.
Figure 28:
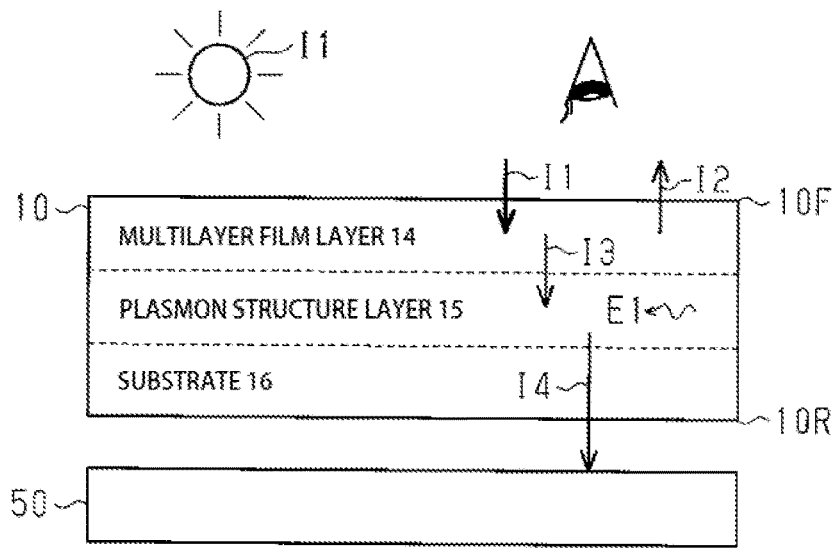
FIG. 28 is an operational view showing the operation of the device attached with the display body of the third application example in the third embodiment.

With reference to FIGS. 26 to 28, the third application example is described. The third application example is directed to an embodiment of a display body-attached device.

As shown in FIG. 26, a display body-attached device 150 includes a display body 10 and a solar cell 50. A light-receiving region of the solar cell 50 is arranged at a position in face-to-face relation with a rear surface 10R of the display body 10, and the rear surface 10R of the display body 10 comes in contact with the light-receiving region of the solar cell 50, for example. The solar cell 50 produces electric power from an energy of light incident on the light-receiving region.

For instance, the display body-attached device 150 is embodied as a clock powered by the solar cell, whereupon the display body 10 is used as a clock face to enhance the design properties of the product. For example, as shown in FIG. 27, in a front surface 10F of the display body 10, a first region 20A, a second region 20B and an auxiliary region 30 constitute a design for decoration and figures and letters for time display. Part of the figures, letters and design may be configured to differ from the display region 20 and the auxiliary region 30 and may be formed, for example, by attaching a resin or a metal to the front surface 10F.

It will be noted that the display body-attached device 150 is not limited to a clock, but may be any devices so far as they are powered by the solar cell 50. For instance, targets to be powered by the solar cell may be display devices. In short, the display body-attached device 150 may have such a configuration that the solar cell 50 is positioned at the rear surface of the display body 10. The solar cell 50 may be in face-to-face relation with a partial region of the rear surface 10R of the display body 10, or may face at least the display region 20.

[Operation of Display Body-Attached Device]

With reference to FIG. 28, how light incident to the display body-attached device 150 proceeds is illustrated below. It will be noted that in FIG. 28, a plasmon structure layer 15 constituted of a concavo-convex structure layer 12 and a metal layer 13 is schematically shown as one flat layer and a multilayer film layer 14 is schematically shown as one flat layer for ease of understanding of the display region 20 of the display body 10.

As shown in FIG. 28, when solar light 11 is irradiated from the outside of the display body-attached device 150 toward the front surface 10F of the display body 10, light 12 of the wavelength region intensified with the multilayer film 14 is emitted to the front surface side of the display body 10 in the display region 20 like the first application example. Accordingly, as viewed from the front surface side of the display body 10, the color of a hue corresponding to the wavelength region of the light 12 is visually recognized in the display region 20.

As illustrated in the first application example, since the display body 10 includes the plasmon structure layer 15, the light transmitted through the multilayer film layer 14 is suppressed from being emitted to the front surface side of the display body 10 due to the reflection in the inside of the display body 10, so that the brightness of the hue in the display region 20 is enhanced as viewed from the front surface side.

On the other hand, light E1 of part of the wavelength region contained in light 13 transmitted through the multilayer film layer 14 is consumed by plasmon resonance in the plasmon structure layer 15, under which light 14 of part of the wavelength region contained in the light 13 is emitted from the plasmon structure layer 15, transmitted through the substrate 16 and emitted to the rear surface side of the display body 10. The thus emitted light 14 is incident into a light-receiving region of the solar cell 50. In this way, the solar cell 50 produces electric power from the energy of the incident light 14.

As stated above, the wavelength region of the light 14 emitted from the plasmon structure layer 15 is determined depending on the structural period P in the concavo-convex structure layer 12. The change of the structural period P enables the wavelength region of the light 14 emitted to the rear surface side of the display body 10 to be changed. Accordingly, the structural period P is so adjusted that the wavelength region of the light 14 is adjusted to be efficiently absorbed by the solar cell 50, and a color of a wavelength region not contributing to photoelectric conversion in the solar cell can be used as a structural color assumed by the display region 20.

It will be noted that where the auxiliary region 30 is observed from the front surface side of the display body 10, the auxiliary region 30 looks to have a hue corresponding to the type of material for the metal layer 13 and a metallic luster.

As stated above, when the front surface 10F is observed from the front surface side of the display body 10 in the state where the light 11 is irradiated from the outside of the display body-attached device 150 toward the front surface 10F of the display body 10, an image as with the case of the reflective front-surface observation of the first application example is observed. The light 14 emitted from the rear surface side of the display body 10 is utilized for power generation of the solar cell 50.

When a design and the like are attached to the dual face of a clock so as to enhance design properties, the formation of the image using an optically opaque material enables the degree of freedom of material selection to be increased, thus making it possible to represent a variety of images. In this connection, however, it is essential to form, at a part of the dial face, a hole through which light is made incident on the solar cell. If such a hole is made large in size, an amount of light incident to the solar cell becomes large but design properties decrease. On the other hand, if the hole size is made small, an amount of light incident to the solar cell becomes small and lowers power generation efficiency although the design properties are enhanced.

In contrast, in the configuration where the display body-attached device 150 according to the third application example is embodied as a clock powered by a solar cell, the display region 20 can be used not only as an image-forming region, but also as a region through which light is passed to the solar cell. Accordingly, it is possible to balance the enhancement of design properties with an increase in power efficiency of the solar cell.

According to the third application example, the following effect is obtained aside from the effects (3-1) to (3-7) of the first application example.

(3-9) When the front surface 10F is observed from the front surface side of the display body 10 in the state where light is irradiated from the outside of the display body-attached device 150 toward the front surface 10F of the display body 10, an image whose brightness of hue is enhanced is visually recognized in the display region 20. The light of a given wavelength transmitted through the display region 20 and emitted from the rear surface side of the display body 10 is utilized for the power generation of the solar cell. Accordingly, the display region 20 can be utilized as an image-forming region and also as a region through which light is passed to the solar cell 50, so that it is possible to balance the enhancement of design properties of the display body-attached device 150 with an increase in the power generation efficiency of the solar cell 50.

Fourth Application Example

Figure 29:
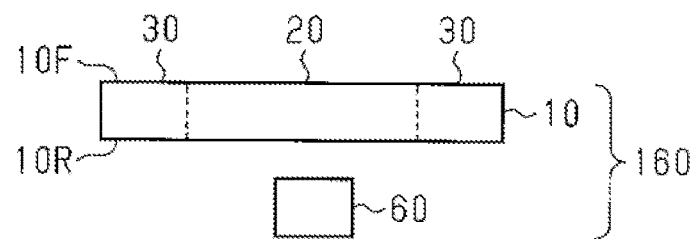
FIG. 29 is a schematic view of a configuration of a device attached with a display body of a fourth application example in the third embodiment.
Figure 30:
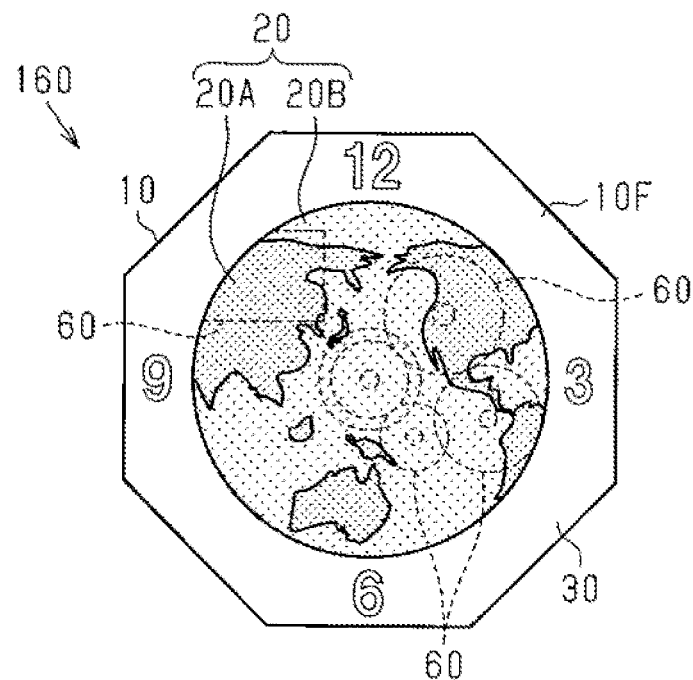
FIG. 30 is a plan view showing an example of a planar structure of a device attached with a display body of the fourth application example in the third embodiment.
Figure 31:
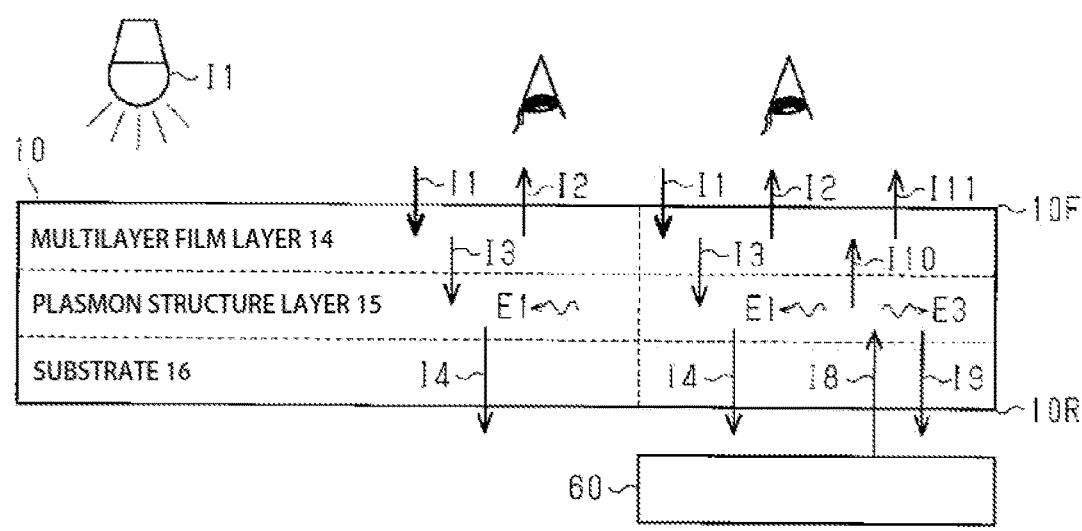
FIG. 31 is an operational view showing the operation of the device attached with the display body of the fourth application example in the third embodiment.

Referring to FIGS. 29 to 31, the fourth application example is illustrated. The fourth application example is an embodiment of a display body-attached device.

As shown in FIG. 29, a display body-attached device 160 includes a display body 10 and a light-emitting structure 60 configured to enable light emission. The light-emitting structure 60 is one wherein light irradiated to the light-emitting structure 60 is emitted by reflection or wherein light is emitted by self-light emission from the light-emitting structure 60. For example, the light-emitting structure 60 is one that is seen as white under white light.

The light-emitting structure 60 is arranged at a position in face-to-face relation with part of the rear surface 10R of the display body 10, and the light-emitting structure 60 and the rear surface 10R are kept distant from each other. More particularly, as viewed from a direction perpendicularly facing the front surface 10F of the display body 10, the front surface 10F includes a region superposed with the light-emitting structure 60 and a region not superposed with the light-emitting structure 60. In more detail, the light-emitting structure 60 is arranged at a position facing a part of the display region 20.

For example, as shown in FIG. 30, the display body-attached device 160 is embodied as a clock wherein the display body is a dial face and the light-emitting structure 160 is a component, such as a denticulate ring or the like, arranged beneath the dial face. It will be noted that the display body-attached device 160 is not limited to the clock, but may be so configured that the light-emitting structure 60 is arranged at a rear surface side of the display body 10.

[Operation of the Display Body-Attached Device]

Referring to FIG. 31, a description will be given of how light incident on the display body-attached device 160 proceeds. It will be noted that in FIG. 31, the plasmon structure layer 15 constituted of the concavo-convex structure layer 12 and the metal layer 13 is schematically shown as one flat layer and the multilayer film layer 14 is schematically shown as one flat layer for ease of understanding of the display region 20 of the display body 10.

As shown in FIG. 31, when white light 11 is irradiated from the outside of the display body-attached device 160 toward the front surface 10F of the display body 10, light 12 of the wavelength region intensified with the multilayer film layer 14 is emitted to the front surface side of the display body 10 at a portion of the display region 20 where no light-emitting structure 60 is disposed at the rear surface side of the display body 10 like the first application example. Accordingly, as viewed from the front surface side of the display body 10, a color of a hue corresponding to the wavelength region of the light 12 is visually recognized in the portion of the display region 20 not superposed with the light-emitting structure 60.

As described in the first application example, since the display body 10 includes the plasmon structure layer 15, the light transmitted through the multilayer film layer 14 is suppressed from being emitted toward the front surface side of the display body 10 due to the reflection in the inside of the display body 10. Hence, the brightness of the hue visually recognized in the portion of the display body 20 not superposed with the light-emitting structure 60 is enhanced.

On the other hand, based on the fact that the light E1 of part of the wavelength region contained in the light 13 transmitted through the multilayer film layer 14 is consumed by plasmon resonance in the plasmon structure layer 15, the light 14 of part of the wavelength region contained in the light 13 is emitted from the plasmon structure layer 15, transmitted through the substrate 16 and emitted to the rear surface side of the display body 10. In the portion wherein the light-emitting structure 60 is positioned at the rear surface side of the display body 10, light 18 is emitted from the light-emitting structure 60 toward the rear surface 10R of the display body 10. Where the light-emitting structure 60 is one wherein light irradiated to the light-emitting structure 60 is emitted by reflection, this light 18 may be either light that is generated by reflecting, with the light-emitting structure 60, the light 14 emitted from the display body 10, or light that is generated by reflecting, with the light-emitting structure 60, light irradiated from a light source provided in the vicinity of the light-emitting structure 60 to the light-emitting structure 60. In addition, where the light-emitting structure 60 is of the type wherein light is emitted by self-emission, the light 18 is one generated by light emission of the light-emitting structure 60.

When the light 18 is irradiated toward the rear surface 10R of the display body 10, the light 18 enters into the substrate 16 and then into the plasmon structure layer 15 from the substrate 16.

When the light 18 arrives at the plasmon structure layer 15, light 19 of part of the wavelength region included in the light 18 is emitted to the rear surface side of the display body 10 as reflected light, and light E3 of part of the wavelength region contained in the light 18 is consumed by plasmon resonance, under which light 110 of part of the wavelength region contained in the light 18 is emitted from the plasmon structure layer 15, like the transmissive front-surface observation of the second application example. Moreover, light 111 of part of the wavelength region contained in the light 110 is transmitted through the multilayer film layer 14 and emitted to the front surface side of the display body 10.

The wavelength regions of the lights 19 and 110 are adjustable depending on the structural period P in the concavo-convex structure layer 12. The change of the structural periods P enables the wavelength region of the light 111 emitted to the front surface side of the display body 10 to be changed. The wavelength region of the light 111 is also adjustable depending on the configuration of the thin films 14a of the multilayer film layer 14.

Accordingly, as viewed from the front surface side of the display body 10, a color of a hue corresponding to the wavelength regions of the light 12 and the light 111 is visually recognized in the portion of the display region 20 superposed with the light-emitting structure 60.

As a result, when the front surface 10F is observed from the front surface side of the display body 10 in the state where white light 11 is irradiated from the outside of the display body-attached device 160 toward the front surface 10F of the display body 10, the portion of the display region 20 superposed with the light-emitting structure 60 and the portion not superposed with light-emitting structure 60, respectively, appear to have colors of mutually different hues, or colors of mutually different saturations and brightnesses. Accordingly, an image corresponding to the shape of the light-emitting structure 60 is visually recognized, and a wide variety of images can be represented using, in combination, a difference in hue between the first region 20A and the second region 20B and a difference in color between the display region 20 and the auxiliary region 30.

The visibility of image can be so controlled that an image corresponding to the shape of the light-emitting structure 60 is permitted either to be seen or not to be seen by the switching on and off of light irradiation on the light-emitting structure 60 and the switching on and off of the light emission of the light-emitting structure 60. In this way, a wider representation of images is possible.

As described above, according to the fourth application example, the following effect is obtained in addition to the effects (3-1) to (3-7) of the first application example.

(3-10) Part of the light emitted from the light-emitting structure 60 is transmitted through the display region 20 of the display body 10 and emitted to the front surface side. Accordingly, when the front surface 10F of the display body 10 is observed from the outside of the display body-attached device in the state wherein light is irradiated from the outside of the display body-attached device 160 toward the front surface 10F of the display body 10, the portion of the display region 20 superposed with the light-emitting structure 60 and the portion not superposed with the light-emitting structure 60 appear to have mutually different colors. Therefore, an image corresponding to the shape of the light-emitting structure 60 is visually recognized thus enabling a wide variety of images to be represented and also the counterfeiting difficulty and design properties to be more enhanced in the display body-attached device 160.

As stated above, in the third embodiment, light in the specific wavelength region is emitted from the display body as reflected or transmitted light due to plasmon resonance. The wavelength region of the transmitted or reflected light is determined by a plurality of factors including the position and size of the periodic elements in the form of individual projections 12b and the metal layer whose position is determined by the respective periodic elements, so that the degree of freedom of adjusting the wavelength region transmitted or reflected in the display body can be increased.

Modification Examples

The respective application examples may be altered in the following ways.

The display region further includes a third region. In the third region, the structural period P of the concavo-convex structure layer 12 is not constant. In the third region, the position of the individual projections 12b as viewed in a direction perpendicular to the front surface 10F may be so determined that the structural periods P are distributed as having a given standard deviation that is, for example, 1/10 times the average value of the structural periods P in the third region. In such a configuration, the third region assumes mutually different colors in very small regions thereof, under which a color formed by mixing these hues is visually recognized by reflective front-surface observation as a whole. Accordingly, it is possible to configure the third region visually recognized as a color close to while, and thus the degree of freedom is raised as to the hue of an image configured in the display region 20.

The display region 20 may include three or more regions assuming mutually different hues, respectively. Alternatively, the display region 20 may be a region assuming one type of hue. In this case, the display body 10 has the display region 20 wherein the brightness of hue is enhanced, so that the product counterfeiting difficulty and design properties can be improved by combination with other display body or by combination with the decoration imparted to products.

The auxiliary region 30 may be a region wherein a metallic luster is visually recognized in the case where reflected light is observed from the front surface side of the display body 10. For instance, a flat resin layer contiguous to the flat portion 12a of the concavo-convex structure layer 12 may be included between the metal layer 13 and the substrate 16. Alternatively, the auxiliary region 30 may include a metal layer different from the metal layer 13 of the display region 20.

The display body 10 may not include the auxiliary region 30, but may be constituted of the display region 20 alone or may further include, aside from the display region 20, a region that includes, for example, the substrate 16 and a resin layer and looks to have a color corresponding to the type of material for the resin layer by reflective front-surface observation.

The third application example and the fourth application example may be used in combination. That is, the display body-attached device may include the display body 10, the solar cell 50 disposed at the rear surface side of the display body and the light-emitting structure 60.

<Additional Note>

The measure for addressing the foregoing problems embraces the following items as technical concepts derived from the third embodiment and its modification examples.

[Item 21]

A display body having a front surface and a rear surface, which comprising a dielectric concavo-convex structure layer having a plurality of projections projecting from the rear surface toward the front surface and arranged in a two-dimensional lattice having a sub-wavelength period as viewed in a direction perpendicular to the front surface, a metal layer positioned on a surface of the concavo-convex structure layer and having a shape that follows a surface profile of the concavo-convex structure layer, and a multilayer film layer capable of causing a multilayer film interference to occur, which is positioned on a surface of the metal layer and covers a structure made of the concavo-convex structure layer and the metal layer.

According to the above configuration, when light is irradiated from the outside of the display body toward the front surface of the display body, light of a given wavelength region is intensified in the multilayer film layer and emitted to the front surface side of the display body. In the structure made of the metal layer and the concavo-convex structure layer, the light transmitted through the multilayer film layer is converted to a surface plasmon due to a plasmon resonance phenomenon and transmitted through the above structure, and is transmitted through the structure from a locally thinned portion of the metal layer positioned on the concavo-convex structure layer. It will be noted that the surface plasmon transmitted through the above structure is re-converted to light upon emission to the rear surface side. Accordingly, the light transmitted through the multilayer film layer is suppressed from being emitted to the front surface side of the display body. Therefore, light of a wavelength region different from the light of the wavelength region intensified with the multilayer film layer is suppressed from being emitted to the front surface side of the display body. As a result, the brightness of the hue visually recognized when the display body is perceived from its front surface side is enhanced.

[Item 22]

The display body as recited in Item 21, wherein a region including the concavo-convex structure layer, the metal layer and the multilayer film layer is a display region wherein the display region includes a first region and a second region as viewed in a direction perpendicular to the front surface, and in reflective front-surface observation wherein white light is irradiated from the outside of the display body toward the front surface to observe the display body from a direction perpendicular to the display body, the first region and the second region are configured as to assume colors of mutually different hues, respectively.

According to the above configuration, the first region and the second region assume colors of mutually different hues in the reflective front-surface observation, respectively. The brightnesses of the hues visually recognized in the first region and the second region are enhanced, so that the difference in hue between the first region and the second region becomes clear and thus, the visibility of the image represented by these regions is enhanced. Accordingly, products attached with the display body are increased in counterfeiting difficulty and design properties.

[Item 23]

The display body as recited in Item 22, wherein an arrangement period of the projections in the first region and an arrangement period of the projections in the second region differ from each other.

According to the above configuration, when making use of the difference between the arrangement periods of the projections, the first region and the second region can be changed in hue. Using such a configuration, the degree of freedom of adjusting the hues in the two regions is higher when compared with a configuration wherein the hues of the first region and the second regions are made different from each other only by a layer configuration including the number of layers of the multilayer film layer, the types of materials and film thicknesses. Moreover, according to the above configuration, when compared with a configuration wherein the hues of the first region and the second regions are made different from each other only by the layer configuration including the number of layers in the multilayer film layer, a difference in the layer configuration of the multilayer film layer between the two regions can be made smaller. To form the projections of mutually different periods in the two regions is easier than to stack multilayer film layers having mutually different layer configurations on the two regions, respectively. Thus, according to the above configuration, the manufacturing procedure of the display body can be simplified.

[Item 24]

The display body as recited in any one of Items 21 to 23, wherein the region including the concavo-convex structure layer, the metal layer and the multilayer film layer is a display layer and the display body further includes an auxiliary layer provided with a metal layer as a region different from the display region and is configured such that in reflective front-surface observation wherein in reflective front-surface observation wherein white light is irradiated from the outside of the display body toward the front surface and the display body is observed from a direction perpendicular to the front surface, the auxiliary region is configured to assume a metallic luster.

According to the above configuration, the display region and the auxiliary region look different in texture in the reflective front-surface observation. Accordingly, a wide variety of representations are possible using the display region and the auxiliary region. Thus, the products having the display body attached are enhanced in the counterfeiting difficulty and design properties thereof.

[Item 25]

The display body as recited in Item 24, wherein the metal layer of the display region and the metal layer of the auxiliary region are formed as one mutually contiguous layer.

According to the above configuration, the metal layer of the display region and the metal layer of the auxiliary region are formed as one mutually contiguous layer, so that it is possible to reduce the number of layers of the display body when compared with a configuration wherein these layers are differently formed.

[Item 26]

A display body-attached device comprising the display body recited in any one of Items 21 to 25, and a solar cell disposed at a position in face-to-face relation with the rear surface of the display body.

According to the above configuration, when the display body is observed from the front surface side thereof in the state where sunlight is irradiated from the outside of the display body-attached device toward the front surface of the display body, an image whose brightness of a hue is enhanced is visually recognized. Light of a given wavelength transmitted through the structure made of the metal layer and the concavo-convex structure layer and emitted to the rear surface side of the display body is utilized for the power generation of the solar cell. Accordingly, the region for forming an image in the display body can be used as a region passing light to the solar cell, so that it is possible to balance the enhancement of the design properties of the display body-attached device with an increase in the power generation efficiency of the solar cell.

[Item 27]

A display body-attached device comprising the display body recited in any one of Items 21 to 25, and a light-emitting structure disposed at a position perpendicular to a part of a rear surface of the display body and configured to be capable of emitting light toward the rear surface of the display body.

According to the above configuration, part of the light emitted from the light-emitting structure is transmitted through the display body and emitted to the front surface side. Accordingly, when the display body is observed from the front surface side in the state where light is irradiated from the outside of the display body-attached device toward the front surface of the display body, an image whose brightness of a hue is enhanced is visually recognized in a portion of the display body not superposed with the light-emitting structure and a color different from the color in the portion not superposed with the light-emitting structure is visually recognized in a portion of the display body superposed with the light-emitting structure. Thus, an image corresponding to the shape of the light-emitting structure can be seen. Therefore, a wider variety of image representations become possible, and counterfeiting difficulty and design properties in the display body-attached device can be enhanced.

[Item 28]

A method for manufacturing a display body comprising a first step of forming a plurality of projections by pressing an intaglio plate against a resin coated onto a substrate surface and curing the resin to form a plurality of projections made of the resin thereby forming a concavo-convex structure layer including the plurality of projections arranged in a two-dimensional lattice having a sub-wavelength period as viewed in a direction perpendicular to a front surface of the substrate, a second step of forming, on the concavo-convex structure layer, a metal layer having a shape that follows a surface profile of the concavo-convex structure layer, and a third step of forming a multilayer film layer capable of causing multilayer interference to occur on a structure made of the concavo-convex structure layer and the metal layer.

According to the above manufacturing method, the concavo-convex structure having fine projections and recesses can be favorably formed.

[Item 29]

The method for manufacturing a display body as recited in Item 28, wherein the display body is such that a region including the concavo-convex structure layer, the metal layer and the multilayer film layer is a display region, and the display region includes a first region and a second region which mutually differ in the arrangement period of the projections, the projections of the first region and the projections of the second region being formed simultaneously in the first step.

According to the above manufacturing method, the display body can be manufactured more efficiently when compared with a manufacturing method wherein the projections of the first region and the projections of the second region are formed by different steps.

Fourth Embodiment

Referring to FIGS. 32 to 39, a fourth embodiment of a display body that is an example of an optical device and a manufacturing method of the display body is illustrated. It will be noted that although the wavelength of incident light irradiated to the display body is not limited, a description will be given of natural light including visible region (wavelength: 400 nm to 800 nm) light recognizable by the naked eye as incident light of the fourth and fifth embodiments.

A display body of the fourth embodiment may be used for the purpose of increasing product counterfeiting difficulty or for the purpose of increasing product design properties or may be used for both purposes. For the purpose of increasing the product counterfeiting difficulty, a display body is attached, for example, to authentication documents such as a passport, licenses and the like, securities such as merchandise coupons, checks and the like, cards such as credit cards, cash cards and the like, and paper money. For the purpose of enhancing product design properties, the display body is attached, for example, to wearable ornaments, articles carried around by users, stationary goods such as house furnishings, home electrics and the like, and structures such as walls, doors and the like. For example, the display body may be used as a dial plate of a clock.

[Configuration of Display Body]

Figure 32:
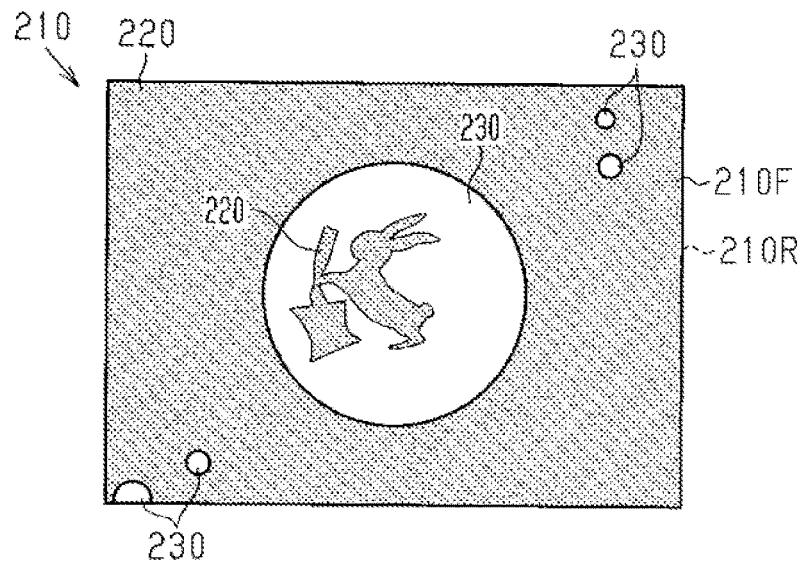
FIG. 32 is a plan view showing a planar structure in a fourth embodiment of a display body.

As shown in FIG. 32, a display body 210 has a front surface 210F and a rear surface 210R that is a surface opposite to the front surface 210F. As viewed in a direction perpendicular to the front surface 210F, the display body 210 includes a first display region 220 and a second display region 230. The first display region 220 is one wherein first pixels, which are an instance of first display pixels, are arranged, and the second display region 230 is one wherein second pixels, which are an instance of second display pixels, are arranged.

The first display region 220 and the second display region 230 are used to represent, as an image, a letter, a signal, a figure, a pattern, a design and a background therefor by single use of these regions or by combination of these regions. As one instance of these images, the configuration shown in FIG. 32 is such that a moon motif is represented by the first display region 220 and the second display region 230, stars are represented around the moon by the second display region 230, and a background is represented by the first display region 220.

Figure 33:
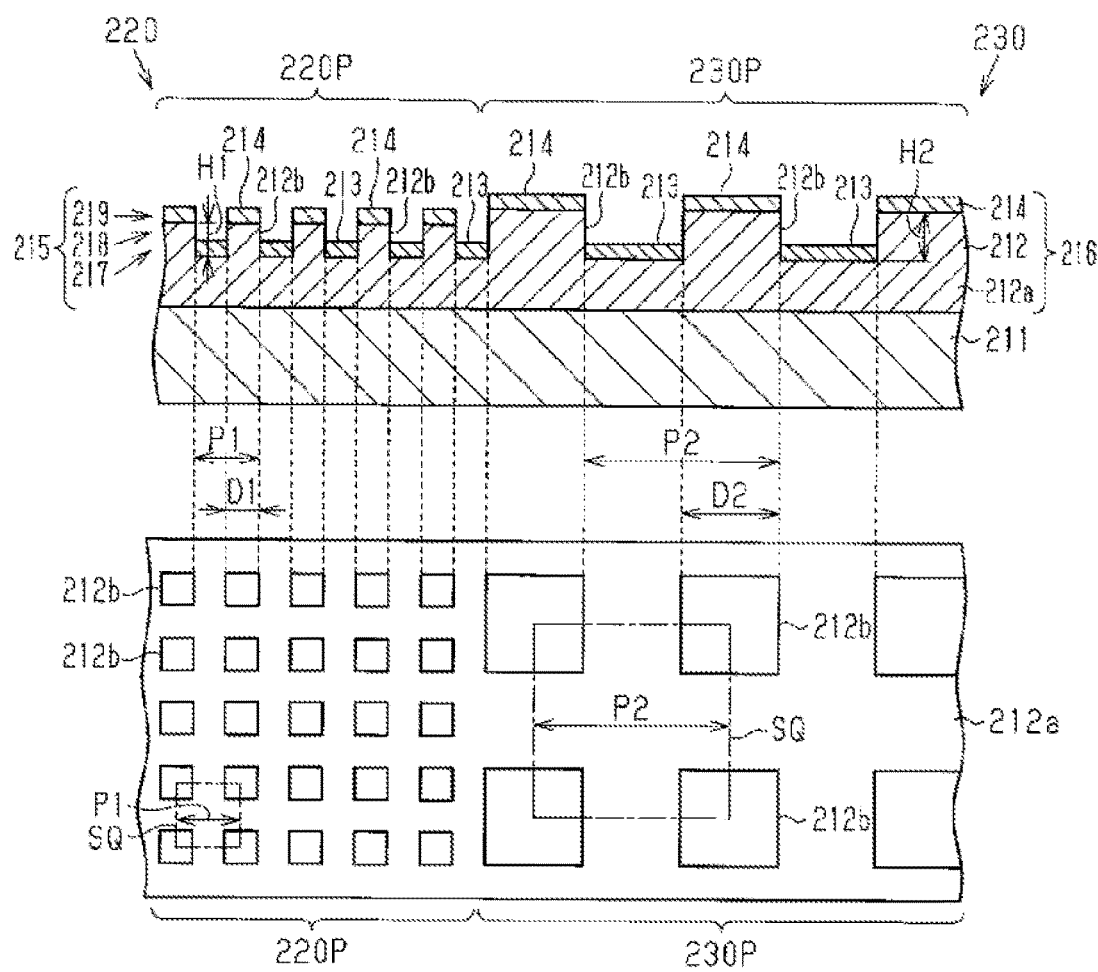
FIG. 33 is a view showing a sectional structure of the display body and a planar structure of a concavo-convex structure layer in the fourth embodiment.

Referring to FIG. 33, the structures of the first display region 220 and the second display region 230 are illustrated. FIG. 33 is an enlarged view showing a structure of a portion including a boundary between the first display region 220 and the second display region 230, in which a first pixel 220P constituting the first display region 220 and a second pixel 230P constituting the second display region 230 are lined up.

Each of the first pixel 220P and the second pixel 230P includes a substrate 211, a concavo-convex structure layer 212, a first metal layer 213 and a second metal layer 214. It will be noted that the side where the concavo-convex structure layer 212 is located relative to the substrate 211 is a front surface side of the display body 210, and the side where the substrate 211 is located relative to the concavo-convex structure layer 212 is a rear surface side of the display body 210. FIG. 33 shows a planar structure of the concavo-convex structure layers 212 of the first pixel 220P and the second pixel 230P as viewed in a direction perpendicular to the front surface 210F of the display body 210 along with a sectional view of the first pixel 220P and the second pixel 230P.

The first pixel 220P and the second pixel 230P are common to each other with respect to their structures except for the structure relating to the projections and recesses of the concavo-convex structure layer 212. For example, the portion of the substrate 211 included in the first pixel 220P is contiguous to the portion included in the second pixel 230P thereby forming an integrated structure. Moreover, the portion of the concavo-convex structure layer 212 included in the first pixel 220P is contiguous to the portion included in the second pixel 230P thereby forming an integrated structure as well. The first metal layer constituting the first pixel 220P and the first metal layer 213 constituting the second pixel 230P are substantially common to each other with respect to their constituent material and thickness, and the second metal layer 214 constituting the first pixel 220P and the second metal layer 214 constituting the second pixel 230P are substantially common to each other with respect to their constituent material and thickness.

The concavo-convex structure layer 212, the first metal layer 213 and the second metal layer 214 in the first pixel 220P constitute a plasmon structure layer 215 that is a structure causing a plasmon resonance to occur. The concavo-convex structure layer 212, the first metal layer 213 and the second metal layer 214 in the second pixel 230P constitute a diffraction grating layer 216 that is a structure emitting diffracted light to a space, whichever at the front surface side or at the rear surface side of the display body 210, through which incident light to the display body 210 passes.

The detailed configuration of the respective layers is now described.

The substrate 211 is in the form of a plate, and the surface of the substrate 211 positioned at the front surface side of the display body 210 is a front surface of the substrate 211. The substrate 211 is transparent to light in the visible region and permits the light in the visible region to be transmitted therethrough. The wavelength of the light in the visible region is from 400 nm to 800 nm. The substrate 211 is made of a dielectric material. The material for the substrate 211 includes, for example, synthetic quartz, a resin such as PET (polyethylene terephthalate), PC (polycarbonate), PEN (polyethylene naphthalate) or the like. The refractive index of the substrate 211 is higher than that of an air layer and is, for example, from 1.2 to 1.7. The substrate 211 may be constituted of a single layer or may be constituted of a plurality of layers.

The concavo-convex structure layer 212 is constituted of a flat portion 212a extending across the surface of the substrate 211 and a plurality of projections 212b projecting from the flat portion 212a toward the front surface side of the display body 210. More particularly, the projection 212b projects from the rear surface 210R of the display body 210 in a direction toward the front surface 210F. The concavo-convex structure layer 212 is a dielectric transparent to light in the visible region and is formed, for example, of a UV curing resin, a thermosetting resin or a thermoplastic resin. The refractive index of the concavo-convex structure layer 212 is higher than that of an air layer.

The projection 212b has a shape of a quadrangular prism, which is square as viewed in a direction perpendicular to the front surface 210F. The length of the projection 212b from its base end to tip end, or a length of the projection 212b in an extending direction of the projection 212b, is a projection height. The projection height of the projection 212b of the first pixel 220P is a first projection height H1, and the projection height of the projection 212b of the second pixel 230P is a second projection height H2.

The length of the projection 212b in a direction across the surface of the substrate 211, or a length of one side of the square constituting the base portion of the projection 212b, is a projection width. The projection width of the projection 212b of the first pixel 220P is a first projection width D1, and the projection width of the projection 212b of the second pixel 230P is a second projection width D2.

The plurality of the projections 212b are arranged in a square arrangement that is an instance of a two-dimensional lattice as viewed in a direction perpendicular to the front surface 210F of the display body 210. The square arrangement is one wherein the centers of the projections 212b are located at the respective apexes of a square SQ. The length of one side of the square SQ is an arrangement period of the projections 212b. In other words, the arrangement period of the projection 212b is the shortest distance between the centers of the mutually adjacent two projections 212b. The arrangement period of the projections 212b is the total of the shortest distance between the mutually adjacent two projections 212b and the projection width. The arrangement period of the projections 212b of the of the first pixel 220P is a first structural period P1, and the arrangement period of the projections 212b of the second pixel 230 P is a second structural period P2.

The first structural period P1 is a period for causing a plasmon resonance to occur in the visible region wavelength and is a sub-wavelength period of not larger than the visible region wavelength, and is further a period smaller than the wavelength of a short wavelength side of the visible region. More particularly, the first structural period P1 is less than 400 nm. The second structural period P2 is a period for diffracting visible region light and is larger than the first structural period P1, and is a length not less than the wavelength of the short wavelength side of the visible region. The second structural period P2 ranges, for example, from 400 nm to 10 μm in terms of a period which allows easy diffraction of visible region light.

The first projection height H1 and the second projection height H2 may be coincident with or different from each other. With the case where the concavo-convex structure layer 212 is formed using a nanoimprinting method, if the configuration is such that the first projection height H1 is higher than the second projection height H2, high processing accuracy of an intaglio plate used to form the projections 212b is likely to be obtained, resulting in the likelihood of obtaining high processing accuracy of the projections 212b. Likewise, in view of the likelihood of obtaining high processing accuracy of the projections 212b, the ratio of the first projection height H1 to the first projection width D1 (H1/D1) is preferably not larger than 3, more preferably not larger than 2. Especially, where the period of the projections 212b is small, a smaller aspect ratio, which is a ratio of the projection height to the projection width, is more likely to obtain high processing accuracy of the projection 212b, whereas with the diffraction grating layer 216, a larger projection height results in a higher diffraction efficiency of light. Hence, if the configuration is such that the second projection height H2 is larger than the first projection height H1, it is possible to ensure a processing accuracy by making the aspect ratio small in the first pixel 220P whose period is relatively small and whose concavo-convex structure layer 212 is a structure for causing plasmon resonance to occur. On the other hand, with the second pixel 230P whose period is relatively large and whose concavo-convex structure layer 212 is a structure for causing optical diffraction to occur, the diffraction efficiency can be enhanced by increasing the projection height.

Further, in the case where the concavo-convex structure layer 212 is formed using a nanoimprinting method, it is preferred that the ratio of the first projection width D1 to the first structural period P1 (D1/P1) and the ratio of the second projection width D2 to the second structural period P2 (D2/P2) are substantially equal to each other. This is because the thickness of the flat portion 212a is likely to be formed uniformly throughout the concavo-convex structure layer 212.

The first metal layer 213 convers the flat portions 212a exposed between the projections 212b. The second metal layer 214 covers the tip end surface of the projection 212b. The first metal layer 213 and the second metal layer 214 are formed of a common metal material and have substantially the same thickness. The respective refractive indexes of the metal layers 213, 214 are lower than an air layer. In view of the likelihood of causing plasmon resonance to occur, it is preferred that the metal layers 213, 214 are formed of a metal material whose real part of complex permittivity is a negative value in the visible region wavelength. The thicknesses of the metal layers 213, 214 are preferably from 10 nm to 200 nm, respectively. The materials for the metal layers 213, 214 include, for example, aluminum, gold, silver, tantalum, indium and the like.

It will be noted that at least in the first pixel 220P, the area of the flat portion 212a exposed between the projections 212b is preferably larger than the total area of the squares of the respective projections 212b as viewed from a direction perpendicularly facing the front surface 210F of the display body. In this case, in the region above the flat portion 212a, i.e. in a base portion region 217 including the respective first metal layers 213 and the base portion of the respective projections 212b, the first metal layers 213 are a sea component in a structural and optical sense, and the base portions of the projections 212b are island components interspersed in the sea component in a structural and optical sense.

In a top region 219 which is a region including the respective second metal layers and air layers between a plurality of the second metal layers 214, the second metal layers 214 are island components in a structural and optical sense, and the air layer is a sea component in a structural and optical sense. Moreover, an intermediate region 218 between the base region 217 and the top region 219, i.e. in a region including a portion other than the base portions of the respective projections 212b and an air layer between the plurality of the projections 212b, the portions other than the base portions of the projections 212b are island components in a structural and optical sense, and the air layer is a sea component in a structural and optical sense.

With the above configuration, the volume ratio of the sea component is larger than the island components in the base region 217, the intermediate region 218 and the top region 219, respectively. The volume ratio of the first metal layer 213 in the base region 217 is larger than the volume ratio of the second metal layer 214 in the top region 219. The volume ratio of the second metal layer 214 in the top region 219 is larger than the volume ratio of a metal material in the intermediate region 218.

In this configuration, the respective refractive indexes of the base region 217, the intermediate region 218 and the top region 219 approximate the averaged magnitude of the refractive indexes of the metal layers 213, 214, the projections 212b and the air layer included in every region. More particularly, the refractive index of the base portion 217 has the magnitude dominated by the first metal layer 213 serving as a sea component and is much less than the refractive index of the air layer. The refractive index of the intermediate region 218 has the magnitude dominated by the air layer serving as a sea component and is higher than the refractive index of the air layer due to the presence of the projections 212b and is a value close to the refractive index of the air layer. The refractive index of the top region 219 has the magnitude dominated by the air layer serving as a sea component, and is lower than that of the air layer due to the presence of the second metal layer 214 and is close to the refractive index of the air layer.

It will be noted that in the first display region 220 of such a configuration as stated above, the periodic structure is constituted of the substrate 211 and the concavo-convex structure layer 212. The projection 212b positioned in the first display region 220 is an instance of the periodic element. In the first display region 220, a support is constituted of the substrate 211 and the flat portion 212a, and the surface of the flat portion 212a, i.e. a surface opposite to a contact surface with the substrate 211 in the flat portion 212a, is a reference plane. The layer constituted of the first metal layer 213 and the second metal layer 214 is taken as a metal layer having, as an entire layer, a shape that follows the surface profile of the periodic structure in the first display region 220. The surface of the periodic structure is a plane including a region of the reference plane surrounding the individual periodic elements and the surface of the individual elements.

[Manufacturing Method of Display Body]

The method for manufacturing the above display body 210 is illustrated.

Initially, the concavo-convex structure layer 212 is formed on the surface of the substrate 211. For the formation of the projections 212b of the concavo-convex structure layer 212, there can be adopted, for example, a photolithographic method using light or a charged particle beam, a nanoimprinting method, or a plasma etching method. Especially, for the formation of the projections 212b on the surface of the flat portion 212a made of a resin, there can be used, for example, the nanoimprinting method. In the case where the projections 212b are formed by processing a substrate made of a hard material, there can be used a combination of the photolithographic method using light or a charged particle beam and a plasma etching. Of these, the nanoimprinting method is suited for the formation of the concavo-convex structure layer 212 having fine projections and recesses in the first pixel 220P.

In the case of using the nanoimprinting method, a polyethylene terephthalate sheet is used, for example, as the substrate 211 and a UV curing resin is coated onto the surface of the substrate 211. Next, a synthetic quartz mold serving as an intaglio plate having recesses arranged in a pattern corresponding to the projections 212b is pressed against the surface of the coated film made of the UV curing resin, followed by irradiation of UV light onto the coated film and the synthetic quartz mold. Subsequently, the synthetic quartz mold is removed from the cured UV resin. In doing so, the projections 212b are formed and the flat portion 212a is formed as a residual film made of the UV cured resin between the projection 212b and the substrate 211. It will be noted that a thermosetting resin may be used in place of the UV curing resin. In this case, UV irradiation can be changed to the application of heat. In addition, a thermoplastic resin may be used in place of the UV curing resin. In this case, UV irradiation can be changed to heating and cooling.

In the above method, when the arrangement period of the recesses in the synthetic quartz mold is changed between a portion corresponding to the first pixel 220P and a portion corresponding to the second pixel 230P, the projections 212$b$ of the first structural period P1 in the first pixel 220P and the projections 212$b$ of the second structural period P2 in the second pixel 230P can be simultaneously formed.

Next, the first metal layer 213 and the second metal layer 214 are, respectively, formed on the surface of the concavo-convex structure layer 212. The first metal layer 213 and the second metal layer 214 are simultaneously formed by forming a metal thin film on the surface of the concavo-convex structure layer 212. The method of forming the first metal layer 213 and the second metal layer 214 includes, for example, a vacuum deposition method, a sputtering method or the like.

[Operation of Display Body: Reflective Front-Surface Observation and Transmissive Rear-Surface Observation]

Figure 34:
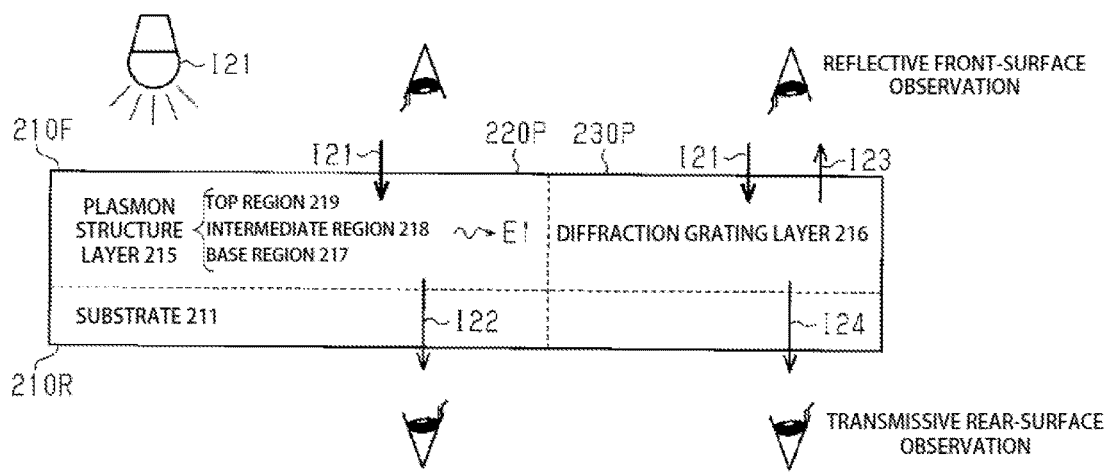
FIG. 34 is an operational view showing the operation of the display body of the fourth embodiment through reflective observation from a surface side and also through transmissive observation from a rear surface side.

With reference to FIG. 34, a description will be given of an image that is visually recognized in the case of observing the display body 210 from the front surface side and the rear surface side when light is incident from the front surface side to the display body 210. It will be noted that in FIG. 34, the plasmon structure layer 215 of the first pixel 220P is schematically shown as one flat layer and the diffraction grating layer 216 of the second pixel 230P is schematically shown as one flat layer for ease of understanding.

Initially, a description will be given of the case where the first display region 220 having the first pixel 220P is observed. When white light l21 is irradiated from the outside of the display body 210 to the front surface 210 of the display body 210, the light l21 enters from the air layer into the plasmon structure layer 215. When the light l21 enters to the concavo-convex structure portion of the plasmon structure layer 215, it enters from the air layer into the top region 219 having a refractive index close to the air layer, so that Fresnel reflection hardly occurs at the interface between the air layer and the top region 219. The concavo-convex structure of the plasmon structure layer 215 is one wherein metal thin films are stacked on a dielectric and the period of the concavo-convex structure is less than the visible region wavelength. Therefore, in the plasmon structure layer 215 having received the light l21, the occurrence of first-order diffracted light at the front surface side of the display body 210 is suppressed, whereas there is generated a plasmon resonance resulting from the coupling between light E21 in the specific wavelength region contained in the light l21 and collective vibrations of electrons. It will be noted that the light l21 is first-order diffracted light generated at an angle nearly parallel to the front surface 210F of the display body 210. The plasmon structure layer 215 permits light of part of the wavelength contained in the light l21 to be transmitted therethrough as a surface plasmon and converted to light l22 emitted from the plasmon structure layer 215. The wavelength region of the light l22 is determined depending on the period of the concavo-convex structure of the plasmon structure layer 215, or the first structural period P1.

As a result, according to the reflective front-surface observation wherein the front surface 210F is observed from the front surface side of the display body 210 in the state where the white light l21 is irradiated from the outside of the display body 210 toward the front surface 210F, black color or a color close black is visually observed in the first pixel 220P because Fresnel reflection hardly occurs at the interface in the plasmon structure layer 215 and plasmon resonance occurs in the plasmon structure layer 215. More particularly, in the reflective front-surface observation, the first display region 220 looks black or looks close to black. Even when an angle of an observer relative to the front surface 210F, i.e. the formation angle between the front surface 210F and the direction of observer's eye, is changed, the color in the first display region 220 remains substantially unchanged.

On the other hand, according to the transmissive rear-surface observation wherein the rear surface 210R is observed from the rear surface side of the display body 210 in the state where the white light l21 is irradiated from the outside of the display body 210 toward the front surface 210F, a color corresponding to the wavelength region of light l22 emitted through plasmon resonance in the plasmon structure layer 215 to the rear surface side of the display body 210 is visually recognized in the first pixel 220P. That is, the first display region 220 looks different in color from white and black in the transmissive rear-surface observation.

Next, a description will be given of the observation of the second display region 230 having the second pixel 230P. When the white light l21 is irradiated from the outside of the display body 210 toward the front surface 210F of the display body 210, the light l21 is diffracted with the diffraction grating layer 216 since the period of the concavo-convex structure in the diffraction grating layer 216 is one that is larger than the visible region wavelength, and diffracted light l23 is emitted to the front surface side of the display body 210. The light l23 contains lights of a plurality of wavelengths, and the emission angles of these lights differ from one another. The emission angles of the lights of the respective wavelengths contained in the light l23 are determined depending on the period of the concavo-convex structure of the diffraction grating layer 216, or the second structural period P2.

As a result, according to the reflective front-surface observation, colors of different hues, saturations and brightnesses are visually recognized depending on the observation angle in the second pixel 230P. More particularly, in the reflective front-surface observation, the color of the second display region 230 looks to be greatly changed with a change in the observation angle.

On the other hand, according to the transmissive rear-surface observation, a color close to black is visually recognized in the second pixel 230P because of the very small intensity of light l24, which is transmitted through the diffraction grating layer 216 having the metal layers 213, 214 after irradiation of the light l21 from the outside of the display body 210 toward the front surface 210F. More particularly, in the transmissive rear-surface observation, the second display region 230 looks close to black.

As stated above, in the reflective front-surface observation, the color visually recognized in the first display region 220 suffers a small change by the observation angle being changed. The color visually recognized in the second display region 230 suffers a great change when the observation angle is changed. Accordingly, there can be realized regions that are mutually different in the degree of color change depending on the difference in the magnitude of the period between the projections 212$b$ in the concavo-convex structure layer 212. Because appearances differ between the first display region 220 and the second display region 230 due to such a difference in the degree of color change as mentioned above, an image, such as a design, made up of the first display region 220 and the second display region 230 is visually recognized according to the reflective front-surface observation.

Because the colors visually recognized in the first display region 220 and the second display region 230 differ in hue, saturation and brightness in the transmissive rear-surface observation, an image, such as a design, made up of the first display region 220 and the second display region 230 is visually recognized even by the transmissive rear-surface observation. The images visually recognized in the display body 210 according to the reflective front-surface observation and the transmissive rear-surface observation are ones that mutually differ in hue, saturation and brightness and also mutually differ from each other with respect to the degree of color change with a change in observation angle.

It will be noted that the results of the above reflective front-surface observation and the transmissive rear-front observation show a similar tendency even in the case where the amount of external light directed toward the front surface 210F is higher than the amount of light directed toward the rear surface 210R. The light irradiated to the front surface 210F of the display body 210 may not be white light.

[Operation of Display Body: Reflective Rear-Surface Observation and Transmissive Front-Surface Observation]

Figure 35:
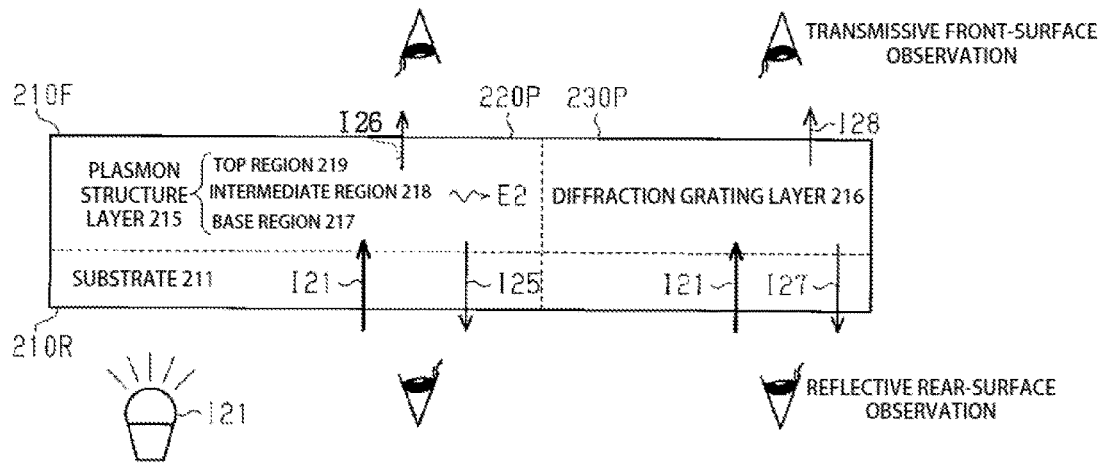
FIG. 35 is an operational view showing the operation of the display body of the fourth embodiment through transmissive observation from a surface side and also through reflective observation from a rear surface side.

Referring to FIG. 35, a description will be given of the mage that is visually recognized in the case where the display body 210 is observed from the front surface side and the rear surface side, respectively, when light is incident from the rear surface side of the display body 210.

Initially, the case where the first display body 220 having the first pixel 220P is observed is illustrated. When white light 121 is irradiated from the outside of the display body 210 toward the rear surface 210R of the display body 210, the light 121 enters from the air layer into the substrate 211 and then from the substrate 211 to the plasmon structure layer 215. When the light 121 enters to the concavo-convex structure portion of the plasmon structure layer 215, it enters from the flat portion 212a of the concavo-convex structure layer 212 having a refractive index higher than the air layer into the base region 217 having a refractive index lower than the air layer, so that Fresnel reflection is liable to occur at the interface therebetween.

On the other hand, when light is transmitted through the interface and enters into the concavo-convex structure portion of the plasmon structure layer 215, a plasmon resonance occurs in the plasmon structure layer 215. As a result, light 125 of a part of the wavelength region contained in the light 121 is emitted to the rear surface side of the display body 210 as reflected light, and the light 126 of part of the wavelength region contained in the light 121 is emitted from the plasmon structure body 215 to the front surface side based on the consumption, with plasmon resonance, of the light E22 of part of the wavelength region contained in the light 121. The wavelength regions of the lights 125 and 126 are determined depending on the period of the concavo-convex structure of the plasmon structure layer 215, i.e. the first structural period P1.

As a result, according to the reflective rear-surface observation wherein the rear surface 210R is observed from the rear surface side of the display body in the state where the white light 121 is irradiated from the outside of the display body 210 toward the rear surface 210R, a color corresponding to the wavelength region of the light 125 emitted to the rear surface side of the display body 210 due to Fresnel reflection is visually recognized in the first pixel 220P. The color corresponding to the wavelength of the light 125 differs from white and black and undergoes a small change in observation angle.

Further, according to the transmissive front-surface observation wherein the front surface 210F is observed from the front surface side of the display body 210 in the state where white light 121 is irradiated from the outside of the display body 210 toward the rear surface 210R, there is visually recognized a color corresponding to the wavelength region of the light 126 emitted through plasmon resonance in the plasmon structure layer 215 to the front surface side of the display body 210. The color corresponding to the wavelength region of the light 126 differs from white, black and the color corresponding to the wavelength region of the light 125. In this regard, however, since the reflection of the light 125 occurs in the plasmon structure layer 215, the intensity of the light transmitted through the display body 210 after irradiation of the light 121 toward the rear surface 210R is not high. Therefore, in the case where the light 121 is irradiated to the front surface 210F and also to the rear surface 210R of the display body 210, the first display region 220 looks close to black as viewed from the front surface side.

Next, the case where the second display region 230 having the second pixel 230P is observed is illustrated. When the white light 121 is irradiated from the outside of the display body 210 toward the rear surface 210R of the display body 210, the light 121 is diffracted in the diffraction grating layer 216, and diffracted light 127 is emitted to the rear surface side of the display body 210. The light emission angles of the respective wavelength regions contained in the light 127 are determined depending on the concavo-convex structure period, i.e. the second structural period P2, of the diffraction grating layer 216.

As a result, according to the reflective rear-surface observation, colors that differ in hue, saturation and brightness correspondingly to the angle of observation are visually recognized in the second pixel 230P. More particularly, the color of the second display region 230 in the reflective rear-surface observation looks to be greatly changed with a change in observation angle.

On the other hand, according to the transmissive front-surface observation, since the intensity of the light 128, which is transmitted through the diffraction grating layer 216 having the metal layers 213, 214 after irradiation of the light 121 from the outside of the display body 210 toward the rear surface 210R, is very small, a color close to black is visually recognized in the second pixel 230P. That is, the second display region 230 looks close to black in the transmissive front-surface observation.

As stated above, the first display region 220 and the second display region 230 differ in appearance from each other in the reflective rear-surface observation, so that according to the reflective rear-surface observation, an image, such as a design, made up of the first display region 220 and the second display region 230 is visually recognized. The images visually recognized in the display body 210 according to the reflective rear-surface observation and the transmissive front-surface observation are ones which are mutually different from each other with respect to the hue, saturation and brightness and which are also mutually different from each other with respect to the degree of color variation due to the change in observation angle.

It will be noted that the results of the reflective rear-surface observation and the transmissive front-surface observation show a similar tendency even when the amount of external light directed toward the rear surface 210R is higher than the amount of external light directed toward the front surface 210F. The light irradiated to the rear surface 210R of the display body 210 may not be white light.

In this way, according to the display body 210 of the fourth embodiment, there can be realized regions wherein the degrees of color change depending on a change in observation angle are different from each other due to the difference in magnitude of the period of the projections 212b in the concavo-convex structure layer 212. The outer edges of these regions are regulated by the position of the projections 212b, and the projections 212b of the first display region 220 are arranged in a sub-wavelength period, so that the position of the outer edges can be more finely set when compared with the region formed by printing with an ink. Accordingly, it is possible to form a finer image by use of the first display region 220 and the second display region 230. Thus, the counterfeiting difficulty and design properties of the display body 210 and also of the product to which the display body 210 is attached can be enhanced.

The image formed by the first display region 220 and the second display region 230 may be, for example, an image wherein a design is depicted in the second display region 230 and the background is formed in the first display region 220, or an image wherein a design is formed by cooperation of the first display region 220 and the second display region 230, or an image wherein the outline of a design is formed in the second display region 230 and the inside of the outline is left to the first display region 220. While the second display region 230 looks iridescently shiny due to a change in observation angle in the reflective front-surface observation, the first display region 220 looks blackish irrespective of the change in observation angle. Especially, when the configuration is such that that the first display region 220 is surrounded with the second display region 230 or the second display region 230 is surrounded with the first display region 220, the first display region 220 is highly visible. Accordingly, the design properties of the image formed of the first display region 220 and the second display region 230 are enhanced.

It will be noted that the display body 210 may be utilized so as to enable reflective front-surface observation and may be used, for example, in the state where light is made incident only from the front surface side to the display body 210 and the display body 210 can be observed only from the front surface side. In this case, there can be realized regions by the first display region 220 and the second display region 230, which are mutually different in the degree of color change depending on a change in observation angle.

Configuration Example of Display Body

A preferred embodiment and a modification example of the structure of the display body 210 are further illustrated.

Configuration Example of First Display Region 220

The configuration example of the first pixel 220P in the first display region 220 is illustrated. It will be noted that the following configuration example may be applied to the second pixel 230P in the second display region 230.

Figure 36:
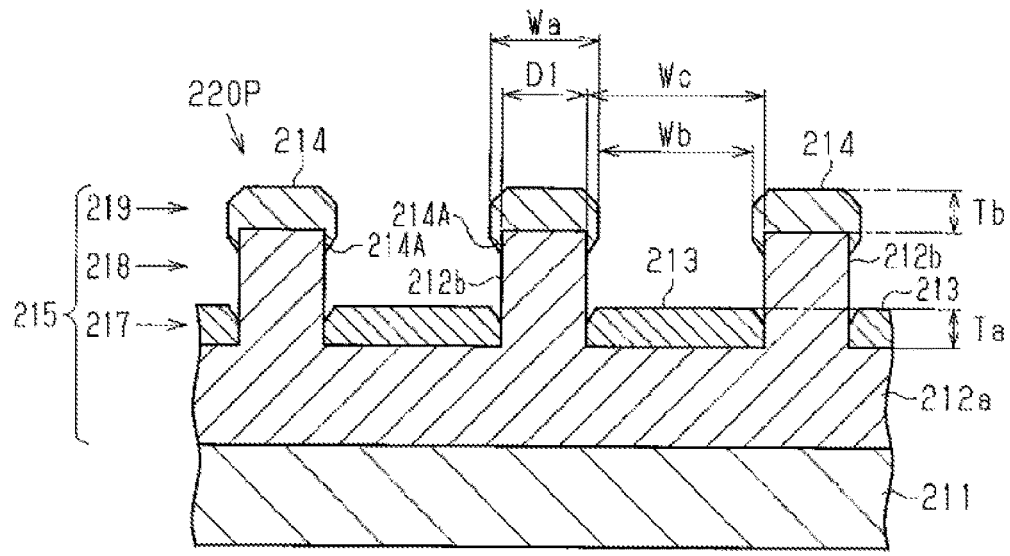
FIG. 36 is a sectional view showing another example of the sectional structure of the display body in the fourth embodiment.

As shown in FIG. 36, a larger thickness Ta of the first metal layer 213 leads to a greater intensity of light emitted by Fresnel reflection occurring at the interface between the base region 217 of the plasmon structure layer 215 and the flat portion 212a, so that the brightness of an image visually recognized by the reflective rear-surface observation is enhanced. Likewise, a larger thickness Ta of the first metal layer 213 leads to a smaller intensity of light transmitted from the rear surface 210R to the front surface 210F, under which even where light is irradiated to the front and rear surfaces of the display body 210, the color in the reflective front-surface observation becomes closer to black.

A smaller ratio of the first projection width D1 to the first structural period P1 leads to a greater area ratio of the region where the first metal layer 213 is positioned in a plane including the surface of the flat portion 212a, so that the brightness of the image visually recognized in the reflective rear-surface observation is enhanced and the color in the reflective front-surface observation becomes closer to black.

Accordingly, the thickness Ta of the first metal layer 213 is preferably not less than 10 nm. The ratio of the first projection width D1 to the first structural period P1 is preferably not larger than 0.75, more preferably not larger than 0.60. In the plane including the upper surfaces of the projections 212b, an occupied area ratio of the projections 212b within the first pixel 220P is preferably not larger than 50%.

On the other hand, a smaller thickness Ta of the first metal layer 213 or a smaller thickness Tb of the second metal layer 214 leads to a greater intensity of light transmitted therethrough in the transmissive front-surface observation and the transmissive rear-surface observation, so that a visually recognized image becomes clear. A larger ratio of the first projection width D1 to the first structural period P1 leads to a greater intensity of light transmitted through the display body 210.

Accordingly, the thickness Ta of the first metal layer 213 and the thickness Tb of the second metal layer 214 are preferably not larger than 200 nm, respectively. The ratio of the first projection width D1 to the first structural period P1 is preferably not less than 0.25, more preferably not less than 0.40. In the plane including the upper surfaces of the projections 212b, the occupied area ratio of the projections 212b in the first pixel 220P is preferably not less than 10%.

When the first metal layer 213 and the second metal layer 214 are formed by a single step for the film formation of a metal layer on the concavo-convex structure layer 212, metal particles flying from a film-forming source are deposited on the surface of the concavo-convex structure layer 212 at a given angle distribution. Eventually, a width Wa of the second metal layer 214 becomes slightly larger than the first projection width D1 of the projection 212b, and a minimum distance Wb between mutually adjacent second metal layers 214 becomes slightly smaller than a minimum distance We between mutually adjacent projections 212b. The peripheral portion around the projection 212b in the first metal layer 213 is thinner at a portion closer to the projection 212b due to the influence of the shadow effect of the second metal layer 214.

According to the above manufacturing method, an intermediate metal layer 214A, which is a metal layer contiguous to the second metal layer 214, is formed on the side faces of each projection 212b. The intermediate metal layer 214A forms an integrated structure with the second metal layer 214, and the thickness on the side faces of the projection 212b is smaller at a portion closer to the first metal layer 213.

In the first pixel 220P, the refractive index of such an intermediate meal layer 214A continuously changes in the thickness direction of the top region 219 and the intermediate region 218 since the first structural period P1 is a sub-wavelength period. The intermediate metal layer 214A is unlikely to reflect light incident from the outside of the display body to the top region 219 and is likely to be transmitted to the intermediate region 218 and the base region 217. Therefore, according to the reflective front-surface observation, a color closer to black is visually recognized in the first display region 220.

When the difference in refractive index between a dielectric layer, i.e. an air layer between the second metal layers 214, and the second metal layer 214 is smaller, the averaged refractive index of the top region 219 acts more likely to suppress Fresnel reflection at the interface between the top region 219 and the air layer on the top region 219. On the other hand, as the difference in refractive index between the projection 212b and the first metal layer 213 is greater, the averaged refractive index of the base region 217 acts more likely to promote Fresnel reflection at the interface between the base region 217 and the flat portion 212a.

Accordingly, if the configuration is such that the first metal layer 213 and the second metal layer 214 have the same refractive index with each other and a difference in refractive index between the projection 212b and the first metal layer 213 is larger than a difference in refractive index between the above dielectric layer and the second metal layer 214, Fresnel reflection at the interface between the top region 219 and the air layer can be suppressed and Fresnel reflection at the interface between the base region 217 and the flat portion 212a can be promoted.

It will be noted that if the first pixel 220P is not provided with such various configurations as set out above so as to appropriately suppress Fresnel reflection at the interface between the top region 219 and the air layer on the top region 219, the emission of diffracted light from the first pixel 220P is suppressed due to the period of the projections 212B in the first pixel 220P being a subs-wavelength period, and plasmon resonance in turn occurs in the plasmon structure layer 215. Accordingly, since the diffracted light from the first pixel 220P is suppressed from being emitted to the front surface side of the display body 210 in the state where light is irradiated from the outside of the display body 210 toward the front surface 210F, there can be realized the first display region 220 wherein the color change depending on a change in observation angle is small.

Modification Examples of the Shape and Arrangement of Projections 212b

Figure 37:
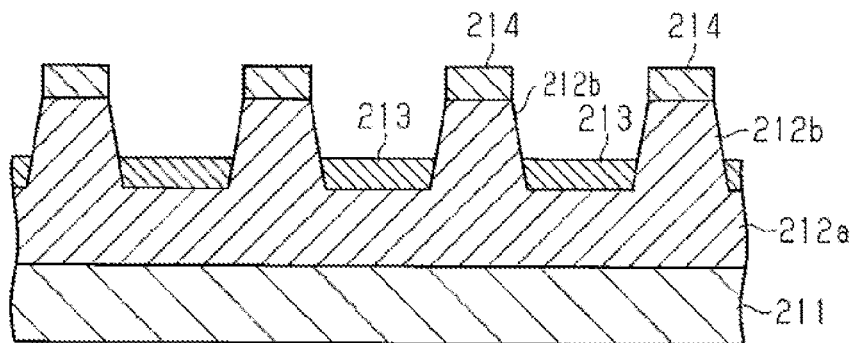
FIG. 37 is a sectional view showing a further example of the sectional structure of the display body in the fourth embodiment.

As shown in FIG. 37, the shape of the projection 212b may be a truncated pyramid, or may be in the form of a pyramid whose top portion is made flat. In this case, the width of the projection 212b in a direction across the surface of the substrate 211 is gradually reduced in a direction from the rear surface 210R of the display body 210 toward the front surface 210F, and one side length of a square base portion of the projection 212b is a projection width. In such a structure, demolding of the intaglio plate used to form the projections 212b can be smoothly carried out upon the formation of the projections 212b. The projection 212b may be frustoconical or columnar in shape, or may be such a shape having no flat face at the tip thereof such as a pyramid or a circular cone.

In the first pixel 220P, the arrangement of the projections 212b as viewed from a direction perpendicular to the front surface 210F of the display body 210 may not be limited to a square arrangement, but may be a two-dimensional lattice. The square arrangement is one wherein the projections 212b are arranged along each of two intersecting directions within the two-dimensional plane. The two-dimensional lattice arrangement includes, aside from the square arrangement, an arrangement wherein the projections 212b are arranged along the respective directions intersecting at angles different from 90° in the two-dimensional plane. In the first pixel 220P, the concavo-convex structure layer 212, the first metal layer 213 and the second metal layer 214 may have such a structure that plasmon resonance occurs in the plasmon structure layer 215 made of these layers.

Figure 38:
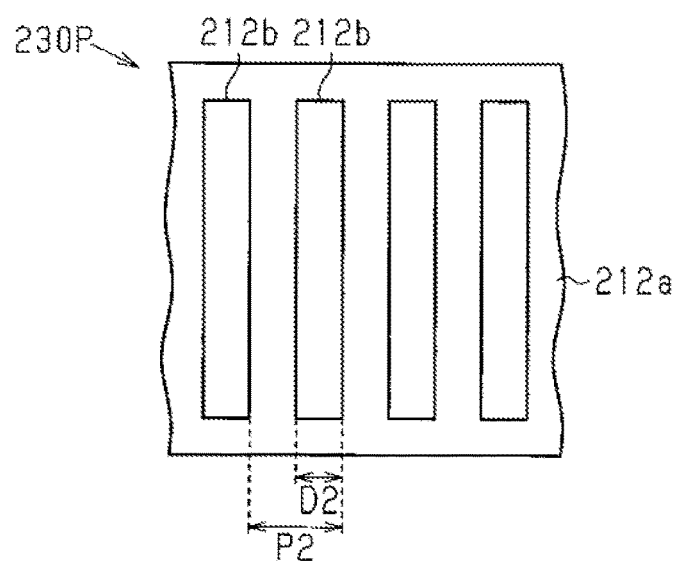
FIG. 38 is a plan view showing another example of an arrangement of projections in a second pixel of the display body in the fourth embodiment

As shown in FIG. 38, in the second pixel 230P, the arrangement of the projections 212b as viewed in a direction perpendicular to the front surface 210F of the display body 210 may not be limited the two-dimensional lattice, but may be an arrangement wherein a plurality of projections 212b extending in strips in one direction are arranged at equal intervals. In this case, the length of the projection 212b in a direction intersecting with the extending direction of the projection 212b is a second projection width D2. In short, in the second pixel 230P, the projections 212b may be arranged such that the diffraction grating layer 216 made of the concavo-convex structure layer 212, the first metal layer 213 and the second metal layer 214 constitutes a diffraction grating capable of diffracting light in the visible region.

Other Modification Examples

Figure 39:
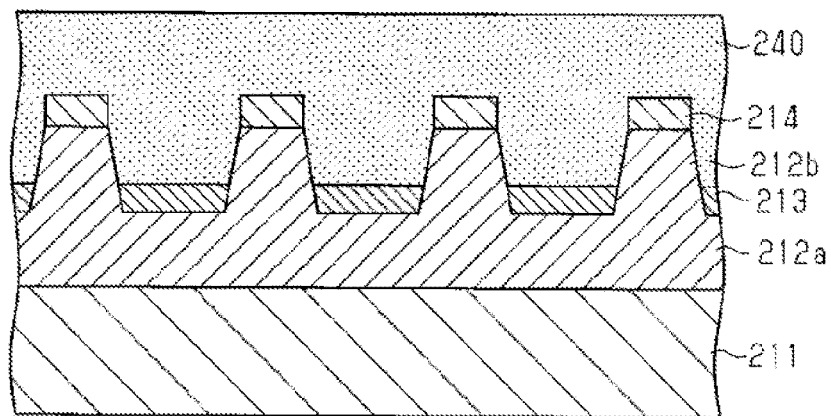
FIG. 39 is a sectional view showing another example of the sectional structure of the display body in the fourth embodiment.

As shown in FIG. 39, the display body 210 may include, in at least one of the first pixel 220P and the second pixel 230P, a protective layer 240 covering the structure made of the concavo-convex structure layer 212, the first metal layer 213 and the second metal layer 214. More particularly, a dielectric different from air may be positioned in the region between the projections 212b and also in the region between the second metal layers 214. The protective layer 240 is constituted, for example, of a low refractive index resin. The protective layer 240 formed of a low refractive index resin has a refractive index that is closer to the refractive index of an air layer than to the refractive index of the projection 212b.

The display body 210 may include, in the first pixel 220P, a multilayer film layer covering the plasmon structure layer 215 at the front surface side relative to the structure. The multilayer film layer is a laminate of a plurality of thin films made of materials that are transparent to visible light and causes multilayer film interference to occur. The refractive indexes of the plurality of thin films are mutually different from one another. When light is irradiated from the outside of the display body 210 toward the front surface 210F, light in the specific wavelength region reflected at the interfaces of the respective thin films is intensified with the interference and emitted to the front surface side. In the first pixel 220P, the first-order diffracted light toward the front surface side is suppressed from occurring and plasmon resonance occurs, so that light in a wavelength region different from the light of the wavelength region intensified with the multilayer film is suppressed from being emitted to the front surface side. Therefore, a color of a hue corresponding to the wavelength region intensified with the multilayer film is brightly seen in the first pixel 220P.

In such a configuration as stated above, while the color in the second display region 230 looks greatly changed depending on a change in observation angle in the reflective front-surface observation, the color visually recognized in the first region 220 is a color corresponding to the wavelength region intensified with the multilayer film and the change of this color depending on a change in observation angle is smaller when compared with the second display region 230. Accordingly, the first display region 220 and the second display region 230 enable realization of regions that are mutually different from each other with respect to the degree of color change depending on a change in observation angle.

The wavelength region intensified with the multilayer film layer is adjustable by the layer configuration of the multilayer film, so that a color other than black can be visually recognized in a region whose color change depending on a change in observation angle is small, thereby enabling representation of a variety of images.

The first metal layer 213 and the second metal layer 214 may be mutually contiguous to provide one metal layer. More particularly, the metal layer may entirely cover the concavo-convex structure layer 212 across the surface of the concavo-convex structure layer 212. In short, the metal layer including the first metal layer 213 and the second metal layer 214 may have, as an entire layer, a shape that follows the surface profile of the concavo-convex structure layer 212. In other words, the metal layer may have such a shape that the portions projected toward the front surface side are arranged in dots along the arrangement of the projections 212b.

The concavo-convex structure layer 212 of the first display region 220 and the concavo-convex structure layer 212 of the first display region 230 may be formed in different steps, respectively. The first metal layer 213 and the second metal layer 214 may be formed in different steps, respectively. In this case, the first metal layer 213 and the second metal layer 214 may be formed of different types of materials.

The substrate 211 and may be integrally formed with the concavo-convex structure layer 212. Alternatively, the concavo-convex structure layer 212 may not be provided with the flat portion 212a and the projections 212b may be projected from the surface of the substrate 211.

As stated above, in the fourth embodiment, light of the specific wavelength is emitted from the display body as reflected or transmitted light due to plasmon resonance. The wavelength region of the transmitted or reflected light is determined depending on the position and size of the periodic elements of the respective projections 212b and also due to a plurality of factors including the metal layers whose position is determined by the respective periodic elements. Thus, the degree of freedom of adjusting the transmitted or reflected wavelength region can be enhanced with the display body.

In the meantime, there has been recently proposed a display body having regions whose appearances differ from each other so as to more enhance counterfeiting difficulty and design properties. For example, there has been proposed a display body that has a structure including a hologram-forming layer having fine irregularities and an ink layer stacked on part of the layer by printing. Such a display body has a region wherein a hologram color is visually recognized, i.e. a region wherein a large color change occurs when a line-of-sight angle of an observer relative to the display body is changed, and a region wherein the ink color is visually recognized, i.e. a region wherein a color change with the change of angle is small.

In order to further improve the counterfeiting difficulty and the design properties based on the appearance of the display body, it is preferred that a finer image is formed by use of the above regions wherein the degree of color change differs depending on the change of angle. On the other hand, an ink layer that is a region wherein a layer made of an ink is positioned is formed by coating an ink by a variety of printing methods, so that limitation is placed on the control of the peripheral position of an ink region as viewed from a direction perpendicular to the surface of the display body.

Accordingly, there has been demanded a display body that is able to realize regions, in which the degrees of color change with the change of angle differ from each other, by using a region that enables the higher-definition control of peripheral position than the ink region. In this way, the provision of a display body capable of enhancing the function developed by the appearance of the display body is an object of the fourth embodiment as well. According to the fourth embodiment, there can be obtained such effects enumerated below and including the effects on the problems set forth above.

(4-1) The first display region 220 and the second display region 230, which are, respectively, regions wherein the degrees of color change with a change in observation angle differ from each other, can be realized by a difference in magnitude of the period between the projections 212b of the concavo-convex structure layer 212. The peripheries of these regions are defined by the position of the projections 212b, and the projections 212b of the first display region 220 are arranged in a sub-wavelength period and the peripheral position can be more finely set than with the case of the region formed by printing of an ink. Therefore, a finer image can be formed by use of the first display region 220 and the second display region 230, and the counterfeiting difficulty and design properties of products attached with the display body 210 can be enhanced. In other words, the function developed by the appearance of the display body 210 can be enhanced.

When light is irradiated from the outside of the display body 210 toward the front surface 210F, images having mutually different hues, saturations and brightnesses are visually recognized by the reflective front-surface observation and the transmissive rear-surface observation, respectively. When light is irradiated from the outside of the display body 210 toward the rear surface 210R, images having mutually different hues, saturations and brightnesses are visually recognized by the transmissive front-surface observation and the reflective rear-surface observation, respectively. In this way, different images are visually recognized for the case where the display body is observed from the front surface side and for the case where observed from the rear surface side, respectively. Thus, counterfeiting difficulty and design properties are enhanced with respect to products to which the display body 210 is attached. The front and back of the display body 210 can be easily distinguished.

(4-2) With the projections 212b of the concavo-convex structure layer 212, a smaller aspect ratio of the projection 212b leads to easier processing of the projection 212b and also to a higher processing accuracy of the projections 212b. This tendency becomes more pronounced for a smaller period of the projections 212b. In contrast, with the projections 212b of the second pixel 230P among the projections 212b of the concavo-convex structure layer 212, a higher height of projection 212b leads to a higher light diffraction efficiency. Hence, with the case of the configuration wherein the first projection height H1 is larger than the second projection height H2, while the aspect ratio is made small so as to ensure the processing accuracy in the first pixel 220P wherein the period is relatively small and the concavo-convex structure layer 212 is a structure for causing plasmon resonance to occur, the projection height is made high so as to enable the diffraction efficiency to be enhanced in the second pixel 230P wherein the period is relatively large and the concavo-convex structure layer 212 is a structure for causing the light diffraction to occur.

(4-3) Since the projections 212b project from the flat portion 212a, the flat portion 212a has the function of supporting the projections 212b included in the first display region 220 and the function of supporting the projections 212b included in the second display region 230. Accordingly, the projections 212b can be appropriately suppressed from being collapsed. The structure supporting the projections 212b located in the respective regions is the flat portion 212a, so that it is possible to simplify the structure required to suppress the projections 212b from being collapsed.

(4-4) The plurality of projections 212b are formed by pressing a resin coated onto the surface of the substrate 211 against an intaglio plate and curing the resin, by which the concavo-convex structure layer 212 having the first region and the second region is formed. Thereafter, the metal layer is formed on the concavo-convex structure layer 212. On this occasion, the projections 212b positioned in the first region are formed in a two-dimensional lattice having a sub-wavelength period so that the portion of the metal layer positioned on the first region and the projections 212b of the first region are configured to provide a structure causing plasmon resonance to occur. The projections 212b located in the second region is formed at a period greater than the period of the projections 212b in the first region so that the portion of the metal layer located on the second region and the projections 212b of the second region are configured to provide a diffraction grating of diffracting visible region light. According to such a manufacturing method as set out above, there can be manufactured a display body 210 having regions that mutually differ from each other with respect to the degree of color change with a change in observation angle, and the concavo-convex structure layer 212 having fine projections and recesses can be conveniently formed.

(4-5) According to the manufacturing method of forming the projections 212b of the first region and the projections 212b of the second region at the same time, the projections 212b of the first pixel 220P and the projections 212b of the second pixel 230P are simultaneously formed. When using this manufacturing method, the display body 210 can be more efficiently manufactured when compared with a manufacturing method of forming the projections 212b of the first pixel 220P and the projections 212b of the second pixel 230P by different steps. The boundary between the first display region 220 arranged with the first pixel 220P and the second display region arranged with the second pixel 230P can be more precisely formed.

Fifth Embodiment

Referring to FIGS. 40 to 45, a description will be given of the fifth embodiment of a display body that is an example of an optical device and also of a method for manufacturing the display body.

The configurations of a first pixel and a second pixel of a display body according to the fifth embodiment are similar to those of the fourth embodiment, respectively. In this regard, however, the second display region of the fifth embodiment includes second pixels that differ from each other with respect to at least one of the arrangement direction of projections and the period of the projections. Here, the difference between the fifth embodiment and the fourth embodiment is mainly illustrated, and parts or portions similar to those of the fourth embodiment are denoted by similar reference numerals and their illustration is omitted.

Example of Different Arrangement Directions of Projections

Figure 40:
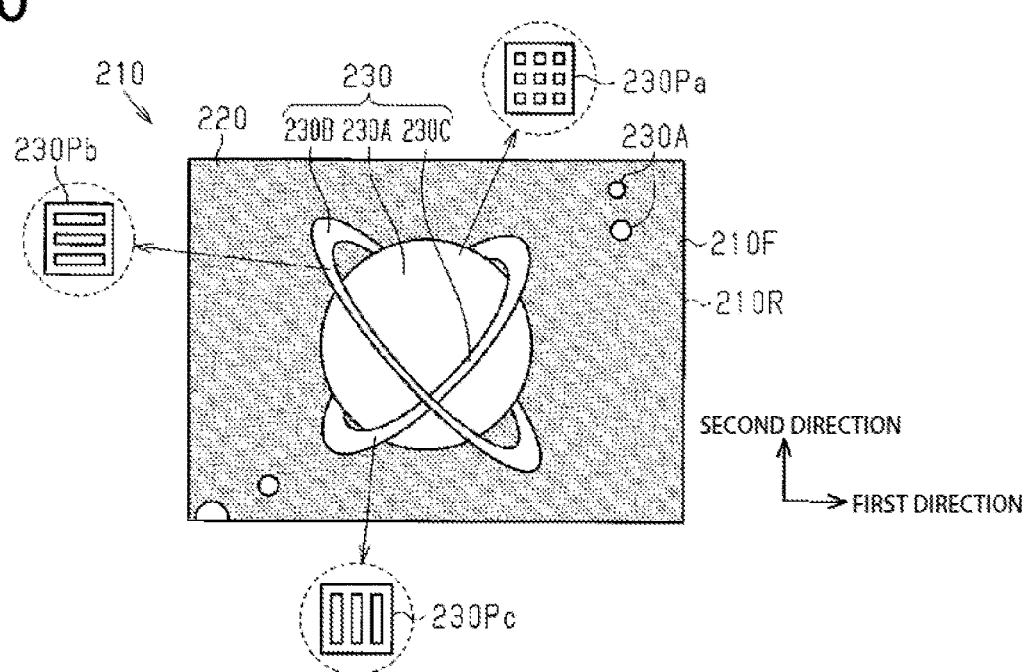
FIG. 40 is a plan view showing a planar structure in an example of a fifth embodiment of a display body.
Figure 41A:
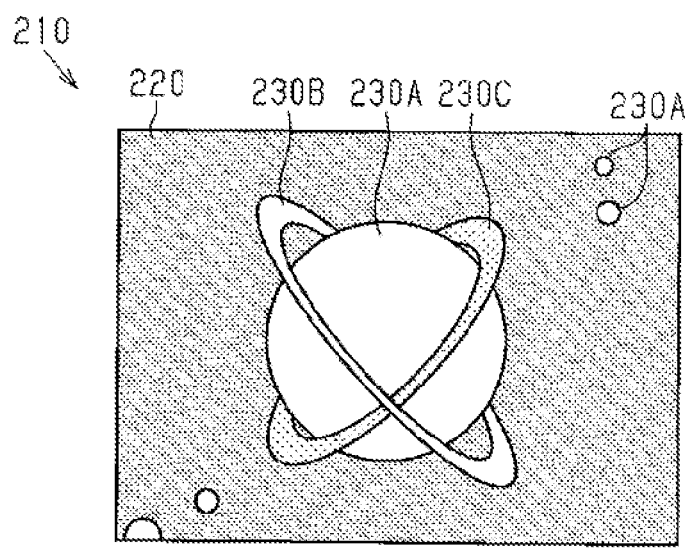
FIG. 41A is a view showing the operation of the display body of the fifth embodiment wherein there is shown a part of a process of change in the image visually recognized in an example of the display body.
Figure 41B:
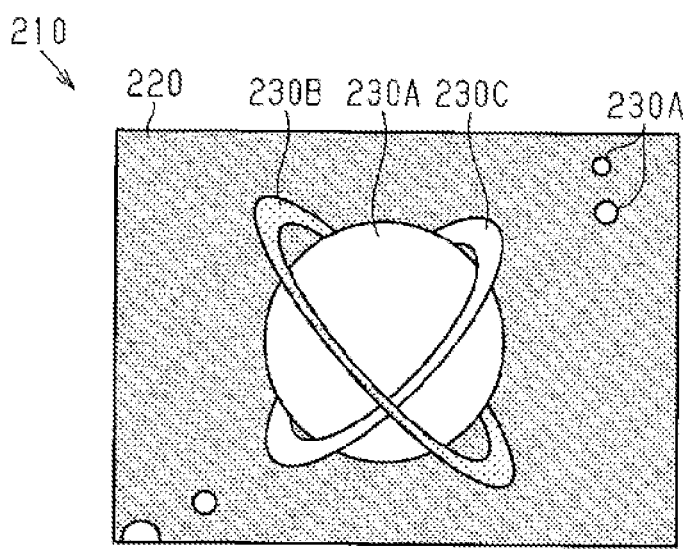
FIG. 41B is a view showing the operation of the display body of the fifth embodiment wherein there is shown a part of a process of change in the image visually recognized in the example of the display body.

With reference of FIG. 40 and FIGS. 41A and 41B, an example including second pixels whose arrangement directions of projections differ from each other is illustrated.

As shown in FIG. 40, as viewed in a direction perpendicular to the front surface 210F, a second display region 230 includes a first sub-region 230A, a second sub-region 230B and a third sub-region 230C.

Projections 212b of a second pixel 230Pa positioned in the first sub-region 230A are arranged in a two-dimensional lattice as viewed in a direction perpendicular to the front surface 210F as is shown in FIG. 33 for the fourth embodiment.

Projections 212b of a second pixel 230Pb positioned in the second sub-region 230B have a plurality of strips arranged at equal intervals and extending in one direction as viewed in a direction perpendicular to the front surface 210F as shown in FIG. 38 for the fourth embodiment.

Projections 212b of a second pixel 230Pc positioned in the third sub-region 230C have a plurality of strips arranged at equal intervals and extending in one direction as view from a direction perpendicular to the front surface 210F wherein the plurality of the strips are arranged in a direction different from the arrangement direction of the projections 212b of the second pixel 203Pb.

For example, the projections 212b of the second pixel 230Pa are arranged along a first direction and also along a second direction perpendicular to the first direction. The projections 212b of the second pixel 230Pb extend along the first direction and are arrayed along the second direction. The projections 212b of the second pixel 230Pc extend along the second direction and are arranged along the first direction. More particularly, the arrangement direction of the projections 212b of the second pixel 230Pb and the arrangement direction of the projections 212b of the second pixel 230Pc are perpendicular to each other.

The second pixel 230Pa of the first sub-region 230A has a low dependence on the arrangement direction of the projections 212b. As to the direction of incident light as viewed in a direction perpendicular to the front surface 210F, i.e. the direction of incident light that is projected on a plane across the front surface 210F, the range of direction of the incident light, with which the second pixel 230Pa is able to emit diffracted light, is wide. The diffracted light is emitted to a direction in response to the direction of the incident light, so that when light including incident light from various directions is irradiated to the front surface 210F of the display body 210, light emitted from the second pixel 230Pa includes diffracted light emitted toward various directions.

On the other hand, as to the direction of incident light that is projected on a plane across the front surface 210F, the second pixel 230Pb of the second sub-region 230B and the second pixel Pc of the third sub-region 230C emit diffracted light to a specific range of direction relative to the incident light from a specific range of direction depending on the arrangement direction of the projections 212b. Accordingly, when light including incident light from various directions is irradiated to the front surface 210F of the display body 210, the emission direction of diffracted light in the second pixel 230Pb and the emission direction of diffracted light in the second pixel 230Pc differ from each other.

When an observer is positioned ahead of the emission direction of diffracted light from the second pixel 230Pa, the first sub-region 230A looks bright. When an observer is positioned ahead of the emission direction of diffracted light from the second pixel 230Pb, the second sub-region 230B looks bright. Likewise, when an observer is positioned ahead of the emission direction of diffracted light from the second pixel 230Pc, the third sub-region 230C looks bright. When the individual regions look bright, the respective regions appear iridescently shiny, or appear greatly changed in color with a change in observation angle.

As a result, in the case where the front surface 210F is observed form the front surface side in the state where external light is irradiated from the front surface 210F of the display body 210, the second sub-region 230B and the third sub-region 230C look bright or dark depending on the positional relationship between these regions and an observer and the direction and intensity of light included in the external light. More particularly, when the display body 210 is moved relative to an observer in such a way that the display body 210 is rotated in a direction across the front surface 210F or the angle of the display body 210 is changed relative to the horizontal plane, the brightness of the second sub-region 230B and the brightness of the third sub-region 230C look changed, respectively. Since the second pixel 230Pb and the second pixel 230Pc differ in the arrangement direction of the projections 212b, such states may occur including states where the second sub-region 230B and the third sub-region 230C both look dark, the second sub-region 230B looks bright and the third sub-region looks dark, the second sub-region 230B looks dark and the third sub-region 230C looks bright, and the second sub-region 230B and the third sub-region 230C both look bright.

In contrast, when the display body 210 is moved relative to an observer, the first sub-region 230A looks bright in a wider range than the second sub-region 230B and the third sub-region 230C.

Accordingly, when using the first sub-region 230A, the second sub-region 230B and the third sub-region 230C, there can be formed an image that is greatly changed in response to the position and viewing angle of an observer relative to the display body 210.

For instance, when the display body 210 shown in FIG. 40 is moved relative to an observer, it may occur that the image visually recognized in the front surface 210 of the display body 210 is changed from the state where the first sub-region 230A and the second sub-region 230B look bright and the third sub-region 230C looks dark as shown in FIG. 41A to the state where the first sub-region 230A and the third sub-region 230C look bright and the second sub-region 230B looks dark as shown in FIG. 41B. Accordingly, a star is represented by the first sub-region 230A and rings around the star are represented by the second sub-region 230B and the third sub-region 230C, respectively, under which there can be provided, to an observer, an image that looks such that the shiny rings are changed.

The combination of the second display region 230 including the second pixels 230P that differ from each other with respect to the arrangement direction of the projections 212b and the first display region 220 enables the change of an image in the second display region 230 to be highlighted. For instance, in an example wherein the second display region 230 is surrounded with the first display region 220, the first region 220 wherein the color change with a change in observation angle is small is positioned around the second display region 230, so that when the display body 210 is moved, the change of an image in the second display region 230 is emphasized. Accordingly, the counterfeiting difficulty and design properties of products attached with the display body 210 can be more enhanced.

It will be noted that the number of regions whose arrangement directions of the projections 212b differ from one another is not specifically limited. The second display region 230 may further include, aside from the second sub-region 230B and the third sub-region 230C, a region wherein the arrangement direction of the projections 212b differ from those of these regions. The second display region 230 may include the second sub-region 230B and the third sub-region 230C alone and may not include the first sub-region 230A wherein the projections 212b are arranged in a two-dimensional lattice.

Example of Difference in Projection Period

Referring to FIGS. 42 to 45, an example is illustrated wherein the second display region includes second pixels wherein the projection periods differ from each other.

As shown in FIG. 42, as viewed from a direction perpendicularly facing the front surface 210F, the second display region 230 includes a fourth sub-region 230D, a fifth sub-region 230E, a sixth sub-region 230F and a seventh sub-region 230G.

The second structural period P2 of the projections 212b positioned in the respective sub-regions 230D to 230G differ in every sub-region. The period of the projections 212b of a second pixel 230Pd positioned in the fourth sub-region 230D is a second structural period P2d, and the period of the projections 212b of a second pixel 230Pe positioned in the fifth sub-region 230E is a second structural period P2e. The period of the projections 212b of a second pixel 230Pf positioned in the sixth sub-region 230F is a second structural period P2f, and the period of the projections 212b of a second pixel 230Pg positioned in the seventh sub-region 230G is a second structural period P2g.

The second structural period P2d, the second structural period P2e, the second structural period P2f and the second structural period P2g increase in this order. It will be noted that the projections 212b in the respective sub-regions 230D to 230G may be arranged in a two-dimensional lattice, or may be in the form of strips arranged at equal intervals and extending in one direction.

As shown in FIG. 43, in the case where an incidence angle α of incident light is constant in the diffraction grating layer 216, a greater second structural period P2 results in a greater diffraction angle β, which is an emission angle of diffracted light. More particularly, the following equation (1) holds among incidence angle α, diffraction angle β, lattice period d, diffraction order n and diffraction wavelength λ. It will be noted that the grating period d means the second structural period P2.

$$d(\sin \alpha - \sin \beta) = n\lambda \qquad (1)$$

When the second structural period P2 is 1.0 μm, for example, under conditions where incident light is white and an incidence angle α is 45°, diffracted light is emitted within a diffraction angle range of about 0° to about 20°. Under the same conditions, when the second structural period P2 is 1.5 μm, the diffraction angle β is from about 18° to about 30°, when the second structural period P2 is 2.0 μm, the diffraction angle β is from about 25° to about 35°, and when the second structural period P2 is 3.0 μm, the diffraction angle β is from about 35° to about 40°.

If an observer is positioned ahead of an emission direction of diffracted light, the region where the second pixel 230P emitting the diffracted light is positioned looks bright. Accordingly, with such a configuration that the second structural periods P2 of the projections 212b positioned in the respective sub-regions 230D to 230G differ from one another, when an observation angle θ, which is an angle formed between the front surface 210F and an eyesight direction of the observer, are changed, the sub-regions 230D to 230G looking bright are changed as shown in FIGS. 44(a) and 44(b).

For example, when α=45°, P2d=1.0 μm, P2e=1.5 P2f=2.0 μm and P2g=3.0 μm, the sub-regions 230D to 230G, which emit diffracted light having the diffraction angle β satisfying 90°−θ=β at an observation angle of θ, look bright. For example, when the observation angle θ is gradually decreased, as shown in FIG. 44B, from the state where the observation angle θ is 90° as shown in FIG. 44A, i.e. from the state where an observer sees the front surface 210F from a direction perpendicular to the front surface 210F of the display body 210, the regions looking bright are changed in the order of the fourth sub-region 230D, the fifth sub-region 230E, the sixth sub-region 230F and the seventh sub-region 230G.

Figure 45A:
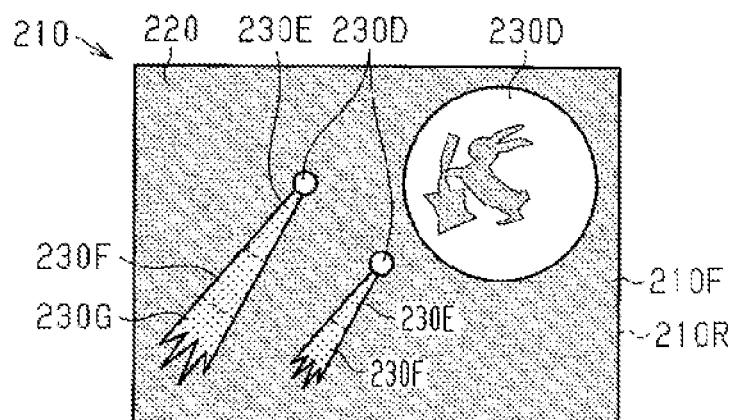
FIG. 45A is a view showing the operation of the display body of the fifth embodiment wherein there is shown a part of a process of change in the image visually recognized in an example of the display body.
Figure 45B:
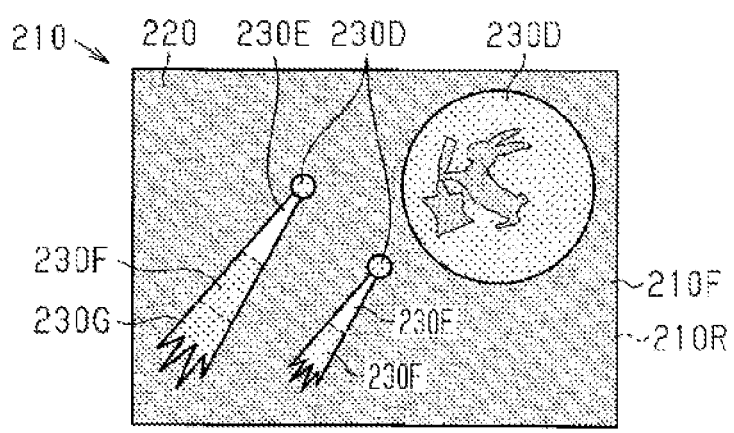
FIG. 45B is a view showing the operation of the display body of the fifth embodiment wherein there is shown a part of a process of change in the image visually recognized in the example of the display body.
Figure 45C:
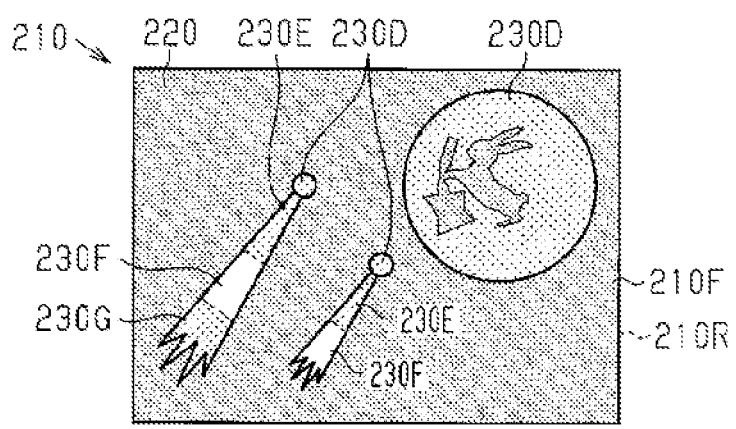
FIG. 45C a view showing the operation of the display body of the fifth embodiment wherein there is shown a part of a process of change in the image visually recognized in the example of the display body.
Figure 45D:
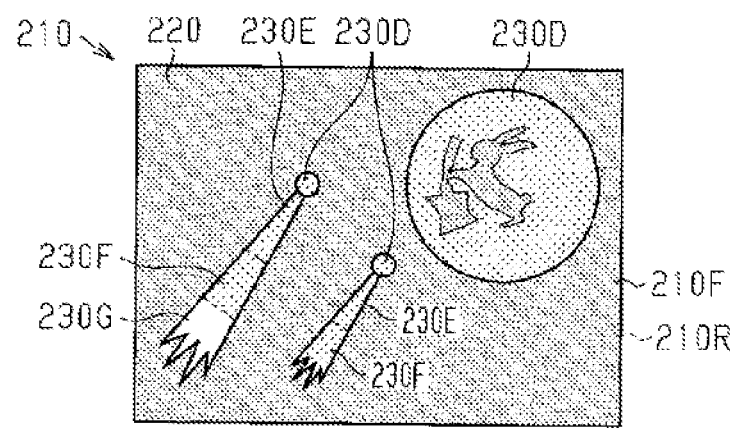
FIG. 45D a view showing the operation of the display body of the fifth embodiment wherein there is shown a part of a process of change in the image visually recognized in the example of the display body.

For example, when the observation angle θ is changed by moving the display body 210 shown in FIG. 42 relative to the observer, the regions undergo successive changes in the order of states including a state where the fourth sub-region 230D looks bright and the fifth sub-region 230E, the sixth sub-region 230F and the seventh sub-region 230G look dark as shown in FIG. 45A, a state where the fifth sub-region 230E looks bright and the fourth sub-region 230D, the sixth sub-region 230F and the seventh sub-region 230G look dark as shown in FIG. 45B, a state where the sixth sub-region 230F looks bright and the fourth sub-region 230D, the fifth sub-region 230E and the seventh sub-region 230G look dark as shown in FIG. 45C, and a state where the seventh sub-region 230G looks bright and the fourth sub-region 230D, the fifth sub-region 230E and the sixth sub-region 230F look dark as shown in FIG. 45D. Accordingly, an image looking as if a meteor flows can be provided to an observer by successively changing a shiny portion from a star represented by the fourth sub-region 230D to the tails of the star successively represented by the fifth sub-region 230E, the sixth sub-region 230F and the seventh sub-region 230G in this order.

Moreover, the combination of the second display region 230 including the second pixels 230P whose periods of the projections 212b differ from each other and the first display region 220 enables an image change in the second display region 230 to be emphasized. For instance, in a configuration where the second display region is surrounded with the first display region 220, the first region 220 wherein the color change with a change in observation angle is small is positioned around the display region 230, so that when the display body 210 is moved, an image change in the second display region 230 is emphasized. Accordingly, the counterfeiting difficulty and design properties of products attached with the display body 210 can be more enhanced.

It will be noted that the number of the regions whose periods of the projections 212b differ from one another is not specifically limited. The above-stated two configurations may be combined together. More particularly, the second display region 230 may include the second pixels 230P wherein the arrangement directions of the projections 212b differ from each other and the second pixels 230P wherein the periods of the projections 212b differ from each other. According to such a configuration, when the display body 210 is moved, an image change in the second display region 230 becomes more complicated, so that the counterfeiting difficulty and design properties can be more enhanced.

As stated above, in the fifth embodiment, light in specific wavelength region is emitted as reflected or transmitted light from the display body due to plasmon resonance. The wavelength region of the transmitted light or the reflected light is determined depending on the position and size of the periodic elements of the respective projections 212b and a plurality of factors including the metal layer whose position is determined depending on the respective periodic elements, so that the degree of freedom of adjusting the wavelength region transmitted or reflected in the display body, Like the fourth embodiment, the provision of a display body capable of enhancing the function developed by the appearance of the display body is also an object of the fifth embodiment. According to the firth embodiment, there can be obtained, aside from those effects (4-1) to (4-5) of the fourth embodiment, the effects enumerated below and including the effects on such problems as set out above.

(5-1) In such a configuration that a plurality of second pixels 230P wherein the arrangement directions of the projections 212b differ from each other are included in the second display region 230, when using a system of moving the display body 210 relative to an observer, the light and dark of the positioning regions of the second pixels 230P, in which the arrangement directions of the projections 212b differ from each other, look as if changed separately. When using this second display region 230, there can be formed an image that is greatly changed depending on the change in position and angle of an observer relative to the display body 210. Moreover, the combination of the first display body 220 and the second display body 230 enables an image change in the second display region 230 to be emphasized, thus leading to more enhanced counterfeiting difficulty and design properties.

(5-2) In such a configuration that a plurality of second pixels 230P wherein the arrangement directions of the projections 212b differ from each other are included in the second display region 230, when using an observation system wherein an observation angle is changed, the light and dark of the positioning regions of the second pixels 230P, in which the arrangement directions of the projections 212b differ from each other, look as if changed separately. Accordingly, there can be formed an image that is greatly changed depending on a change in observation angle by the use of the second display region 230. Moreover, the combination of the first display body 220 and the second display body 230 enables an image change in the second display region 230 to be emphasized, thus leading to more enhanced counterfeiting difficulty and design properties.

It will be noted that in the fourth and fifth embodiments, the display element included in the first display region 220 and the display element included in the second display region 230 may not be limited to an element that is a minimum repetition unit for forming a raster image, but also may be a region wherein anchors for forming a vector image is formed are connected, respectively. As described in the modification examples of the second embodiment, the periodic element of the periodic structure may be a recess depressed from the reference plane wherein the surface of a support is taken as the reference plane.

The configuration of the device attached with the display body of the second embodiment may be applied to the fourth and fifth embodiments. More particularly, the device attached with the display body may be provided with the display body and the light-emitting structure of the fourth or fifth embodiment.

<Additional Note>

The measure for solving the foregoing problems embraces the following items as technical concepts derived from the fourth embodiment, the fifth embodiment and the modification examples thereof.

[Item 31]

A display body having a front surface and a rear surface and comprising a dielectric concavo-convex structure having a plurality of projections projected in a direction of from the rear surface toward the front surface, and a metal layer positioned on the surface of the concavo-convex structure and having a shape that follows a surface profile of the concavo-convex structure, wherein the display body includes a first display region in which first display elements are positioned and a second display region in which second display elements are positioned as viewed in a direction perpendicular to the front surface of the display body, the plurality of the projections in the first display elements being arranged in a two-dimensional lattice having a sub-wavelength period as viewed from a direction perpendicularly facing the front surface of the display body and making up of a structure capable of causing plasmon resonance to occur along with a portion of the metal layer making up of the first display element, and the plurality of the projections in the second display elements being arranged at a period greater than the arrangement period of the projections in the first display element and making up of a diffraction grating diffracting visible region light along with a portion of the metal layer making up of the second display element.

According to the above configuration, when light is irradiated from the outside of the display body toward the front surface of the display body, the occurrence of primary diffracted light at the front surface side of the display body is suppressed in the first display element. On the other hand, the primary diffracted light, which is generated from light incident into the structure composed of the metal layer and the concavo-convex structure layer at an angle close to the horizon relative to the surface of the display body, causes a plasmon resonance to occur. The surface plasmon induced in the structure through plasmon resonance is transmitted through the structure and is emitted, as light, to the rear surface side of the structure. In this way, since the emission of the diffracted light to the front surface side of the display body is suppressed, the color change in the first display region is small even when the observation angle, which is an angle formed between the front surface and the eyesight direction of an observer, is changed. On the other hand, the diffracted light in the diffraction grating is emitted from the second display region to the front surface side of the display body, for which the color of the second display region appears to change greatly with a change in observation angle.

As stated above, the difference in the magnitude of the arrangement period of the projections in the concavo-convex structure layer enables the first display region and the second display region, which differ from each other with respect to the degree of color change with a change in observation angle, to be realized. The outer peripheries of these regions are defined by the positions of the projections. The projections of the first display region are arranged in a sub-wavelength period and the position of the outer periphery can be more finely set when compared with the region formed by ink printing. Accordingly, a finer image can be formed by use of the first display region and the second display region. Thus, the counterfeiting difficulty and design properties, i.e. the function developed by the appearance of the display body, can be enhanced.

[Item 32]

The display body as recited in Item 31, wherein the height of the projection in the second display element is higher than the height of the projection in the first display element.

With the projections of the concavo-convex structure layer, a smaller aspect ratio of the projection leads to easier processing of the projections and also to higher processing accuracy of the projections. This tendency becomes more pronounced at a smaller period of the projections. In contrast, with the projections of the second display element among the projections of the concavo-convex structure layer, the height of the projection gives an influence on the diffraction efficiency. Where the projection height is low, there is some concern that the diffraction efficiency of light becomes low, thereby worsening the visibility of diffracted light. In this regard, according to the above configuration, as to the first display element which has such a structure that the period is relatively small and the concavo-convex structure layer causes a plasmon resonance to occur, when the height of the projection is made low, an aspect ratio can be easily made small and high processing accuracy can be likely to be obtained. On the other hand, with the second display element which has such a structure that the period is relatively great and the concavo-convex structure layer is one causing the diffraction of light to occur, when the height of the projection is made high, the diffraction efficiency can be increased.

[Item 33]

The display body as recited in Item 31 or 32 wherein the first display element is such that an area ratio occupied by the projections within the first display element in a plane including the upper surfaces of the projections ranges from not less than 10% to not larger than 50%.

According to such a configuration as described above, since the area ratio in the first display region is not larger than 50%, the observation of transmitted light by reflective observation from the front surface side is suppressed. Further, since the area ratio is not less than 10%, the visibility of an image by transmissive observation from the front and rear surface sides is ensured.

[Item 34]

The display body as recited in any one of Items 31 to 33, further comprising a substrate having a surface supporting the concavo-convex structure layer wherein the concavo-convex structure layer has a flat portion shaped to extend across the surface of the substrate and the projections project from the flat portion.

According to the above configuration, the flat portion has a function of supporting the projections included in the first display region and a function of supporting the projections included in the second display region. Accordingly, collapse of the projections can be adequately prevented. The structure for supporting the projections in the respective regions is the flat portion, so that it is possible to simplify a structure required for preventing the collapse of the projections.

[Item 35]

The display body as recited in any one of Items 31 to 34, wherein the second display region includes a plurality of the second display elements wherein the arrangement directions of the projections differ from one another.

According to the above configuration, brightness and darkness of the individual second display elements in the second display region appear to change separately in an observation system wherein the display body is moved relative to an observer. Accordingly, an image whose change with a change in position and angle of the observer relative to the display body is great can be formed using the display body. Moreover, the combination of the first display region and the second display region enables an image change in the second display region to be emphasized, so that the function developed by the appearance of the display body can be more enhanced.

[Item 36]

The display body as recited in any one of Items 31 to 35, wherein the second display region includes a plurality of the second display elements wherein the arrangement periods of the projections differ from each other.

According to the above configuration, brightness and darkness of the individual second display elements in the second display region appear to change separately in an observation system wherein an observation is carried out by changing an observation angle. Accordingly, an image whose change with a change in observation angle is great can be formed using the display body. Moreover, the combination of the first display region and the second display region enables an image change in the second display region to be emphasized, so that the function developed by the appearance of the display body can be more enhanced.

[Item 37]

A method for manufacturing a display body comprising a first step of pressing an intaglio plate against a resin coated onto a surface of a substrate and curing the resin to form a concavo-convex structure layer which has a plurality of projections made of the resin and includes a first region and a second region, and a second step of forming, on the concavo-convex structure layer, a metal layer having a shape that follows a surface profile of the concavo-convex structure layer wherein in the first step, a plurality of the projections, which are arranged in the first region in a two-dimensional lattice having a sub-wavelength period as viewed from a direction perpendicularly facing the surface of the substrate, is formed in such a way that a portion of the metal layer positioned on the first region and the projections in the first region are configured to provide a structure causing a plasmon resonance to occur, and a plurality of the projections, which are arranged in the second region at a period greater than the arrangement period of the projections in the first region, are formed so that a portion of the metal layer positioned on the second region and the projections in the second region are configured to provide a diffraction grating diffracting visible region light.

According to the above method, there can be manufactured the display body which has regions whose degrees of color change with a change in observation angle differ from each other due to the difference in magnitude of the arrangement period of the projections in the concavo-convex structure layer. Accordingly, there can be obtained the display body, which is enhanced in the function developed by the appearance of the display body. Additionally, according to the above manufacturing method, the concavo-convex structure layer having fine projections and recesses can be conveniently formed.

[Item 38]

The method for manufacturing the display body as recited in Item 37, wherein the projections of the first region and the projections of the second region are formed simultaneously in the first step.

According to the above manufacturing method, the display body can be more efficiently manufactured when compared with a manufacturing method wherein the projections of the first region and the projections of the second region are formed by different steps. Moreover, the boundary between the first region and the second region can be formed more precisely.

Sixth Embodiment

With reference to FIGS. 46 to 55, the sixth embodiment of a display body which relates to an example of an optical device and also to a manufacturing method of the display body is illustrated. Here, the difference between the sixth embodiment and the first embodiment is mainly illustrated, and parts or portions similar to those of the first embodiment are denoted by similar reference numerals and their illustration is omitted.

[Structure of display body]

Figure 46:
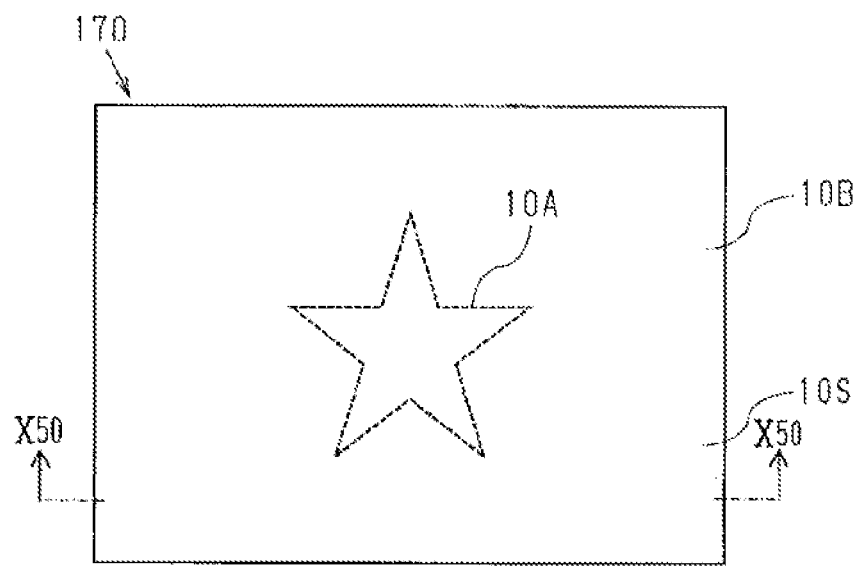
FIG. 46 is a plan view showing a planar structure in a sixth embodiment of a display body.

As shown in FIG. 46, a front surface 10S of a display body 170 is segmented into a first display region 10A and a second display region 10B. The sectional structure of the first display region 10A and the sectional structure of the second display region 10B differ from each other.

Figure 47:
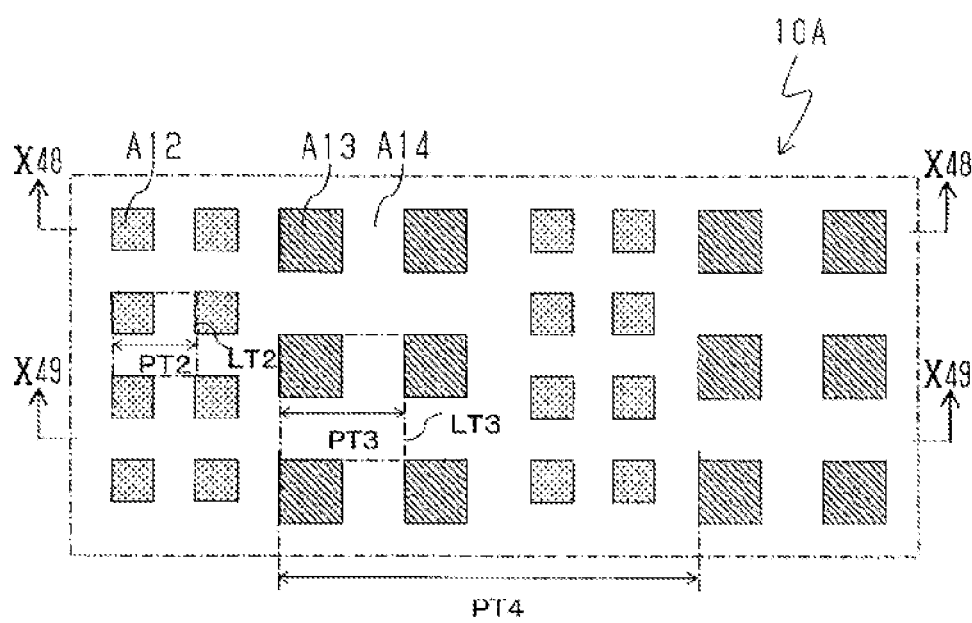
FIG. 47 is an enlarged view showing an enlarged planar structure of a first display region of the sixth embodiment.

FIG. 47 is a partially enlarged view of the first display region 10A shown in FIG. 46. As shown in FIG. 47, the first display region 10A includes a plurality of isolated regions A12, a plurality of isolated regions A13 whose size differs from that of the isolated region A12, and a single peripheral region A14 surrounding the individual isolated regions A12 and the individual isolated regions A13 as viewed in a direction perpendicular to the surface 10S of the display body 170. In FIG. 47, the respective isolated regions A12 are indicated by dots and the respective isolated regions A13 are indicated by oblique lines for the sake of illustration of the isolated regions A12 and A13.

The respective isolated regions A12 and A13 are arranged in a square arrangement across the front surface 10S. The square arrangement of the isolated regions A12 is one wherein the isolated regions A12 are positioned at the respective apexes of a square LT2 which has a structural period PT2 on one side thereof. On the other hand, the squarer arrangement of the isolated regions A13 is one wherein the isolated regions A13 are positioned at the respective apexes of a square LT3 having a structural period PT3 on one side thereof. The structural period PT2 and the structural period PT3 satisfy PT2<PT3.

It will be noted that the plurality of the isolated regions A12 are not limited to being arranged in the square arrangement, but may be arranged in a two-dimensional lattice. Likewise, the plurality of the isolated regions A13 are not limited to being arranged in the square arrangement, but may be arranged in a two-dimensional lattice. The two-dimensional lattice arrangement is one wherein elements are arranged along two directions intersecting with each other within a two-dimensional plane.

Figure 48:
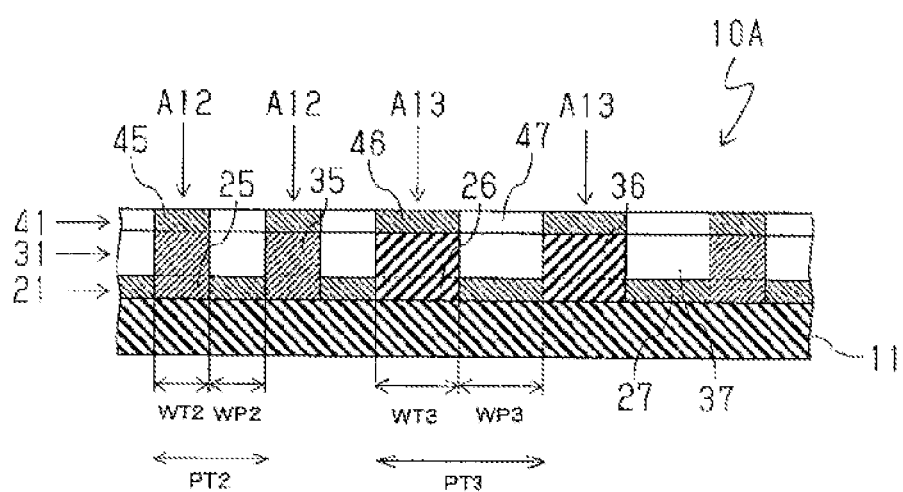
FIG. 48 is a view showing a sectional structure of the first display region of the sixth embodiment and is a sectional view taken along the line X48-X48 of FIG. 47.

As shown in FIG. 48, the display body 170 includes a support 11. The configuration of the support 11 is similar to the support 11 of the first embodiment.

The first display region 10A includes a first grating layer 21, an intermediate grating layer 31 and a second grating layer 41 in the order closer to the support 11. The intermediate grating layer 31 is sandwiched between the first grating layer 21 and the second grating layer 41, and a front surface side of the structure is a side where the first grating layer 21 is positioned relative to the support 11. In contrast, a rear surface side is one where the support 11 is positioned relative to the first grating layer 21.

[First Grating Layer 21]

The first grating layer 21 is positioned on one of the surfaces of the support 11. The first grating layer includes a plurality of first dielectric layers and a first metal layer 27, and the plurality of the first dielectric layers include a plurality of first dielectric layers that differ in width in an arrangement direction, i.e. a direction where the first dielectric layers are arranged. In the following illustration, the case where the first grating layer 21 has two types of first dielectric layers, i.e. first dielectric layers 25 and first dielectric layers 26, which differ in width in the arrangement direction is described.

As viewed in a direction perpendicular to the surface S of the display body 170, the first dielectric layer 25 is positioned in the isolated region A12. On the other hand, the first dielectric layer 26 is positioned in the isolated region A13. The first metal layer 27 is positioned in the peripheral region A14 as viewed in a direction perpendicular to the front surface 10S. The plurality of the first dielectric layers 25 are arranged in a two-dimensional lattice across the front surface 10S and the plurality of the first dielectric layers 26 are also arranged in a two-dimensional lattice across the front surface 10S.

The respective first dielectric layers 25, 26 are a structure projecting from the surface of the support 11. The respective first dielectric layers 25, 26 are integrated, for example, with the support 11. Alternatively, the respective first dielectric layers 25, 26 may have a boundary, for example, between themselves and the surface of the support 11, thus being different bodies from the support 11.

The first metal layer 27 has a mesh pattern for surrounding the individual first dielectric layers 25, 26 one by one as viewed in a direction perpendicular to the front surface 10S. In the first grating layer 21, the first single metal layer 27 is an optical sea component having free electrons throughout, and the respective first dielectric layers 25, 26 are island components distributed in the sea component.

As viewed in a direction perpendicular to the front surface 10S, the structural period PT2 positioned in the first dielectric layers 25 is the total of a shortest width WP2 between the adjacent first dielectric layers 25 and a width WT2 of the first dielectric layer 25. On the other hand, the structural period PT3 positioned in the first dielectric layers 26 is the total of a shortest width WP3 between the adjacent first dielectric layers 26 and a width WT3 of the first dielectric layer 26.

The structural period PT2 and the structural period PT3 are, respectively, a sub-wavelength period that is less than a wavelength in the visible region and satisfy the same conditions as the structural period PT of the first embodiment. More particularly, in the respective directions of the two-dimensional lattice arrangement of the isolated regions A12, A13, the ratio of the width WT2 of the first dielectric layer 25 to the structural period PT2 and the ratio of the width WT3 of the first dielectric layer 26 to the structural period PT3 are, respectively, from 0.25 to 0.75, preferably from 0.40 to 0.60.

On the one hand, as shown in the foregoing FIG. 47, when the display body 170 is macroscopically viewed, the display body 170 can be taken as a structure wherein a combined structure of the two isolated region A12 and the two isolated region A13 is repeated. The period of the positions of such a structure could be taken as a new structural period PT4, which is a combination of the structural period PT2 of the isolated regions A12 and the structural period PT3 of the isolated regions A13.

In other words, the structural period PT4 is a combined period of the structural period PT2 and the structural period PT3, which are, respectively, a sub-wavelength period. The structural period PT4 is greater than a sub-wavelength period, and structures arranged in the structural period PT4 are formed in the display body 170, so that first-order diffracted light in the visible region is emitted from the display body 170.

It will be noted that with the example shown in FIG. 47, although the structural period PT4 is configured such that the isolated regions A12 and the isolated regions A13 are, respectively, arranged two by two along one direction, the number of the isolated regions for constituting the structural period PT4 is not limited thereto. More particularly, when there are arranged a plurality of the isolated region groups each of which has a structural period that is a sub-wavelength period and which have structural periods different from one another, there is formed a period that is greater than a sub-wavelength period as a combined period of these isolated region groups. In this way, such a structure as to cause first-order diffracted light to be emitted may be formed.

Like the first embodiment, the thickness of the first grating layer is preferably from 10 nm to 200 nm, more preferably from 10 nm to 100 nm.

[Intermediate Grating Layer 31]

The intermediate grating layer 31 is positioned on the first grating layer 21. The intermediate grating layer 21 is arranged on a surface opposite to the support 11 side in the first grating layer 21. Like the first embodiment, the thickness of the intermediate grating layer 31 is larger than the thickness of the first grating layer 21 and is preferably not larger than 150 nm.

The intermediate grating layer 31 includes, for example, a plurality of first intermediate dielectric layers including a plurality of first intermediate dielectric layers 35 and a plurality of first intermediate dielectric layers 36, and a second single intermediate dielectric layer 37 having a permittivity lower than the first intermediate dielectric layers 35, 36. The respective first intermediate dielectric layers 35 are positioned in the isolated regions A12 as viewed in a direction perpendicular to the front surface 10S. On the other hand, the respective first intermediate dielectric layers 36 are positioned in the isolated regions A13 as viewed from a direction perpendicular to the front surface 10S. The single second intermediate dielectric layer 37 is positioned in the peripheral region A14 as viewed in a direction perpendicular to the front surface 10S. The plurality of the first intermediate dielectric layers 35 are arranged in a two-dimensional lattice across the front surface 10S, and the plurality of the first intermediate dielectric layers 36 are also arranged in the two-dimensional lattice across the front surface 10S.

The respective intermediate dielectric layers 35 are a structure projection from the first dielectric layer 25. Likewise, the respective first intermediate dielectric layers 36 are a structure projection from the first dielectric layer 26. The respective first intermediate dielectric layers 35 may be integrated with the dielectric layer 25 or may be a different one therefrom. The respective first intermediate dielectric layers 36 may be integrated with the first dielectric layer 26 or may be one different therefrom. As viewed in a direction perpendicular to the front surface 10S, the positioning period of the first intermediate dielectric layers 35 is the total of the shortest width WP2 and the width WT2 and is thus the afore-indicated structural period PT2 like the first dielectric layers 25. Likewise, the positioning period of the first intermediate dielectric layers 36 is the total of the shortest width WP3 and the width WT2 and is thus the afore-indicated PT3. In the respective directions of the two-dimensional lattice arrangement of the isolated regions A12, A13, the ratio of the width WT2 of the first intermediate dielectric layer 35 to the structural period PT2 and the ratio of the width WT3 of the first intermediate dielectric layer 36 to the structural period PT3 are, respectively, from 0.25 to 0.75, and are preferably from 0.40 to 0.60.

The second intermediate dielectric layer 37 has a mesh pattern for surrounding the individual first intermediate dielectric layers 35 and the individual first intermediate dielectric layers 36 one by one as viewed in a direction perpendicular to the front surface 10S. In the intermediate grating layer 31, the second single intermediate dielectric layer 37 is a structural and optical sea component, and the respective first intermediate dielectric layers 35, 36 are structural and optical island components. The second intermediate dielectric layer 37 is an air layer or a resin layer.

[Second Grating Layer 41]

The second grating layer 41 is positioned on the intermediate grating layer 31. The second grating layer 41 is arranged on a surface opposite to the first grating layer 21 side in the intermediate grating layer 31. Like the first embodiment, the thickness of the second grating layer 41 is preferably from 10 nm to 200 nm, more preferably from 10 nm to 100 nm.

The second grating layer 41 includes, for example, a plurality of second metal layers including a plurality of second metal layers 45 and a plurality of second metal layers 46, and a second single dielectric layer 47. The position of the respective second metal layers 45 includes the isolated region A12 as viewed from a direction to the front surface 10S. The position of the respective metal layers 46 includes the isolated region A13 as viewed in a direction perpendicular to the front surface 10S. The position of the single second dielectric layer 47 is included in the peripheral region A14 as viewed in a direction perpendicular to the front surface 10S. The plurality of the second metal layers 45 are arranged in the two-dimensional lattice across the front surface 10S, and the plurality of the second metal layers 46 are also arranged in the two-dimensional lattice across the front surface 10S.

The respective second metal layers 45 are a structure overlaid on the top surface of the first intermediate dielectric layer 35 and are different from the first intermediate dielectric layer 35. The respective metal layers 46 are a structure overlaid on the top surface of the first intermediate dielectric layer 36 and are different from the first intermediate dielectric layer 36. As viewed in a direction perpendicular to the front surface 10S, the positioning period of the second metal layers 45 is the total of the shortest width WP2 and the width WT2 like the first dielectric layer 25 and is thus the afore-indicated structural period PT2. Likewise, the positioning period of the second metal layers 46 is the total of the shortest width WP3 and the width WT3 like the first dielectric layers 26 and is thus the afore-indicated structural period PT3. In the respective directions of the two-dimensional lattice arrangement of the isolated regions A12, A13, the ratio of the width WT2 of the second metal layer 45 to the structural period PT2 and the ratio of the width WT3 of the second metal layer 46 to the structural period PT3 are, respectively, from 0.25 to 0.75, and are preferably 0.40 to 0.60.

The second dielectric layer 47 has a mesh pattern for surrounding the individual second metal layers 45 and the individual second metal layers 46 one by one as viewed in a direction perpendicular to the front surface 10S. In the second grating layer 41, the single second dielectric layer 47 is an optical sea component wherein free electrons are smaller in number than the second metal layer 45 and the second metal layer 46, and the respective second metal layers 45, 46 are island components distributed in the sea component. The second dielectric layer 47 is an air layer or a resin layer.

In the region whose structural period is the structural period PT2, the volume ratio of the first metal layer 27 serving as a sea component in the first grating layer 21 is greater than that of the second metal layers 45 serving as island components in the second grating layer 41. The volume ratio of the second metal layers 45 serving as island components in the second grating layer 41 is greater than the volume ratio of a metal material in the intermediate grating layer 31. In the region whose structural period is the structural period PT3, the volume ratio of the first metal layer 27 serving as a sea component in the first grating layer 21 is greater than that of the second metal layers 46 serving as island components in the second grating layer 41. The volume ratio of the second metal layers 46 serving as island components in the second grating layer 41 is greater than that of a metal material in the intermediate grating layer 31.

In the above configuration, the structure constituted of the first dielectric layers 25 and the first intermediate dielectric layers 35 and the structure constituted of the first dielectric layers 26 and the first intermediate layers 36 are, respectively, an example of a periodic element and are projections projecting from a reference plane that is the surface of the support 11. The structure constituted of the support 11, the first dielectric layers 25, 26 and the first intermediate dielectric layers 35, 36 is an example of a periodic structure. The layer formed of the first metal layers 27, the second metal layers 45 and the second metal layers 46 is taken as a metal layer having, as an entire layer, a shape that follows a surface profile of the periodic structure. The surface of the periodic structure means a surface of the reference plane including the region surrounding the respective periodic elements and the surfaces of the individual periodic elements.

In the sixth embodiment, the support 11 includes a substrate and an intermediate layer positioned at the surface side relative to the substrate like the first embodiment, and the respective first dielectric layers 25, 26 may be integrated with the intermediate layers 11b.

Figure 49:
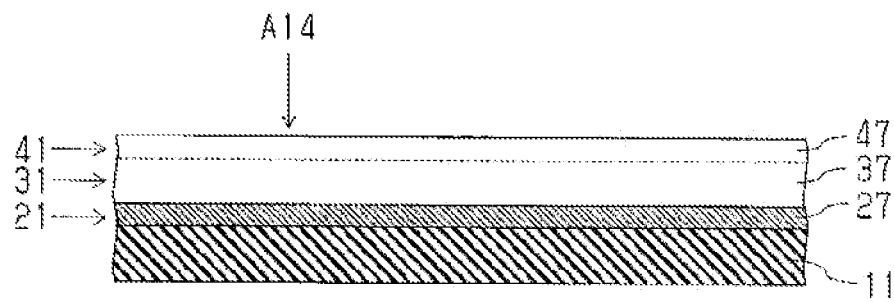
FIG. 49 is a view showing a sectional structure of the first display region of the sixth embodiment and is a sectional view taken along the line X49-X49 of FIG. 47.

As shown in FIG. 49, the peripheral region A14 has a configuration similar to the peripheral region A3 of the first embodiment. More particularly, in the peripheral region A14, the first metal layer 27 of the first grating layer 21, the second intermediate dielectric layer 37 of the intermediate grating layer 31 and the second dielectric layer 47 of the second grating layer 41 are positioned in the order closer to the support 11.

Figure 50:
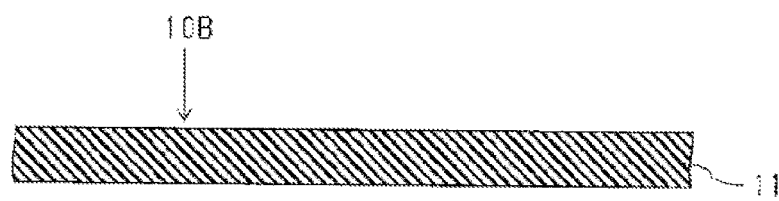
FIG. 50 is a view showing a sectional structure of a second display region of the sixth embodiment and is a sectional view taken along the line X50-X50 of FIG. 46.

As shown in FIG. 50, a second display region 10B has a configuration similar to the second display region 10B of the first embodiment and does not include, on the support 11, such first grating layer 21, intermediate grating layer 31 and second grating layer 41 as described above. Alternatively, the second display layer 10B may include, for example, a layer formed of the same material as a constituent material for the first dielectric layers 25, 26, and a metal layer formed of the same material as a constituent material for the first metal layer 27.

[Optical Configuration of Display Body]

Figure 51:
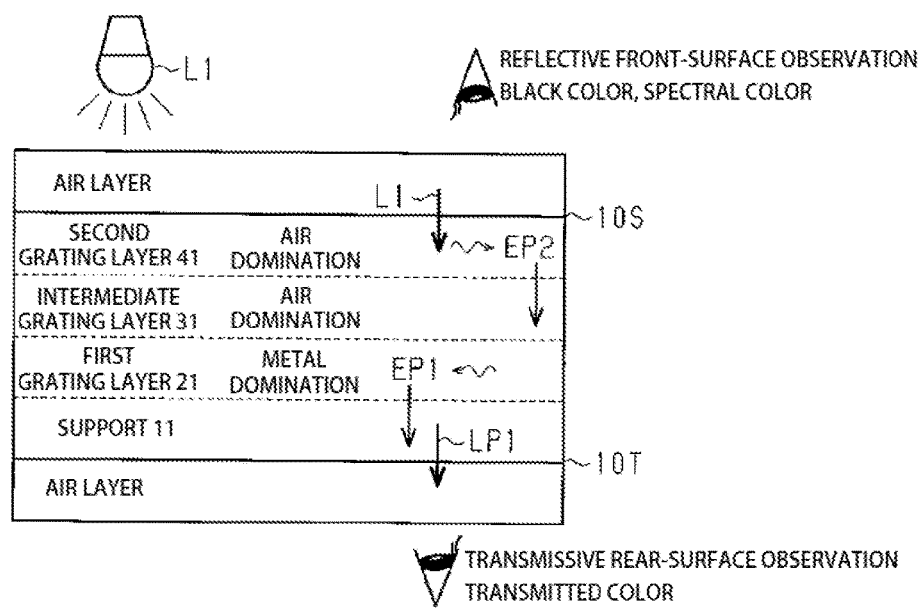
FIG. 51 is an operational view showing the operation of the display body of the sixth embodiment through reflective observation from a front surface side and also through transmissive observation from a rear surface side.

Next, the optical configuration of the display body 170 is described. The optical configurations of the regions including a region where the structural period is the structural period PT2 and a region where the structural period is the structural period PT3 are the same as in the display body of the first embodiment. Accordingly, as shown in FIG. 51, the refractive index of the first grating layer 21 has the magnitude being dominated by the first metal layer 27 serving as a sea component and is much lower than the refractive index of an air layer. The refractive index of the intermediate grating layer 31 has the magnitude being dominated by the second intermediate dielectric layer 37 serving as a sea component and is higher than the refractive index of the air layer and is a value close to the refractive index of the air layer. The refractive index of the second grating layer 41 has the magnitude being dominated by the second dielectric layer 47 serving as a sea component and is lower than the refractive index of the air layer and is a value close to the refractive index of the air layer.

[Reflective Front-Surface Observation and Transmissive Rear-Surface Observation]

When white light L1 is incident from the outside of the display body to the second grating layer 41, Fresnel reflection is unlikely to occur at the interface between the air layer and the second grating layer 41 like the first embodiment. When the light is incident to the intermediate grating layer 31, Fresnel reflection is also unlikely to occur at the interface between the second grating layer 41 and the intermediate grating layer 31.

On the other hand, since the structural period PT2 of the second metal layer 45 of the second grating layer 41 and the structural period PT3 of the second metal layer 46 are, respectively, a sub-wavelength period, light EP2 in part of the wavelength region of light incident to the second grating layer 41 is subjected to plasmon resonance in the second grating layer 41. As a result, the second grating layer 41 permits light in part of the wavelength region of light incident to the second grating layer 41 to be transmitted to the intermediate grating layer 31. Moreover, since the structural period PT2 of the first dielectric layer 25 of the first grating layer 21 and the structural period PT3 of the first dielectric layer 26 are, respectively, a sub-wavelength period, light EP1 in part of the wavelength region of light incident to the first grating layer 21 is also subjected to plasmon resonance. As a result, the first grating layer 21 permits light LP1 in part of the wavelength of light incident to the first grating layer 21 to be transmitted to the support 11.

On the other hand, the structural period PT4 that is a combination of the structural period PT2 and the structural period PT3 is larger than a sub-wavelength period. When light is irradiated to the diffraction grating structure whose period is greater than a sub-wavelength period, a spectral color due to first-order diffracted light is observed. Therefore, light except for the wavelength region consumed by plasmon resonance is split, and light that undergoes a great hue change with an observation angle is visually recognized at a part of the observation angle.

Eventually, according to the reflective front-surface observation wherein light L1 is made incident from the outside of the display body 170 to the second grating layer 41 and the front surface 10S is observed from the front surface side of the display body 170, Fresnel reflection is less likely to occur at the respective interfaces mentioned above and plasmon resonance occurs in the respective grating layers, resulting in the visual recognition of a black color or a color close to black in the first display region 10A due to the interdependence thereof.

On the other hand, according to the transmissive rear-surface observation wherein light L1 is made incident from the outside of the display body 170 to the second grating layer 41 and a rear surface 10T is observed from the rear surface side of the display body 170, colored light transmitting the display body 170 through plasmon resonance in the respective grating layers, or light other than white and black light, is visually recognized in the first region 10A. It will be noted that the results of the above reflective front-surface observation and the transmissive rear-surface observation show a similar tendency in the case where the amount of external light directed toward the front surface 10S is higher than the amount of external light directed toward the rear surface 10T.

[Reflective Rear-Surface Observation and Transmissive Front-Surface Observation]

Figure 52:
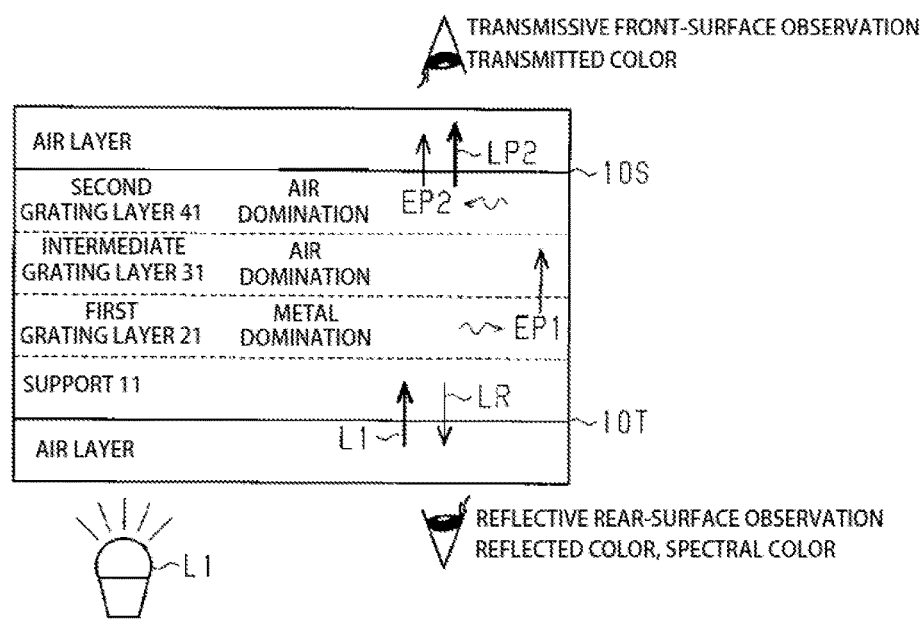
FIG. 52 is an operational view showing the operation of the display body of the sixth embodiment through reflective observation from a rear surface side and also through transmissive observation from a front surface side.

As shown in FIG. 52, when light L1 is incident from the outside of the display body 170 to the support 11, Fresnel reflection is likely to occur at the interface between the support 11 and the first grating layer 11 like the first embodiment. It will be noted that the difference in refractive index between the support 11 and the first grating layer 21 is greater than the difference in refractive index between the first grating layer 21 and the intermediate grating layer 31 and is also greater than the difference in refractive index between the intermediate grating layer 31 and the second grating layer 41.

On the other hand, light EP1 in a part of the wavelength region of light transmitting the interface between the support 11 and the first grating layer 21 is subjected to plasmon resonance. As a consequence, the first grating layer 21 permits light in a part of the wavelength region of light incident to the first grating layer 21 to be transmitted to the intermediate grating layer 31. Light EP2 in part of the wavelength region of light incident to the second grating layer 41 after the transmission through the intermediate grating layer 31 is also subjected to plasmon resonance in the second grating layer 41. As a result, the second grating layer 41 permits light LP2 in part of the wavelength region of light incident to the second grating layer 41 to be transmitted to an air layer.

On the one hand, the structural period PT4 that is a combination of the structural period PT2 and the structural period PT3 is greater than a sub-wavelength period. When light is irradiated to a diffraction grating structure whose period is greater than a sub-wavelength period, a spectral color due to the first-order diffracted light is observed. Therefore, light except for the wavelength region consumed by plasmon resonance is split, and light whose hue is greatly changed with an observation angle is visually recognized at part of an observation angle.

As a result, according to the reflective rear-surface observation wherein light L1 is made incident from the outside of the display body to the support 11 and the rear surface 10T is observed from the rear surface side of the display body, colored light LR due to Fresnel reflection at the above interface, or light LR other than white and black light, is visually recognized in the first display region 10A. In addition thereto, a spectral color due to the diffraction grating structure whose period is greater than a sub-wavelength period is visually recognized depending on the observation angle.

On the other hand, according to the transmissive front-surface observation wherein light L1 is made incident from the outside of the display body to the support 11 and the front surface 10S is observed from the front surface side of the display body, colored light LR after through Fresnel reflection and plasmon resonance in the respective grating layers is visually recognized in the first display region 10A. It is to be noted that the results of the above transmissive front-surface observation and the reflective rear-surface observation show a similar tendency in the case where the amount of external light directed toward the front surface 10S is higher than the amount of external light directed toward the rear surface 10T.

[Method for Manufacturing the Display Body]

Next, an example of a method for manufacturing the display body 170 is described.

Initially, the first dielectric layers 25, 26 and the first intermediate dielectric layers 35, 36 are formed on the surface of the support 11. The first dielectric layers 25 and the first intermediate dielectric layers 35 are integrally formed as a projection projected from the surface of the support 11, respectively, and the first dielectric layers 26 and the first intermediate dielectric layers 36 are integrally formed as a projection projected from the surface of the support 11, respectively. As a projection-forming method, there can be adopted, for example, a photolithographic method using light or a charged particle beam, a nanoimprinting method, or a plasma etching method. Especially, the nanoimprinting method can be utilized as a method for forming projections made of a resin on the surface of the support 11. In the case where the projections are formed by processing a hard substrate material, there may be used a combined method of a photolithographic method using light or a charged particle beam and a plasma etching method.

For example, a polyethylene terephthalate sheet is used as a substrate, and a UV curing resin is coated onto the surface of the substrate. Next, the surface of a synthetic quartz mold used as an intaglio plate is pressed against the surface of the coated film made of the UV curing resin, followed by irradiation of UV light. Subsequently, the synthetic quartz mold is removed from the UV-cured resin. In this way, the projections and recesses of the intaglio plate are transferred to the resin on the substrate surface thereby forming the projections each made of the first dielectric layer 25 and the first intermediate dielectric layer 35 and the projections each made of the first dielectric layer 26 and the first intermediate dielectric layer 36. It will be noted that the UV curing resin may be changed to a thermosetting resin. The UV irradiation may be changed to heat and cooling.

Next, the first meal layer 27, the second metal layers 45 and the second metal layers 46 are formed on the surface of the support 11 provided with the projections. The method of forming these metal layers includes, for example, a vacuum deposition method or a sputtering method. In doing so, the first grating layers 21, which are segmented with the top surfaces of the first metal layers 27, are formed, and the second grating layers 46, which are segmented with the top surfaces of the second metal layers 45 and the second metal layers 46, are formed. The intermediate grating layer 31 sandwiched between these first grating layer 21 and the second grating layer 41 is formed.

Configuration Example of First Display Region

In the display body 170, the region having the structural period PT2 and the region having the structural period PT3 should preferably have such configuration shown as a preferred configuration of the first display region 10A in the first embodiment, respectively.

Figure 53:
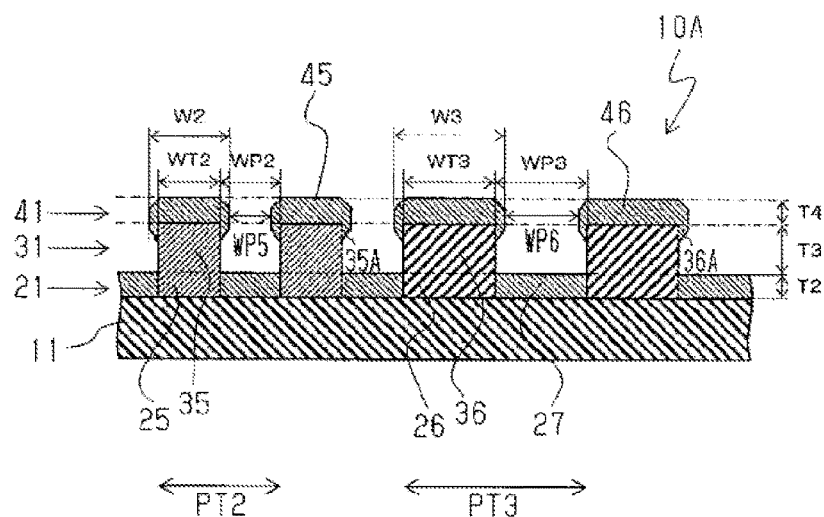
FIG. 53 is a sectional view showing an example of an enlarged part of a sectional structure in the first display region of the sixth embodiment.

That is, as shown in FIG. 53, if the thickness T2 of the first metal layer 27 is not less than 10 nm, and the ratio of the width WT2 of the first dielectric layer 25 to the structural period PT2 is not larger than 0.75 and the ratio of the width WT3 of the first dielectric layer 26 to the structural period PT3 is not larger than 0.75 both in the respective directions of the two-dimensional lattice arrangement of the isolated regions A12, A13, there can be satisfactorily obtained the accuracy of discriminating the front and back of the display body by the reflective rear-surface observation and the reflective front-surface observation.

On the other hand, when the thickness T2 of the first metal layer 27 and the thicknesses T4 of the second metal layers 45, 46 are not larger than 200 nm, the ratio of the width WT2 of the first dielectric layer 25 to the structural period PT2 is not less than 0.25 in the respective directions of the two-dimensional lattice arrangement of the isolated regions A12, A13, and the ratio of the width WT3 of the first dielectric layer 26 to the structural period PT3 is not less than 0.25, an image visually recognized by transmissive front-surface observation and an image visually recognized by transmissive rear-surface observation become clear enough to be visually recognized.

It is preferred that the total of the thickness T2 of the first dielectric layers 25, 26 of the first grating layer 21 and the thickness T3 of the first intermediate dielectric layers 35, 36 of the intermediate grating layer 31 is less than 2 and is also less than the structural period PT3. More preferably, the total of the thickness T2 of the first dielectric layers 25, 26 and the thickness T3 of the first intermediate dielectric layers 35, 36 is less than half the structural period PT2 and is also less than half the structural period PT3.

It will be noted that the thickness of the first intermediate dielectric layer 35 and the thickness of the first intermediate dielectric layer 36 are preferably the same with each other. According to such a configuration, where the synthetic quartz mold of the intaglio plate for forming the first intermediate dielectric layers 35 and the first intermediate dielectric layers 36 is made using a dry etching method, the recesses of the intaglio plate can be formed by one processing procedure. In this regard, however, where the structural period PT2 is greatly different from the structural period PT3, there may be some cases where the first intermediate dielectric layer 35 and the first intermediate dielectric layer 36 differ in thickness due to the processing characteristics. The difference in thickness between the first intermediate dielectric layer 35 and the first intermediate dielectric layer 36 due to the processing procedure presents no problem because such difference does not substantially influence the observation of the display body 170 as an optical change.

The constituent materials for the first metal layer 27 and he second metal layers 45, 46 preferably include those materials whose real part of complex permittivity for visible region light is a negative value like the first embodiment. Preferred examples include aluminum, silver, gold, indium, tantalum and the like.

Where the first metal layer 27, the second metal layers 45 and the second metal layers 46 are formed by a single step, the width W2 of the second metal layer 45 becomes slightly larger than the width WT2 of the first intermediate dielectric layer 35, and the shortest width WP5 of the mutually adjacent second metal layers 45 becomes slightly less than the shortest width WP2 like the first embodiment. Likewise, the width W3 of the second metal layer 46 becomes slightly larger than the width WT3 of the first intermediate dielectric layer 36, and the shortest width WP6 of the mutually adjacent second metal layers 46 becomes slightly less than the shortest width WP3. In this case, the ratio of the width W2 of the second metal layer 45 to the structural period PT2 is from 0.25 to 0.75, and the ratio of the width W3 of the second metal layer 46 to the structural period PT3 is from 0.25 to 0.75. The peripheries of the first intermediate dielectric layers 35, 36 in the first metal layer 27 suffer an influence of the shadow effect due to the second metal layers 45, 46 and are thinner in a portion closer to the first intermediate dielectric layers 35, 36.

In the structure formed by the above film-forming method, an intermediate metal layer 35A that is a metal layer contiguous to the second metal layer 45 is formed on the side surfaces of the first intermediate dielectric layer 35 like the first embodiment. Likewise, an intermediate metal layer 36A that is a metal layer contiguous to the second metal layer 46 is formed on the side surfaces of the first intermediate dielectric layer 36.

The intermediate metal layer 35A is sandwiched between the first intermediate dielectric layer 35 and the second intermediate dielectric layer 37. The intermediate metal layer 35A is a structure integral with the second metal layer 45, and its thickness on the side surface of the first intermediate dielectric layer 35 is smaller at a portion closer to the first metal layer 27. Likewise, the intermediate metal layer 36A is sandwiched between the first intermediate dielectric layer 36 and the second intermediate dielectric layer 37. The intermediate metal layer 36A is a structure integrated with the second metal layer 46, and its thickness on the side surface of the first intermediate dielectric layer 36 is smaller at a portion closer to the first metal layer 27.

As to such intermediate metal layers 35A, 36A, since the structural periods PT2, PT3 is, respectively, a sub-wavelength period, the refractive indexes along the thickness of the second grating layer 41 and the intermediate grating layer 31 are changed continuously. Therefore, in the reflective front-surface observation, a color closer to black is visually recognized in the first display region 10A.

If the configuration is such that the first metal layer 27, the second metal layer 45 and the second metal layer 46 have the same refractive index with one another, and the difference in refractive index between the first dielectric layer 25 and the first metal layer 27 and the difference in refractive index between the first dielectric layer 26 and the first metal layer 27 are, respectively, larger than the difference in refractive index between the second dielectric layer 47 and the second metal layers 45, 46, it becomes possible to suppress Fresnel reflection at the interfaces between the second grating layer 41 and other layers and to promote Fresnel reflection at the interfaces between the first grating layer 21 and the other layers.

It will be noted that in order to suppress Fresnel reflection at the interfaces between the second grating layer 41 and other layers and to promote Fresnel reflection at the interfaces between the first grating layer 21 and other layers, it is preferred to satisfy the following requirements. More particularly, the difference in refractive index between a front surface layer, which is a layer contacting the second dielectric layer 47 at a side opposite to the intermediate grating layer 31 relative to the second dielectric layer 47, and the second dielectric layer 47 is preferably less than the difference in refractive index between the first metal layer 27 and the support 11. The surface layer is, for example, an air layer. More preferably, the refractive index of the second dielectric layer 47 should be the same as the refractive index of the surface layer.

As stated above, in the sixth embodiment, light in specific wavelength region is emitted from the display body as reflected or transmitted light due to plasmon resonance. The wavelength region of the transmitted or reflected light is determined depending on a plurality of factors including the position and size of the respective projections serving as a periodic element and the metal layer whose position is determined depending on the respective periodic elements, so that the degree of freedom of adjusting the wavelength region transmitted or reflected in the display body.

In the meantime, a display body including a diffraction grating has been hitherto used as an instance of a display body provided with a counterfeit preventing function. The diffraction grating constitutes, for example, a hologram. The diffraction grating of the display body includes, for example, a transparent resin layer and a metal layer positioned on the resin layer. For example, the shape of the diffraction grating expressed by a mathematical function having a sine secondary structure is such that the inclined portion of the diffraction grating has a metal layer that is thinner than other portions, and the structural difference between the inclined portions leads to a difference in transmittance or reflectance added to the metal layer. This enables representation by gray scale and representation wherein the hue of reflected image and the hue of transmitted image mutually differ from each other. However, such a shape of the diffraction grating requires high symmetry in the height direction of the structure in the diffraction grating, i.e. in the front and back direction of the display body. As a result, a difference in hue is insignificant between the image observed from the front surface of the display body and the image observed from the rear surface of the display body. Hence, difficulty is involved in determining the front and the back of the display body based on the visual recognition of the images. In order to enhance the design properties of the display body, it has been proposed that a color layer is provided in contact with a diffraction grating layer of the display body thereby forming a colored hologram. However, such a hologram has the problem in that it is difficult to obtain a satisfactory diffraction effect and it is also difficult to obtain a hologram that appears to be sufficiently bright in a desired color. Moreover, because it is necessary to provide a color layer differently from the hologram layer, and an additional number of steps in a manufacturing process have been undesirably invited.

As will be appreciated from the foregoing, the sixth embodiment also has for its object the provision of a display body which enables the determination of the front and back of the display body through observation of an image formed in the display body and which has excellent design properties and counterfeiting difficulty and enables dynamic, hue representation with a diffraction grating. The effects enumerated below and including the effects on such problems as set out above can be obtained according to the sixth embodiment in addition to the effects (1-1), (1-2) and (1-4) to (1-8) of the first embodiment.

(6-1) Since the magnitudes of the structural period PT2 and the structural period PT3 are, respectively, a sub-wavelength period that is less than a visible region wavelength, first-order diffracted light is not reflected in the region units having these structural periods. Thus, a static hue representation whose hue change due to observation angle is small is enabled. Meanwhile, since the magnitude of the structural period PT4 is one that is larger than a sub-wavelength period, the spectral color derived from first-order diffracted light is observed in the region unit having the structural period PT4, and a dynamic hue representation whose hue change with an observation angle is great is enabled. Accordingly, hue representations wherein hue changes due to observation angle differ from each other can be realized on the same plane.

As stated above, the discrimination of the front and the back of the display body 170 is possible through the observation of a visually recognized image and the display body 170 provided with a dynamic, hue representation excellent in deign properties and counterfeiting difficulty can be realized.

Modification Examples of Sixth Embodiment

In the above embodiment, there has been illustrated an example wherein the first grating layer 21 has two types of first dielectric layers having mutually different widths in the arrangement direction. In another example, the first grating layer 21 may have n types (wherein n is an integer of 2 or over) of first dielectric layers having mutually different widths in the arrangement direction. The number of the first dielectric layers for every type is plural. In this case, the structural period between the first dielectric layers of the same types with the same width in the arrangement direction among the n types of first dielectric layers having mutually different widths in the arrangement direction should be a sub-wavelength period. The n types of first dielectric layers may include a plurality of the first dielectric layers for every type, which have mutually different widths in the arrangement direction and the same structural period. In other words, in the n types of the first dielectric layers, the structural periods should be not larger than n in number. When a set of a plurality of the first dielectric layers for every type is taken as a first dielectric layer subgroup and a set of plural types of the first dielectric layer subgroups is taken as a first dielectric layer group, the structural period in the respective first dielectric layer subgroups is a sub-wavelength period. When a plurality of the first dielectric layer groups are periodically arranged, there can be formed a structural period that is larger than the sub-wavelength period.

Figure 54:
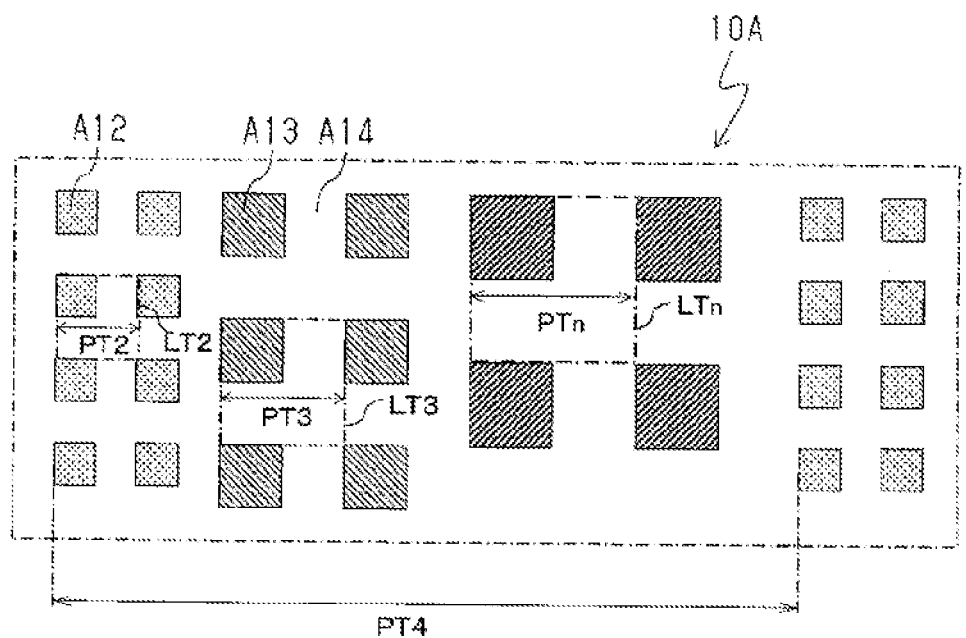
FIG. 54 is an enlarged view showing an enlarged planar structure of the first display region in a modification example of the sixth embodiment.

FIG. 54 shows an example wherein the first grating layer 21 has three types (n=3) of first dielectric layers. The structural period PT2, the structural period PT3 and the structural period PTn, each between the first dielectric layers having the same width in the arrangement direction, have a sub-wavelength period, respectively. The set of the first dielectric layer subgroups having the respective structural periods PT2, PT3 and PTn are taken as a first dielectric layer group. When a plurality of the first dielectric layer groups are periodically arranged, there is formed a structural period PT4 which is larger than the sub-wavelength period.

The widths in the arrangement direction of the first dielectric layers of the first grating layer 21 may be the same. More particularly, the first grating layer 21 may include one type (n=1) of first dielectric layer. In this case, the structural period between the first dielectric layers should be the sub-wavelength period. When a plurality of the first dielectric layers whose structural period is the sub-wavelength period are taken as a first dielectric layer subgroup and the first dielectric layer group is formed of one first dielectric layer subgroup, a structural period that is larger than the sub-wavelength period can be formed by periodically arranging a plurality of the first dielectric layer groups at intervals.

Figure 55:
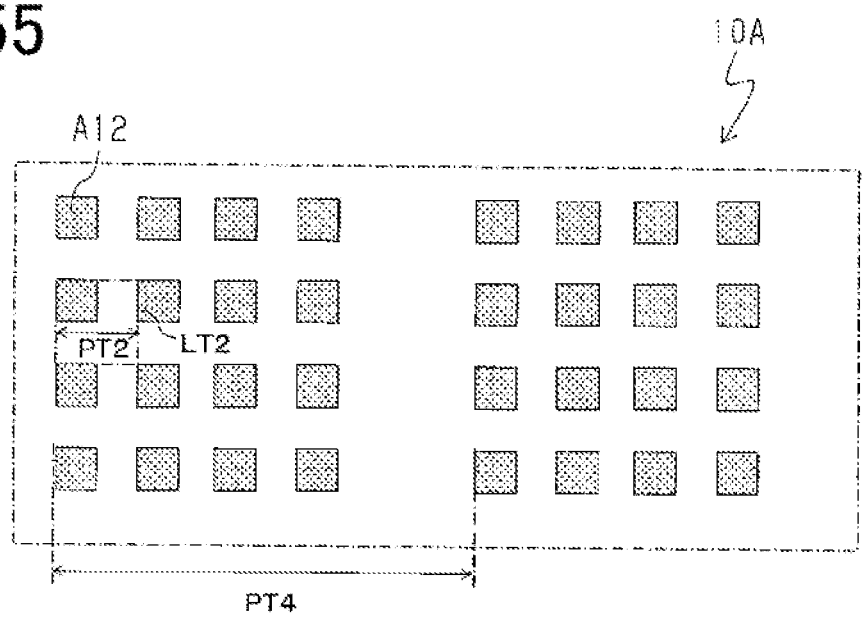
FIG. 55 is an enlarged view showing an enlarged planar structure of the first display region in another modification example of the sixth embodiment.

FIG. 55 shows an example wherein the first grating layer 21 has one type (n=1) of first dielectric layer. The structural period PT2 between the first dielectric layers is a sub-wavelength period. In FIG. 55, although there is shown an example wherein a first dielectric layer sub-group and a first dielectric layer group are constituted of sixteen first dielectric layers arranged in a 4×4 matrix, the number of the first dielectric layers constituting the first dielectric layer group is not limited to sixteen. When a plurality of the first dielectric layer groups are periodically arranged at intervals, the structural period PT4 that is larger than the sub-wavelength period is formed.

In the first display region 10A, the respective regions having mutually different structural periods may be applied with the same configuration as in the modification examples of the first embodiment. The display body may include, on the metal layer, the same dielectric layer as in the second embodiment. As described in the modification examples of the second embodiment, when the surface of the support 11 is taken as a reference plane, the periodic elements of the periodic structure may be recesses depressed from the reference plane.

The configuration of the display body-attached device of the second embodiment may be applied to the sixth embodiment and its modification examples. That is, the display body-attached device may include the display body and the light-emitting structure of the sixth embodiment or its modification examples.

<Additional Notes>

As a measure for solving the above problems, the following items are included as a technical concept derived from the sixth embodiment and its modification examples.

[Item 41]

A display body comprising a dielectric support capable of transmitting visible region light, a first grating layer arranged on one surface of the support, an intermediate grating layer arranged on a surface of the first grating layer opposite to the support side, and a second grating layer arranged on a surface of the intermediate grating layer opposite to the first grating layer side wherein the first grating layer includes a plurality of first dielectric layers arranged in a two-dimensional lattice and a first metal layer having a mesh pattern for surrounding the individual dielectric layers, the intermediate grating layer includes a plurality of first intermediate dielectric layers arranged in a two-dimensional lattice and a second intermediate dielectric layer having a mesh pattern for surrounding the individual first intermediate dielectric layers and having a permittivity lower than the first intermediate dielectric layer, the second grating layer includes a plurality of second metal layers arranged in a two-dimensional lattice and a second dielectric layer having a mesh pattern for surrounding the individual second metal layers, the plurality of the first dielectric layers have one or more magnitudes of the width in the arrangement direction of the first dielectric layers along the two-dimensional lattice, the first grating layer has a plurality of the first dielectric layers for every type of width, a plurality of the first dielectric layers having the same width are formed as a first dielectric layer subgroup, the structural period of the first dielectric layers in the respective first dielectric subgroups is a sub-wavelength period, one or more of the first dielectric layer subgroups constitute a first dielectric layer group, and a plurality of the first dielectric layer groups are regularly arranged whereby a structural period larger than the sub-wavelength is formed.

[Item 42]

The display body as recited in Item 41, wherein the first metal layer and the second metal layer, respectively, have a negative value in the real part of complex permittivity for visible region light.

[Item 43]

The display body as recited in Item 41 or 42, wherein the arrangement of the two-dimensional lattice is a square arrangement or a hexagonal arrangement.

[Item 44]

The display body as recited in any one of Items 41 to 43, wherein the ratio of the width of the first dielectric layer to the structural period of the first dielectric layers and the ratio of the width of the second metal layer to the structural period of the second metal layers are, respectively, from 0.40 to 0.60.

[Item 45]

The display body as recited in any one of Items 41 to 44, wherein the thickness of the first grating layer is not larger than 100 nm, the thickness of the second grating layer is not larger than 100 nm, the thickness of the intermediate grating layer is not larger than 150 nm, and the intermediate grating layer is thickest among the first grating layer, the second grating layer and the intermediate grating layer.

[Item 46]

The display body as recited in any one of Items 41 to 45, wherein a constituent material for the first metal layer is the same as a constituent material of the second metal layer, the second dielectric layer is an air layer, and a difference in refractive index between the first dielectric layer and the first metal layer is larger than a difference in refractive index between the second dielectric layer and the second metal layer.

Seventh Embodiment

Referring to FIGS. 56 to 58, there is illustrated the seventh embodiment of a display body that is an example of an optical device and also of a method for manufacturing the display device. It will be noted that although the wavelength region of incident light irradiated to the display body is not limited, a description will be given, in the seventh and eighth embodiments, of natural light including light in the visible region (wavelength: from 400 nm to 800 nm) recognizable by the naked eye and used as incident light.

The display bodies of the seventh and eighth embodiments may be used for the purpose of enhancing product counterfeiting difficulty or may be used for the purpose of enhancing product design properties, or may be used for both purposes.

Figure 56A:
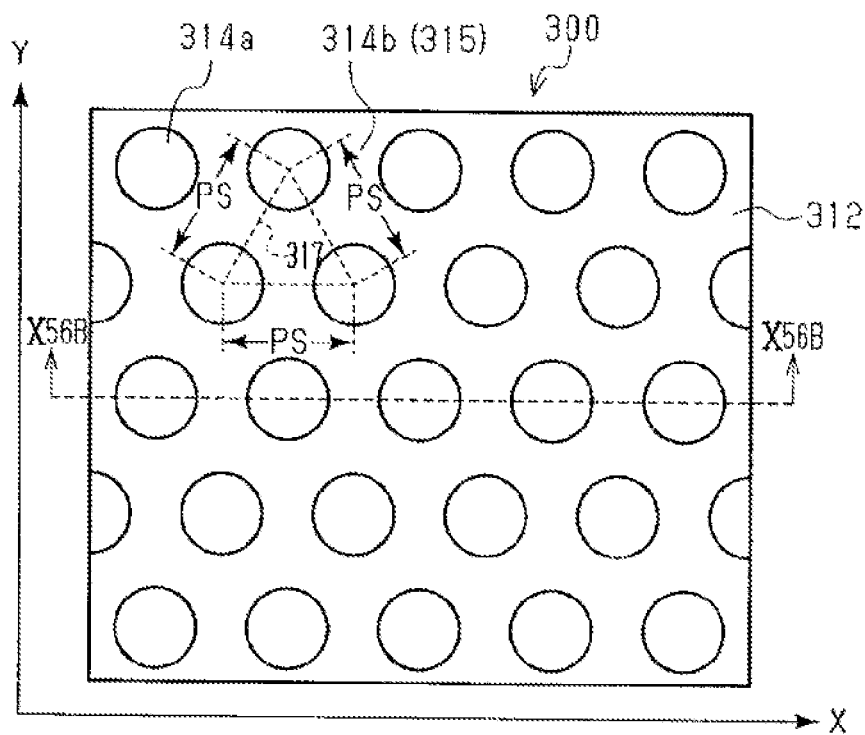
FIG. 56A is a plan view showing a planar structure of a concavo-convex structure layer in a seventh embodiment of a display body.
Figure 56B:
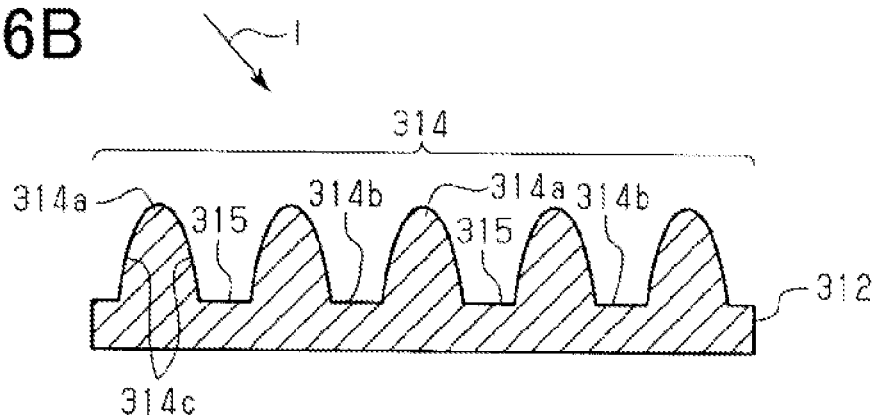
FIG. 56B is a view showing a sectional structure of the concavo-convex structure layer of the seventh embodiment and is a sectional view taken along the line X56B-X56B of FIG. 56A.
Figure 56C:
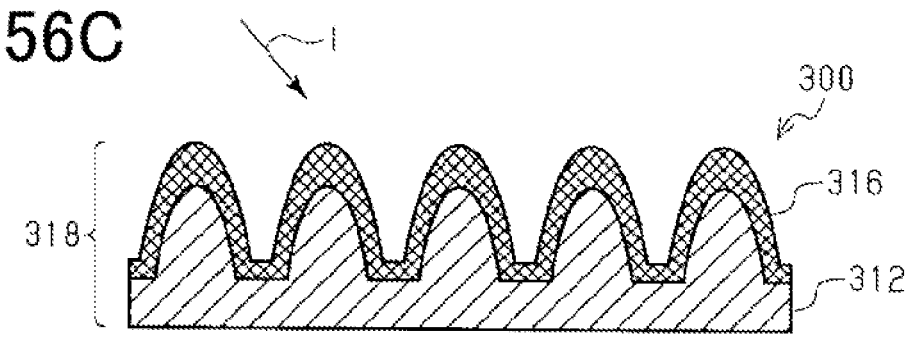
FIG. 56C is a sectional view showing the sectional structure of the display body of the seventh embodiment.

As shown in FIGS. 56A to 56C, a display body 300 of the seventh embodiment includes has a stacked body 318 including a support layer 312 constituted of a material transparent to incident light 1, a concavo-convex structure layer 314 formed on the surface of the support layer 312 and a metal layer 316 provided on the concavo-convex structure layer 314. The concavo-convex structure layer 314 is made of a dielectric material. Where the incident light 1 is visible region light, the dielectric material preferably includes, for example, synthetic quartz and a resin that permit the transmission of the visible region light.

The concavo-convex structure layer 314 is comprised of a plurality of projections 314a arranged to have periodicity and recesses 314b that are portions other than the projections 314a. With the concavo-convex structure layer 314 shown in FIG. 56A, the plurality of the projections 314a are configured to be arranged in a hexagonal arrangement that is an example of the two-dimensional lattice arrangement. The recesses 314b have a flat face 315.

With the example shown in FIG. 56A, the respective projections 314a are arranged such that the apexes of the adjacent three projections 314a form an equilateral triangle. One side length PS of the equilateral triangle 317 is a structural period of the projections 314a.

Figure 57A:
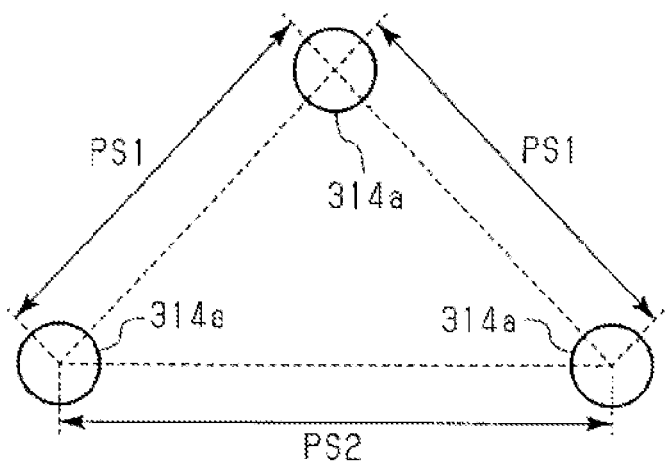
FIG. 57A is a plan view showing an example of the concavo-convex structure of the seventh embodiment having a plurality of structural periods.
Figure 57B:
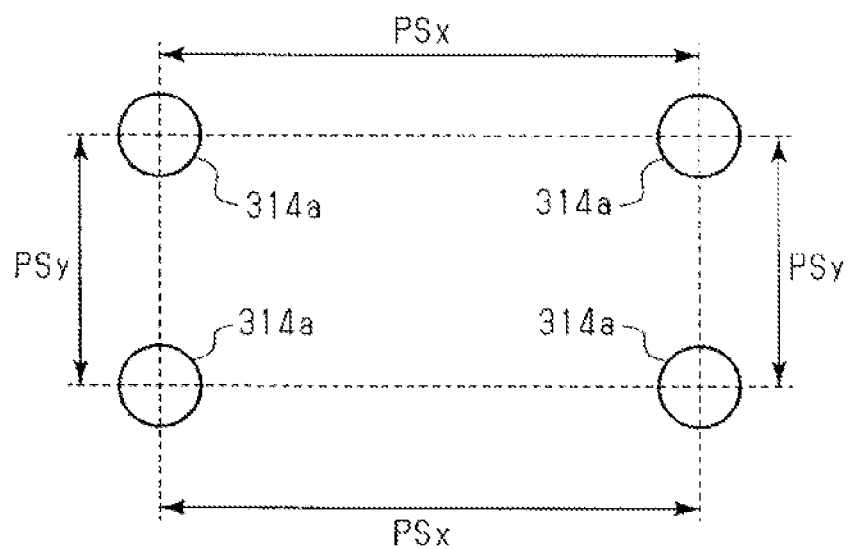
FIG. 57B is a plan view showing another example of the concavo-convex structure of the seventh embodiment having a plurality of structural periods.

It will be noted that the projection arrangement is not limited to one wherein the apexes of the adjacent three projections 314a form an equilateral triangle arrangement, but the plurality of the projections 314a may be arranged in such a way that the apexes of the adjacent four projections form a quadrate, or may be in a square arrangement. Alternatively, the plurality of the projections 314a may be so arranged that the apexes of the adjacent three projections 314a form an isosceles triangle, not an equilateral triangle, or the apexes of the adjacent four projections 314a form a rectangle, not a square. FIG. 57A shows an example of an arrangement wherein the apexes of the adjacent three projections 314a form an isosceles triangle, and FIG. 57B shows an example of an arrangement wherein the apexes of the adjacent four projections 314a form a rectangle. In these cases, there are two structural periods of the projections 314a, respectively. More particularly, with the example shown in FIG. 57A, the side lengths PSl and PS2 of the isosceles triangle are, respectively, a structural period. With the example shown in FIG. 57B, the respective side lengths PSx and PSy of the rectangle are a structural period.

The structural period PS of the projections 314a in the concavo-convex structure layer 314 is a sub-wavelength period that is lower than the wavelength of incident light 1. In the case where there are a plurality of structural periods as shown in FIGS. 57A and 57B, all the structural periods PS are less than the wavelength of the incident light 1. For instance, with the example shown in FIG. 57A, the structural periods PS1 and PS2 are less than the wavelength of the incident light l, respectively, and with the example shown in FIG. 57B, the structural periods PSx and PSy are less than the wavelength of the incident light 1, respectively. Where the incident light 1 is visible region light, the structural PS is preferably not larger than 500 nm, more preferably not larger than 400 nm, so as to reduce the influence of a spectral color due to first-order diffracted light.

A side wall 314c of the projection 314a is not inclined toward the recess 314b adjacent to the projection 314a as exemplified in FIGS. 58A to 58D, and at least a part of the side wall 314c of the projection 314a is inclined toward the center of the projection 314a.

Figure 58A:
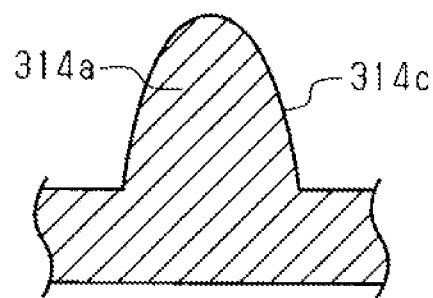
FIG. 58A is a sectional view showing an example of the projection shape of the concavo-convex structure layer of the seventh embodiment.
Figure 58B:
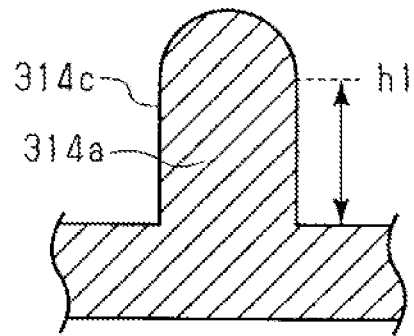
FIG. 58B is a sectional view showing another example of the projection shape of the concavo-convex structure layer of the seventh embodiment.
Figure 58C:
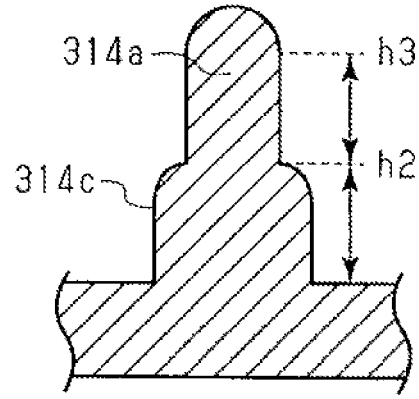
FIG. 58C is a sectional view showing a further example of the projection shape of the concavo-convex structure layer of the seventh embodiment.
Figure 58D:
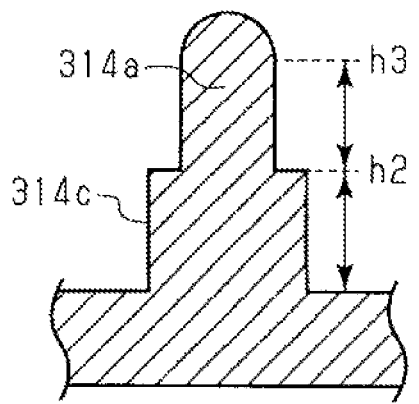
FIG. 58D is a sectional view showing another example of the projection shape of the concavo-convex structure layer of the seventh embodiment.

FIG. 58A shows an enlarged shape of the side wall 314c of the projection 314a exemplified in FIG. 56B. The shape of the side wall 314c of the projection 314a is not limited to one wherein it is continuously inclined toward the center of the projection 314a as shown in FIG. 58A. As shown in FIG. 58B, the side wall 314c may be so shaped as not to be inclined up to a height h1 from the support layer 31, but to be inclined toward the center of the projection 31a at a portion higher than the height h1. Alternatively, as shown in FIG. 58C, while the side wall 314c may be so shaped as to be inclined toward the center of the projection 314a at a portion up to a height h2 from the support layer 312, but not to be inclined from the height h2 to a height h3 and to be again inclined toward the center of the projection 314a at a portion higher than the height h3. Moreover, as shown in FIG. 58D, the side wall 314c may be so shaped as not to be inclined to the height h2 from the support layer 312, not to be inclined to the height h3 although the diameter of the projection 314a is thinned at the height h2, and then to be inclined toward the center of the projection 314a at a portion higher than the height h3.

In the above configuration, the projection 314a is an example of a periodic element and is a projection projecting from a reference plane when the surface of support layer 312 that is an example of a support is taken as a reference plane. The structure constituted of the support layer 312 and the concavo-convex structure layer 314 is an example of a periodic structure. The metal layer 316 is taken as a metal layer having, as an entire layer, a shape that follows the surface profile of the periodic structure. The surface of the periodic structure is a plane including the region of the reference plane surrounding the individual periodic elements and the surfaces of the respective periodic elements. The side surface of the periodic element which is the side wall 314c of the projection 314a has no portion inclined closely to the reference plane, i.e. has no portion which is inclined farther away from the center of the periodic element when farther away from the reference plane. Moreover, at least a part of the side surface of the periodic element is inclined closer to the center of the periodic element when farther away from the reference plane. It will be noted that the center of the periodic element means the center of a periodic element as viewed in a direction perpendicular to the reference plane.

Next, a method for manufacturing the display body 300 is described.

In order to manufacture the display body 300, the concavo-convex structure layer 314 is formed on the surface of a substrate made, for example, of a dielectric material such as synthetic quartz or a resin by a known processing technique such as a lithographic method using light or a charged particle beam, a nanoimprinting method or a plasma etching method thereby forming a stacked body of the support layer 312 and the concavo-convex structure 314. Especially, as a method of forming the projections 314a on the surface of the support layer 312 made of a resin, there can used, for example, the nanoimprinting method. Where the projections 314a are formed by processing a hard material substrate, there may be used a combined method of the photolithographic method using light or a charged particle beam and the plasma etching method.

Subsequently, as shown in the sectional view of FIG. 56C, a metal is deposited on the concavo-convex structure layer 314 by use of a known technique such, for example, as a vacuum deposition method thereby forming the metal layer 316. The constituent material for the metal layer 316 preferably includes those materials which have a negative value in the real part of complex permittivity in the wavelength region of light incident on the display body 300. Where natural light including visible region light is irradiated to the display body 300, for example, the constituent materials for the metal layer 316 preferably include metal materials such as aluminum, silver, gold, indium, tantalum and the like. In this regard, the constituent materials for the metal layer 316 are not limited to the above materials, but may be metals other than the above-indicated ones.

The thickness of the metal layer 316 is preferably within a range of from 10 nm to 300 nm, more preferably not less than 20 nm. The upper limit of 300 nm is a value which is determined as a thickness of the metal layer 316 such that the transmittance of the display body 300 (i.e. a peak transmittance in transmission spectra) is allowed to exceed 1%, and the lower limit of 10 nm is a value determined while considering the formation of a natural oxide film. It will be noted that if the display body 300 is configured to develop an antireflective effect and a surface plasmon resonance phenomenon as will be described hereinafter, the thickness of the metal layer 316 may be less than 10 nm.

Next, a description will be given of an operation of a display body 300 according to the seventh embodiment. In the following, a description will be given of the case where the incident light 1 is visible region light.

The structural period PS of the projections and the recesses of the concavo-convex structure layer 314 is not larger than a visible region wavelength, and the structural period of the projections and the recesses of the metal layer 316 formed on the concavo-convex structure layer 314 is also not larger than a visible region wavelength. Accordingly, as shown in FIG. 56C, when incident light l is incident from a side at which the metal layer 316 is positioned in the display body 300, an iridescent shiny spectral color due to the first-order diffraction color is less likely to be observed.

Since the concavo-convex structure layer 314 has a concavo-convex profile having a plurality of projections 314a as shown in FIG. 56B, the stacked body 318 including the metal layer 316, the concavo-convex structure layer 314 and the support layer 312 approximates a layer whose refractive index continuously changes in the thickness direction. Accordingly, in the region where the concavo-convex structure layer 314 is positioned, for example, a reflection preventing effect appears against incident light l incident from the front surface side of the support layer 312 that is an upper side in FIG. 56C.

Such a reflection preventing effect increases with an increasing height of the projection 314a. However, where the concavo-convex structure layer 314 is formed, for example, by a dry etching method, a greater height of the projection 314a results in a longer time required for processing, with some concern that the yield lowers by the influence of the variation in density of the plasma used for dry etching. Accordingly, it is preferred from the standpoint of the ease in manufacture that the ratio of the height of the projection 314a to the structural period PS is not larger than 0.5.

In the display body 300, the projection 314b has the flat portion 315, the concavo-convex structure layer 314 and the metal layer 316, respectively, have a concavo-convex structure of the sub-wavelength period, and the constituent material for the metal layer 316 is selected from metal materials whose real part of complex permittivity for visible region light is a negative value. These enable a part of the incident light l and collective vibrations of electrons to interact thereby causing a plasmon resonance to occur.

For instance, where natural light is irradiated from the rear surface side of the support layer 312 which is a lower side in FIG. 56C, Fresnel reflection occurs on the flat surface 315 and no light in the wavelength region consumed by plasmon resonance is reflected. Hence, if the wavelength region consumed by plasmon resonance is present in the visible region, a complementary color corresponding to the wavelength region consumed by plasmon resonance is observed as reflected light.

Further, where the metal layer 316 is sufficiently small in thickness, a part of the light l in the visible region can transmit through the display body 300. In this regard, however, the transmitted light has wavelength selectivity due to plasmon resonance.

Accordingly, in the observation under natural light, the display body 300 can realize different color representations by observation including observation of reflected light from a front surface side that is an upper side in FIG. 56C, observation of transmitted light from a front surface side or a rear surface side that is a lower side in FIG. 56C, and observation of reflected light from the rear surface side.

As stated above, in the seventh embodiment, light in specific wavelength region is emitted from the display body as reflected or transmitted light due to plasmon resonance. Since the wavelength region of the transmitted or reflected light is determined due to a plurality of factors including the position and magnitude of the periodic elements which means the respective projections 314a and the metal layer whose position is determined by the respective periodic elements, the degree of freedom of adjusting the wavelength region transmitted through or reflected from the display body can be enhanced.

In the meantime, a display body including a diffraction grating has been hitherto employed as an instance of a display body provided with a counterfeit preventing function. The diffraction grating of such a display body includes a transparent resin layer and a metal layer positioned on the resin layer. For example, the diffraction grating represented by a mathematic function having a sine secondary structure is so shaped as to have a metal layer that is thinner than other side in an inclined portion of the diffraction grating, under which a difference in transmittance or reflectance is given to the metal layer due to the structural difference between the inclined portions. In doing so, a representation by gray scale and a representation wherein the color of a reflected image and the color of a transmitted image mutually differ from each other can be realized. However, the shape of the diffraction grating needs high symmetricity in the height direction of the structure in the diffraction grating, or in the front and rear direction of the diffraction grating. As a result, the difference in color between the image observed from the front surface of the display body and the image observed from the rear surface of the display body is insignificant and difficulty is involved in discriminating the front and back of the display body based on these visual recognitions thereof.

From the foregoing, the provision of a display body that enables the discrimination of the front and back of the display body by observation of the image formed by the display body is also an object of the seventh embodiment. As stated above, according to the display body 300 of the seventh embodiment, in the respective observations including observations of reflected light at the front and back sides and transmitted light, mutually different colors are observed. Therefore, there can be realized a display body that is not impaired with respect to the ease in authenticity discrimination.

Modification Examples of Seventh Embodiment

With reference to FIGS. 59 to 60, a modification example of the seventh embodiment is illustrated.

In the above embodiment, the flat portion is present only on the recess 314b. In the present modification example, a flat face 319 is present at the tip end of the projection 314a as exemplified in FIG. 59B.

Figure 59A:
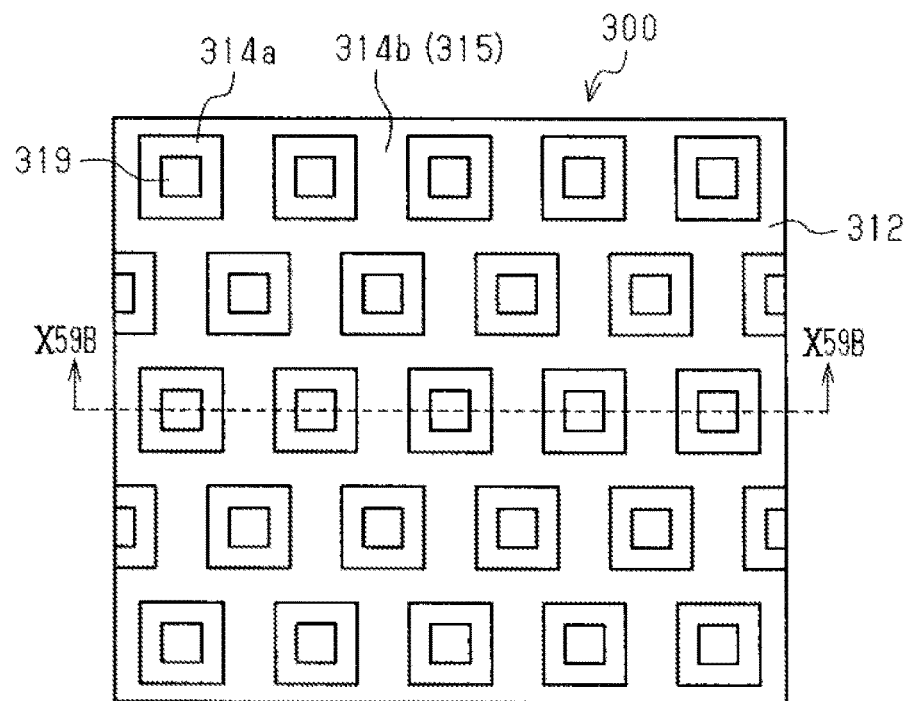
FIG. 59A is a sectional view showing a planar structure of the concavo-convex structure layer in a modification example of the seventh embodiment.
Figure 59B:
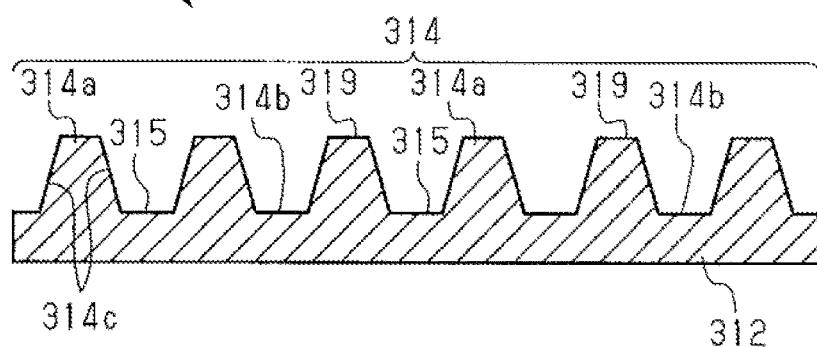
FIG. 59B is a view showing the sectional structure of the concavo-convex structure layer in the modification example of the seventh embodiment and is a sectional view taken along the line X59B-X59B of FIG. 59A.
Figure 59C:
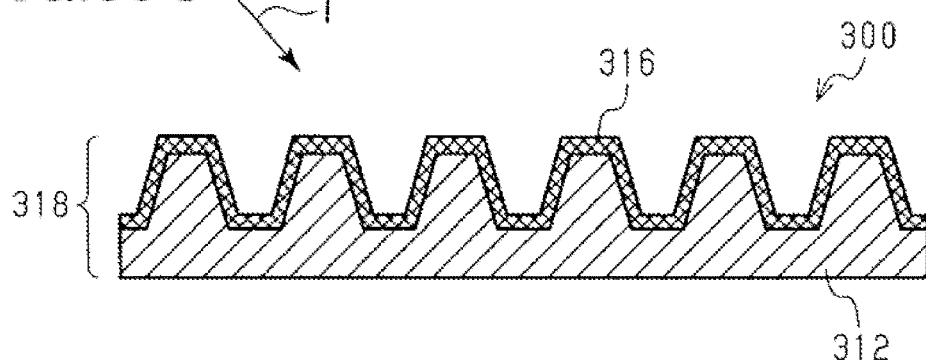
FIG. 59C is a sectional view showing the sectional structure of the display body of the modification example of the seventh embodiment.
Figure 60A:
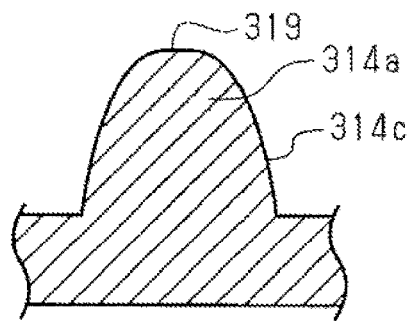
FIG. 60A is a sectional view showing an example of a projection shape of the concavo-convex structure layer in the modification example of the seventh embodiment.
Figure 60B:
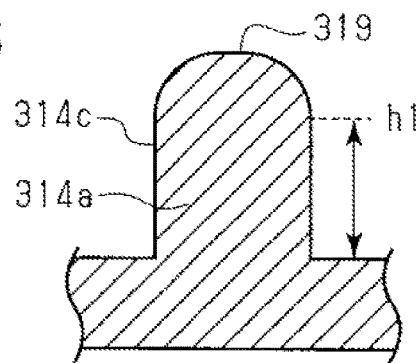
FIG. 60B is a sectional view showing another example of the projection shape of the concavo-convex structure layer in the modification example of the seventh embodiment.
Figure 60C:
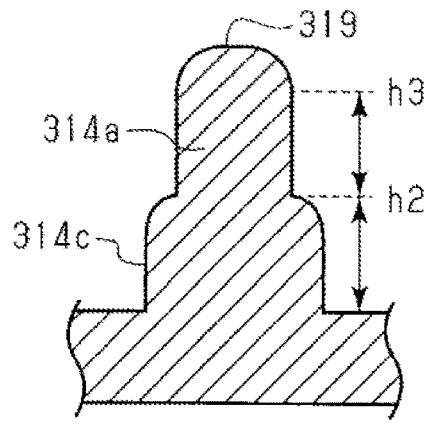
FIG. 60C is a sectional view showing a further example of the projection shape of the concavo-convex structure layer in the modification example of the seventh embodiment.
Figure 60D:
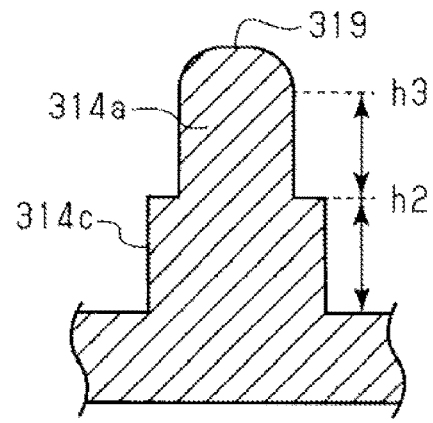
FIG. 60D is a sectional view showing another example of the projection shape of the concavo-convex structure layer in the modification example of the seventh embodiment.

The sectional shape of the projection 314a across the surface of the support layer 312 may be circular as shown in FIG. 56A or polygonal. FIG. 59A shows an example of a configuration wherein the sectional shape of the projection 314a across the surface of the support 312 is square. Moreover, the projection 314a has a shape wherein the width of the projection 314a becomes narrower toward the tip end thereof as shown in FIG. 59B. As shown in FIG. 59C, the surface of the concavo-convex structure layer 314 is covered with the metal layer 316 like FIG. 56C.

Furthermore, as exemplified in FIGS. 60A to 60D, the side wall 314c of the projection 314a is not inclined toward the adjacent recess 314b, but at least a part of the side wall 314c of the projection 314a is inclined toward the center of the projection 314a. The projection 314a shown in FIG. 60A has a shape wherein the top of the projection 314a shown in FIG. 58A is changed to a flat surface 319, and the projection 314a shown in FIG. 60B has a shape wherein the top of the projection 314a shown in FIG. 58B is changed to a flat surface 319. The projection 314a shown in FIG. 60C has a shape wherein the top of the projection 314a shown in FIG. 58C is changed to a flat surface 319, and the projection 314a shown in FIG. 60D has a shape wherein the top of the projection 314a shown in FIG. 58D is changed to a flat surface 319.

Even in the structure where the flat surface is provided not only on the recess 314b, but also on the projection 314a, mutually different colors are observed through the respective observations including front-surface and rear-surface observations of reflected light and an observation of transmitted light due to the same mechanism as illustrated in the seventh embodiment.

Eighth Embodiment

With reference to FIGS. 61 and 62, the eighth embodiment is illustrated with respect to a display body that is an example of an optical device and also to a method for manufacturing the display body. In the following description, differences between the eighth embodiment and the seventh embodiment are mainly illustrated and like parts as in the seventh embodiment are indicated by like reference numerals and the illustration thereof is omitted.

While the concavo-convex structure of the concavo-convex structure layer 314 in the display body 300 of the seventh embodiment is called a dot array structure, the concavo-convex structure of the concavo-convex structure layer 314 in a display body of the eighth embodiment is called a hole array structure.

Figure 61A:
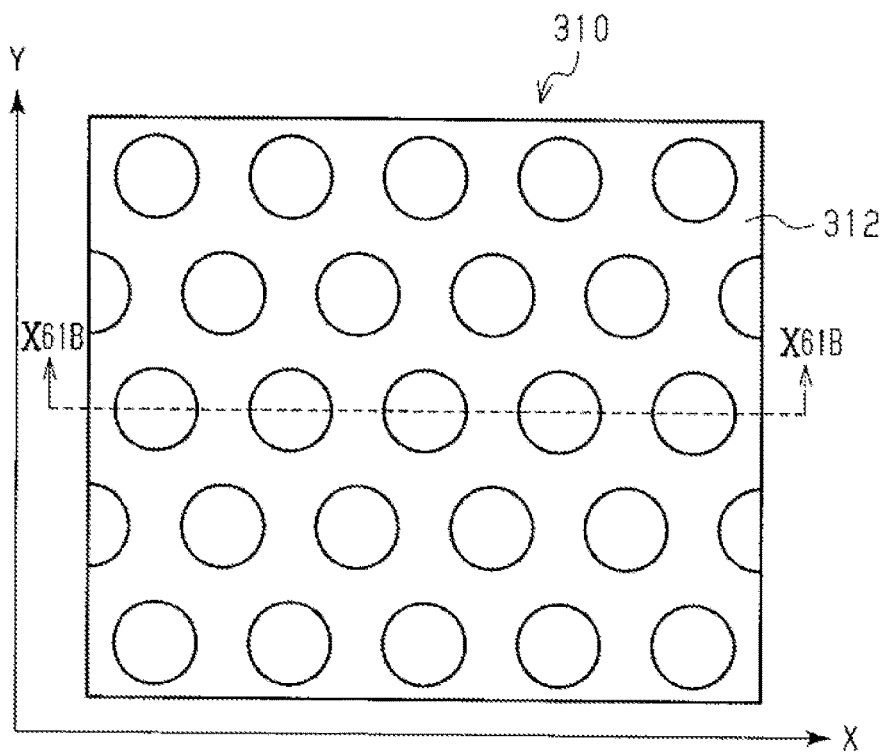
FIG. 61A is a plan view showing a planar structure of a concavo-convex structure layer in an eighth embodiment of a display body.
Figure 61B:
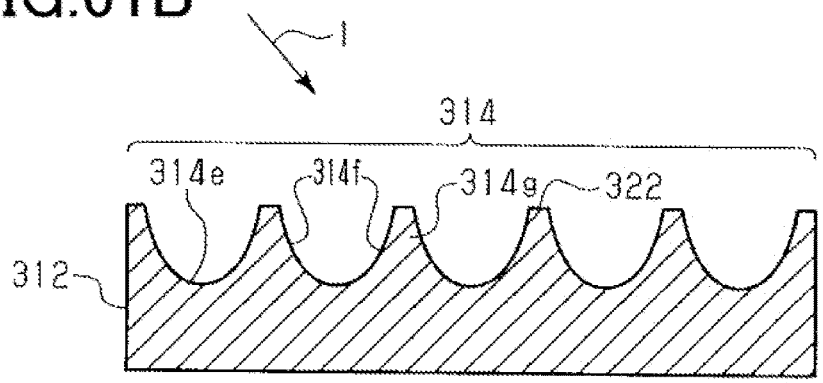
FIG. 61B is a view showing a sectional structure of the concavo-convex structure layer of the eighth embodiment and is a view taken along the line X61B-X61B of FIG. 61A.
Figure 61C:
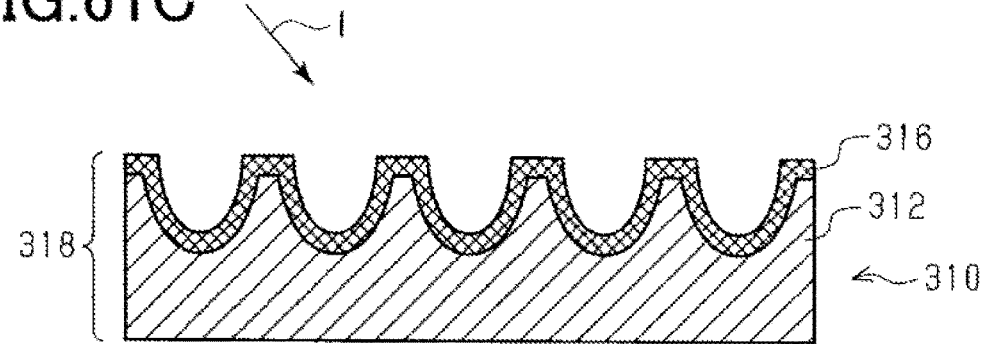
FIG. 61C is a sectional view showing a sectional structure of the display body of the eighth embodiment.

As shown in FIGS. 61A to 61C, a display body 310 of the eighth embodiment includes a stacked body 318 having a support layer 312, which is constituted of a material transparent to incident light l and includes a concavo-convex structure layer 314, and a metal layer 316 formed on the concavo-convex structure layer 314.

The concavo-convex structure layer 314 is made of a dielectric material like the seventh embodiment. In the case where the incident light l is visible region light, the dielectric material preferably includes, for example, synthetic quartz and resins through which visible light is able to pass.

In the eighth embodiment, a plurality of recesses 314 arranged in priodicity are provided on the support layer 312 thereby forming the concavo-convex structure layer 314. In the concavo-convex structure layer 314, a flat surface 322 is present on each of projections 314g that are a region other than the recesses 314e.

It will be noted that the example of the concavo-convex structure layer 314 shown in FIG. 61A shows a configuration wherein the recesses 314e are arranged in a hexagonal arrangement that is an example of a two-dimensional lattice arrangement. Nevertheless, the arrangement pattern of the recesses 314e is not limited to the hexagonal arrangement as described in the seventh embodiment.

The structural period PS of the recesses and projections of the concavo-convex structure layer 314, or the arrangement period of the recesses 314e in the eighth embodiment, is a sub-wavelength period which is less than the wavelength of incident light l as illustrated in the seventh embodiment.

As shown in FIG. 62A to 62D, a side wall 314f of the recess 314e is not inclined toward an adjacent projection 314g, but at least a part of the side wall 314f of the recess 314e is inclined toward the center of the recess 314e.

Figure 62A:
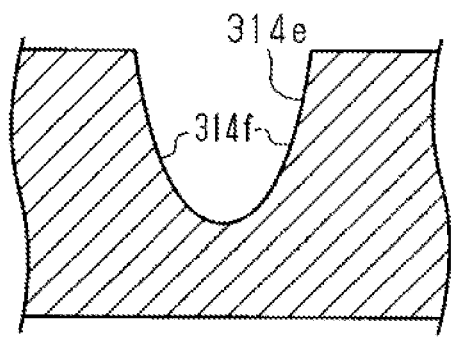
FIG. 62A is a sectional view showing an example of a recess shape of a concavo-convex structure of the eighth embodiment.
Figure 62B:
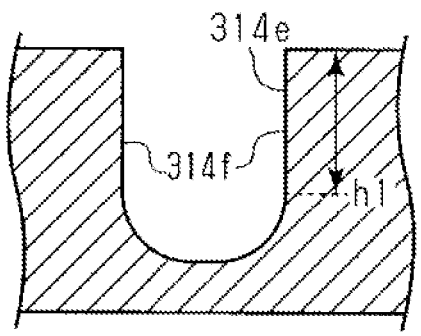
FIG. 62B is a sectional view showing another example of the recess shape of the concavo-convex structure of the eighth embodiment.
Figure 62C:
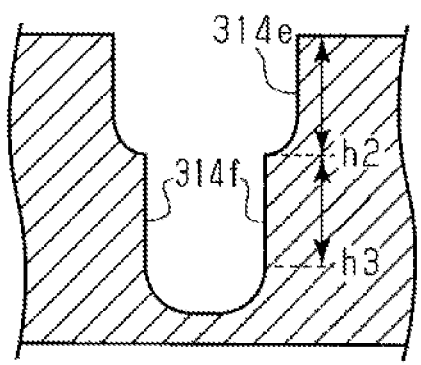
FIG. 62C is a sectional view showing a further example of the recess shape of the concavo-convex structure of the eighth embodiment.
Figure 62D:
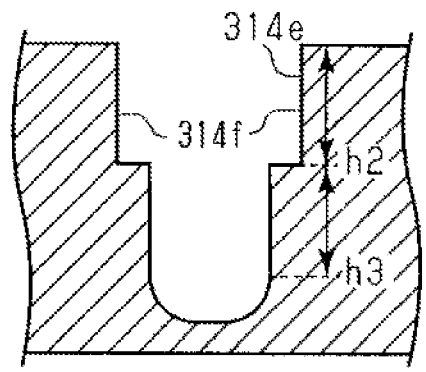
FIG. 62D is a sectional view showing another example of the recess shape of the concavo-convex structure of the eighth embodiment.

FIG. 62A shows, as enlarged, the shape of the side wall 314f of the recess 314e exemplified in FIG. 61B. The shape of the side wall 314f of the recess 314e is not limited to the shape continuously inclined toward the center of the recess 314e as exemplified in 62A. As shown in FIG. 62B, the side wall 314f may be so shaped as not to be inclined up to a depth h1 from the surface of the support layer 312 but to be inclined from a portion deeper than the depth h1 toward the center of the recess 314e. Alternatively, as shown in FIG. 62C, the side wall 314f may be so shaped as to be inclined at least a part up to a depth h2 from the surface of the support layer 312 toward the center of the recess 314e, but not to be inclined from the depth h2 to a depth h3 and to be inclined again from a portion deeper than the depth h3 toward the center of the recess 314*e*. Moreover, as shown in FIG. 62D, the side wall 314*f* may be so shaped as not to be inclined to the depth h2 from the surface of the support layer 312 and not to be inclined up to the depth h3 although the recess 314*e* becomes narrow in diameter at the depth h2 and to be inclined toward the center of the recess 314*e* at a portion deeper than the depth h3.

It will be noted that although not shown, a flat surface may be provided at the bottom of the recess 314*e* like the configuration of the modification example of the seventh embodiment.

According to the display body 310 of the eighth embodiment configured as stated above, mutually different colors are observed by observations including front-surface and rear-surface observations of reflected light and an observation of transmitted light due to the same mechanism as illustrated in the seventh embodiment. Therefore, there can be realized a display body that is not impaired with respect to the ease in authenticity determination.

In the above configuration, the recess 314*e* is an example of a periodic element and is a recess depressed from a reference plane when the surface of the support layer 312 which is an example of a support is taken as the reference plane. The structure constituted of the support layer 312 including the concavo-convex structure layer 314 is an example of a periodic structure. The metal layer 316 is taken as a metal layer having, as an entire layer, a shape that follows the surface profile of the periodic structure. The surface of the periodic structure includes a plane including a region of the reference plane surrounding the individual periodic elements and the surfaces of the respective periodic elements. The side face of the periodic element, which is the side wall 314*f* of the recess 314*e*, has no inclined portion which is farther away from the center of the periodic element when farther away from the reference plane. Moreover, at least a part of the side face of the periodic element is inclined more closely to the center of the periodic element when farther away from the reference plane. It will be noted that the center of the periodic element means a center of a periodic element as viewed in a direction perpendicular to the reference plane.

As stated above, in the eighth embodiment, light in specific wavelength region is emitted from the display body as reflected light or transmitted light due to plasmon resonance. Since the wavelength region of the transmitted or reflected light is determined due to a plurality of factors including the position and size of the respective recesses 314*e* and the metal layer whose position is determined depending on the respective periodic elements, the degree of freedom of adjusting the wavelength region transmitted through or reflected with the display body can be enhanced.

Like the seventh embodiment, the provision of a display body that enables the discrimination of the front and back of the display body by observation of the image formed by the display body is also an object of the eighth embodiment. As stated above, according to the eighth embodiment, there can be realized a display body that is not impaired with respect to the ease in authenticity discrimination.

Modification Examples of Seventh and Eighth Embodiments

Figure 63A:
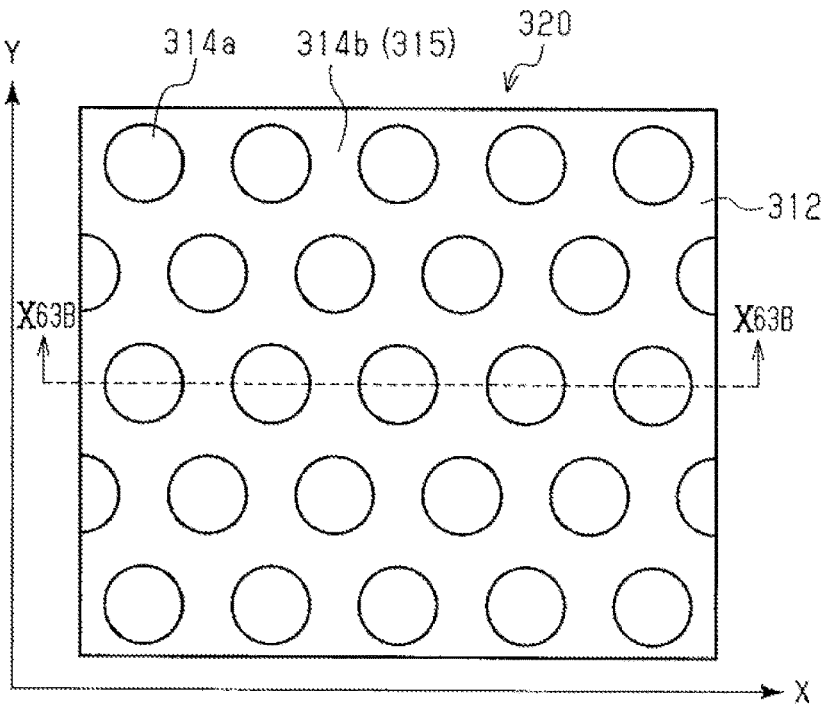
FIG. 63A is a plan view showing a planar structure of the concavo-convex structure layer in a modification example of the eighth embodiment.
Figure 63B:
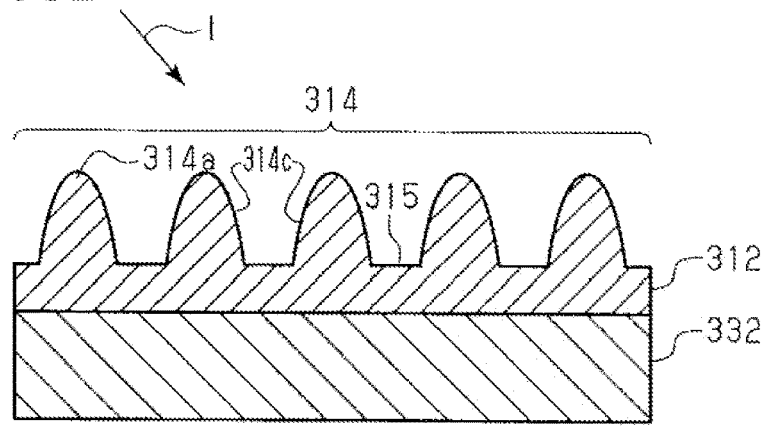
FIG. 63B is a view showing a sectional structure of the concavo-convex structure layer in the modification of the eighth embodiment and is a sectional view taken along the line X63B-X63B of FIG. 63A.
Figure 63C:
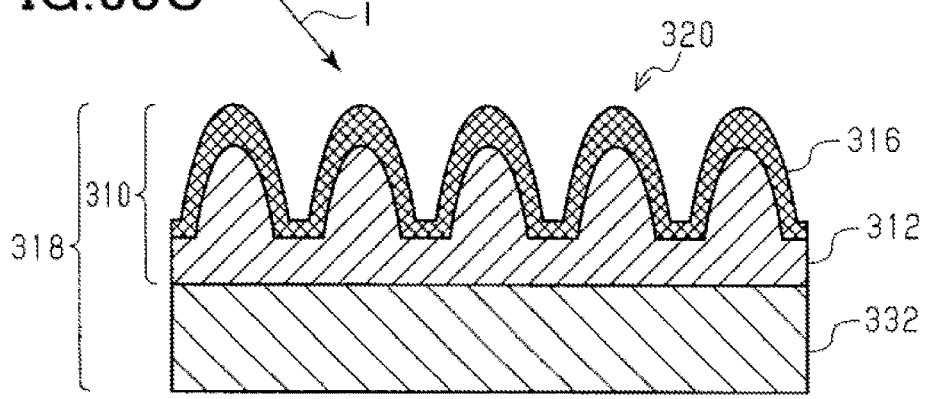
FIG. 63C is a sectional view showing the sectional structure of the display body of the modification example of the eighth embodiment.

With reference to FIGS. 63A to 63C, modification examples of the seventh and eighth embodiments are described. In the following, differences from the seventh embodiment are mainly illustrated and like parts as in the seventh embodiment are indicated by like reference numerals and the illustration thereof is omitted.

A display body 320 of the present modification example has a configuration wherein a stacked body having a structure similar to the display body 300 of the seventh embodiment is arranged on a substrate 332 as shown in FIG. 63C.

Where incident light l is visible region light, the substrate 332 is preferably made of a dielectric material capable of transmitting the visible region light, such as synthetic quartz or a resin, like the support 312. Such a substrate 332 can be imparted with a function, for example, of an adhesive layer. When the substrate 332 is used as an adhesive layer, the display body 320 can be bonded to a desired location.

It is to be noted that although not shown, a flat surface may be present on the tip end of the projection 314*a* like the configuration of the modification example of the seventh embodiment. The stacked body having a similar structure as the display body 310 of the eighth embodiment may be disposed on the substrate 332 thereby providing a display body.

In the above configuration, the substrate 332 and the support layer 312 serve as a support.

Next, a method for manufacturing the display body 320 is described.

Initially, using a known technique such as a nanoimprinting method using light or heat, the concavo-convex structure layer 314 is formed. For example, a UV curing resin is coated onto the substrate 332 made of polyethylene terephthalate, followed by pressing, against the UV curing resin coating, the surface of a synthetic quartz mold formed with a structure wherein the projections and recesses of the concavo-convex structure layer 314 as shown in FIGS. 63A to 63C are reversed. Subsequently, UV light is irradiated to cure the UV curing resin, followed by demolding between the substrate 332 and the mold.

It will be noted that when using a thermosetting resin or a thermoplastic resin instead of the UV curing resin, the demolding between the substrate 332 and the mold may be performed after pressing of the mold and heating or cooling.

With respect to the relation between a preferred structural period PS and the height of the projection 314*a* in the concavo-convex structure layer 314, the ratio of the height of the projection 314*a* to the structural period PS is preferably not larger than 0.5 like the seventh embodiment.

As described above, when using the manufacturing method suited for mass production by use, for example, of the nanoimprinting technique, there can be realized the display body 320 that enables mutually different colors to be observed in the observations including front-surface and rear-surface observations of reflected light and an observation of transmitted light. In this regard, however, since the wavelength selectivity of reflected or transmitted light changes depending on the refractive index of the support layer 312 for the concavo-convex structure layer 314, the material of the support layer 312 should be preferably selected depending on the desired color formation. Moreover, when the substrate 332 is functioned as an adhesive layer, the display body 320 can be used by being attached to a desired location.

It will be noted that the configurations of the projections 314*a* and the recesses 314*e* of the seventh embodiment, the eighth embodiment and the modification examples thereof may be applied to the configurations of the periodic elements in the display bodies of the first to sixth embodiments. Additionally, the configuration of the display body-attached device of the second embodiment may be applied to the seventh embodiment, the eighth embodiment and the modification examples thereof. Alternatively, the display body-attached device may include the display body of the seventh embodiment, the eighth embodiment or the modification examples thereof and the light-emitting structure.

<Additional Notes>

The measure for addressing the foregoing problems embraces the following items as a technical concept derived from the seventh embodiment, the eighth embodiment and the modification examples thereof.

[Item 51]

A display body comprising a support made of a material transparent to incident light, a concavo-convex structure layer formed on the surface of the support layer, and a metal layer formed to cover the surface of the concavo-convex structure layer wherein the concavo-convex structure layer includes a plurality of projections arranged to have a periodicity, a flat surface is present on the respective recesses that are a portion other than the respective projections in the concavo-convex structure layer, and at least a part of the side wall of the respective projection is inclined toward the center of the projection without being inclined toward the recess adjacent to the projection.

[Item 52]

The display body as recited in Item 51, wherein the plurality of the projections are arranged in a two-dimensional lattice.

[Item 53]

The display body as recited in Item 51 or 52, wherein a flat surface is positioned on the respective projections.

[Item 54]

The display body as recited in Item 51 or 52, wherein a flat surface is not positioned on the respective projections.

[Item 55]

A display body comprising a support made of a material transparent to incident light and including a concavo-convex structure layer, and a metal layer formed to cover the surface of the concavo-convex structure layer wherein the concavo-convex structure layer includes a plurality of recesses arranged to have a periodicity, a flat surface is present on the respective projections that are a portion other than the recesses in the concavo-convex structure layer, and at least a part of the side wall of the recess is inclined toward the center of the recess without being inclined toward the projection adjacent to the recess.

[Item 56]

The display body as recited in Item 55, wherein the recesses are arranged in a two-dimensional lattice.

[Item 57]

The display body as recited in Item 55 or 56, wherein a flat surface is positioned on the respective recesses.

[Item 58]

The display body as recited in Item 55 to 56, wherein a flat surface is not positioned on the respective recesses.

[Item 59]

The display body as recited in any one of Items 51 to 58, wherein the concavo-convex structure layer is made of a dielectric material.

[Item 60]

The display body as recited in any one of Items 51 to 59, wherein the structural period of the projections and recesses in the concavo-convex structure layer is not larger than the wavelength of the incident light.

[Item 61]

The display body as recited in Item 60, wherein the structural period is not larger than 400 nm.

[Item 62]

The display body as recited in any one of Items 51 to 61, wherein the thickness of the metal layer is from 10 nm to 200 nm.

[Item 63]

The display body as recited in any one of Items 51 to 62, wherein the metal layer is made of a material containing at least one of aluminum, gold, silver, tantalum and indium.

Ninth Embodiment

With reference to FIGS. 64 to 71, the ninth embodiment is illustrated with respect to an optical filter that is an example of an optical device, a display device, an image pickup device and a method for manufacturing an optical device.

Figure 64:
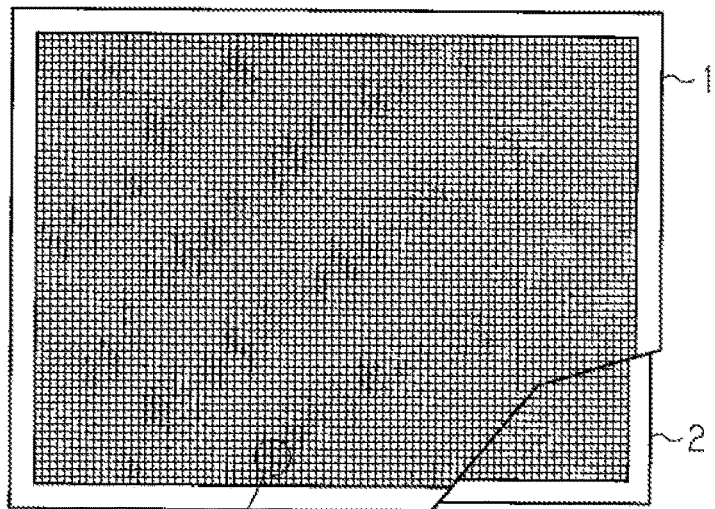
FIG. 64 is a plan view showing a planar structure in a display device of a ninth embodiment.
Figure 64:
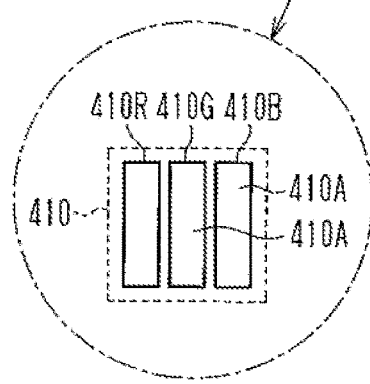

As shown in FIG. 64, a display body includes a color filter 1 that is an example of an optical filter, and a light source device 2. The color filter 1 serves to convert the color of light incident from the light source device 2. The light source device 2 emits light incident to the color filter 1. The light source device 2 includes, for example, a liquid crystal device provided with a backlight, an EL device provided with a plurality of self-luminous elements, or an LED device provided with a plurality of LED (light emitting diode) elements. The light source device 2 includes a plurality of unit regions arranged in a matrix, and the intensity of light emitted from the light source device 2 is changed in every unit.

The color filter 1 includes one pixel 410 in the respective unit regions, and the individual pixels include three types of subpixels 410A. The subpixel 410A is an example of a filter element. The type of subpixel 410A is determined by the color of light emitted from the subpixel 410A. The three types of subpixels 410A include a red subpixel 410R, a green subpixel 410G and a blue subpixel 410B. The red subpixel 410R emits red light after conversion of light incident to the red subpixel 410R. The green subpixel 410G emits green light after conversion of light incident to the green subpixel 410G. The blue subpixel 410B emits blue light after conversion of light incident to the blue subpixel 410B.

[Structure of Subpixel]

Figure 65:
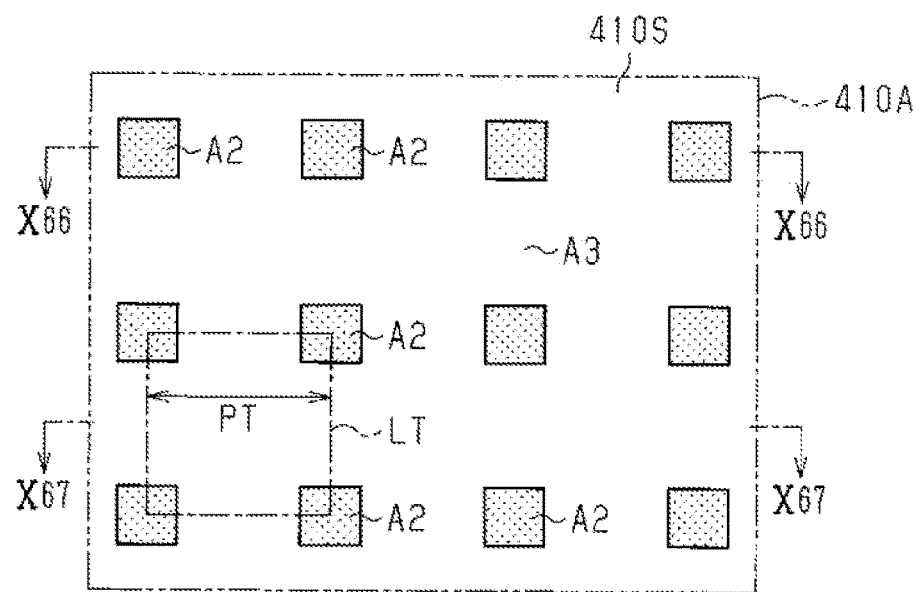
FIG. 65 is an enlarged view showing an enlarged plan structure of subpixels of a color filter of a ninth embodiment.

As shown in FIG. 65, the subpixel 410A includes a plurality of isolated regions A2 and a single peripheral region A3 surrounding the individual isolated regions A2 as viewed in a direction perpendicular to the subpixel 410A. In FIG. 65. Each isolated region A2 is indicated as a dot for the sake of illustration of the isolated regions A2.

The respective isolated regions A2 are arranged in a square arrangement across the surface 410S of the subpixel 410A. The square arrangement is one wherein the isolated regions A2 are positioned at the respective apexes of a square LT whose one side has a structural period PT. It will be noted that the respective isolated regions A2 may be arranged in a hexagonal arrangement. More particularly, the isolated regions A2 are arranged in an island arrangement that is either of the square arrangement or the hexagonal arrangement. It is to be noted that the hexagonal arrangement is one wherein the isolated regions A2 are positioned at the respective apexes of an equilateral triangle.

Figure 66:
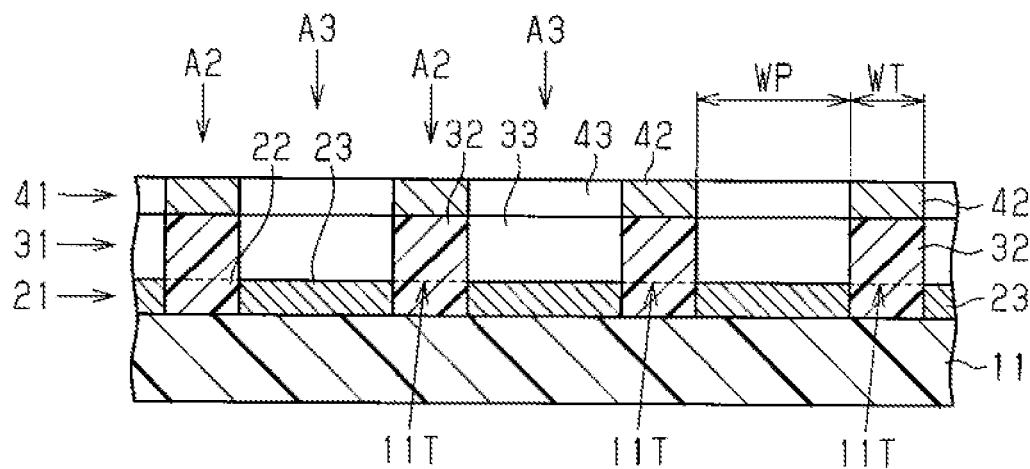
FIG. 66 is a view showing a sectional view of the subpixels of the ninth embodiment and is a sectional view taken along the line X66-X66 of FIG. 65.

As shown in FIG. 66, the color filter includes the transparent support 11 permitting visible region light to be transmitted therethrough. The wavelength of the visible region light is from 400 nm to 800 nm. The sectional structure of the support 11 may be either a single layer structure or a multilayer structure.

The constituent material for the support 11 is a dielectric material including, for example, a resin such as a photocurable resin or an inorganic material such as quartz. Preferably, the constituent material for the support 11 is a resin. The refractive index of the support 11 is higher than that of an air layer and is preferably from 1.2 to 1.7, for example.

The subpixel 410A includes a first grating layer 21, an intermediate grating layer 31 and a second grating layer 41 in the order closer to the support 11. The intermediate grating layer 31 is sandwiched between the first grating layer 21 and the second grating layer 41. It will be noted that a surface at which the first grating layer is positioned in the support 11 is a front surface of the support 11, and a side at which the first grating layer 21 is positioned relative to the support 11 is a front surface side of the structure. In contrast, a side at which the support 11 is positioned relative to the first grating layer 21 is a rear surface side of the structure.

[First Grating Layer 21]

The first grating layer 21 is positioned on the surface of the support 11. The first grating layer 21 includes a plurality of first dielectric layers 22 and a single first metal layer 23. As viewed in a direction perpendicular to the surface 410S of the subpixel 410A, the respective first dielectric layers are positioned in the isolated regions A2. As viewed in a direction perpendicular to the surface 410S, the single first metal layer 23 is positioned in the peripheral region A3. The plurality of the first dielectric layers 22 are arranged across the front surface 410S in an island arrangement that is either of the square arrangement and the hexagonal arrangement.

The respective first dielectric layers 22 are a structure projecting from the surface of the support 11. The respective first dielectric layers 22 are integrated, for example, with the support 11. Alternatively, the respective dielectric layers 22 may have a boundary between themselves and the surface of the support 11 thus being a different body from the support 11.

As viewed from a direction perpendicular to the surface 410S, the first metal layer 23 has a mesh pattern for surrounding the individual first dielectric layers 22 one by one. In the first grating layer 21, the first single metal layer 23 is an optical sea component which is full of free electrons from end to end, and the respective first dielectric layers 22 are island components distributed in the sea component.

As viewed in a direction perpendicular to the surface 410S, the structural period that is a positioning period of the first dielectric layers 22 is the total of the shortest width WP of the mutually adjacent first dielectric layers 22 and the width WT of the first dielectric layer 22. The structural period PT is a sub-wavelength period that is a visible region wavelength. In view of the brightness of the color of light emitted from the subpixel 410S and the obtainment of the processing accuracy of the first grating layers 21, the structural period is preferably from 200 nm to 400 nm.

The ratio of the width WT of the first dielectric layer to the structural period PT is from 0.30 to 0.65. In view of the obtainment of high processing accuracy of the first grating layer 21 and the likelihood of causing plasmon resonance to occur in the first grating layer 21, the ratio of the width WT of the first dielectric layer 22 to the structural period PT is preferably from 0.40 to 0.60.

The thickness of the first grating layer 21 is preferably not larger than 200 nm. In view of the obtainment of high processing accuracy of the first grating layer 21, the likelihood of causing plasmon resonance to occur in the first grating layer 21, the enhancement of light transmission in the first grating layer 21, and the obtainment of brightness in hue of images in respective observations, the thickness of the first grating layer 21 is preferably not larger than 15 nm.

[Intermediate Grating Layer 31]

The intermediate grating layer is positioned on the first grating layer 21. The thickness of the intermediate grating layer 31 is larger than the thickness of the first grating layer 21. In view of the obtainment of high processing accuracy of the intermediate grating layer 31, the thickness of the intermediate grating layer 31 is preferably from 100 nm to 200 nm in total with the first grating layer 21.

The intermediate grating layer 31 includes a plurality of first intermediate dielectric layers 32 and a second single intermediate dielectric layer. As viewed in a direction perpendicular to the surface 410S, the respective first intermediate dielectric layers 32 are positioned in the isolated regions A2. The second single intermediate dielectric layer 33 is positioned in the peripheral region A3 as viewed in a direction perpendicular to the surface 410S. The plurality of the first intermediate dielectric layers 32 are arranged across the surface 410S in an island arrangement that is either of the square arrangement and the hexagonal arrangement.

The respective first intermediate dielectric layers 32 are a structure projecting from the first dielectric layer 22. The respective first intermediate dielectric layers 32 are, for example, integrated with the first dielectric layer 22. Alternatively, the respective first intermediate dielectric layers 32 may have, for example, a boundary between themselves and the first dielectric layer 22, thus being a different body from the first dielectric layer 22. As viewed in a direction perpendicular to the surface 410S, the positioning period of the first intermediate dielectric layers is the total of the shortest width WP and the width WT and is thus the structural period PT like the first dielectric layers 22. The ratio of the width of the first intermediate dielectric layer 32 to the structural period PT is from 0.30 to 0.65. The ratio of the width WT of the first intermediate dielectric layer 32 to the structural period PT is preferably from 0.4 to 0.6.

As viewed in a direction perpendicular to the surface 410S, the second intermediate dielectric layer 33 has a mesh pattern for surrounding the individual first intermediate dielectric layers 32 one by one. In the intermediate grating layer 31, the second single intermediate dielectric layer 33 is a structural and optical sea component, and the respective intermediate dielectric layers 32 are structural and optical island components. The second intermediate dielectric layer 33 is an air layer or a resin layer.

[Second Grating Layer 41]

The second grating layer 41 is positioned on the intermediate grating layer 31. The thickness of the second grating layer 41 is preferably not larger than 200 nm. The thickness of the second grating layer 41 is less than the thickness of the intermediate grating layer 31. From the standpoint that high processing accuracy of the second grating layer 41 is obtained, plasmon resonance is likely to occur in the second grating layer 41, light transmission in the second grating layer 42 is enhanced, and the colors of images by the respective observations become bright, it is preferred that the thickness of the second grating layer 41 is not larger than 15 nm.

The second grating layer 41 includes a plurality of second metal layers 42 and a second single dielectric layer 43. As viewed in a direction perpendicular to the surface 410S, the positions of the respectively second metal layers 42 include the isolated regions A2. The position of the second single dielectric layer 43 is included in the peripheral region A3 as viewed in a direction perpendicular to the surface 410S. The plurality of the second metal layers 42 are arranged across the surface 410S in an island arrangement that is either of the square arrangement and the hexagonal arrangement.

The respective second metal layers 42 are a structure overlapped on the top surface of the first intermediate dielectric layer 32. The respective second metal layers 42 have a boundary between themselves and the first intermediate dielectric layers 32 and are thus different bodies from the first intermediate dielectric layers 32. As viewed in a direction perpendicular to the surface 410S, the positioning period of the second metal layers 42 is the total of the shortest width WP and the width WT like the first dielectric layers 22 and is thus the structural period PT. The ratio of the width of the second metal layer 42 to the structural period PT is from 0.30 to 0.65. The ratio of the width of the second metal layer 42 to the structural period PT is preferably from 0.4 to 0.6.

As viewed in a direction perpendicular to the surface 410S, the second dielectric layer 43 has a mesh pattern for surrounding the individual second metal layers 42 one by one. In the second grating layer 41, the second single dielectric layer 43 is an optical sea component wherein free electrons are less in number than in the second metal layer 42, and the respective second metal layers 42 are island components distributed in the sea component. The second dielectric layer 43 is an air layer or a resin layer.

The volume ratio of the first metal layer 23 serving as a sea component in the first grating layer 21 is larger than the volume ratio of the second metal layers 42 serving as island components in the second grating layer 41. The volume ratio of the second metal layers 42 serving as island components in the second grating layer 41 is larger than a metal material in the intermediate grating layer 31.

It will be noted that the structure constituted of the first dielectric layers 22 and the first intermediate dielectric layer 32 is an example of the periodic element and is the projection 11T projected from a reference plane when the surface of the support 11 is taken as the reference plane. The rear surface of the first dielectric layer 22 is an example of one end portion in the periodic element, and the front surface of the first intermediate dielectric layer 32 is an example of the other end portion of the periodic element. The structure constituted of the support 11, the first dielectric layers 22 and the first intermediate dielectric layer 32 is an example of a periodic structure. The layer constituted of the first metal layer 23 and the second metal layers 42 is taken as a metal layer having, as an entire layer, a shape that follows the surface profile of the periodic structure. The surface of the periodic structure is a plane including the region of the reference plane surrounding the individual periodic elements and the surfaces of the respective periodic elements.

Figure 67:
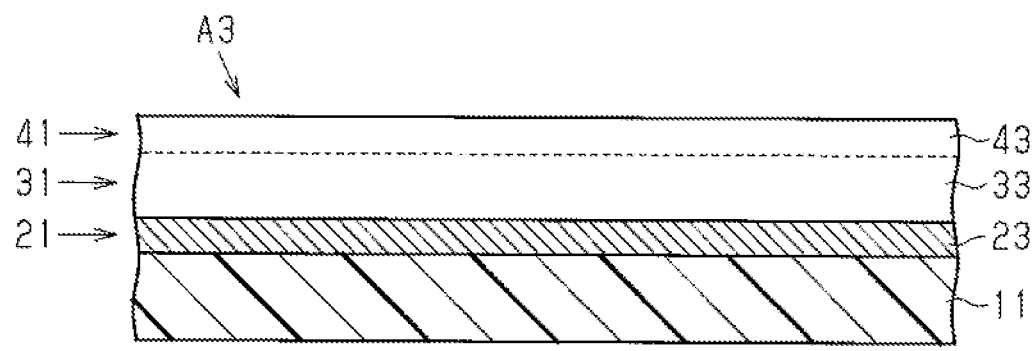
FIG. 67 is a view showing a sectional view of the subpixels of the ninth embodiment and is a sectional view taken along the line X67-X67 of FIG. 65.

As shown in FIG. 67, the peripheral region A3 includes, in the layer order from the support 11, the first metal layer 23 of the first grating layer 21, the second intermediate dielectric layer 33 of the intermediate grating layer 31, and the second dielectric layer 43 of the second grating layer 41. The second intermediate dielectric layer 33 is sandwiched between the first metal layer 23 and the second dielectric layer 43.

Figure 68:
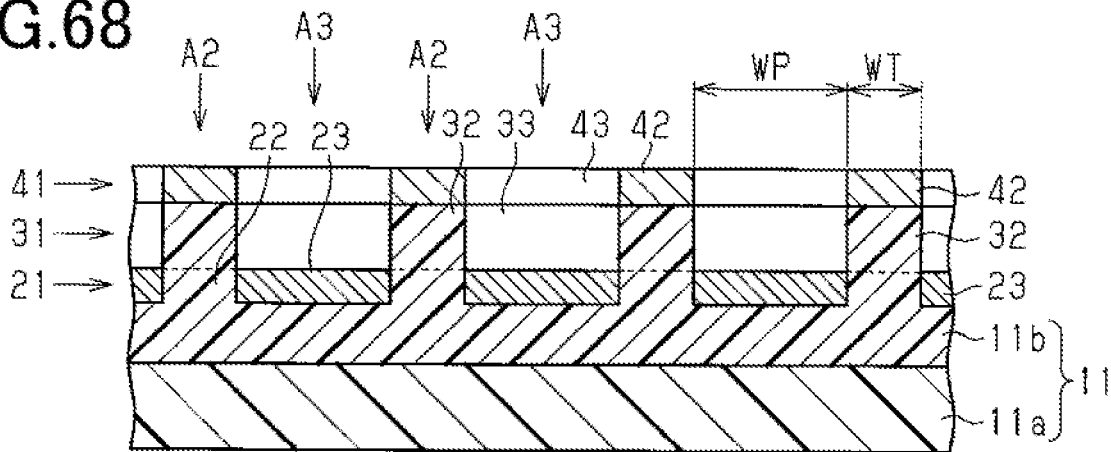
FIG. 68 is a sectional view showing another example of the sectional view of the subpixels of the ninth embodiment.

It will be noted that as stated above, the sectional structure of the support 11 may be a multilayer structure, and the respective first dielectric layers 22 may not have a boundary between themselves and the support 11. FIG. 68 shows a structure wherein the support 11 is constituted of two layers, of which the layer at the front surface side of the support 11 is integrated with the respective first dielectric layers 22. More particularly, the support 11 includes a substrate 11a and an intermediate layer 11b, and the intermediate layer 11b is positioned at the front surface side relative to the substrate 11a. The respective first dielectric layers 22 are projected from the intermediate layer 11b, and the respective first dielectric layers 22 and the intermediate layer 11b are integrated with each other.

[Optical Configuration of Color Filter]

Next, an optical configuration of the color filter is described.

Here, there is illustrated a configuration wherein the front surface 410S of the subpixel 410A and the rear surface 410T of the subpixel 410A are, respectively, in contact with an air layer, and the second intermediate dielectric layer 33 and the second dielectric layer 43 are, respectively, an air layer or a resin layer whose refractive index is close to that of the air layer.

Figure 69:
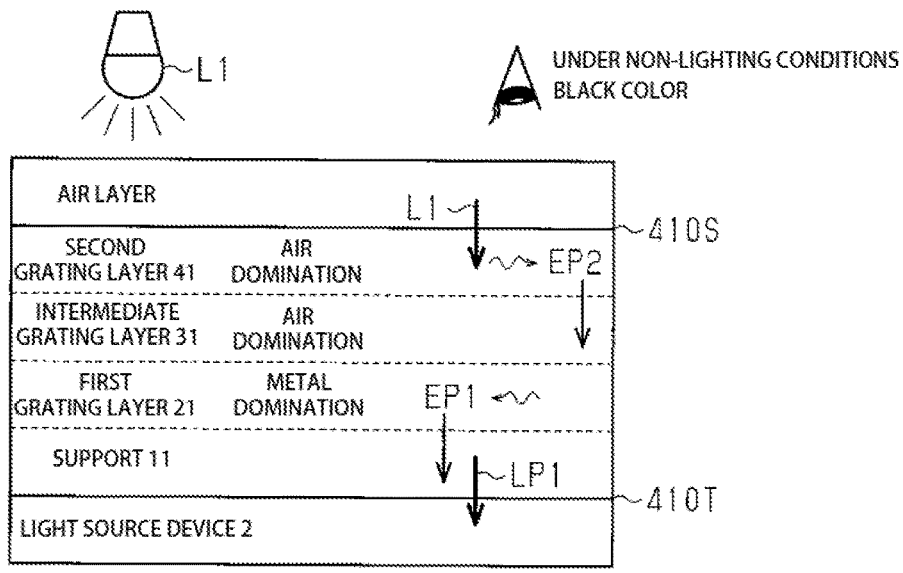
FIG. 69 is an operational view showing the operation of the color filter of the ninth embodiment upon non-lighting of a light source device.

As shown in FIG. 69, the refractive index of the support 11 has the magnitude dominated by a dielectric and is larger than the refractive index of the air layer.

The refractive index of the first dielectric layer 22 is higher than the refractive index of the air layer, and the refractive index of the first metal layer 23 is lower than the refractive index of the air layer. The refractive index of the first grating layer 21 approximates the magnitude averaged between the refractive index of the first metal layer 23 and the refractive index of the first dielectric layer 22. The ratio of the width WT of the first dielectric layer 22 to the structural period PT is from 0.30 to 0.65, so that the refractive index of the first grating layer 21 is resultantly the magnitude dominated by the first metal layer 23 serving as a sea component and is much lower than the refractive index of the air layer.

The refractive index of the first intermediate dielectric layer 32 is higher than the refractive index of the air layer, and the refractive index of the second intermediate dielectric layer 33 is equal to or higher than the refractive index of the air layer. The refractive index of the intermediate grating layer 31 approximates the magnitude averaged between the refractive index of the second intermediate dielectric layer 33 and the refractive index of the first intermediate dielectric layer 32. Since the ratio of the width WT of the first intermediate dielectric layer 32 to the structural period PT is from 0.30 to 0.65, the refractive index of the intermediate grating layer 31 has the magnitude dominated by the second intermediate dielectric layer 33 serving as a sea component and is higher than and close to the refractive index of the air layer.

The refractive index of the second metal layer 42 is lower than the refractive index of the air layer, and the refractive index of the second dielectric layer 43 is equal to or higher than the refractive index of the air layer. The refractive index of the second grating layer 41 approximates the magnitude averaged between the refractive index of the second dielectric layer 43 and the refractive index of the second metal layer 42. The ratio of the width WT of the second metal layer 42 to the structural period PT is from 0.30 to 0.65, so that the refractive index of the second grating layer 41 resultantly has the magnitude dominated by the second dielectric layer 43 serving as a sea component and is lower than and close to the refractive index of the air layer.

[Non-Lighting Observation]

In a non-lighting state of the light source device 2, the main light incident to the color filter is external light L1 incident from the front surface side of the color filter. The external light L1 incident from the front surface 410S of the subpixel 410A to the second grating layer 41 enters from the air layer to the second grating layer 41 and then from the second grating layer 41 into the intermediate layer 31. The external light L1 incident to the second grating layer 41 enters from the air layer into the second grating layer 41 having a refractive index close to the air layer, and the thickness of the second metal layer 42 is sufficiently small, so that Fresnel reflection hardly occurs at the interface between the second grating layer 41 and the intermediate grating layer 31. The light incident to the intermediate grating layer 31 enters from the second grating layer 41 having a refractive index close to the air layer to the intermediate grating layer 31 having a refractive index close the air layer, so that Fresnel reflection hardly occurs at the interface between the second grating layer 41 and the intermediate grating layer 31 as well.

On the other hand, since the structural period PT of the second metal layers 42 is a sub-wavelength period that is less than a visible region wavelength, part of the external light L1 incident to the second grating layer 41 is converted to a surface plasmon due to plasmon resonance in the second grating layer 41 and this surface plasmon transmits through the second grating layer 41. The surface plasmon passing through the second grating layer 41 is re-converted to light and emitted. Plasmon resonance is a phenomenon wherein part of the external light L1 incident to the second grating layer 41 is coupled with collective vibrations of electrons in the second grating layer 41. The wavelength region of light EP2 emitted from the second grating layer 41 due to plasmon resonance is a specific wavelength region that depends on the grating structure including the structural period PT of the second metal layers 42 and the type of material. As a result, the second grating layer 41 allows the transmission, to the intermediate grating layer 31, of light in part of the wavelength region of the external light L1 incident to the second grating layer 41.

Since the structural period PT of the first dielectric layers 22 is a sub-wavelength that is less than a visible region wavelength, part of the light incident to the first grating layer 21 is also converted to a surface plasmon due to plasmon resonance in the first grating layer 21, and the surface plasmon transmits through the first grating layer 21. The surface plasmon passing through the first grating layer 21 is re-converted to light and emitted. The wavelength region of light EP1 emitted from the first grating layer 21 due to plasmon resonance is a specific wavelength region depending on the grating structure including the structural period PT of the first dielectric layer 22 and the type of material. As a result, the first grating layer 21 permits the light LP1 in part of the wavelength of light incident to the first grating layer 21 to transmit to the support 11.

As stated above, according to the non-lighting observation wherein the external light L1 is made incident from the outside of the color filter to the second grating layer 41 and the front surface 410S is observed from the front surface side of the color filter, Fresnel reflection is less likely to occur at the respective interfaces indicated above and plasmon resonance occurs in the respective grating layers, with the result that a black color or a color close to black is visually recognized in the sub-pixel 410A.

[Lighting Observation]

Figure 70:
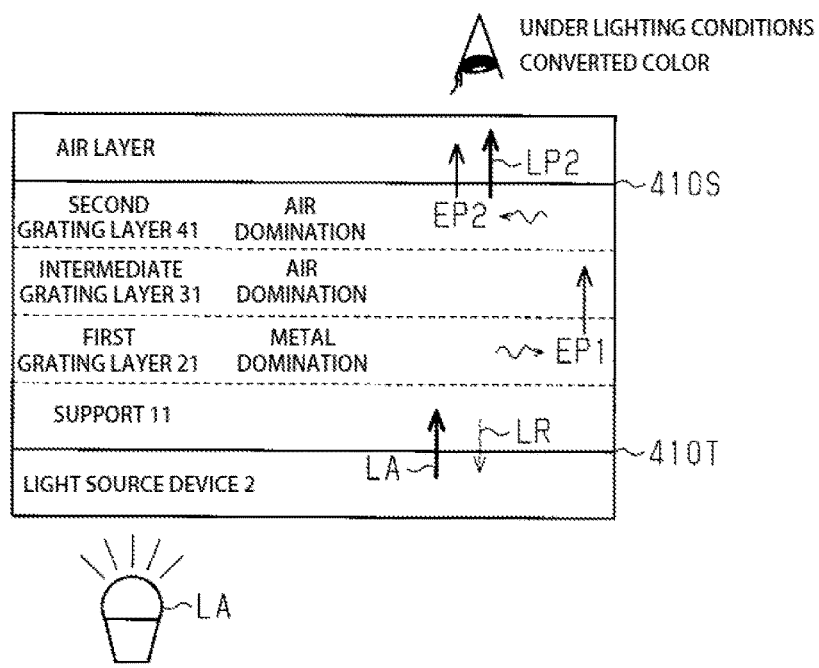
FIG. 70 is an operational view showing the operation of the color filter of the ninth embodiment at the time of lighting of a light source device.

As shown in FIG. 70, white light LA from the light source device 2, which is incident from the rear surface 410T of the subpixel 410A to the support 11, enters from the air layer into the support 11 and then from the support 11 into the first grating layer 21. The light LA incident to the support 11 enters from the support 11 having a refractive index higher than the air layer into the first grating layer 21 having a refractive index lower than the air layer, under which Fresnel reflection is likely to occur at the interface between the support 11 and the first grating layer 21. In this regard, however, since the first metal layer 23 is sufficiently small in thickness, the intensity of reflected light LR by Fresnel reflection can be adequately suppressed.

On the other hand, part of the light transmitted through the interface between the support 11 and the first grating layer 21 is consumed by plasmon resonance in the first grating layer 21. The wavelength region of light EP1 emitted from the first grating layer 21 due plasmon resonance here is a specific wavelength region depending on the grating structure including the structural period PT of the first metal layer 23 and the type of material. As a result, the first grating layer 21 permits the light of the specific wavelength region in the light incident to the first grating layer 21 to be transmitted to the intermediate grating layer 31.

Part of the light incident to the second grating layer 41 after transmission through the intermediate grating layer 31 is also consumed by plasmon resonance in the second grating layer 41. The wavelength region of light EP2 emitted from the second grating layer 41 due to plasmon resonance is also a specific wavelength region depending on the grating structure including the structural period PT of the second dielectric layers 43 and the type of material. As a result, the second grating layer 41 permits the light of the specific wavelength region in the light incident to the second grating layer 41 to be transmitted to the air layer.

As stated above, in the lighting observation wherein the light LA is made incident from the light source device 2 to the color filter and the front surface 410S is observed from the front surface side of the color filter, colored light undergoing plasmon resonance in the respective grating layers described above, or the light LP2 after the color conversion corresponding to the type of subpixel 410A, is visually recognized in the subpixel 410A.

[Method for Manufacturing Color Filter]

Next, an example of a method for manufacturing the color filter is illustrated.

Initially, the first dielectric layers 22 and the first intermediate dielectric layers 32 are formed on the surface of the support 11. The first dielectric layers 22 and the first intermediate dielectric layers 32 are integrally formed as a projection 11T projecting from the surface of the support 11. For the formation of the projections 11T, there can be adopted a photolithographic method using light or a charged particle beam, a nanoimprinting method, or a plasma etching method. Especially, where the projections 11T are formed on the surface of the support 11 made of a resin, there can be used, for example, a nanoimprinting method. In the case where the projections 11T are formed by processing a hard material substrate, there may be used a combined method of the photolithographic method using light or a charged particle beam and the plasma etching method.

For example, where the subpixel 410A having the support 11 made of the substrate 11a and the intermediate layer 11b as shown in FIG. 68 is prepared, a polyethylene terephthalate sheet is used as the substrate 11a, followed by coating a UV curing resin on the surface of the substrate 11a. Next, the surface of a synthetic quartz mold used as an intaglio plate is pressed against the surface of the coated film made of the UC curing resin, followed by irradiation of UV light. Subsequently, the synthetic quartz mold is removed from the UV cured resin. In this way, the projections and recesses of the intaglio plate are transferred to the resin on the surface of the substrate 11a, and the projections 11T each made of the first dielectric layer 22 and the first intermediate dielectric layer 32, and the intermediate layers 11b, are formed. It will be noted that the UV curing resin may be changed to a thermosetting resin. UV irradiation may be changed to heating. Moreover, the UV curing rein may be changed to a thermoplastic resin, and the UV irradiation may be changed to heating and cooling.

Next, the first metal layers 23 and the second metal layers 42 are formed on the surface of the support 11 provided with the projections 11T. The method for forming the first metal layers 23 and the second metal layers 42 includes, for example, a vacuum deposition method and a sputtering method. Hence, the first grating layer 21 segmented with the top surfaces of the first metal layers 23 is formed, the second grating layer 41 segmented with the top surfaces of the second metal layers 42 is formed, and the intermediate grating layer 31 sandwiched between the first grating layer 21 and the second grating layer 41 is formed.

Configuration Example of Subpixel

Figure 71:
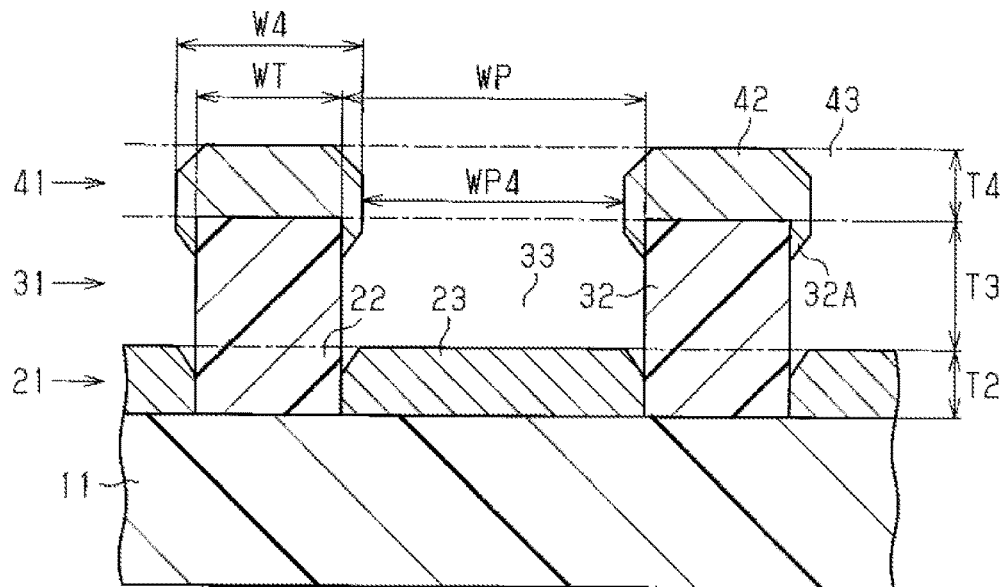
FIG. 71 is a sectional view showing an enlarged example of a part of a sectional structure in the subpixel of the ninth embodiment.

As shown in FIG. 71, a smaller thickness T2 of the first metal layer 23 leads to a greater intensity of transmitted light in the first grating layer 21 thereby more enhancing image brightness in lighting observation. A larger ratio of the width WT of the first dielectric layer 22 to the structural period PT also leads to a more enhanced image lightness in lighting observation.

It will be noted that when the region of the first metal layers 23 is excessively small, or when the region of the second metal layers 42 is excessively small, continuity defects occur in the first metal layer 23 and the second metal layer 42, so that wavelength selectivity due to plasmon resonance as set out before is unlikely to be obtained.

In this connection, if a thickness T2 of the first metal layer 23 and a thickness T4 of the second metal layer 42 are, respectively, not larger than $\frac{1}{10}$ times the total of the thickness T2 of the first grating layer 21 and a thickness T3 of the intermediate grating layer 31 and the ratio of the width WT of the first dielectric layer 22 to the structural period PT is not less than 0.30, a satisfactory image color is obtained in lighting observation.

If the thickness T2 of the first metal layer 23 and a thickness T4 of the second metal layer 42 are, respectively, $\frac{1}{10}$ times the total of the thickness T2 of the first grating layer 21 and the thickness T3 of the intermediate dielectric layer 31 and the ratio of the width WT of the first dielectric layer 22 to the structural period PT is not larger than 0.65, satisfactory image brightness in the above lighting observation is obtained. Moreover, the ratio of the width WT of the first dielectric layer 22 to the structural period PT is preferably not larger than 0.6, more preferably not larger than 0.5.

It is preferred that the total of the thickness T2 of the first dielectric layer 22 and the thickness T3 of the first intermediate layer 32 is less than the structural period PT that is the total of the width WT of the first dielectric layer 22 and the shortest width WP. More preferably, the total of the thickness T2 of the first dielectric layer 22 and the thickness T3 of the first intermediate dielectric layer 32 is less than half the structural period PT.

According to the configuration as set out above, in the projections each integrally formed of the first dielectric layer 22 and the first intermediate dielectric layer 32, it is possible to increase their shape accuracy, and the projections 11T are suppressed from being collapsed on the surface of the support 11.

The metal material whose real part of complex permittivity in the visible region wavelength is negative is likely to cause plasmon resonance to occur in the first grating layer 21 and the second grating layer 41 using such a material. The constituent material for the first metal layer 23 is one that has a negative value in the real part of the complex permittivity. The constituent material for second metal layer 42 is also one that has a negative value in the real part of the complex permittivity.

The constituent materials for these first metal layer 23 and second metal layer 42 include, for example, aluminum, silver, gold, indium, tantalum and the like.

It will be noted that as stated in the above manufacturing method, the first metal layers 23 and the second metal layers 42 can be formed by a single step of forming a metal layer on the support 11 having the first dielectric layers 22 and the first intermediate dielectric layers 32.

In this case, metal particles sputtered from a film formation source are deposited at a given distribution of angle relative to the surface of the support 11. As a result, a width W4 of the second metal layer 42 becomes slightly larger than a width WT of the first intermediate dielectric layer 32, and a shortest width WP4 of the mutually adjacent second metal layers 42 becomes slightly less than the shortest width WP. In this case, the ratio of the width W4 of the second metal layer 42 to the structural period PT is from 0.30 to 0.65. Incidentally, the periphery of the first intermediate dielectric layer 32 in the first metal layer 23 receives an influence of a shadow effect due to the second metal layer 42 and becomes thinner at a portion closer to the first intermediate dielectric layer 32.

In the structure formed by the above formation method, the intermediate metal layer 32A that is a metal layer contiguous to the second metal layer 42 is formed on the side surfaces of the first intermediate dielectric layer 32.

The intermediate metal layer 32A is sandwiched between the first intermediate dielectric layer 32 and the second intermediate dielectric layer 33. The intermediate metal layer 32A is a structure integrated with the second metal layer 42, and its thickness on the side surface of the first intermediate dielectric layer 32 becomes smaller at a portion closer to the first metal layer 23.

Since such an intermediate dielectric layer 32A has the structural period PT that is a sub-wavelength period, the change in refractive index of the second grating layer 41 and the intermediate grating layer 31 in a thickness direction is made continuous.

The intermediate metal layer 32A reduces the likelihood of reflecting light incident from the front surface 410S of the subpixel 410A to the second grating layer 41 and permits easy transmission of light to the intermediate grating layer 31 and the first grating layer 21. Therefore, in the above-described non-lighting observation, a color closer to black is visually recognized in the subpixel 410A.

It will be noted that in order to suppress Fresnel reflection particularly at the front surface side of the subpixel 410A, it is preferred to satisfy the following requirements. More particularly, a difference in refractive index between the front surface layer, which is a layer in contact with the second dielectric layer 43 at a side opposite to the intermediate grating layer 31 relative to the second dielectric layer 43, and the second dielectric layer 43 should preferably be less than a difference in refractive index between the first metal layer 23 and the support 11. The surface layer is, for example, an air layer. More preferably, the refractive index of the second dielectric layer 43 should be the same as the refractive index of the surface layer.

As stated above, in the ninth embodiment, light in specific wavelength region is emitted from the optical filter as reflected or transmitted light due to plasmon resonance.

Since the wavelength region of the transmitted or reflected light is determined due to a plurality of factors including the position and size of the periodic elements which mean the respective projections 11T and the metal layer whose position is determined by the respective periodic elements, the degree of freedom of adjusting the wavelength region transmitted through or reflected from the optical filter can be enhanced.

In the meantime, a color conversion unit of an existing color filter is a single thin film layer capable of absorbing light of a given wavelength region, and a color after color conversion in the color filter becomes darker as the thin film layer is thicker. On the one hand, the thickness of the thin film layer is uneven within the thin film, i.e. the film may be thicker at edges thereof or may be thicker at the center thereof. Difficulty is involved in adjusting the thickness of the thin film layer within a desired distribution in the subpixel, and the just-stated color filter has no degree of freedom of adjusting, within the subpixel, the distribution of a wavelength region allowed to be selectively transmitted by the subpixel. Such a problem as described above is not limited to the color filters used in a display device, but is common to optical filters of the type that include a filter element capable of transmitting light in specific wavelength region out of the light emitted from a light source.

As stated above, the provision of an optical filter which is able to increase the degree of freedom of adjusting, within a filter element, the distribution of wavelength region of light allowed to be transmitted by the filter element is also an object of the ninth embodiment. According to the ninth embodiment, the effects described below are obtained including the effect on the above problem.

(9-1) According to the lighting observation wherein the color filter is observed from a direction perpendicular to the front surface 410S, an image having a color other than white or black is visually recognized in the subpixel 410A. In this case, the colors of the respective subpixels 410A are determined depending on the position and size of the projections 11T serving as the respective period elements and the respective metal layers 23, 42 whose positions are determined by the respective projections 11T. Hence, it is possible to increase the degree of freedom of adjusting, within the respective subpixels 410A, the color distribution in the respective subpixels 410A, i.e. the distribution of the wavelength of light allowed to be transmitted by the respective subpixels 410A.

For example, where the margin of subpixel 410A is light in color, it is possible that the position and size of the respective projections 11T positioned at the margin of the subpixel 410A, or the thicknesses of the respective metal layers 23, 42 are made different from those of the other portion of the subpixel 410A so that the color becomes darker.

For example, where the center of the subpixel 410A is dark in color, it is possible that the position and size of the respective projections 11T positioned at the center of the subpixel 410A and the thicknesses of the respective metal layers 23, 42 positioned at the center of the subpixel 410A are made different from those of other portion of the subpixel 410A so that the color becomes pale.

(9-2) Since the structural period PT is from 200 nm to 400 nm, diffraction of visible region light as would occur due to the repetition of the projections 11T is suppressed. As a result, the mixing of an iridescent color in the color of an image in the lighting observation is suppressed, and the color of an image can be made clear in every subpixel 410A.

(9-3) Since the total of the thickness T2 of the first grating layer 21 and the thickness T3 of the intermediate grating layer 31 is from 100 nm to 200 nm, visible region light is able to adequately pass through these first grating layer 21 and intermediate grating layer 31. Therefore, the clearness of the color in the respective subpixels 410A and the brightness of light in the respective subpixels 410A can be more enhanced.

(9-4) Further, since the thickness T2 of the first metal layer 23 and the thickness T4 of the second metal layer 42 are, respectively, not larger than 15 nm, the clearness of the color in the respective subpixels 410A and the brightness of light in the respective subpixels 410A can be much more enhanced.

(9-5) Since the total of the thickness T2 of the first grating layer 21 and the thickness T3 of the intermediate grating layer 31, respectively, have a magnitude sufficient to be applied with an intaglio plate such as for nanoimprinting, the projections 11T having the functions of both the first dielectric layers 22 and the first intermediate dielectric layers 32 can be formed as a single structure.

(9-6) In the non-lighting observation, Fresnel reflection is unlikely to occur at the interface between an air layer and the second grating layer 41 and also at the interface between the second grating layer 41 and the intermediate grating layer 31, and plasmon resonance occurs in the first grating layer 21 and the second grating layer 41, for which black or a color close to black is visually recognized in the subpixel 410A. Therefore, an indication suited for non-lighting can be given to the display device.

(9-7) Since the intermediate metal layer 32A has an anti-reflection function, the color of an image visually recognized by the non-lighting observation can be made much closer to black.

(9-8) When using a manufacturing method of forming a periodic structure constituted of the support 11 and a plurality of projections 11T according to a manufacturing procedure using a nanoimprinting method for the formation of the projections 11T or by transferring projections and recesses of an intaglio plate to a resin coated onto the surface of the substrate 11a, the periodic structure having fine projections and recesses can be easily and appropriately formed.

For example, when a plurality of holes arranged in a sub-wavelength period are formed on a flat metal layer and a dielectric material is filled in the holes, a grating structure causing plasmon resonance to occur can be formed. However, the formation of fine holes in the metal layer needs the formation of an etching mask by use of a photolithographic method or a nanoimprinting method and etching of the metal layer by a plasma etching method, thus complicating the manufacture of a color filter. Eventually, the yield of the color filter is apt to be lowered. In contrast, when using a method of forming a grating structure wherein plasmon resonance is caused to occur by stacking a metal layer on the projections and recesses formed by the nanoimprinting method like the present embodiment, the lowering of the yield can be suppressed.

Modification Example of Ninth Embodiment

The ninth embodiment can be performed by modifications in the following ways.

[Intermediate Grating Layer 31]

The first dielectric layers 32 and the second intermediate dielectric layers 33 can be embodied as different structures. In this case, the second intermediate dielectric layer 33 is preferably a resin layer having a refractive index that is closer to the refractive index of an air layer than to the refractive index of the first intermediate dielectric layer 32.

The second intermediate dielectric layer 33 and the second dielectric layer 43 can be formed as different structures. In this case, the second intermediate dielectric layer 33 is preferably a resin layer having a refractive index that is closer to the refractive index of an air layer than to the refractive index of the second dielectric layer 43.

[First Grating Layer 21]

Figure 72:
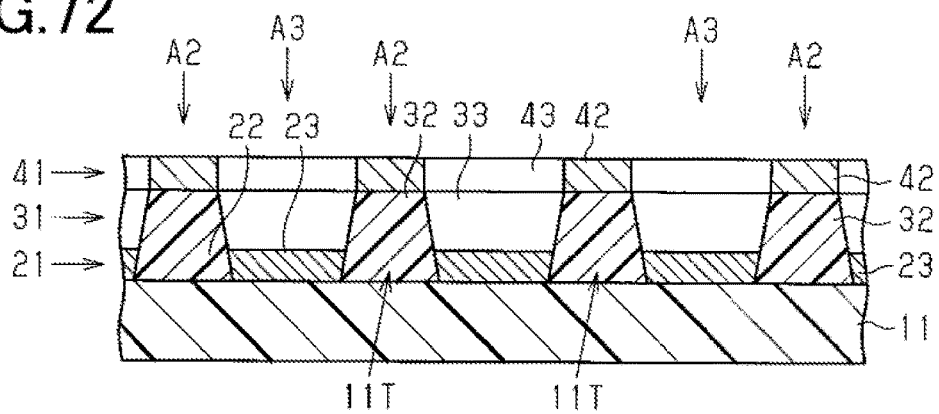
FIG. 72 is a sectional view showing an enlarged part of a sectional structure in the subpixel of a modification example of the ninth embodiment.

As shown in FIG. 72, the projections 11T constituted of the first dielectric layers 22 and the first intermediate dielectric layers 32 can be shaped each in the form of a pyramid projecting from the surface of the support 11. Such a structure enables smooth removal from an intaglio plate used to form them upon the formation of the first dielectric layers 22 and the first intermediate dielectric layers 32.

[Periodic Element]

The periodic elements arranged on the reference plane can be embodied in the form of recesses, which can be bottomed holes in the surface of the support 11. In this case, the reference plane means a surface of the support 11. One end portion of the periodic element is an opening of each hole, and the other end portion is a bottom face of each hole. The first metal layer 23 is positioned in the form of meshes each enclosing the opening of the individual holes, and the second metal layers 42 are each positioned on the bottom face of the respective holes. The inside of the respective holes is segmented with the second metal layer 42 and the first intermediate dielectric layer 32 positioned upwardly thereof. The space surrounded by the first metal layer 23 functions as the first dielectric layer 22. Even in such a configuration, the effects according to the foregoing (9-1) to (9-4), and (9-6) to (9-8) can be obtained.

The projections or recesses serving as a periodic element may be shaped as the projections or recesses shown in the seventh embodiment, the eighth embodiment and the modification examples thereof.

[Protective Layer]

The color filter further includes a protective layer on the second metal layer 42. In this case, the intensity of Fresnel reflection at the interface between the protective layer and the second metal layer 42 and the wavelength selectivity of the color filter associated therewith are changed depending on the refractive index of the protective layer. Hence, the constituent material for the protective layer is appropriately selected based on the wavelength region to be selected by the color filter.

Figure 73:
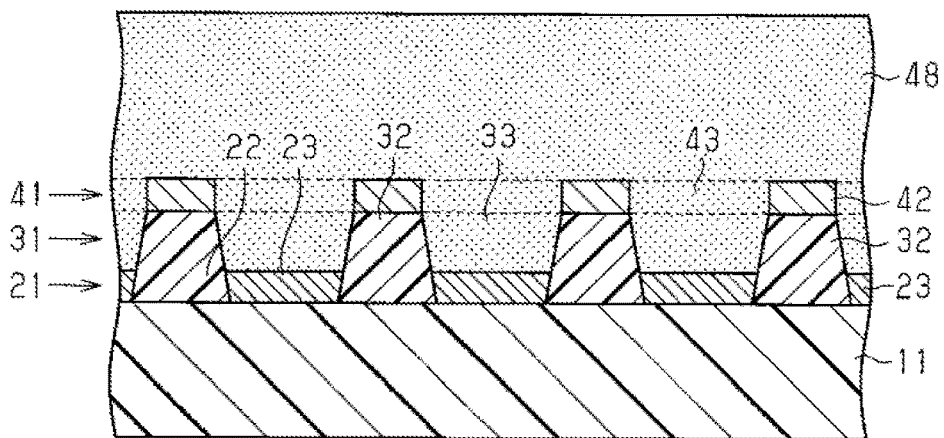
FIG. 73 is a sectional view showing an enlarged part of the sectional structure in the subpixel of the modification of the ninth embodiment.

It will be noted that as shown in FIG. 73, a protective layer 48 can be embodied as an integrated structure with the second dielectric layer 43 and the second intermediate dielectric layer 33. In this case, the protective layer 48 is preferably a resin layer with a low refractive index. The low refractive index resin layer has a refractive index closer to the refractive index of an air layer than the refractive index of the first dielectric layer 22 or the first intermediate dielectric layer 32.

Other Examples

As viewed in a direction perpendicular to the front surface 410S of the subpixel 410A, the arrangement of the isolated regions A2 is not limited to the square array and the hexagonal array, but a two-dimensional lattice array may be enough for the isolated regions. That is, the plurality of the first dielectric layers 22 may be arranged in a two-dimensional lattice. The plurality of the first intermediate dielectric layers 32 may also be arranged in a two-dimensional lattice. The plurality of the second metal layers 42 may be arranged in a two-dimensional lattice as well. In other words, the periodic elements of the periodic structure may be arranged in a two-dimensional lattice having a sub-wavelength period. The two-dimensional lattice array is one wherein elements are arranged along the respective two intersecting directions in a two-dimensional plane. In this case, the ratio of the width WT to the periodic structure PT is a ratio of the width WT to the structural period PT in one direction. The ratio which is within a given range means that the ratio of the width WT to the structural period PT is within a given range in the two respective array directions of the periodic elements. The thicknesses of the respective layers of the color filter, which are within a given range relative to the structural period PT, respectively, mean that the thicknesses of the respective layers are within a given range relative to the structural period PT in the two respective array directions of the periodic elements.

The shape of the isolated region A2, or the planar shape of the periodic element, as viewed in a direction perpendicular to the front surface 410S of the subpixel 410A, is not limited to a square, but may be a rectangle or other polygon, or may be a circle.

Figure 74:
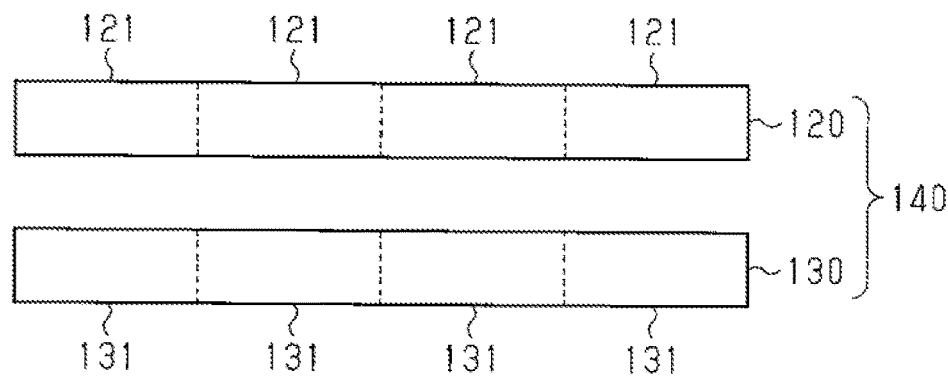
FIG. 74 is a view showing a configuration of an image pickup element to which the configuration of the ninth embodiment is applied.

The configuration of the optical filter of the ninth embodiment may be applied as a filter used for image pickup devices. The pickup device includes, for example, a CCD (charge coupled device) image sensor or a CMOS (complementary metal oxide semiconductor) image sensor. As shown in FIG. 74, an image pickup device 140 includes an optical filter 120 having a plurality of filter elements 121, and a light receiving element group 130 having a plurality of light receiving elements 131. The filter element 121 has a stacked structure similar to the subpixel 410A of the ninth embodiment, i.e. the structure made up of a periodic structure and a metal layer, and permits light of specific wavelength among light incident on the filter element 121 to be transmitted therethrough. The light receiving element 131 is an element wherein light incident to the light receiving element 131 is converted to electric charges.

The optical filter 120 and the light receiving element group 130 are facing each other and are so arranged that light transmitted through one filter element 121 is made incident to one light-receiving element 131. In other words, a portion of the optical filter 120 emitting transmitted light to one light receiving element 131 means one filter element 121. The light receiving element 131 receives the light transmitted through the filter element 121 and converts it into an electrical signal. The electric signal from the light receiving element 131 is subjected to calculation in a signal processing circuit, by which an image such as a product located at a side opposite to the light receiving element group 130 relative to the optical filter 120 is recorded.

The optical filter 120 is, for example, an on-chip color filter and the plurality of the filter elements 121 include plural types of filter elements 121 whose transmission wavelength regions differ from one another. For instance, the plurality of the filter elements 121 include three types of filter elements 121 such as a filter element 121 permitting red light transmission, a filter element 121 permitting green light transmission, and a filter element 121 permitting blue light transmission. Alternatively, the plurality of the filter elements 121 may include four types of filter elements 121 such as a filter element 121 permitting yellow (yellow) light transmission, a filter element 121 permitting light blue (cyan) transmission, a filter element 121 permitting purplish red (magenta) light transmission, and a filter element 121 permitting green (green) light transmission.

Where the image pickup device 140 is one used to record one color image like an image pickup device used in an infrared camera, the transmission wavelength regions of the plurality of filter elements 121 may be coincident with one another.

The structural period PT of the periodic elements of the periodic structure included in the filter element 121 may be not larger than the transmission wavelength region of the filter element 121. More particularly, in the ninth and tenth embodiments, the sub-wavelength period is defined as a period that is not larger than the transmission wavelength region of the filter element 121.

The light transmission wavelength region of the filter element 121 can be adjusted depending on a plurality of factors including the structural period PT, the width WT of a periodic element, a distance between one end portion and the opposite end portion of the periodic element, and the thicknesses of the metal layers 23, 42. Therefore, in any case where the optical filter 120 is used as any of devices, the degree of freedom of adjusting the light transmission wavelength region of the filter element 121 in the filter element 121 can be increased.

Tenth Embodiment

With reference to FIGS. 75 to 78, there is illustrated the tenth embodiment including sub-embodiments directed to an optical filter, a display device and an image pickup device which are examples of optical devices and also to a method for manufacturing the optical filter. The tenth embodiment is also one wherein an optical filter is embodied as a color filter assembled in display devices. In the following description, differences between the tenth embodiment and the ninth embodiment are mainly illustrated, and like parts as in the ninth embodiment are indicated by like reference numerals and their illustration is omitted.

[Structure of Subpixel]

Figure 75:
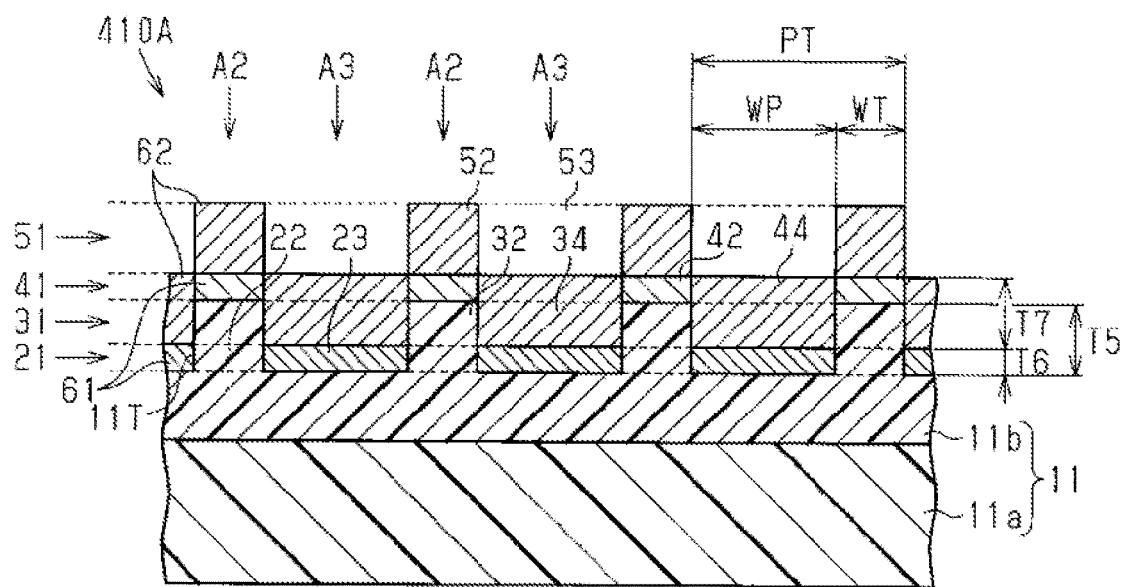
FIG. 75 is a sectional view showing a sectional structure of subpixels in a color filter of a tenth embodiment.

As shown in FIG. 75, a subpixel 410A includes an upper grating layer 51 in addition to a support 11, a first grating layer 21, an intermediate grating layer 31 and a second grating layer 41. The first grating layer 21, the intermediate grating layer 31, the second grating layer 41 and the upper grating layer 51 are stacked in this order from the surface of the support 11. That is, the second grating layer 41 is sandwiched between the intermediate grating layer 31 and the upper grating layer 51.

The support 11 has a similar configuration to the ninth embodiment. FIG. 75 shows the support 11 made of a substrate 11a and an intermediate layer 11b. It will be noted that where the support 11 is made of the substrate 11a and the intermediate layer 11b, it is preferred that a constituent material for the substrate 11a has a refractive index closer to a refractive index of a constituent material for the intermediate layer 11b. The respective refractive indexes of the substrate 11a and the intermediate layer 11b are higher than that of an air layer and are, for example, from 1.2 to 1.7.

[First Grating Layer 21]

The first grating layer 21 has a similar configuration to the ninth embodiment and includes a plurality of first dielectric layers 22 individually positioned in isolated regions A2, a first single metal layer 23 positioned in a peripheral region A3. The ratio of the width WT of the first dielectric layer 22 to the structural period PT is from 0.30 to 0.65, preferably from 0.40 to 0.60. More preferably, the ratio is not larger than 0.5. The thickness of the first grating layer 21 is preferably not larger than 200 nm, more preferably not larger than 15 nm.

[Intermediate Grating Layer 31]

The intermediate grating layer 31 includes a plurality of the first intermediate dielectric layers 32 positioned in the isolated regions A2 and a second single intermediate dielectric layer 34 positioned in the peripheral region A3. The intermediate grating layer 31 has the same configuration as the ninth embodiment except that a material for the second intermediate dielectric layer 34 differs from that of the second intermediate dielectric layer 33 of the ninth embodiment.

More particularly, the thickness of the intermediate grating layer 31 is larger than thickness of the first grating layer 21, and the total thickness of the first grating layer 21 and the intermediate grating layer 31 is preferably from 100 nm to 200 nm. The ratio of the width WT of the first intermediate dielectric layer 32 to the structural period PT is from 0.30 to 0.65, preferably from 0.4 to 0.6. More preferably, the ratio is not large than 0.5.

[Second Grating Layer 41]

The second grating layer 41 includes a plurality of second metal layers 42 individually positioned in a region including the isolate regions A2, and a second single dielectric layer 44 included in the peripheral region A3. The second grating layer 41 has the same configuration as in the ninth embodiment except that a constituent material for the second dielectric layer 44 differs from that of the second dielectric layer 43 of the ninth embodiment.

The thickness of the second grating layer 41 is less than that of the intermediate grating layer 31. The thickness of the second grating layer 41 is preferably not larger than 200 nm, more preferably not less than 15 nm. The ratio of the width of the second metal layer 42 to the structural period PT is from 0.30 to 0.65, preferably from 0.4 to 0.6. More preferably, the ratio is not larger than 0.5.

[Upper Grating Layer 51]

The upper grating layer 51 includes a plurality of first upper dielectric layers 52 and a second single upper dielectric layer 53. The position of the respective first upper dielectric layers 52 includes the isolated region A2 as viewed in a direction perpendicular to the front surface 410S. The position of the second single upper dielectric layer 53 is included in the peripheral region A3 as viewed in a direction perpendicular to the front surface 410S. The thickness of the upper grating layer 51 is preferably 200 nm or less.

The respective first upper dielectric layers 52 are a structure overlaid on the top of the second metal layer 42. The respective first upper dielectric layers 52 are ones different from the second metal layers 42. As viewed in a direction perpendicular to the front surface 410S, the positioning period of the first upper dielectric layers 52 is the structural period PT. The ratio of the width of the first upper dielectric layer 52 to the structural period PT is from 0.30 to 0.65, preferably from 0.4 to 0.6. More preferably, the ratio is not larger than 0.5.

As viewed in a direction perpendicular to the front surface 410S, the second upper dielectric layer 53 has a mesh pattern for surrounding the individual upper dielectric layers 52 one by one. The second upper dielectric layer 53 is one different from the second dielectric layer 44. In the upper grating layer 51, the second upper dielectric layer 53 is a structural and optical sea component, and the respective upper dielectric layers 52 are structural and optical island components.

Figure 76:
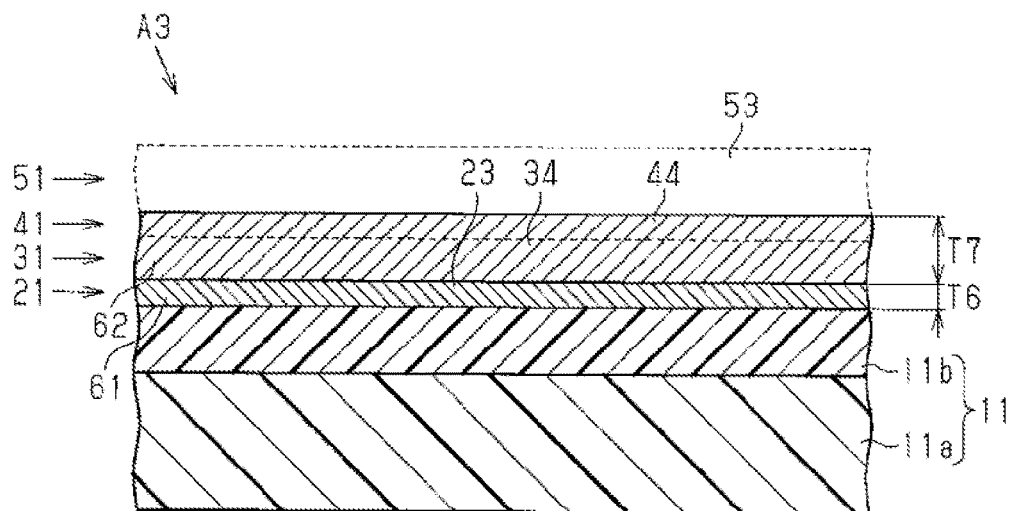
FIG. 76 is a sectional view showing a sectional structure of the subpixel of the tenth embodiment.

As shown in FIG. 76, in the peripheral region A3, there are stacked the first metal layer 23 of the first grating layer 21, the second intermediate dielectric layer 34 of the intermediate grating layer 31, the second dielectric layer 44 of the second grating layer 41 and the second upper dielectric layer 53 of the upper grating layer 51 in the order closer to the support 11.

[Materials for the Respective Grating Layers]

The first dielectric layer 22 and the first intermediate dielectric layer 32 are, respectively, a dielectric and are made, for example, of a resin such as photocurable resin or an inorganic material such as quartz like the ninth embodiment. The refractive indexes of the first dielectric layer 22 and the first intermediate dielectric layer 32 are higher than that of an air layer, respectively, and are, for example, from 1.2 to 1.7. For example, the intermediate layer 11b of the substrate 11a, the first dielectric layer 22 and the first intermediate dielectric layer 32 are an integral structure and are made of the same material, respectively.

The first metal layer 23 and the second metal layer 42 are formed of a metal material, respectively. As in the ninth embodiment, the constituent materials for the first metal layer 23 and the second metal layer 42 are, respectively, a material whose real part of the complex permittivity in a visible region wavelength is a negative value. Preferred examples include aluminum, silver, gold, indium, tantalum and the like. The first metal layer 23 and the second metal layer 42 are made, for example, of the same material.

The second intermediate dielectric layer 34, the second dielectric layer 44 and the first upper dielectric layer 52 are, respectively, a transparent dielectric permitting the transmission of visible region light. Preferably, the second intermediate dielectric layer 34, the second dielectric layer 44 and the first upper dielectric layer 52 are formed of an inorganic compound such as silicon dioxide (SiO2), aluminum oxide (Al2O3), tantalum oxide (Ta2O5), niobium dioxide (Nb2O5), zirconium dioxide (ZrO2), titanium dioxide (TiO2), magnesium fluoride (MgF2), calcium fluoride (CaF2) and the like. Of these, the constituent materials for the second intermediate dielectric layer 34, the second dielectric layer 44 and the first upper dielectric layer 52 should more preferably contain an oxide of one element selected from the group consisting of titanium, niobium, aluminum, tantalum, hafnium, zirconium, silicon and magnesium.

In this regard, however, the second intermediate dielectric layer 34, the second dielectric layer 44 and the first upper dielectric layer 52 may be constituted of an organic compound, respectively. The refractive indexes of the second intermediate dielectric layer 34, the second dielectric layer 44 and the first upper dielectric layer 52 are, respectively, higher than that of an air layer and are, for example, from 1.3 to 3.0.

For example, the second intermediate dielectric layer 34 and the second dielectric layer 44 are formed as an integral structure, and the second intermediate dielectric layer 34, the second dielectric layer 44 and the first upper dielectric layer 52 are made of the same material.

The second upper dielectric layer 53 is a transparent dielectric permitting the transmission of visible region light and is an air layer or a resin layer having a refractive index close to that of the air layer. The refractive index of the second upper dielectric layer 53 is lower than those of the first upper dielectric layer 52 and the second dielectric layer 44.

In the configuration set out above, the structure constituted of the first dielectric layer 22 and the first intermediate dielectric layer 32 is an example of the periodic element and is the projection 11T projecting from the surface of the support 11 as a reference plane. The structure constituted of the support 11, the first dielectric layers 22 and the first intermediate dielectric layers 32 is an example of the periodic structure. The layer formed of the first metal layer 23 and the second metal layer 42 is positioned on the surface of the periodic structure and is taken as a metal layer 61 having, as an entire layer, a shape that follows the surface profile of the periodic structure. The layer constituted of the second intermediate dielectric layer 34, the second dielectric layer 44 and the first upper dielectric layer 52 is positioned on a surface opposite to a contact surface with the periodic structure in the metal layer 61 and is taken as a dielectric layer 62 having, as an entire layer, a shape that follows the surface profile of the metal layer 61.

On this occasion, in order to realize the configuration of the respective grating layers 21, 31, 41, 51 described above, a thickness T5 that is the height of the projection 11T is preferably from 100 nm to 200 nm. A thickness T6 of the metal layer 61 is preferably not larger than 200 nm, more preferably not larger than 15 nm. A thickness T7 of the dielectric layer 62 is less than the thickness T5 that is the height of the projection 11T and is preferably not larger than 200 nm. It will be noted that when the dielectric layer 62 positioned in a region between the adjacent projections 11T is more depressed than the metal layer 61 on the projection 11T, a part or whole of the second dielectric layer 44 of the second grating layer 41 is constituted of the same material as of the second upper dielectric layer 53 of the upper grating layer 51. That is, in this case, a part or whole of the second dielectric layer 44 is an air layer or a resin layer. In this regard, however, the second dielectric layer 44 should preferably be a structure contiguous from the second intermediate dielectric layer 34.

Further, it is preferred that the thickness T6 of the metal layer 61 is not larger than $\frac{1}{10}$ times the thickness T5 that is the height of the projection 11T like the ninth embodiment. The thickness T5 that is the height of the projection 11T is preferably less than the structural period PT, more preferably less than half the structural period PT.

It will be noted that although depending on the manner of preparing the metal layer 61, the thickness of the metal layer 61 may differ between the region on the projection 11T, i.e. the second metal layer 42, and the region between the adjacent projections 11T, i.e. the first metal layer 23. In the present embodiment, the thickness T6 of the metal layer 61 is defined as a thickness of the metal layer 61 which is positioned in a region extending in a band in the peripheral region A3, or which is positioned at the center in a width direction of a region where no projection 11T is present along one direction. It will be noted that this is true of the ninth embodiment also.

Likewise, although depending on the manner of preparing the dielectric layer 62, the thickness of the dielectric layer 62 may differ between the region on the projection 11T, i.e. the first upper dielectric region 52, and the region between the adjacent projections 11T, i.e. the second intermediate dielectric layer 34 and the second dielectric layer 44. In the present embodiment, the thickness T7 of the metal layer 62 is defined as a thickness of the metal layer 62 which is positioned in a region extending in a band in the peripheral region A3, or is positioned at the center in a width direction of a region where no projection 11T is present along one direction. It will be noted that this is true of the ninth embodiment also.

[Method for Manufacturing the Color Filter]

Next, an example of a method for manufacturing the color filter of the tenth embodiment is illustrated.

The support 11, the first dielectric layers 22, the first intermediate dielectric layers 32, the first metal layer 23 and the second metal layers 42 are formed in the same manner as in the ninth embodiment. More particularly, the first dielectric layers 22 and the first intermediate dielectric layers 32 are integrally formed as the projections 11T projecting from the surface of the support 11. For the formation of the projections 11T, there can be adopted, for example, a lithographic method using light or a charged particle beam, a nanoimprinting method or a plasma etching method. Especially, the nanoimprinting method can be used for the formation of the projections 11T on the surface of the support 11 made of a resin, for example. In the case where a hard material substrate is processes to form the projections 11T, there may be used a combined method of the photolithographic method using light or a charged particle beam and the plasma etching method.

Next, the metal layer 61 is formed on the surface of the support 11, on which the projections 11T have been formed, according to a vacuum deposition method or a sputtering method. The metal layer 61 is formed to have a shape that follows the surface profile of the periodic structure made up of the support 11 and the projections 11T. In doing so, the first metal layer 23 and the second metal layers 42 are formed.

Thereafter, the dielectric layer 62 is formed on the surface of the structure, on which the metal layer 61 has been formed. For the formation of the dielectric layer 62, there is used, for example, a vacuum deposition method or a sputtering method. The dielectric layer 62 is formed in conformity with the surface configuration of the metal layer 61. In this way, the second intermediate dielectric layers 34, the second dielectric layers 44 and the first upper dielectric layers 52 are formed.

According to such a manufacturing method, the first grating layer 21 segmented with the top surfaces of the first metal layer 23 is formed, and the intermediate grating layer 31 which is segmented with the top surfaces of the first intermediate dielectric layer 32, or the top surfaces of the projections 11T, is thus segmented. Moreover, the second grating layer 41 segmented with the top surfaces of the second metal layer 42 is formed, and the upper grating layer 51 segmented with the top surfaces of the first upper dielectric layers 52 is formed.

[Optical Function of Color Filter]

Figure 77:
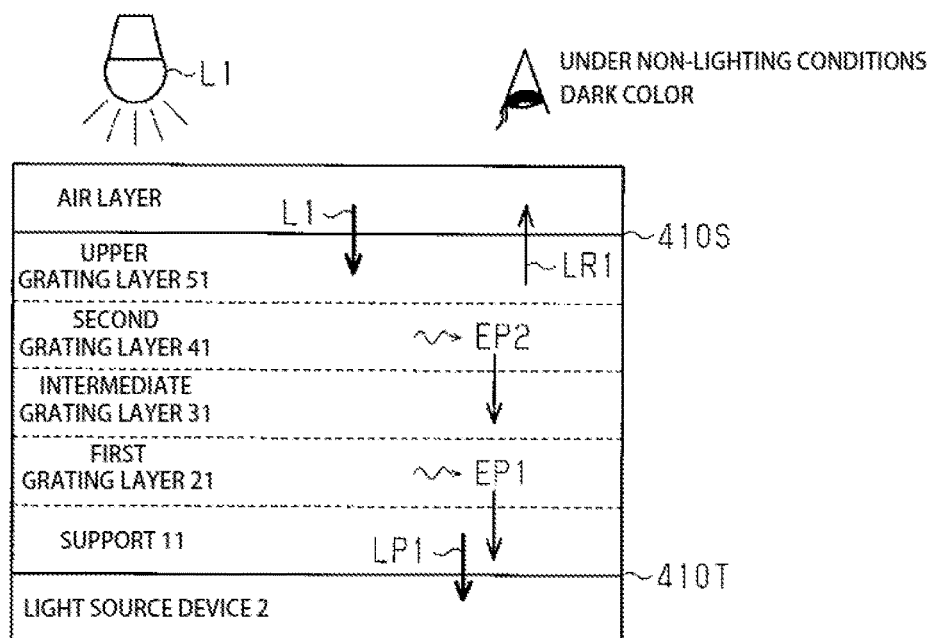
FIG. 77 is an operational view showing the operation of the color filter of the tenth embodiment upon non-lighting of a light source device.
Figure 78:
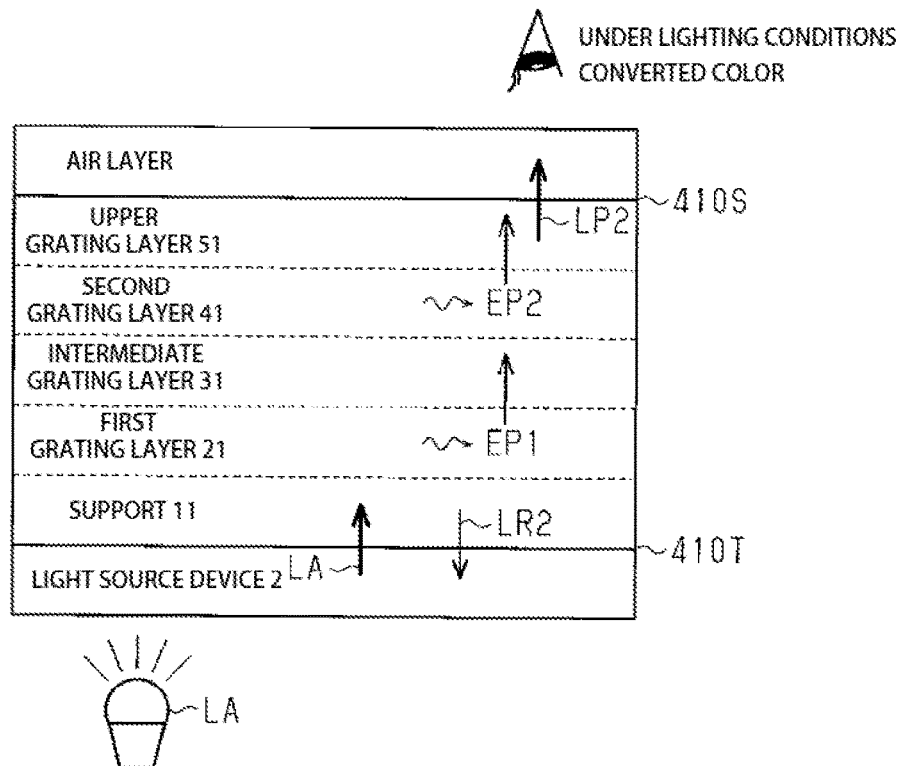
FIG. 78 is an operational view showing the operation of the color filter of the tenth embodiment upon lighting of a light source device.

Referring to FIGS. 77 and 78, the optical configuration and operation of the color filter of the tenth embodiment are described.

As shown in FIG. 77, when the light source device 2 is under non-lighting conditions, external light L1 incident from the front surface side of the color filter enters from the air layer to the upper grating layer 51. The refractive index of the upper grating layer 51 approximates the magnitude averaged between the refractive index of the first upper dielectric layer 52 and the refractive index of the second upper dielectric layer 53. More particularly, the refractive index of the upper grating layer 51 has the magnitude dominated by the second upper dielectric layer 53 serving as a sea component and is a value close to that of the air layer. Since the external light L1 enters from the air layer to the upper grating layer 51 having a refractive index close to the air layer, so that Fresnel reflection is less likely to occur at the interface between the air layer and the upper grating layer 51. Accordingly, the reflection at the interface between the air layer and the upper grating layer 51 is suppressed, and the light incident into the upper grating layer 51 is allowed to transmit through the upper grating layer 51 and arrives at the second grating layer 41.

The refractive index of the second grating layer 41 approximates the magnitude averaged between the refractive index of the second metal layer 42 and the refractive index of the second dielectric layer 44. More particularly, the refractive index of the second grating layer 41 has the magnitude dominated by the second dielectric layer 44 serving as a sea component and is a value higher than that of the air layer. The second grating layer 41 has a grating structure made of a metal and a dielectric and the structural period PT of the second metal layers 42 is a sub-wavelength period, so that plasmon resonance occurs in the second grating layer 41. Accordingly, a part of the light arriving at the second grating layer 41 is reflected at the interface between the upper grating layer 51 and the second grating layer 41, and a part of the light arriving at the second grating layer 41 is converted to the surface plasmon and allowed to transmit through the second grating layer 41. The light EP2 of the wavelength region consumed by plasmon resonance is not reflected at the interface between the upper grating layer 51 and the second grating layer 41.

The refractive index of the intermediate grating layer 31 approximates the magnitude averaged between the refractive index of the first intermediate dielectric layer 32 and the refractive index of the second intermediate dielectric layer 34. More particularly, the refractive index of the intermediate grating layer 31 has the magnitude dominated by the second intermediate dielectric layer 34 serving as a sea component. Since the first intermediate dielectric layer 32 and the second intermediate dielectric layer 34 are, respectively, made of a transparent dielectric permitting the transmission of visible region light, the intermediate grating layer 31 is high in light transmission in the visible region. Although depending on the difference in refractive index between the second grating layer 41 and the intermediate grating layer 31, part of the light arriving at the intermediate grating layer 31 is reflected at the interface between the second grating layer 41 and the intermediate grating layer 31.

The refractive index of the first grating layer 21 approximates the magnitude averaged between the refractive index of the first dielectric layer 22 and the refractive index of the first metal layer 23. More particularly, the refractive index of the first grating 21 has the magnitude dominated by the first metal layer 23 serving as a sea component. The first grating layer 21 has a grating structure made of a metal and a dielectric. Since the structural period PT of the first dielectric layers 22 is a sub-wavelength period, plasmon resonance occurs in the first grating layer 21. Accordingly, part of the light arriving at the first grating layer 21 is reflected at the interface between the intermediate grating layer 31 and the first grating layer 21, and part of the light arriving at the first grating layer 21 is converted to the surface plasmon and allowed to transmit through the first grating layer 21. The light EP1 in the wavelength region consumed by plasmon resonance is not reflected at the interface between the intermediate grating layer 31 and the first grating layer 21.

Part of the light transmitting through the first grating layer 21 may be reflected at the interface between the first grating layer 21 and the support 11, at the interface between the intermediate layer 11b and the substrate 11a and at the interface between the support 11 and the air layer. Part of the light LP1 in the wavelength of light allowed to transmit through the first grating layer 21 is transmitted through the support 11 and emitted to the rear surface side of the color filter.

The lights reflected at the interfaces of the respective layers are emitted to the front surface side of the color filter, and an interference occurs due to the light path difference among these lights. As a result, when the external light L1 is made incident from an outside of the color filter, light LR1 of the specific wavelength region caused by plasmon resonance and light interference is emitted from the front surface side of the color filter. In this regard, however, since the thicknesses of the first metal layer 23 and the second metal layer 42 are sufficiently small, the light LR1 that is reflected light is suppressed in intensity. As a result, according to the on-lighting observation wherein the external light L1 is made incident from the outside of the color filter into the upper grating layer 51, followed by observation of the front surface 410S from the front surface side of the color filter, a colored and dark color that differs from black or white is visually recognized in the subpixel 410A.

As shown in FIG. 78, when white light LA is made incident from the light source device 2 to the rear surface 410T of the subpixel 410A, plasmon resonance occurs in the first grating layer 21 and the second grating layer 41 in the same way, respectively. Then, light LP2 of specific wavelength region, which includes light re-converted from the surface plasmon that is transmitted through the first grating layer 21 and the second grating layer 41, respectively, and light transmitted through all the layers, is emitted. Accordingly, according to the lighting observation wherein light LA is made incident from the light source device 2 to the color filter and the front surface 410S is subsequently observed from the front surface side of the color filter, light LP2 after color conversion depending on the type of subpixel 410A, i.e. a colored color different from black and white, is visually recognized in the subpixel 410A.

On the other hand, when the white light LA is made incident from the light source device 2 to the rear surface 410T of the subpixel 410A, light LR2 of specific wavelength region caused by plasmon resonance and light interference in addition to Fresnel reflection is emitted to the rear surface side of the color filter as light reflected at the interfaces between the respective layers. Nevertheless, the light LR2 is suppressed low in intensity.

It will be noted that as stated above, since plasmon resonance to light in specific wavelength region occurs in the first grating layer 21 and the second grating layer 41, respectively, the wavelength region allowing the transmission through the grating layers 21, 41 after consumption with plasmon resonance in each of the grating layers 21, 41 and the wavelength region reflected at the interfaces between the grating layers 21, 41 and other layer without consumption with plasmon resonance become different from each other. Accordingly, the reflected lights LR1, LR2 and the transmitted lights LP1, LP2 differ from each other with respect to the wavelength region.

The ratio of the width WT to the structural period PT is from 0.30 to 0.65, so that with respect to the first grating layer 21 and the second grating layer 41 in which plasmon resonance occurs, the first grating layer 21 becomes a layer wherein the first metal layer 23 is predominantly positioned, and the second grating layer 41 becomes a layer wherein the second dielectric layer 44 is predominantly positioned. The wavelength regions absorbed by plasmon resonance differ between the first grating layer 21 and the second grating layer 41 due to the structural difference as mentioned above. In addition, light reflectance differs between the interface of the first grating layer 21 and other layer and the interface of the second grating layer 41 and other layer. Light incident from the front surface side of the color filter to the subpixel 410A arrives at the second grating layer 41 earlier than at the first grating layer 21 and undergoes a great optical effect of the second grating layer 41. On the other hand, light incident from the rear surface side of the color filter to the subpixel 410A arrives at the first grating layer 21 earlier than at the second grating layer 41 and undergoes a great effect of the first grating layer 21. As a result, especially the color of reflected light greatly differs between the case where light is incident from the front surface side to the subpixel 410A and the case where light is incident from the rear surface side to the subpixel 410A.

Further, the wavelength region consumed by plasmon resonance in the respective grating layers 21, 41 varies depending on the grating structure of the respective grating layers 21, 41, i.e. the structural period PT, the thicknesses of the respective grating layers 21, 41 and the widths WT of the first dielectric layer 22 and the second metal layer 42 and also on the types of materials for the respective grating layers 21, 41, i.e. the refractive indexes of a material for the metal layer 61 and a material for the projection 11T and the refractive index of a material or the dielectric layer 62. Accordingly, the wavelength region of reflected or transmitted light can be controlled, for example, by proper selection of a material for the first dielectric layer 22 of the first grating layer 21 and also by proper selection of a material for the second dielectric layer 44 of the second grating layer 41. That is, light color after conversion with the subpixel 410A can be controlled.

For example, the comparison is made, for example, of two subpixels 410A wherein the two subpixels 410A have the same structural period PT with their projections 11T and metal layers 61 being made of the same materials, respectively, except that materials for the dielectric layers 62 differ between the two subpixels 410A. More particularly, in the two subpixels 410A, the first grating layers 21 have the same configuration, materials for the first intermediate layers 32 in the intermediate grating layer 31 are the same as each other, and materials for the second metal layers 42 in the second grating layer 41 are the same with each other. On the one hand, in the two subpixels 410A, materials for the second intermediate dielectric layers 34 in the intermediate grating layer 31 differ from each other, materials for the second dielectric layers 44 in the intermediate grating layer 41 differ from each other, and materials for the first upper dielectric layers 52 in the upper grating layer 51 also differ from each other. Thus, in the two subpixels 410A, the respective configurations of the intermediate grating layer 31, the second grating layer 41 and the upper grating layer 51 differ from each other, by which the wavelength regions of light transmitting through these layers differ between the two subpixels 410A. Accordingly, the wavelength regions of light after color conversion emitted from the two subpixels 410A differ from each other.

As stated above, in the tenth embodiment, light of specific wavelength region is emitted from the optical filter as reflected or transmitted light due to plasmon resonance. Since the wavelength region of the transmitted or reflected light is determined depending on a plurality of factors including the position and size of the periodic elements in the form of the projections 11T and the metal layers whose positions are determined by the respective periodic elements, it is possible to enhance the degree of freedom of adjusting the wavelength region transmitted through or reflected from the optical filter.

Similar to the ninth embodiment, the provision of an optical filter that enables the enhancement of the degree of freedom of adjusting, within a filter element, the distribution of wavelength region of light transmitted through the filter element is also an object of the tenth embodiment. According to the tenth embodiment, the effects exemplified below and including the effects on the above problems are obtained in addition to the effects of (9-1) to (9-5) and (9-8) of the ninth embodiment.

(10-1) Since the subpixel 410A has the dielectric layer 62, the transmission wavelength region of the subpixel 410A can be adjusted by changing a constituent material for the dielectric layer 62. Accordingly, the degree of freedom of adjusting, within the subpixel 410A, the distribution of a wavelength region of light transmitted through the subpixel 410A can be further enhanced.

(10-2) When the configuration is such that the dielectric layer 62 is formed of a material including an oxide of an element selected from the group consisting of titanium, niobium, aluminum, tantalum, hafnium, zirconium, silicon and magnesium, the refractive index of the dielectric layer 62 can be selected from a wide range. Accordingly, the degree of freedom of adjusting the transmission wavelength region of the subpixel 410A is improved.

(10-3) When the configuration is such that the thickness T7 of the dielectric layer 62 is lower than the thickness T5 that is the height of the projection 11T, light permeability in the subpixel 410A is enhanced, so that the intensity of light transmitted through the subpixel 410A is increased. Accordingly, it is possible to increase the clarity of a color in the respective subpixels 410A and the brightness of light in the respective subpixels 410A. If the thickness T7 of the dielectric layer 62 is not larger than 200 nm, the light permeability in the subpixel 410A can be satisfactorily increased.

Modification Examples of Tenth Embodiment

The tenth embodiment can also be performed by change in the following ways.

In the plane composed of the isolated regions A2 and the peripheral region A3, the area ratio occupied by the isolated regions A2, i.e. an occupying ratio of the projections 11T per unit area in the plane including the reference plane and the projections 11T, is preferably not less than 0.1. If the configuration is such that the area ratio is larger than 0.1, an aspect ratio that is a ratio of the height to the width of the projection 11T is suppressed from becoming excessively large. Thus, the durability of the structure comprised of the support 11 and the projections 11T is increased and a high processing accuracy of the projections 11T is likely to be obtained.

On the other hand, when the configuration is such that the area ratio is less than 0.5, the occurrence of Fresnel reflection at the interface between the upper grating layer 51 and its upper layer is favorably suppressed. It will be noted that although depending on the manner of preparing the metal layer 61 and the dielectric layer 62, a material is attached to the side surfaces of the projection 11T upon the formation of these layers. If the area ratio is less than 0.5, the distance of the region between the mutually adjacent projections 11T is sufficiently ensured. Thus, the region between the projections 11T is suppressed from being filled with the material attached to the side surfaces of the projections 11T when the metal layer 61 and the dielectric layer 62 are formed. Accordingly, the metal layer 61 and the dielectric layer 62 are likely to be formed in a shape that follows the surface profile of the underlying layer. As a consequence, the upper grating layer 51 wherein the first upper dielectric layers 52 are interspersed therethroughout is conveniently formed, so that the effect of suppressing Fresnel reflection at the interface in the upper grating layer 51 can be conveniently obtained.

In order to suppress Fresnel reflection especially at the front surface side of the subpixel 410A, it is preferred that a difference in refractive index between the surface layer that is a layer in contact with the second upper dielectric layer 53 at a side opposite to the second grating layer 41 relative to the second dielectric layer 53 and the second upper dielectric layer 53 is less than a difference in refractive index between the first metal layer 23 and the support 11. The surface layer is, for example, an air layer. More preferably, the refractive index of the second upper dielectric layer 53 is equal to the refractive index of the surface layer.

Like the ninth embodiment, the first metal layer 23 and the second metal layers 42 in the tenth embodiment can have such shape features as shown in FIG. 71. The metal layer 61 may include a first intermediate metal layer 32A that is a metal layer positioned at the side surfaces of the first intermediate dielectric layer 32 and contiguous to the second metal layer 42. The intermediate metal layer 32A is sandwiched between the first intermediate dielectric layer 32 and the second intermediate dielectric layer 34 and is thinner at a portion closer to the first metal layer 23. It will be noted that plasmon resonance may occur in the intermediate grating layer 31 due to the presence of the intermediate metal layer 32A.

In the tenth embodiment, the projection 11T may be in the form of a pyramid projected from the surface of the support 11 like the structure shown in FIG. 72 related to the ninth embodiment.

Figure 79:
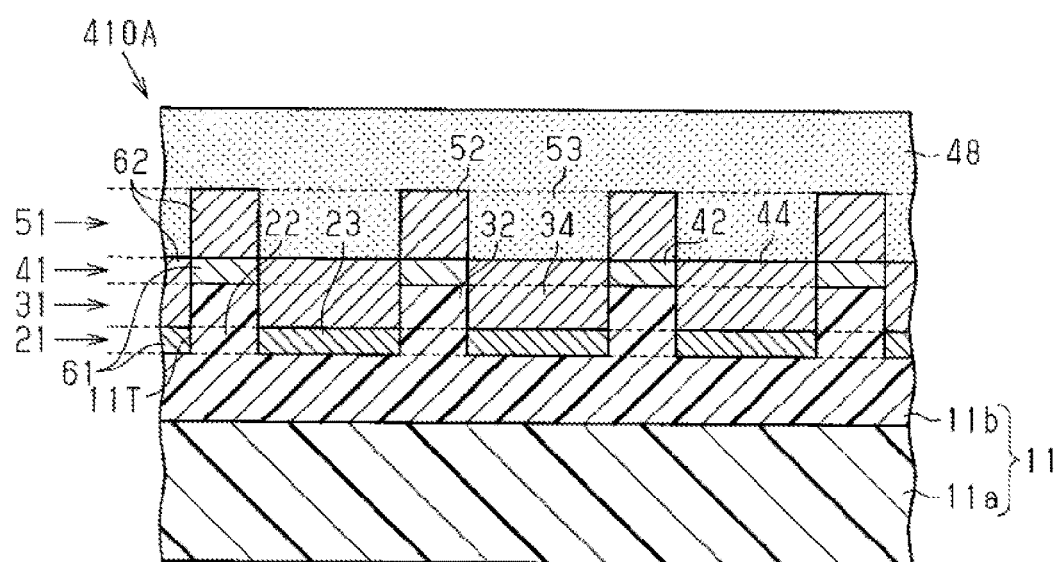
FIG. 79 is an enlarged sectional view of a part of a sectional structure in the subpixels of a modification example of the tenth embodiment.

As shown in FIG. 79, the color filter may be provided with a protective layer 48 on the dielectric layer 62. According to such a configuration, the structure constituted of the support 11 and the projections 11T, the metal layer 61 and the dielectric layers 62 can be protected. The protective layer 48 can be embodied as an integrated structure with the second upper dielectric layer 53. In this case, the protective layer 48 is preferably a resin layer having a low refractive index. The low refractive index resin layer has a refractive index closer to the refractive index of an air layer than the refractive indexes of the first dielectric layer 22 and the first intermediate dielectric layer 32 are.

If the configuration is such that the protective layer 48 serving as the surface of the color filter is formed of a resin containing fluorine, dirt attachment to the surface of the color filter is suppressed.

It will be noted that the protective layer 48 may have a flat surface as shown in FIG. 79, or may have a shape following the surface profile of the dielectric layer 62.

As viewed in a direction perpendicular to the front surface 410S of the subpixel 410A, the arrangement of the isolated regions A2 is not limited to a square arrangement and a hexagonal arrangement, but may be in a two-dimensional lattice. More particularly, a plurality of the first dielectric layers 22 may be arranged in a two-dimensional lattice, and a plurality of the first intermediate dielectric layers 32 may also be arranged in a two-dimensional lattice. Moreover, a plurality of the second metal layers 42 may be arranged in a two-dimensional lattice, and a plurality of the first upper dielectric layers 52 may be arranged in a two-dimensional lattice. In other words, the periodic elements of the periodic structure may be arranged in a two-dimensional lattice having a sub-wavelength period. The two-dimensional lattice arrangement is one wherein elements are arrayed along each of two directions intersecting with each other within a two-dimensional plane. In this case, the ratio of the width WT to the structural period PT means a ratio of the width WT to the structural period PT in one direction, and the ratio which is within a given range means that a ratio of the width WT to the structural period PT in each of the two arrangement directions of the periodic elements is within a given range. The thicknesses of the respective layers of the color filter which are within given ranges relative to the structural period PT, respectively, mean that the thicknesses of the respective layers relative to the structural period PT in each of the two arrangement directions of the periodic elements are within given ranges, respectively.

The shape of the isolated region A2 as viewed in a direction perpendicular to the front surface 410S of the subpixel 410A, i.e. a planar shape of the periodic element, is not limited to a square, but may be a rectangle or other polygon, or may be a circle.

Figure 80:
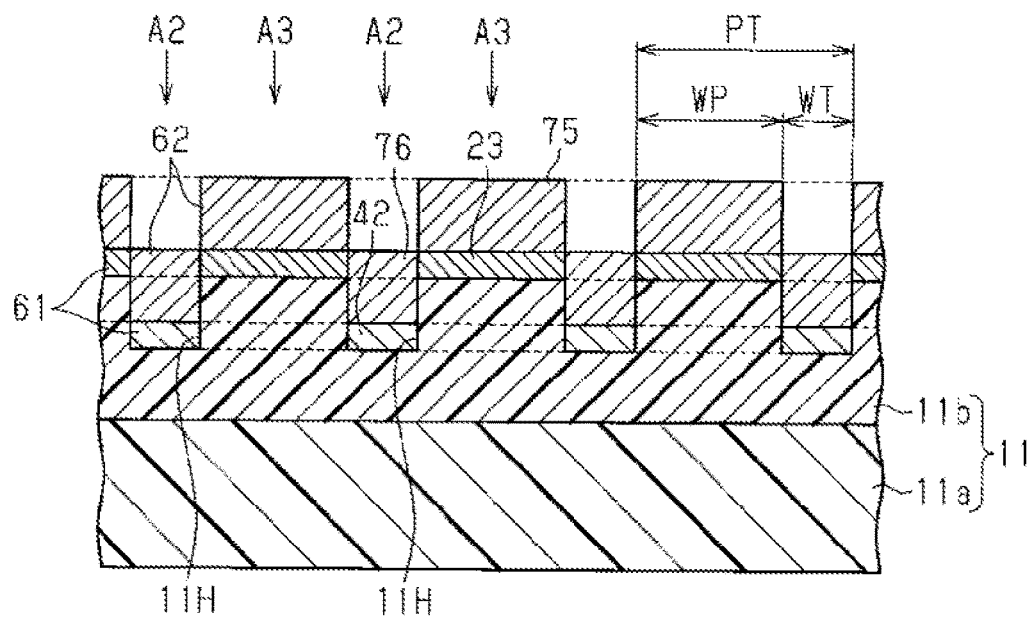
FIG. 80 is an enlarged sectional view showing a part of a sectional structure in the subpixels of another modification example of the tenth embodiment.

In the tenth embodiment, the periodic elements arrayed on the reference plane may be bottomed holes in the surface of the support 11. More particularly, as shown in FIG. 80, a recess 11H that is a hole depressed from the surface of the support 11 is positioned in the isolated region A2. As viewed in a direction perpendicular to the front surface 410S of the subpixel 410A, a plurality of the recesses 11H are arrayed in a two-dimensional lattice having a sub-wavelength period. In such a configuration, the support 11 is a periodic structure. When the surface of the support 11 is taken as a reference plane, the periodic elements of the periodic structure are the recesses 11H depressed from the reference plane. One end portion of the periodic element is the opening of the respective recesses 11H and the other end portion is the bottom of the respective recesses 11H.

In this case, the metal layers 61 have a shape that follows the surface profile of the periodic structure, and the dielectric layers 62 have a shape that follows the surface profile of the metal layers 61. The first metal layer 23 is positioned in a mesh pattern for surrounding the opening of the respective recesses 11H, and the second metal layer 42 is positioned at the bottom surface of the respective recesses 11H. A mesh-shaped dielectric layer 75 is positioned on the first metal layer 23, and dielectric layers 76 arranged in the two-dimensional lattice are positioned on the second metal layers 42. In this case, there is formed a grating structure made of a metal and a dielectric on the basis of the second metal layers 42 and the mesh-shaped portions of the support 11 for surrounding the individual second metal layers 42. In addition, the dielectric layers 76 positioned on the second metal layers 42 and the first metal layer 23 enable a grating structure made of a metal and a dielectric to be formed. When light is irradiated to the color filter, the subpixel 410A allows light in a specific wavelength region to transmit therethrough due to the occurrence of plasmon resonance in the layers having these grating structures. According to such a configuration, the effects as in (10-1) to (10-3) described before can be obtained.

It will be noted that as to the projections or recesses which are periodic elements, the shape of the projections or recesses as described in the seventh embodiment, the eighth embodiment and the modification examples thereof may be applied.

The configuration of the optical filter of the tenth embodiment may be applied to the filter used in an image pickup device like the ninth embodiment.

<Additional Notes>

The measure for solving the foregoing problems embraces the following items as a technical concept derived from the ninth embodiment, the tenth embodiment and the modification examples thereof.

[Item 71]

An optical filter comprising a plurality of filter elements permitting selective transmission of light in specific wavelength region wherein the filter element includes a dielectric periodic structure and has a plurality of periodic elements arranged in a two-dimensional lattice, and a metal layer positioned on the surface of the periodic structure, wherein a flat plane on which the plurality of the periodic elements are arranged in the periodic structure is a reference plane, the periodic element is either of a projection having one end portion on the reference plane and projecting from the reference plane and a recess having one end portion on the reference plane and depressed from the reference plane, the metal layer include a first metal layer having a mesh pattern for surrounding the one end portion of the respective periodic element in the reference plane and a second metal layer positioned at the other end portion of the respective periodic elements, a structural period of the structural elements is a sub-wavelength period which is less than the wavelength region allowing transmission through the filter element, a ratio of a width of the periodic element to the structural period in each of directions along the two-dimensional lattice is from 0.30 to 0.65, the metal layer has a negative value with respect to a real part of complex permittivity for visible region light, and a thickness of the metal layer is not larger than $\frac{1}{10}$ times the distance between the one end portion and the other end portion of the periodic element.

In the above optical device, a layer which is a virtual layer across the reference plane and includes the first metal layer is the first grating layer. In the first grating layer, the interface between the metal layer and the dielectric is repeated in sub-wavelength period. A layer which is a virtual layer across the reference plane and include a plurality of the second metal layers is the second grating layer. In the second grating layer, the interface between the metal layer and the dielectric is repeated in sub-wavelength period. In these first grating layer and second grating layer, plasmon resonance occurs. In the first grating layer, part of the light incident into the first grating layer is converted to a surface plasmon due to plasmon resonance and the surface plasmon is transmitted through the first grating layer. In the second grating layer, part of the light incident into the second grating layer is converted to a surface plasmon due to plasmon resonance, followed by transmission through the second grating layer. The surface plasmon transmitted through the first grating layer and the second grating layer is re-converted to light and emitted.

In this case, since the ratio of the width of the periodic element to the structural period is from 0.30 to 0.65 and the thickness of the metal layer is not larger than $\frac{1}{10}$ times the distance between the one end portion and the other end portion of the respective periodic elements, light permeability is ensured for both the first metal layer and the second metal layer. The wavelength region of light transmitted through the first grating layer and the wavelength region of light transmitted through the second grating layer change depending on the magnitude of the structural period and the thickness of the periodic element. As a result, colored light other than black and white is emitted from the filter element. Since the wavelength region of light transmitted through the filter element is determined depending on the position and size of the respective periodic elements and the metal layer whose position is determined by the respective periodic elements, it is possible to increase the degree of freedom of adjusting the distribution of wavelength region of light transmitted through the filter elements inside the filter element.

[Item 72]

The optical filter as recited in Item 71, wherein the distance between the one end portion and the other end portion of the periodic element is from 100 nm to 200 nm.

According to the above configuration, the distance between the one end portion and the other end portion of the periodic element and the thickness of the metal layer determined correspondingly to the distance are, respectively, a magnitude sufficient to allow adequate transmission of light incident to the filter element. Therefore, it is possible to further increase the intensity of light transmitted through the filter element and the brightness of color.

[Item 73]

The optical filter as recited in Item 71 or 72, wherein the thickness of the metal layer is not larger than 15 nm.

[Item 74]

The optical filter as recited in any one of Items 71 to 73, wherein the periodic element is the projection and a ratio of the width of the periodic element to the structural period in each of directions along the two-dimensional lattice is not larger than 0.5.

According to the above configuration, the intensity of light transmitted through the filter element is increased.

[Item 75]

The optical filter as recited in any one of Items 71 to 74, wherein a constituent material for the metal layer contains a metal material selected from the group consisting of aluminum, tantalum, silver and gold.

According to the above configuration, the constituent material for the metal layer is one that is likely to cause plasmon resonance to occur and can increase wavelength selectivity in the first grating layer and the second grating layer. Accordingly, the wavelength selectivity of light transmitted through the filter element can be increased.

[Item 76]

The optical filter as recited in any one of Items 71 to 75, further comprising a dielectric layer which is positioned on the surface of the metal layer and has a shape that follows a surface profile of the metal layer, and a thickness of the dielectric layer is not larger than the distance between the one end portion and the other end portion of the periodic element.

According to the above configuration, when the constituent material for the dielectric layer is changed, the wavelength region of light transmitted through the filter element can be adjusted. Accordingly, the degree of freedom of adjusting the wavelength region of light transmitted through the periodic element can be further increased.

[Item 77]

The optical filter as recited in Item 76, wherein the thickness of the dielectric layer is not larger than 200 nm.

According to the above configuration, the intensity of light transmitted through the filter element can be increased.

[Item 78]

The optical filter as recited in Item 76 or 77, wherein the constituent material for the dielectric layer contains an oxide of an element selected from the group consisting of titanium, niobium, aluminum, tantalum, hafnium, zirconium, silicon and magnesium.

According to the above configuration, when compared with the case the dielectric layer is constituted of a resin, the refractive index of the dielectric layer can be chosen from a wide range. Accordingly, the degree of freedom of adjusting the wavelength region of light transmitted through the filter element can be further increased.

[Item 79]

The optical filter as recited in any one of Items 71 to 78, wherein the optical filter is one assembled in a display device, and the plurality of the filter elements of the optical filter include plural types of filter elements capable of selectively transmitting light in wavelength regions inherent to the plural types, respectively.

According to the above configuration, in the color filter assembled in the display device, the degree of freedom of adjusting the distribution of wavelength region of light transmitted through the filter elements functioning as a subpixel can be increased.

[Item 80]

The optical filter as recited in any one of Items 71 to 78, wherein the optical filter is one assembled in an image pickup device.

According to the above configuration, the filter assembled in the image pickup device is increased in the degree of freedom of adjusting the distribution of wavelength region of light transmitted through the filter elements.

[Item 81]

A display device comprising the optical filter recited in any one of Items 71 to 79, and a light source device capable of making visible region light incident into the filter elements.

According to the above configuration, the filter element of the optical filter functions as a subpixel, and there can be realized a display device provided with the optical device, which has an increased degree of freedom of adjusting the distribution of wavelength region of light transmitted through the filter elements.

[Item 82]

An image pickup device comprising the optical filter recited in any one of Items 71 to 78 and 80, and a light receiving element receiving light transmitted through the filter element and converted to an electrical signal.

According to the above configuration, there can be realized an image pickup device provided with an optical filter, which has an increased degree of freedom of adjusting the distribution of wavelength region of light transmitted through the filter elements.

[Item 83]

A method for manufacturing an optical filter having a plurality of filter elements permitting selective transmission of light in specific wavelength region, the method comprising a first step of forming a periodic structure in such a way that the filter elements are formed by transferring projections and recesses of an intaglio plate to a resin coated onto a surface of a substrate, and a plurality of periodic elements in the form of either of the projections and the recesses are positioned in a two-dimensional lattice having a sub-wavelength period that is less than the wavelength region transmitted through the filter element as viewed in a direction perpendicular to the substrate, a ratio of a width of the periodic element to a structural period of the periodic elements in each of directions along the two-dimensional lattice being from 0.30 to 0.65, and a second step of forming a metal layer, which has a shape that follows a surface profile of the periodic structure and has a negative value in the real part of complex permittivity for light in the visible region, on the periodic structure in a thickness of not larger than $1/10$ times the distance between one end portion and the other end portion of the periodic elements positioned on a plane wherein the plurality of the periodic elements are arranged in the periodic structure.

According to the above manufacturing method, the optical filter has an increased degree of freedom of adjusting, in the optical filter, the distribution of the wavelength region of light transmitted through the filter elements. Additionally, the periodic structure having fine projections and recesses can be easily and favorably formed.

[Item 84]

The method for manufacturing an optical filter as recited in Item 83, further comprising a third step of forming, on the metal layer, a dielectric layer having a shape that follows the surface profile of the metal layer so as to have a thickness less than the distance between the one end portion and the other end portion of the periodic element.

According to the above manufacturing, when the constituent material for the dielectric layer is changed, the wavelength region of light transmitted through the filter element can be adjusted. Accordingly, the degree of freedom of adjusting the wavelength region of light transmitted through the filter element can be further increased.

EXAMPLES

The optical device and the manufacturing method thereof described above are particularly illustrated by way of examples.

Example 1

Example 1 is one for the display body of the first embodiment.

Initially, a mold serving as an intaglio plate used for a photo-nanoimprinting method was provided. More particularly, a film of chromium (Cr) was formed on the surface of a synthetic quartz substrate in a thickness of 10 nm by sputtering, followed by forming an electron beam resist pattern on the Cr film by electron beam lithography. The resist used was of a positive type and the film thickness was set at 150 nm. The thus formed pattern was one wherein squares with a side of 160 nm were arranged in a hexagonal array whose structural period PT was 320 nm in a square region with a side of 1 cm. The region drawn with the electron beam was an inner region of the square.

Next, the Cr film in the region exposed from the resist was etched by a plasma generated by application of high frequency to a mixed gas of chlorine and oxygen. Subsequently, the synthetic quartz substrate in the region exposed from the resist and the Cr film was etched by a plasma generated by application of high frequency to ethane hexafluoride gas. In doing so, the depth of the etched synthetic quartz substrate was found to be 150 nm. The residual resist and Cr film were removed to obtain a mold having a concavo-convex structure formed thereon. A releasing agent, Optool HD-1100 (manufactured by Daikin Industries Ltd.), was applied onto the surface of the mold.

Next, a UV curing resin was coated onto the surface on which the pattern of the mold had been formed. A polyethylene terephthalate film, which had been subjected to adhesion enhancing treatment on one surface thereof, was used to cover the surface of the mold with the surface having been subjected to the adhesion enhancing treatment. Moreover, the UV curing resin was spread with a roller so that the UV curing resin was spread out over the entire region of the mold in which the pattern was formed. UV light was irradiated to cure the UV curing resin, followed by peeling the polyethylene terephthalate film from the mold. In this way, the pattern of the projections arranged in the hexagonal array was formed on the surface of the UV cured resin thereby obtaining a periodic structure, which was a laminate of the UV cured resin layer and the polyethylene terephthalate film substrate.

Next, a 100 nm thick aluminum (A1) film was formed on the surface of the periodic structure by a vacuum deposition method to form a metal layer. Thus, a display body of Example 1 was obtained. A side where the metal layer was positioned relative to the substrate is the front surface side of the display body, and a side where the substrate was positioned relative to the metal layer is the rear surface side of the display body.

White light was irradiated to the display body of Example 1, and the region in which the projection pattern was formed was subjected to measurement of the wavelength and reflectance of front side reflected light, the wavelength and reflectance of rear side reflected light and the wavelength and transmittance of transmitted light.

Figure 81:
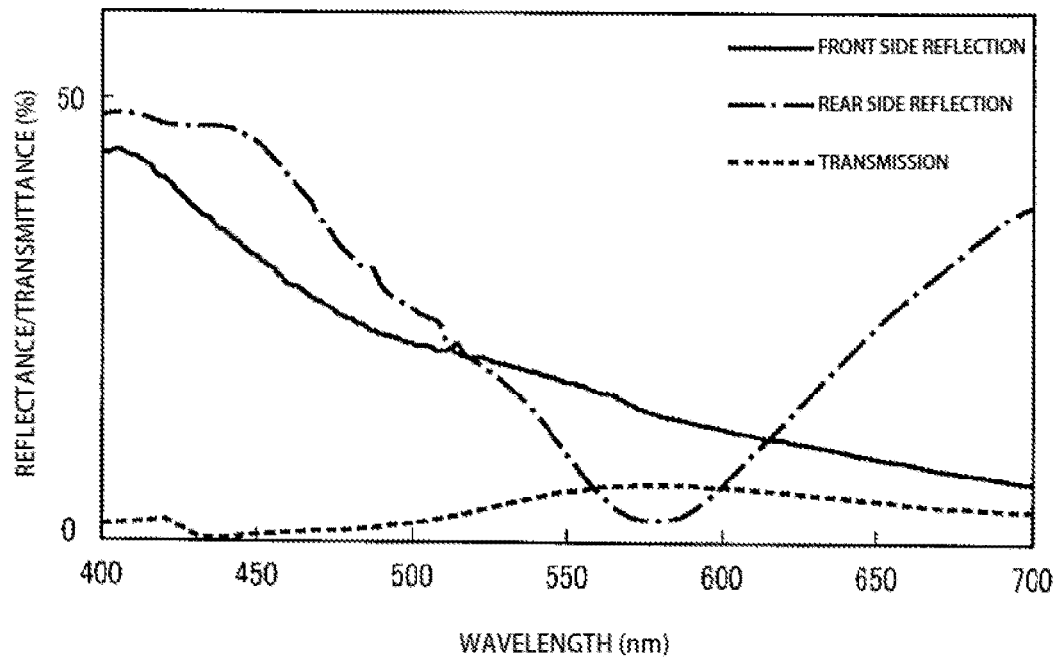
FIG. 81 is a graph showing the results of measurement of a wavelength of light reflected at a front surface side of a display body of Example 1, a wavelength of light reflected at the rear surface side, and a wavelength of transmitted light.

These results are shown in FIG. 81. As shown in FIG. 81, the front side reflected light, the rear side reflected light and the peak wavelengths of transmitted light all mutually differ from each other. In the region where no projection pattern was formed, a color having a metallic luster was observed as light reflected from the metal layer made of aluminum.

Example 2

Example 2 is an example of the first embodiment.

Initially, a mold serving as an intaglio plate used for a photo-nanoimprinting method was provided. More particularly, a film of chromium (Cr) having a thickness of 10 nm was formed on the surface of a synthetic quartz substrate by sputtering, followed by forming an electron beam resist pattern on the Cr film by electron beam lithography. The resist used was of a positive type and the film thickness was set at 150 nm.

Next, the Cr film in the region exposed from the resist was etched by a plasma generated by application of high frequency to a mixed gas of chlorine and oxygen. Subsequently, the synthetic quartz substrate in the region exposed from the resist and the Cr film was etched by a plasma generated by application of high frequency to ethane hexafluoride gas. In doing so, the depth of the etched synthetic quartz substrate was found to be 150 nm. The residual resist and Cr film were removed to obtain a mold having a concavo-convex structure formed thereon. A releasing agent, Optool HD-1100 (manufactured by Daikin Industries Ltd.), was applied onto the surface of the mold.

Figure 82A:
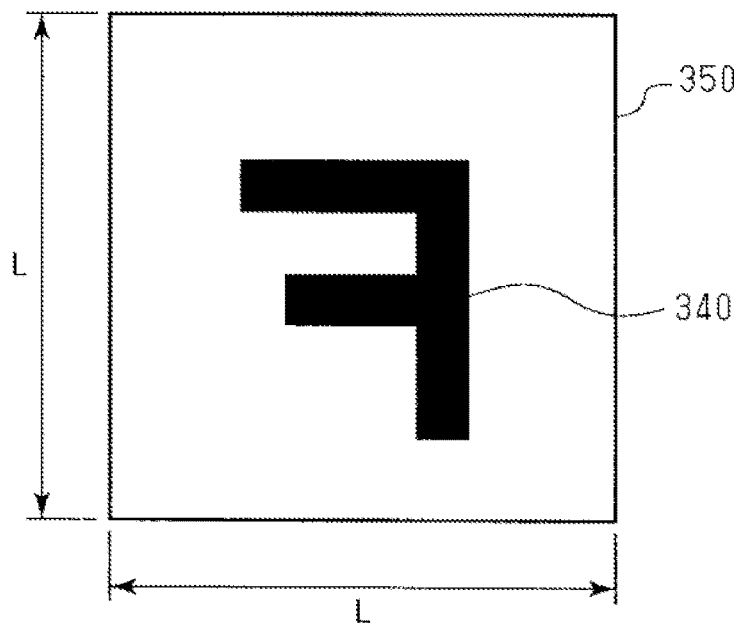
FIG. 82A is a view showing a design positioned on the surface of a mold used in Example 2.
Figure 82B:
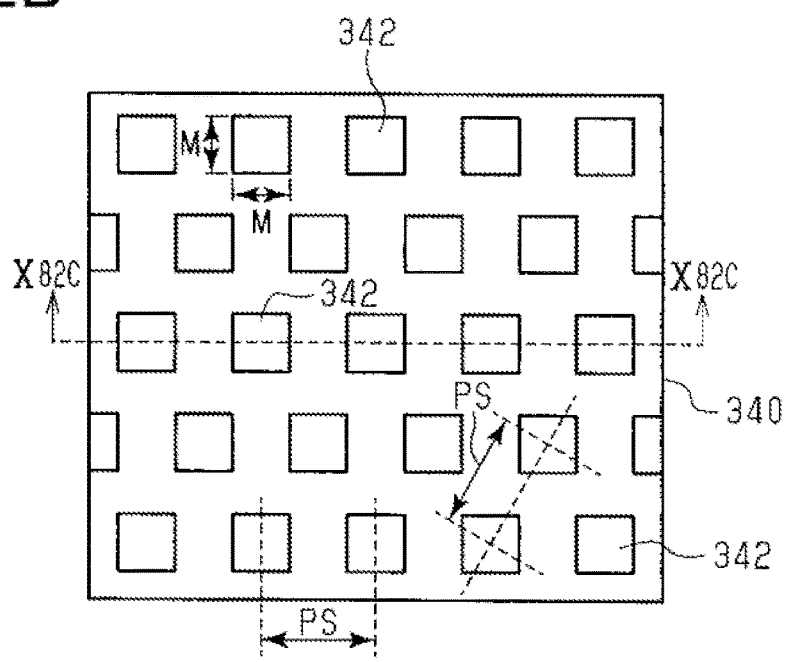
FIG. 82B is an enlarged plan view showing a planar structure in a region where the design is positioned in the mold used in Example 2.
Figure 82C:
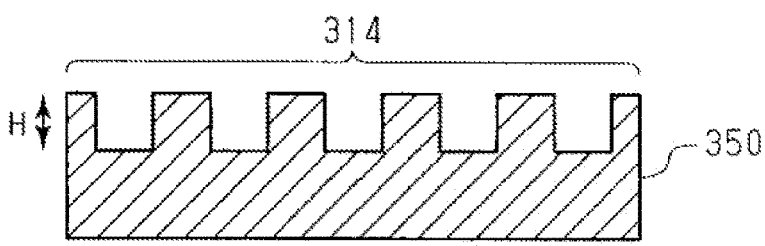
FIG. 82C is a view showing a sectional structure of a region where the design is positioned in the mold used in Example 2 and is a sectional view taken along the line X82C-X82C of FIG. 82B.

The thus formed mold was a mold 350 including a design 340 shown in FIG. 82A. A length L of a side of the mold 350 was 1 cm. As enlarged in FIG. 82B, the design 340 was made up of a pattern of squares 342 with a side length M of 150 nm arranged in a hexagonal array with a structural period PS of 300 nm. The region drawn with the electron beam corresponds to an inside region of the square 342. FIG. 82C shows a sectional structure of the region wherein the design 340 was formed in the mold 350.

Next, a UV curing resin was coated on the substrate made of synthetic quartz by spin coating to form a 50 nm thick resin layer. Subsequently, the surface of the resin layer and the surface of the mold were pressed together under reduced pressure at a compression pressure of 50 kN, followed by irradiation of light with a wavelength of 365 nm to cure the UV curing resin. Thereafter, there was obtained a structure, which was made of the resin layer having projections and recesses obtained by reversing projections and recesses on the surface of the mold, and of the substrate.

Thereafter, the structure was exposed to an O2 plasma to remove the residual film from the UV cured resin. The substrate was etched by means of a plasma generated by application of high frequency to octafluorocyclobutane gas to such an extent that the pattern made of the UV cured resin disappeared completely. In this way, a periodic structure, which was the substrate formed with the projections and recesses on the surface thereof, was obtained. The height H of the projection of the concavo-convex structure formed by the above step was 140 nm.

Figure 83A:
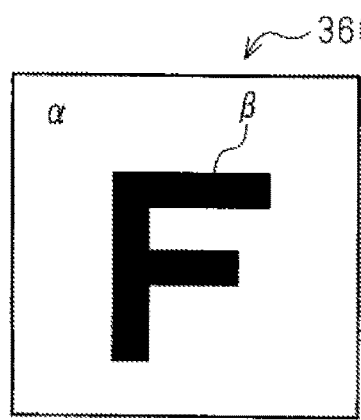
FIG. 83A is a view showing an image as viewed from the from surface side of the display body of Example 2 and FIG. 83B is an image as viewed from the rear surface side of the display body of Example 2.
Figure 83B:
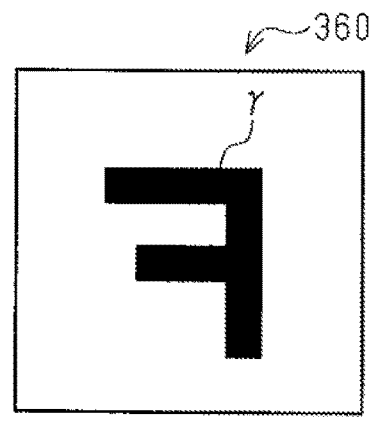

Next, a 300 nm thick film of aluminum (Al) was formed on the surface of the periodic structure by a vacuum deposition method, thereby forming a metal layer. Thus, a display body of Example 2 was obtained. A side where the substrate was positioned relative to the substrate was a front surface side of the display body, and a side wherein the substrate was positioned relative to the metal layer was a rear surface side of the display body. FIG. 83A shows an image by viewing the display body 360 of Example 2 from the front surface side thereof, and FIG. 83B shows an image by viewing the display body 360 of Example 2 from the rear surface side thereof.

In the display body 360 of Example 2, the wavelength of reflected light was measured with respect to the three regions including a region α where no design was drawn on the front surface, a region β where a design was drawn on the front surface, and a region y where no design is drawn on the rear surface. The results are shown in FIG. 84.

Figure 84:
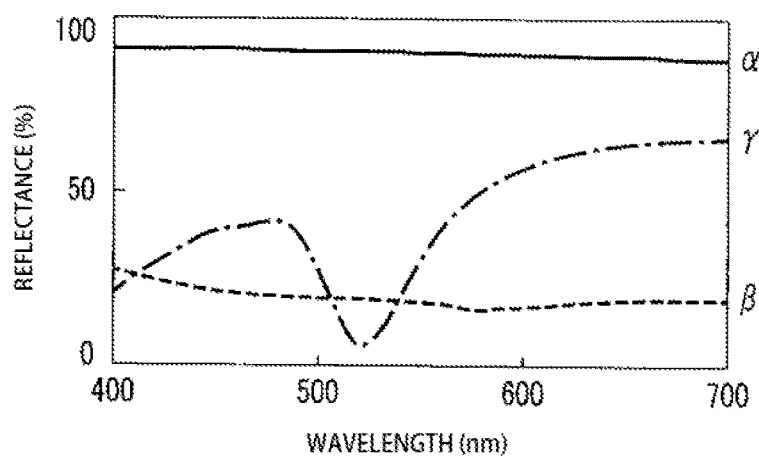
FIG. 84 is a graph showing the results of measurement of a reflected light wavelength in the display body of Example 2.

As shown in FIG. 84, when compared with the spectra of the region β, the spectra of the region α are such that the reflectance in a visible region of from 400 nm to 700 nm is uniformly lower. Hence, when natural light was irradiated to the display body 360 and the resulting reflected image of the display body 360 was observed by the naked eye from the rear surface side, the design looked close to black.

On the other hand, the spectra of the region y are such that the reflectance in a wavelength region in the vicinity of 520 nm abruptly lowers. Accordingly, when natural light was irradiated to the display body 360 and the resulting reflected image of the display body 360 was observed by the naked eye from the rear surface side, the design looked close to magenta.

Figure 85:
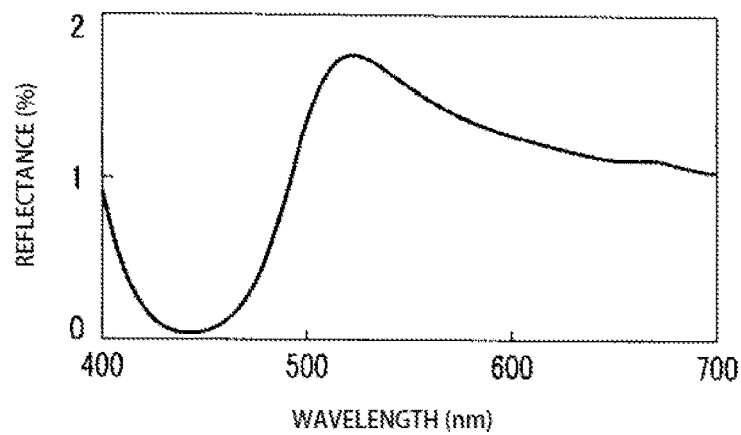
FIG. 85 is a graph showing the results of measurement of a transmitted light wavelength in the display body of Example 2.

Further, light was irradiated from the front surface side of the display body 360 of Example 2, and the wavelength of transmitted light of the region where the design was drawn was measured. The results are shown in FIG. 85. As shown in FIG. 85, although the transmittance was found to be 1 to 2%, the transmittance in the wavelength region in the vicinity of 440 nm abruptly lowered. Therefore, when natural light was irradiated to the display body 360 and the transmitted image through the display body 360 was observed by the naked eye from the rear surface side, the design looked close to yellowish green.

In this way, it was confirmed that when the display body of Example 2 was observed under natural light, mutually different color representations could be realized in the respective observations including an observation of reflected light form the front surface side, an observation of reflected light from the rear surface side and an observation of transmitted light.

Example 3

Example 3 is an example of the display body of the second embodiment.

Initially, a mold serving as an intaglio plate used for a photo-nanoimprinting method was provided. More particularly, a film of chromium (Cr) was formed on the surface of a synthetic quartz substrate in a thickness of 10 nm by sputtering, followed by forming an electron beam resist pattern on the Cr film by electron beam lithography. The resist used was of a positive type and the film thickness was set at 150 nm. The thus formed pattern was one wherein squares with a side of 160 nm were arranged in a hexagonal array whose structural period PT was 320 nm in a square region with a side of 1 cm. The region drawn with the electron beam was an inside region of the square.

Next, the Cr film in the region exposed from the resist was etched by a plasma generated by application of high frequency to a mixed gas of chlorine and oxygen. Subsequently, the synthetic quartz substrate in the region exposed from the resist and the Cr film was etched by a plasma generated by application of high frequency to ethane hexafluoride gas. In doing so, the depth of the etched synthetic quartz substrate was 100 nm. The residual resist and Cr film were removed to obtain a mold having a concavo-convex structure formed thereon. A releasing agent, Optool HD-1100 (manufactured by Daikin Industries Ltd.) was applied onto the surface of the mold.

Next, a UV curing resin was coated onto the surface on which the pattern of the mold had been formed. A polyethylene terephthalate film which had been subjected to adhesion enhancing treatment on one surface thereof was used to cover the surface of the mold with the surface having subjected to the adhesion enhancing treatment. Moreover, the UV curing resin was spread with a roller so that the UV curing resin was spread out over the entire region of the mold in which the pattern was formed. UV light was irradiated to cure the UV curing resin, followed by peeling the polyethylene terephthalate film from the mold. In this way, the pattern of the projections arranged in the hexagonal array was formed on the surface of the UV cured resin thereby obtaining a periodic structure, which was a laminate of the UV cured resin layer and the polyethylene terephthalate film substrate. The refractive index of the UV curing resin after curing was 1.52.

Next, a 50 nm thick aluminum (Al) film was formed on the surface of the periodic structure by a vacuum deposition method to form a metal layer. Moreover, a 150 nm thick film of silicon dioxide (SiO2) was formed on the surface of the metal layer to form a dielectric layer. Thus, a display body of Example 3 was obtained. A side where the dielectric layer is positioned relative to the substrate is the front surface side of the display body, and a side where the substrate is positioned relative to the metal layer is the rear surface side of the display body.

When white light was irradiated to the display body of Example 3, a blue color close to black was observed by reflective front-surface observation in the region wherein the projection pattern was formed, a purple color was observed by the reflective rear-surface observation, and an orange color was observed by the transmissive front-surface observation and the transmissive rear-surface observation. In the region where no projection pattern was formed, a color having a metallic luster was observed as reflected light from the metal layer made of aluminum.

What is claimed is:

1. A display body comprising:
   (a) an optical device comprising:
      (i) a support having a reference plane;
      (ii) a dielectric periodic structure including a plurality of periodic elements arranged in a two-dimensional lattice having a sub-wavelength period on the reference plane wherein the periodic elements each are either of a projection projecting from the reference plane and a recess depressed from the reference plane; and (iii) a metal layer positioned on a surface of the periodic structure, which is a plane including a region of the reference plane surrounding the periodic elements and the surfaces of the periodic elements and having a shape that follows a surface profile of the periodic structure;

the display body further comprises on the reference plane of the support of the optical device:

(b) a first grating layer having a thickness of from 10 nm to 200 nm;

(c) a second grating layer having a thickness of from 10 nm to 200 nm; and (d) an intermediate grating layer that is thicker than the first grating layer and the second grating layer and is sandwiched between the first grating layer and the second grating layer in a thickness direction, wherein:

the first grating layer includes a plurality of first dielectric layers arranged in an island arrangement, which is either of a square arrangement and a hexagonal arrangement, and a first metal layer having a mesh pattern for surrounding the individual dielectric layers;

the intermediate grating layer includes a plurality of first intermediate dielectric layers arranged in an island arrangement, which is either of a square arrangement and a hexagonal arrangement, and a second intermediate dielectric layer having a mesh pattern for surrounding the individual first intermediate layers and having a refractive index lower than the first intermediate dielectric layer;

the second grating layer includes a plurality of second metal layers arranged in an island arrangement, which is either of a square arrangement and a hexagonal arrangement, and a second dielectric layer having a mesh pattern for surrounding the individual second metal layers;

the periodic element is the projection wherein the periodic element is constituted of the first dielectric layer and the first intermediate dielectric layer, and the first metal layer and the second metal layer are included in the metal layer;

a volume ratio of the first metal layer in the first grating layer is greater than a volume ratio of the second metal layer in the second grating layer, and a volume ratio of the second metal layer in the second grating layer is greater than a volume ratio of a metal material in the intermediate grating layer;

a ratio of a width of the first dielectric layer to a structural period of the first dielectric layers and a ratio of a width of the second metal layer to a structural period of the second metal layers are, respectively, from 0.25 to 0.75; and the first dielectric layers have a boundary with the reference plane of the support and a material of the first dielectric layers is different from a material of the support.

2. The display body of claim 1, wherein the first metal layer and the second metal layer, respectively, have a negative value in the real part of complex permittivity for light in the visible region.

3. The display body of claim 1, wherein the ratio of the width of the first dielectric layer to the structural period of the first dielectric layers and the ratio of the width of the second metal layer to the structural period of the second metal layers are, respectively, from 0.40 to 0.60.

4. The display body of claim 3, wherein:

the first dielectric layer and the first intermediate dielectric layer are an integrated structure;

a thickness of the first grating layer is not larger than 100 nm;

a thickness of the second grating layer is not larger than 100 nm; and a thickness of the intermediate grating layer not larger than 150 nm.

5. The display body of claim 1, wherein:

a constituent material for the first metal layer and a constituent material for the second metal layer are the same as each other;

the second dielectric layer is an air layer; and a difference in refractive index between the first dielectric layer and the second metal layer is larger than a difference in refractive index between the second dielectric layer and the second metal layer.

6. The display body of claim 5, wherein the first dielectric layer and the first intermediate dielectric layer are an integrated structure, and the second intermediate dielectric layer and the second dielectric layer are an integrated structure.

7. The display body of claim 6, wherein:

the intermediate grating layer further comprises an intermediate metal layer positioned on side surfaces of the first intermediate dielectric layer and sandwiched between the first intermediate layer and the second intermediate layer; and the intermediate metal layer is an integrated structure with the second metal layer and included in the metal layer and the thickness on the side surfaces is smaller at a portion closer to the first metal layer.

8. A display body-attached device comprising:

the display body defined in claim 1; and a light-emitting structure arranged at a position facing a part of either of front and rear surfaces of the display body and configured to enable light emission toward the display body.

9. A display body comprising:

(a) an optical device comprising:

(i) a support having a reference plane;

(ii) a dielectric periodic structure including a plurality of periodic elements arranged in a two-dimensional lattice having a sub-wavelength period on the reference plane wherein the periodic elements each are either of a projection projecting from the reference plane and a recess depressed from the reference plane; and (iii) a metal layer positioned on a surface of the periodic structure, which is a plane including a region of the reference plane surrounding the periodic elements and the surfaces of the periodic elements and having a shape that follows a surface profile of the periodic structure;

the display body further comprises on the reference plane of the support of the optical device:

(b) a first grating layer having a thickness of from 10 nm to 200 nm;

(c) a second grating layer having a thickness of from 10 nm to 200 nm; and (d) an intermediate grating layer that is thicker than the first grating layer and the second grating layer and is sandwiched between the first grating layer and the second grating layer in a thickness direction, wherein:
the first grating layer includes a plurality of first dielectric layers arranged in an island arrangement, which is either of a square arrangement and a hexagonal arrangement, and a first metal layer having a mesh pattern for surrounding the individual dielectric layers;
the intermediate grating layer includes a plurality of first intermediate dielectric layers arranged in an island arrangement, which is either of a square arrangement and a hexagonal arrangement, and a second intermediate dielectric layer having a mesh pattern for surrounding the individual first intermediate layers and having a refractive index lower than the first intermediate dielectric layer;
the second grating layer includes a plurality of second metal layers arranged in an island arrangement, which is either of a square arrangement and a hexagonal arrangement, and a second dielectric layer having a mesh pattern for surrounding the individual second metal layers;
the periodic element is the projection wherein the periodic element is constituted of the first dielectric layer and the first intermediate dielectric layer, and the first metal layer and the second metal layer are included in the metal layer;
a volume ratio of the first metal layer in the first grating layer is greater than a volume ratio of the second metal layer in the second grating layer, and a volume ratio of the second metal layer in the second grating layer is greater than a volume ratio of a metal material in the intermediate grating layer;
a ratio of a width of the first dielectric layer to a structural period of the first dielectric layers and a ratio of a width of the second metal layer to a structural period of the second metal layers are, respectively, from 0.25 to 0.75; and
each first intermediate dielectric layer of the plurality of the first intermediate dielectric layers has a boundary with a respective first dielectric layer of the plurality of the first dielectric layers and a material of the first intermediate dielectric layers is different from a material of the first dielectric layers.

10. The display body of claim 9, wherein the first metal layer and the second metal layer, respectively, have a negative value in the real part of complex permittivity for light in the visible region.

11. The display body of claim 9, wherein the ratio of the width of the first dielectric layer to the structural period of the first dielectric layers and the ratio of the width of the second metal layer to the structural period of the second metal layers are, respectively, from 0.40 to 0.60.

12. The display body of claim 9, wherein:
a constituent material for the first metal layer and a constituent material for the second metal layer are the same as each other;
the second dielectric layer is an air layer; and
a difference in refractive index between the first dielectric layer and the second metal layer is larger than a difference in refractive index between the second dielectric layer and the second metal layer.

13. A display body comprising:
(a) an optical device comprising:
(i) a support having a reference plane;
(ii) a dielectric periodic structure including a plurality of periodic elements arranged in a two-dimensional lattice having a sub-wavelength period on the reference plane wherein the periodic elements each are either of a projection projecting from the reference plane and a recess depressed from the reference plane; and
(iii) a metal layer positioned on a surface of the periodic structure, which is a plane including a region of the reference plane surrounding the periodic elements and the surfaces of the periodic elements and having a shape that follows a surface profile of the periodic structure;
the display body further comprises on the reference plane of the support of the optical device:
(b) a first grating layer having a thickness of from 10 nm to 200 nm;
(c) a second grating layer having a thickness of from 10 nm to 200 nm; and
(d) an intermediate grating layer that is thicker than the first grating layer and the second grating layer and is sandwiched between the first grating layer and the second grating layer in a thickness direction, wherein:
the first grating layer includes a plurality of first dielectric layers arranged in an island arrangement, which is either of a square arrangement and a hexagonal arrangement, and a first metal layer having a mesh pattern for surrounding the individual dielectric layers;
the intermediate grating layer includes a plurality of first intermediate dielectric layers arranged in an island arrangement, which is either of a square arrangement and a hexagonal arrangement, and a second intermediate dielectric layer having a mesh pattern for surrounding the individual first intermediate layers and having a refractive index lower than the first intermediate dielectric layer;
the second grating layer includes a plurality of second metal layers arranged in an island arrangement, which is either of a square arrangement and a hexagonal arrangement, and a second dielectric layer having a mesh pattern for surrounding the individual second metal layers;
the periodic element is the projection wherein the periodic element is constituted of the first dielectric layer and the first intermediate dielectric layer, and the first metal layer and the second metal layer are included in the metal layer;
a volume ratio of the first metal layer in the first grating layer is greater than a volume ratio of the second metal layer in the second grating layer, and a volume ratio of the second metal layer in the second grating layer is greater than a volume ratio of a metal material in the intermediate grating layer;
a ratio of a width of the first dielectric layer to a structural period of the first dielectric layers and a ratio of a width of the second metal layer to a structural period of the second metal layers are, respectively, from 0.25 to 0.75; and
each first intermediate dielectric layer of the plurality of the first intermediate dielectric layers forms an integrated structure with a respective first dielectric layer of the plurality of the first dielectric layers, the integrated structure has a shape of a narrowing cone projecting the reference plane of the support.

* * * * *